United States Patent [19]
Sugiura et al.

[11] Patent Number: 5,739,589
[45] Date of Patent: Apr. 14, 1998

[54] SEMICONDUCTOR INTEGRATED CIRCUIT DEVICE PROCESS FOR FABRICATING THE SAME AND APPARATUS FOR FABRICATING THE SAME

[75] Inventors: Jun Sugiura, Musashino; Osamu Tsuchiya; Makoto Ogasawara, both of Ohme; Fumio Ootsuka, Ohme; Kazuyoshi Torii, Kodaira; Isamu Asano; Nobuo Owada, both of Ohme; Mitsuaki Horiuchi, Hachioji; Tsuyoshi Tamaru, Ohme; Hideo Aoki, Ohme; Nobuhiro Otsuka, Kokubunji; Seiichirou Shirai, Hamura-machi; Masakazu Sagawa, Ohme; Yoshihiro Ikeda, Ohme; Masatoshi Tsuneoka, Ohme; Toru Kaga, Urawa; Tomotsugu Shimmyo, Kawagoe; Hidetsugu Ogishi, Hachioji; Osamu Kasahara, Hinode-machi; Hiromichi Enami, Tachikawa; Atsushi Wakahara, Ohme; Hiroyuki Akimori, Ohme; Sinichi Suzuki, Ohme; Keisuke Funatsu, Ohme; Yoshinao Kawasaki, Kumage-cho; Tunehiko Tubone, Kudamatsu; Takayoshi Kogano, Iruma; Ken Tsugane, Ohme, all of Japan

[73] Assignees: Hitachi, Ltd.; Hitachi VLSI Engineering Corp., both of Tokyo, Japan

[21] Appl. No.: 657,194

[22] Filed: Jun. 3, 1996

Related U.S. Application Data

[60] Continuation of Ser. No. 230,021, Apr. 19, 1994, Pat. No. 5,557,147, which is a division of Ser. No. 954,142, Sep. 30, 1992, Pat. No. 5,331,191, which is a division of Ser. No. 496,330, Mar. 20, 1990, Pat. No. 5,202,275.

[30] Foreign Application Priority Data

Mar. 20, 1989 [JP] Japan .................. 1-065849

[51] Int. Cl.$^6$ .................. H01L 21/44; H01L 21/48
[52] U.S. Cl. .................. 257/763; 257/770; 257/775
[58] Field of Search .................. 257/763, 758, 257/770, 775

[56] References Cited

U.S. PATENT DOCUMENTS 4,962,060  10/1990  Sliwa et al. .................. 437/192

*Primary Examiner*—Donald Monin
*Attorney, Agent, or Firm*—Antonelli, Terry, Stout, & Kraus, LLP

[57] ABSTRACT

Herein disclosed is a semiconductor integrated circuit device fabricating process for forming MISFETs over the principal surface in those active regions of a substrate, which are surrounded by inactive regions formed of an element separating insulating film and channel stopper regions, comprising: the step of for forming a first mask by a non-oxidizable mask and an etching mask sequentially over the principal surface of the active regions of the substrate; the step of forming a second mask on and in self-alignment with the side walls of the first mask by a non-oxidizable mask thinner than the non-oxidizable mask of the first mask and an etching mask respectively; the step of etching the principal surface of the inactive regions of the substrate by using the first mask and the second mask; the step of forming the element separating insulating film over the principal surface of the inactive regions of the substrate by an oxidization using the first mask and the second mask; and the step of forming the channel stopper regions over the principal surface portions below the element separating insulating film of the substrate by introducing an impurity into all the surface portions including the active regions and the inactive regions of the substrate after the first mask and the second mask have been removed.

21 Claims, 70 Drawing Sheets

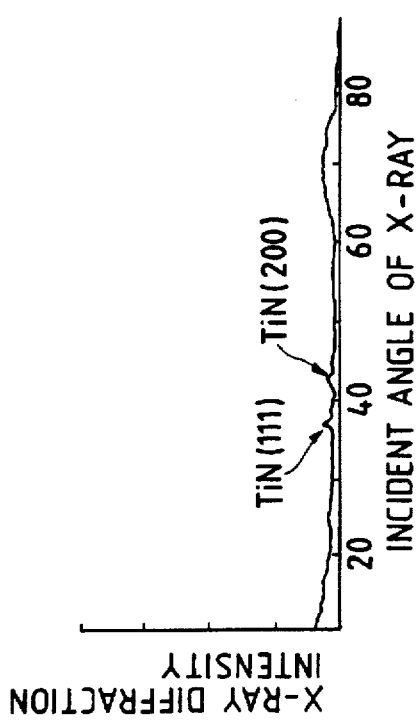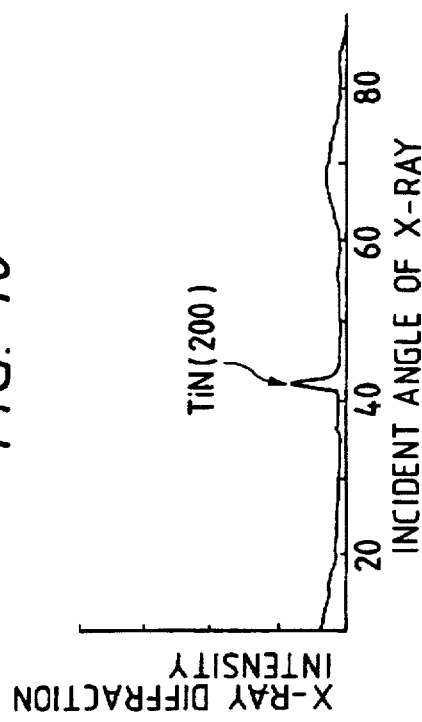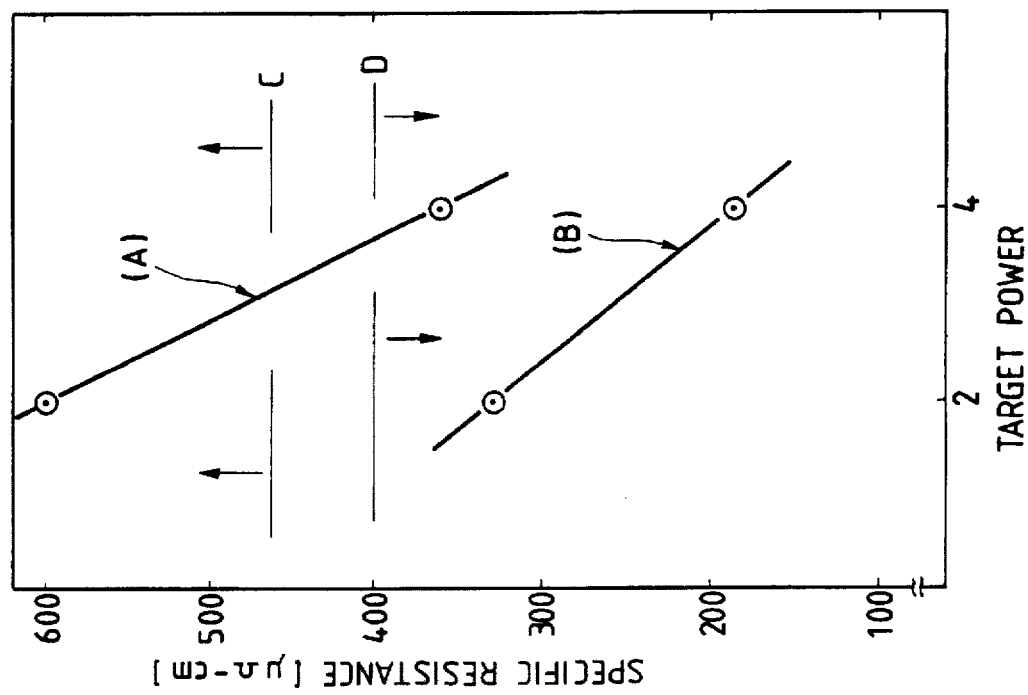

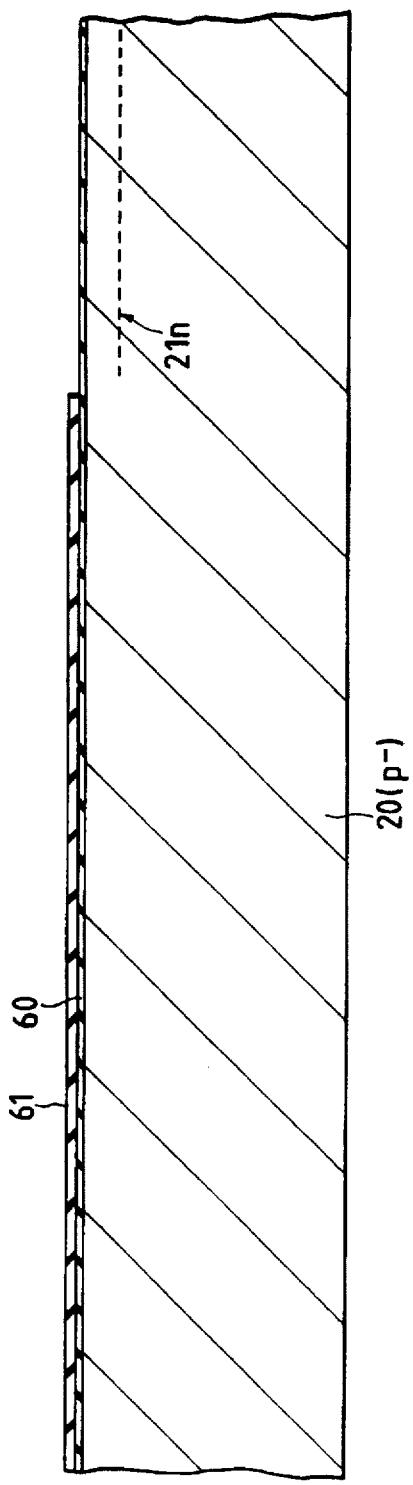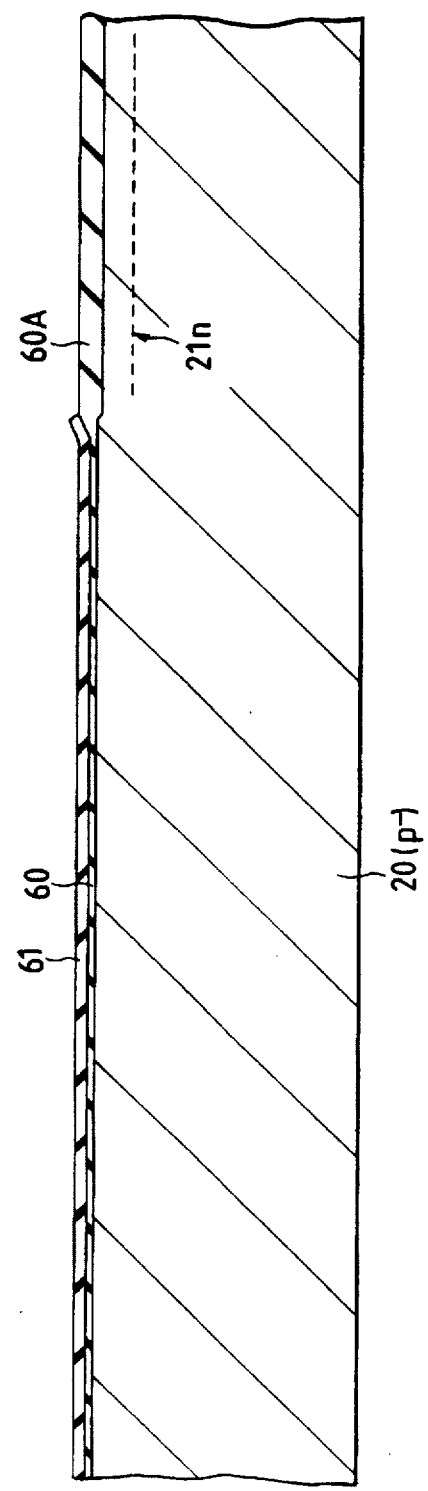

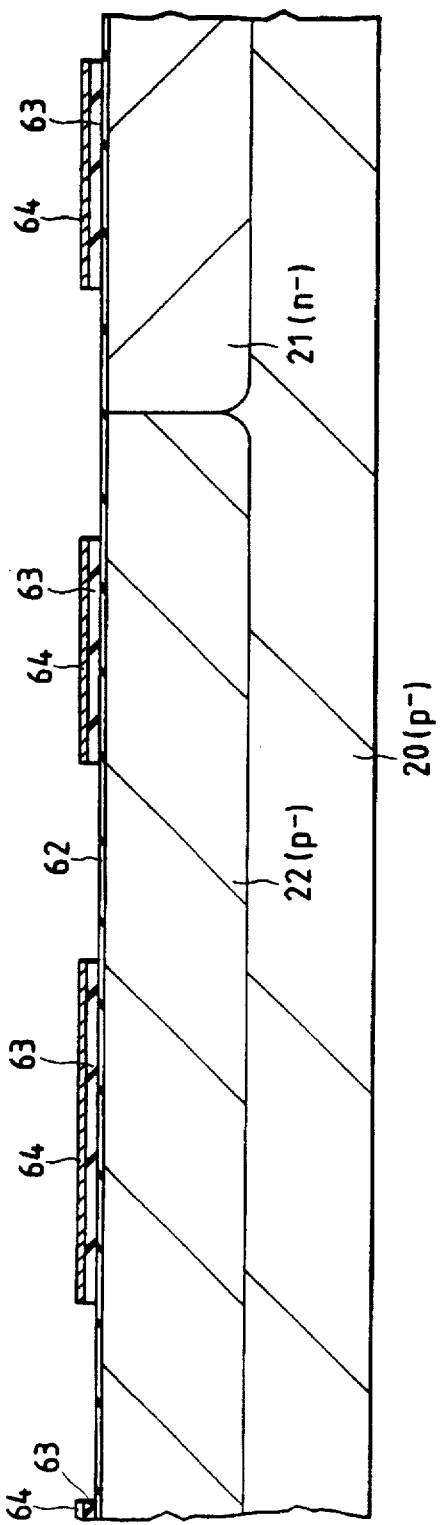
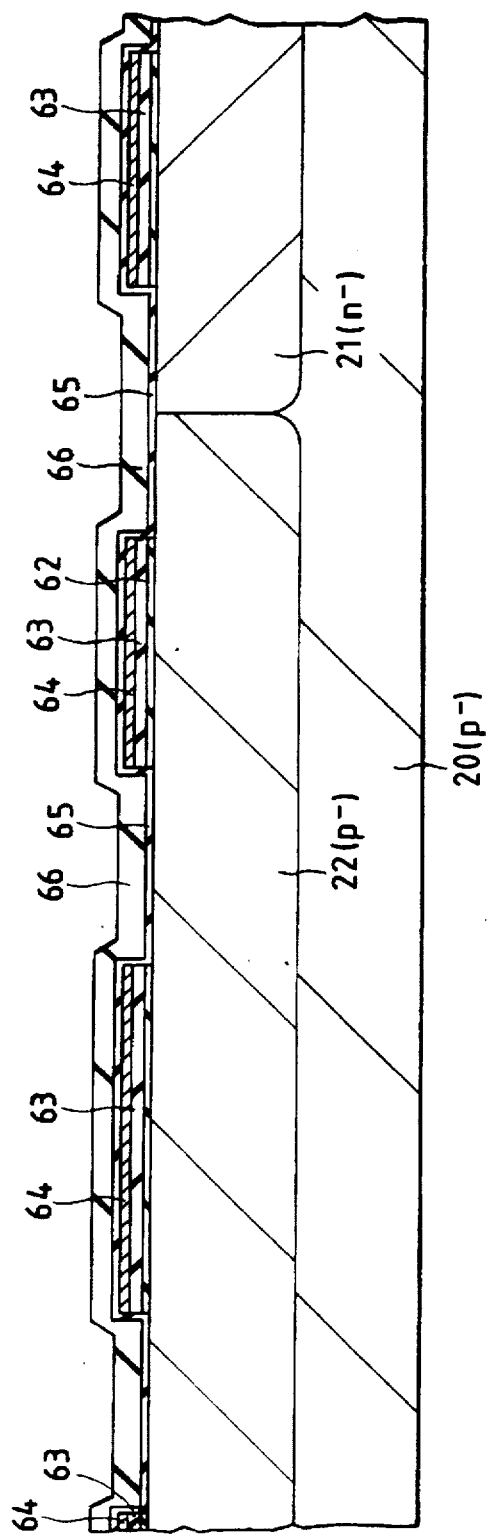

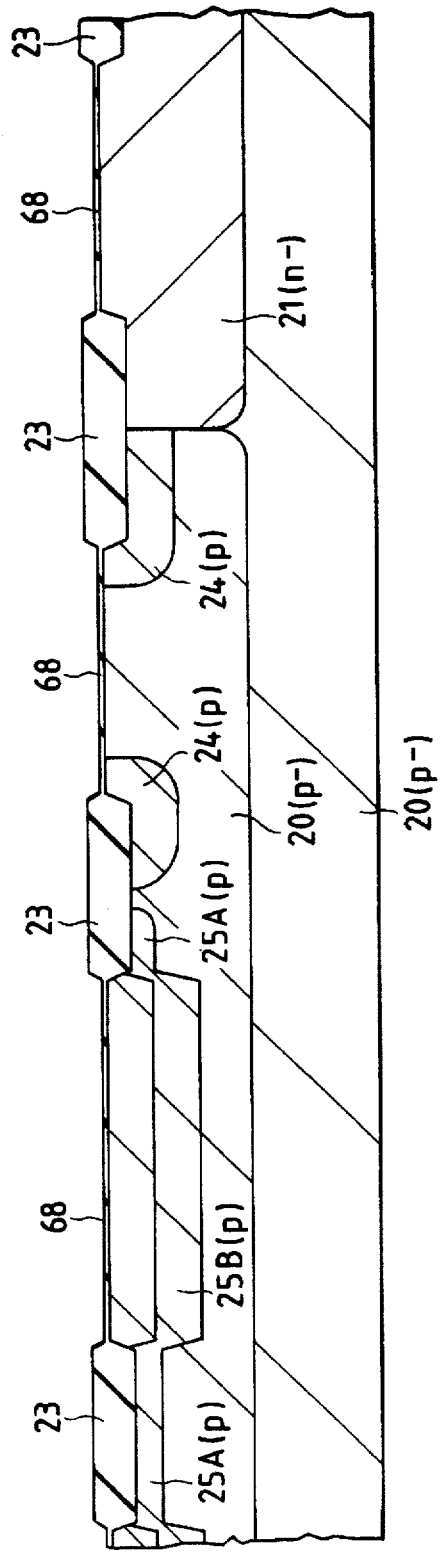
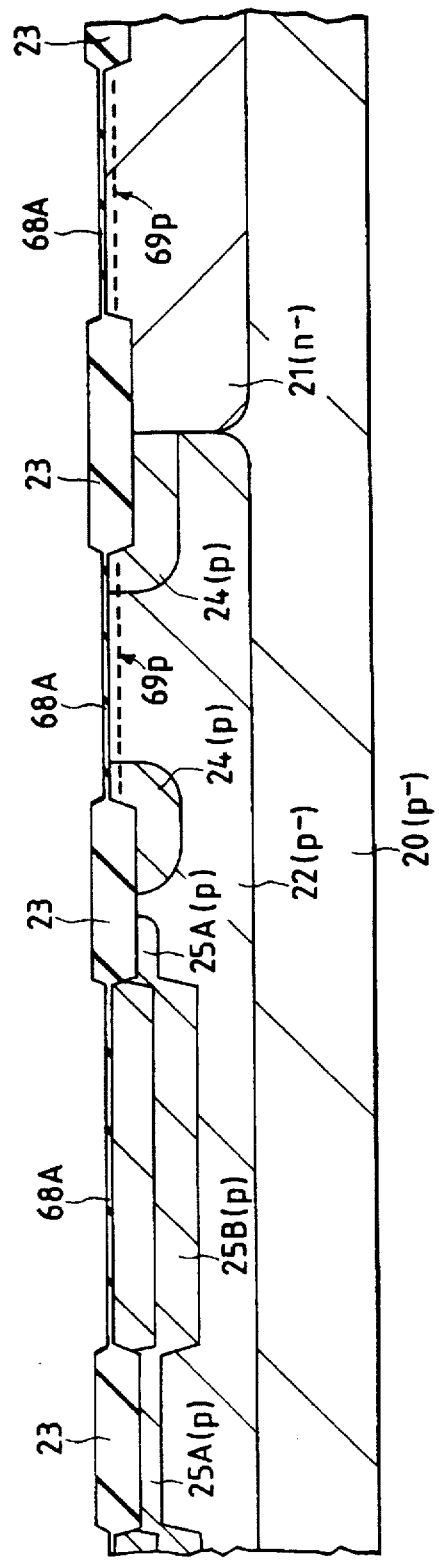

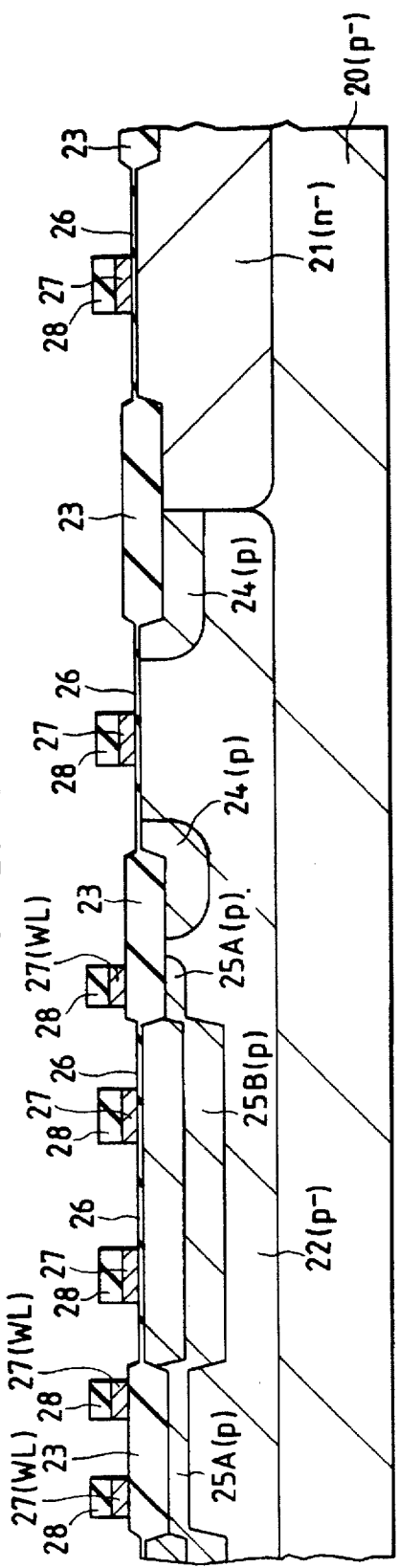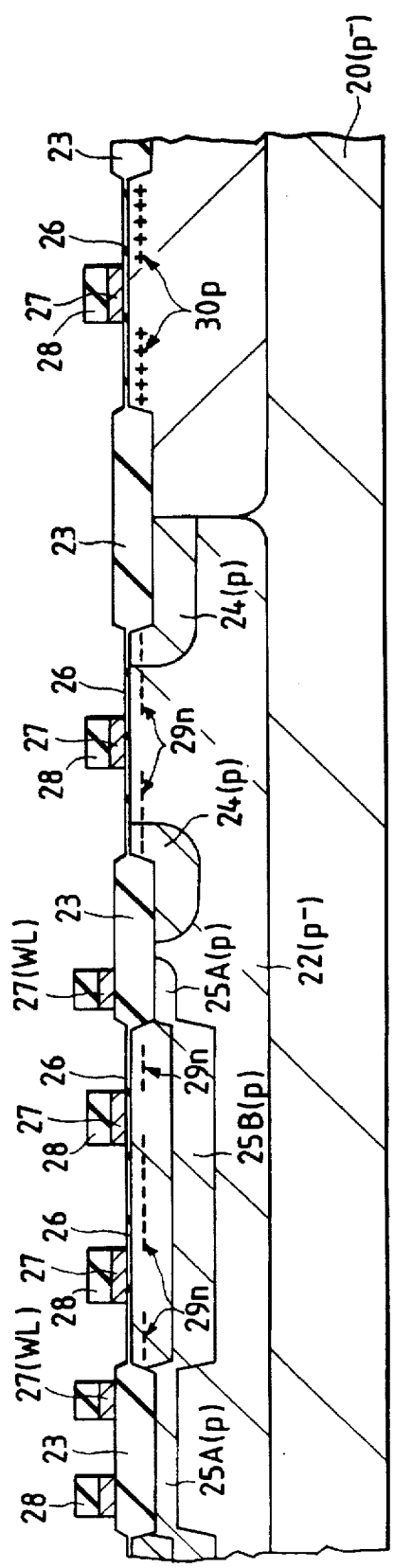

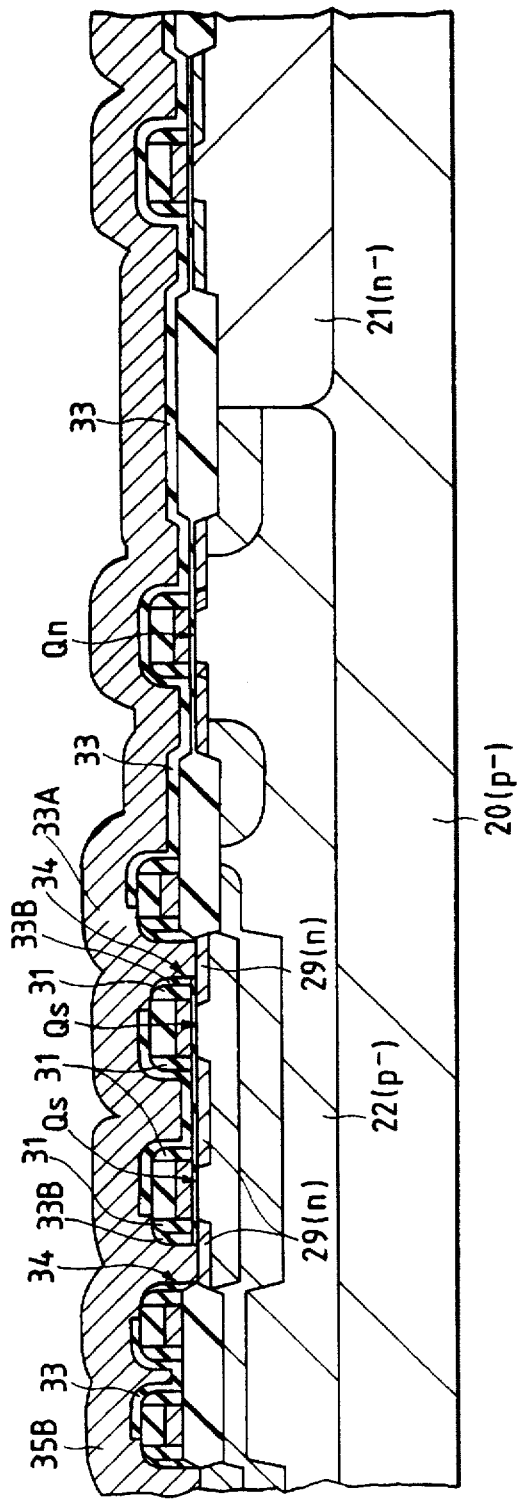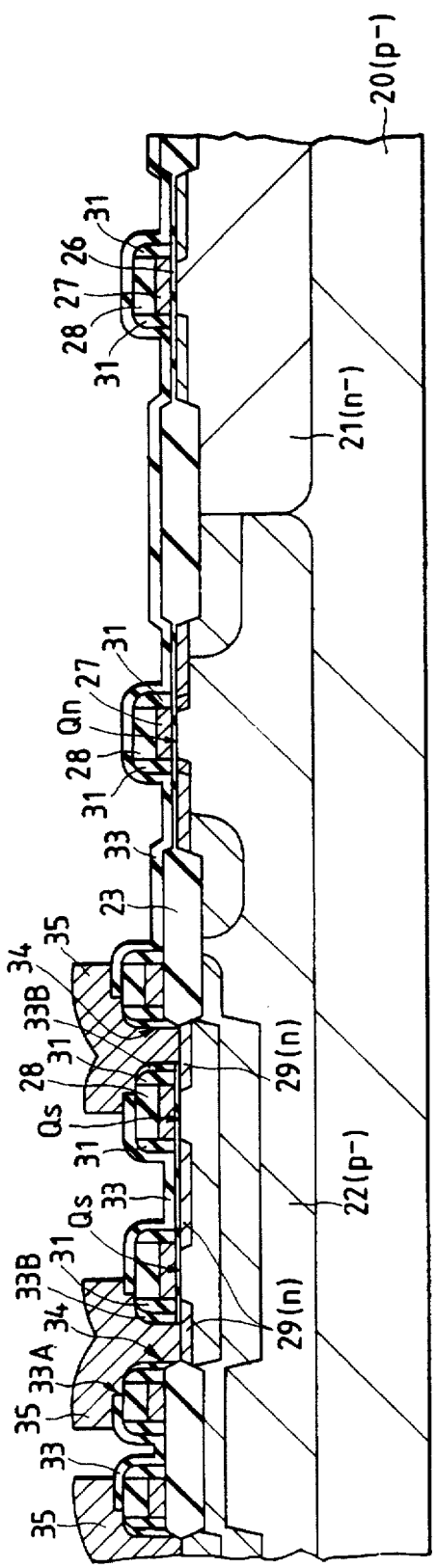

FIG. 55(A)
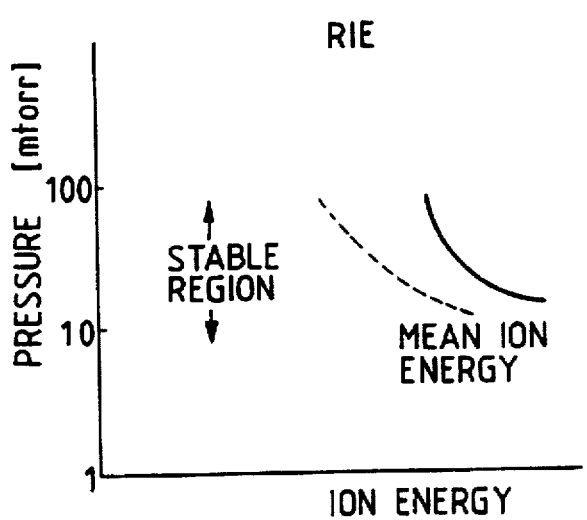
FIG. 55(B)
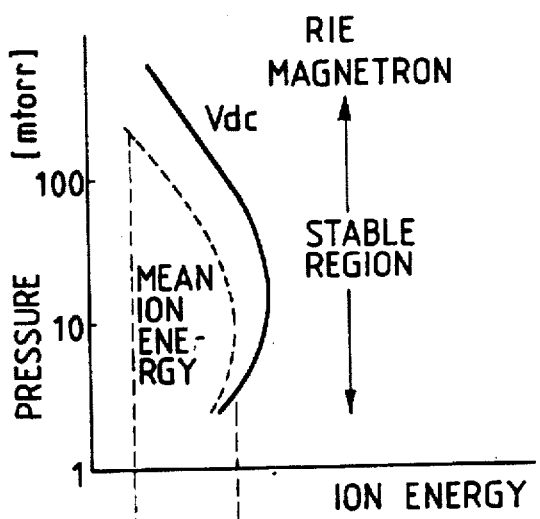
FIG. 55(C)
FIG. 55(D)
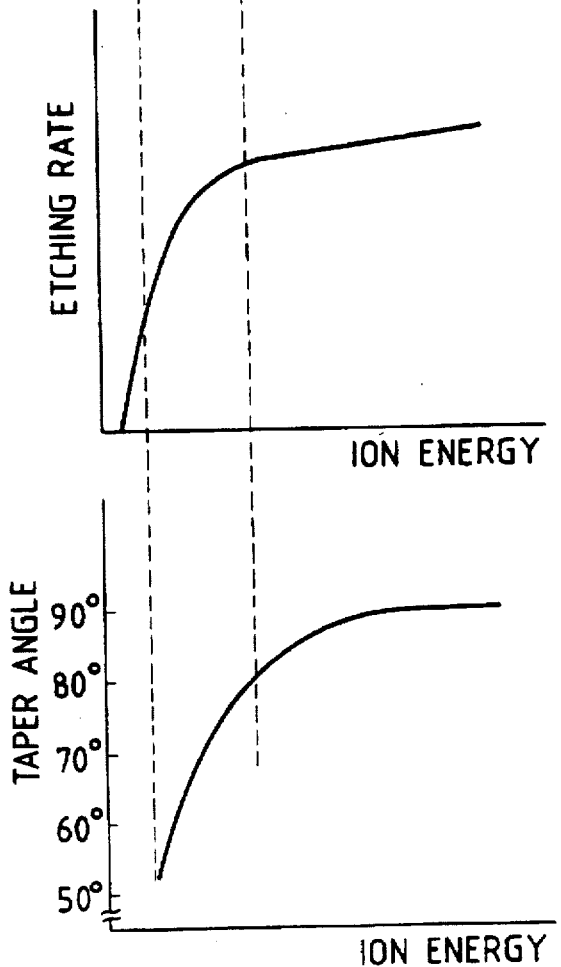

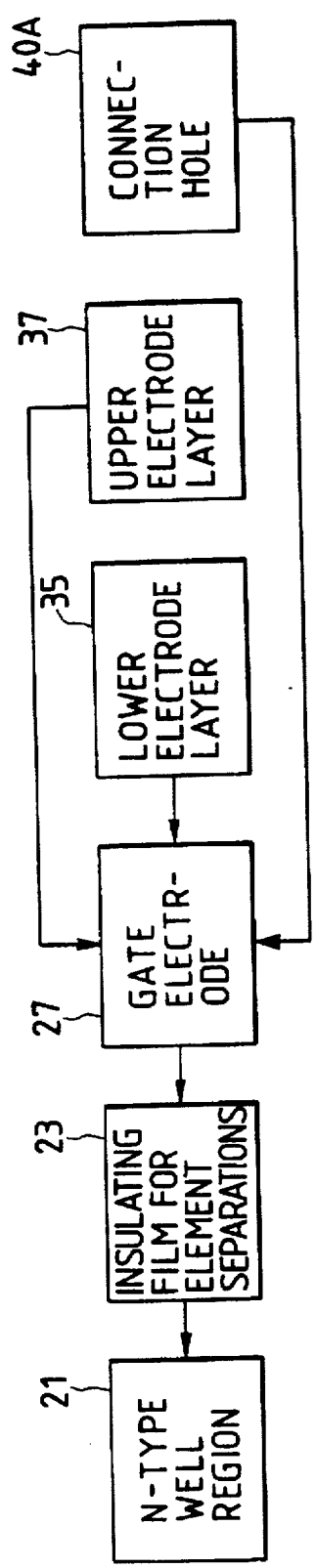
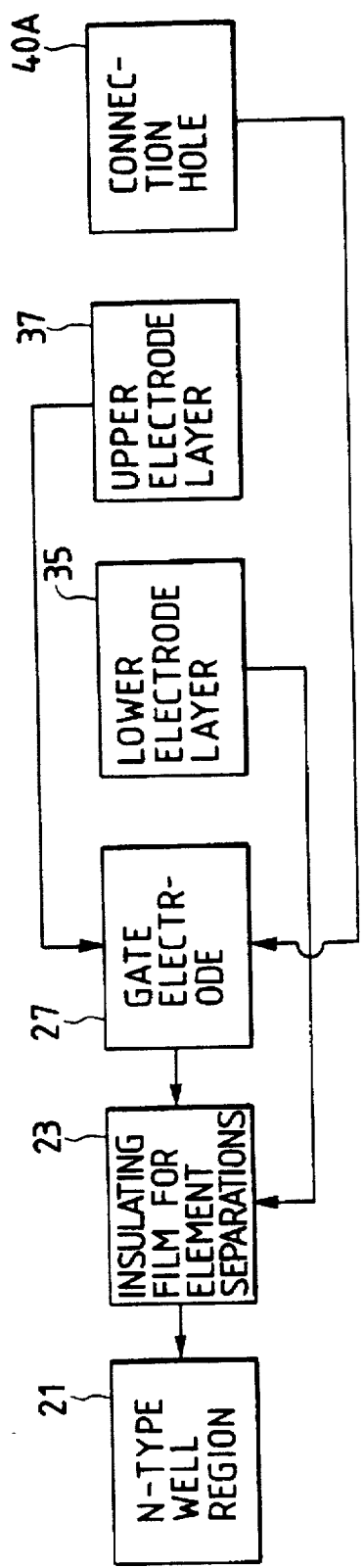
FIG. 89(A)
FIG. 89(B)

FIG. 99(B)

| | COMPARISONS OF INDIVIDUAL ALIGNMENT TYPES IN CASE PELLET PATTERN OF 1st LAYER IS ARRAYED WITH STRAIN OR ROTATION | | |
|---|---|---|---|
| | CHIP ALIGNMENT TYPE | MULTI-POINT WAFER ALIGNMENT TYPE | ASSOCIATED ALIGNMENT TYPE |
| NO ROTATIONAL CORRECTION | α, β, γ | α, β, γ | α, β, γ |
| ROTATIONAL CORRECTION | α, β, γ | α, β, γ | α, β, γ |

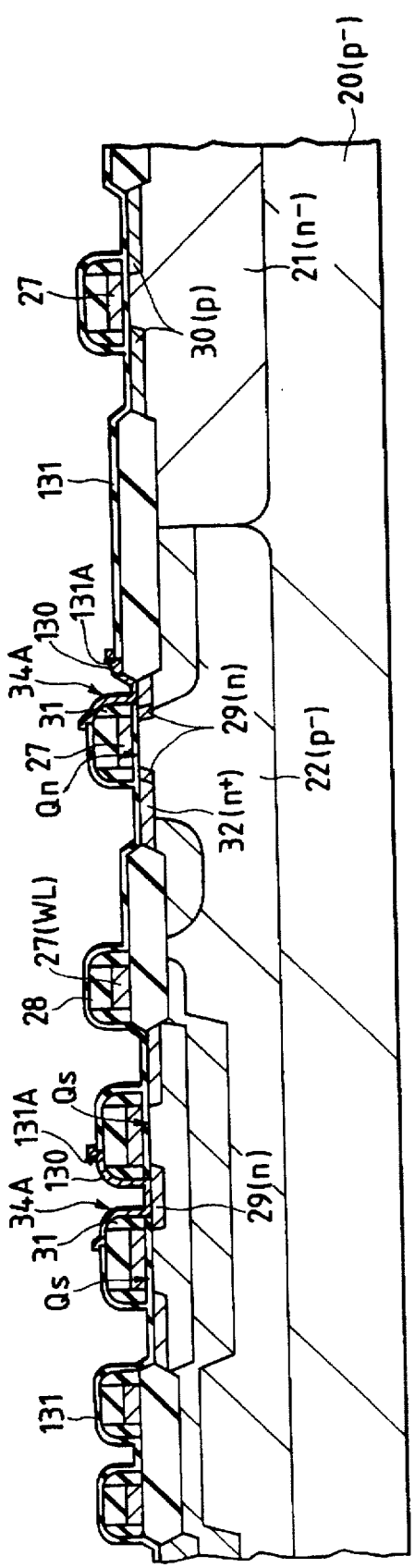
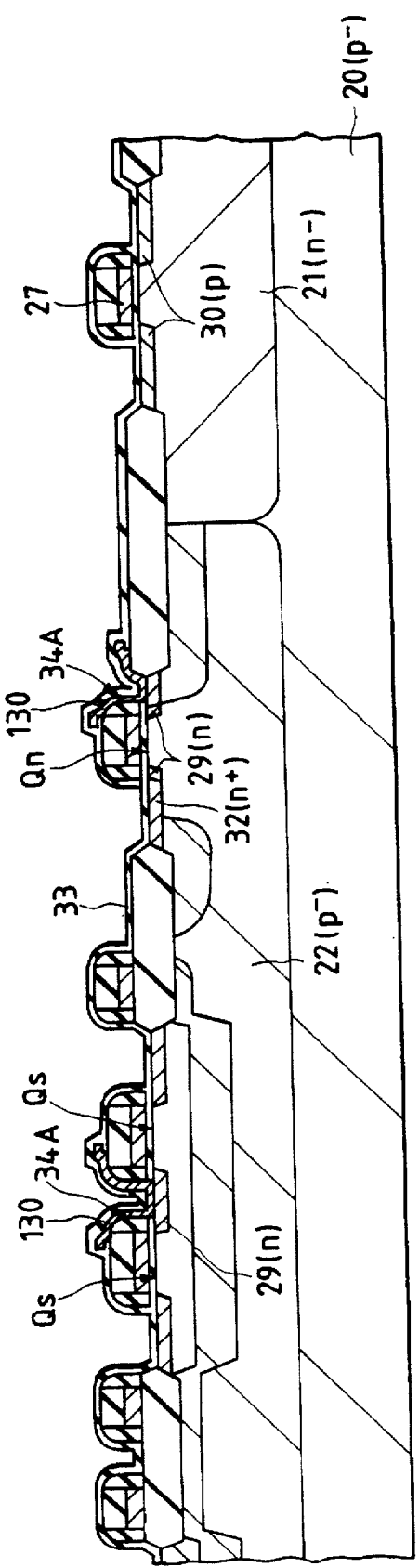

SEMICONDUCTOR INTEGRATED CIRCUIT DEVICE PROCESS FOR FABRICATING THE SAME AND APPARATUS FOR FABRICATING THE SAME

This application is a continuation of application Ser. No. 08/230,021, filed Apr. 19, 1994, now U.S. Pat. No. 5,557, 147; which is a Divisional of application Ser. No. 07/954, 142, filed Sep. 30, 1992, now U.S. Pat. No. 5,331,191; which is a Divisional of application Ser. No. 07/496,330, filed Mar. 20, 1990, now U.S. Pat. No. 5,202,275.

BACKGROUND OF THE INVENTION

The present invention relates to a semiconductor technology and, more particularly, to a technology which is effected when applied to a semiconductor integrated circuit device having a DRAM (i.e., Dynamic Random Access Memory) and to a technology for forming the former.

A memory cell of the DRAM for latching an information of 1 [bit] is constructed of a series circuit between a memory cell selecting MISFET and a information storing capacity element. The memory cell selecting MISFET of the aforementioned memory cell is formed over the principal surface of the active regions of a semiconductor substrate (or well regions). The active regions of the semiconductor substrate are formed within the region which are surrounded by an element separating insulating film (i.e., a field insulating film) formed in the inactive regions of the aforementioned semiconductor substrate and channel stopper regions. The aforementioned memory cell selecting MISFET has its gate electrodes connected with word lines extending in a row direction. One of the semiconductor regions of the memory cell selecting MISFET are connected with complementary data lines. The other semiconductor regions are connected with one of the electrode of the aforementioned information storing capacity element. This information storing capacity element has its other electrode supplied with a predetermined potential.

The DRAM of this kind has a tendency of being integrated to have a larger capacity and having its memory cells small-sized. In case the size of the memory cells is reduced, the size of the information storing capacity element is also reduced so that the amount of charge storage or information is dropped. This reduction in the charge storage will drop the α-ray soft error withstand voltage. Therefore, it is an important technical target of the DRAM having a capacity as large as 1 [Mbit] or more to improve the α-ray soft error withstand voltage.

On the basis of this technical target, there is a tendency that the stacked structure (i.e., STC structure) is adopted in the information storing capacity element of the memory cell of the DRAM. The information storing capacity element of this stacked structure is constructed by laminating a lower electrode layer, a dielectric film and an upper electrode layer sequentially. The lower electrode layer is partially connected with other semiconductor region of the memory cell selecting MISFET and has its other portion extended to over the gate electrodes. The upper electrode layer is formed over the aforementioned lower electrode layer through a dielectric film. This upper electrode layer is integrated with the upper electrode layer of the information storing capacity element of the stacked structure of another adjoining memory cell so that it may be used as a common plate electrode.

Incidentally, the DRAM acting as the information storing capacity element of the stacked structure and constructing the memory cell is disclosed in U.S. application Ser. No. 07/246,514 filed on Sep. 19, 1988, for example.

SUMMARY OF THE INVENTION

We have found the following problems during the development of a DRAM having a capacity as high as 16 [Mbits].

In the DRAM, the separations of the memory cells are accomplished at present at an element separating insulating film and channel stopper regions. The element separating insulating film is formed by oxidizing the principal surface of the inactive regions of the semiconductor substrate by using a non-oxidizable mask (of a silicon nitride film) formed over the principal surface of the active regions of the semiconductor substrate. On the other hand, the channel stopper regions are formed of an impurity such as B, which is introduced into the principal surface portions of the active regions (i.e., only the memory cell array) and the inactive regions of the semiconductor substrate. This impurity is introduced, after the element separating insulating film has been formed, by the ion implantation method using such a high energy as to transmit the element separating insulating film. More specifically, the impurity introduced into the principal surface portions of the inactive regions of the semiconductor substrate below the element separating insulating film is formed as the aforementioned channel stopper regions. Since the impurity thus introduced into the principal surface portions of the active regions of the semiconductor substrate is introduced into deeper regions than the impurity introduced into the principal surface portions of the inactive regions, it will not adversely affect the memory cells. The process of forming the channel stopper regions using the ion implantation method using that high energy is featured in that it can reduce the narrow channel effect of the memory cell selecting MISFET. Specifically, the aforementioned forming process can form the channel stopper regions in self-alignment with the element separating insulating film so that it can reduce the amount of diffusion of the impurity for forming the channel stopper regions to the active regions.

However, the DRAM being developed by us is intended to have a capacity as large as 16 [Mbits] so that it cannot retain the memory cell area and the memory cell separating area sufficiently. In other words, the aforementioned element separating insulating film has a large amount of oxidization (i.e., bird's beak) in a transverse direction so that the area of the element separating insulating film is augmented more than necessary. This augmentation of the area of the element separating insulating film in turn shrinks the memory area more than necessary. In case, therefore, the aforementioned element separating insulating film is thinned to reduce the amount of transverse oxidization, the shallow regions of the principal surface portions of the active regions of the semiconductor substrate are doped with an impurity for forming the channel stopper regions. The impurity thus introduced into the principal surface portions of the active regions of the semiconductor substrate enhances the impurity concentration of the surface so that it fluctuates the threshold voltage of the memory cell selecting MISFET of the memory cell. As a result, the memory cell area can neither be retained, not can be shrunk the separating area of the memory cells, thus raising a problem that the DRAM cannot be highly integrated.

The present invention has the following objects:
(1) to provide, a technology capable improving the degree of integration in a semiconductor integrated circuit device having a storing function;
(2) to provide a technology capable of improving the electric reliability in the aforementioned semiconductor integrated circuit device;
(3) to provide a technology capable of improving the soft error withstand voltage in the aforementioned semiconductor integrated circuit device;

(4) to provide a technology capable of reducing the number of fabrication steps in the aforementioned semiconductor integrated circuit device;

(5) to provide a technology capable of improving the treating accuracy for the fabrications in the aforementioned semiconductor integrated circuit device;

(6) to provide a technology capable of improving the drivability of the semiconductor elements in the aforementioned semiconductor integrated circuit device;

(7) to provide a technology capable of improving the fabrication yield in the aforementioned semiconductor integrated circuit device;

(8) to provide a technology capable of increasing the operating speed in the aforementioned semiconductor integrated circuit device;

(9) to provide a technology capable of preventing the defects such as the disconnections of wiring lines in the aforementioned semiconductor integrated circuit device;

(10) to provide a technology capable of improving a moisture resistance in the aforementioned semiconductor integrated circuit device;

(11) to provide a technology capable of simplifying the steps of forming redundancy fuse elements in the aforementioned semiconductor integrated circuit device;

(12) to provide a technology capable of improving the quality of films to be used in the aforementioned semiconductor integrated circuit device; and

(13) to provide an apparatus for fabricating the aforementioned item (12).

The aforementioned and other objects and novel features of the present invention will become apparent from the following description to be made with reference to the accompanying drawings.

Of the invention to be disclosed hereinafter, the reprensentatives will be briefly summarized in the following.

(1) There is provided a semiconductor integrated circuit device fabricating process for forming MISFETs over the principal surface in those active regions of a substrate, which are surrounded by inactive regions formed of an element separating insulating film and channel stopper regions, comprising: the step of for forming a first mask by a non-oxidizable mask and an etching mask sequentially over the principal surface of the active regions of said substrate; the step of forming a second mask on and in self-alignment with the side walls of said first mask by a non-oxidizable mask thinner than the non-oxidizable mask of said first mask and an etching mask respectively; the step of etching the principal surface of said inactive regions of said substrate by using said first mask and said second mask; the step of forming the element separating insulating film over the principal surface of the inactive regions of said substrate by an oxidization using said first mask and said second mask; and the step of forming the channel stopper regions over the principal surface portions below the element separating insulating film of said substrate by introducing an impurity into all the surface portions including the active regions and the inactive regions of said substrate after said first mask and said second mask have been removed.

(2) In the foregoing item (1), the step of forming said element separating insulating film is accomplished by a hot oxidization method within a range of 1.050° to 1.150°.

(3) There is provided a semiconductor integrated circuit device having a storing function, in which a first MISFET forming a memory cell and a second MISFET forming a peripheral circuit are formed over the principal surface of the active regions of a substrate in regions surrounded by an element separating insulating film and channel stopper regions, wherein the improvement resides: in that said inactive regions are doped with an impurity through said element separating insulating film to form a first channel stopper over the principal surface portions of the active regions of said substrate forming said first MISFET and the inactive regions surrounding said active regions; and in that the principal surface portions of the inactive regions of said substrate surrounding said active regions for forming the second MISFET are doped with an impurity to form second channel stopper regions of the same conduction type as that of said first channel stopper regions.

(4) In the foregoing item (3), said first MISFET and said second MISFET are formed over the principal surface portions of the well regions which are formed in the principal portions of said substrate and which have the same conduction type as the former but a higher impurity concentration than that of the former.

(5) There is provided a semiconductor integrated circuit device having a storing function and arranged with the individual elements of a memory cell and a peripheral circuit over the principal surface of the individual different active regions of a substrate, which are surrounded by channel stopper regions formed over the principal surface portions of inactive regions of said substrate, wherein the improvement resides: in that a first channel region enclosing said memory cell and a second channel stopper region of the same conduction type as that of said first channel stopper region are independently formed at different fabrication steps; in that the active regions such as the elements of said memory cell and said peripheral circuit or other elements are not arranged in the boundary regions of said first stopper region and said second stopper region. Said first channel stopper region and said second channel stopper region are superposed or isolated at their boundary.

(6) There is provided a semiconductor integrated circuit device including a first MISFET having the LDD structure to be used as an input/output step circuit and a second MISFET having the LDD structure and the same conduction type as that of said first MISFET to be used as an internal circuit, wherein the improvement resides: in that the used voltage of said first MISFET is made higher than that of said second MISFET, wherein the improvement resides: in that the used voltage of said first MISFET is made higher than that of said second MISFET; in that the gate length of said MISFET is made larger than that of said second MISFET; and in that the gate length of the lightly doped semiconductor regions forming the individual LDD structures of said first MISFET and said MISFET are made substantially equal.

(7) There is provided a process for fabricating a semiconductor integrated circuit device including a first MISFET having a high-voltage LDD structure to be used as an input/output step circuit and a second FET having a low-voltage LDD structure and the same conduction type channel as that of said first MISFET to be used as an internal circuit, comprising: the step of forming the gate insulating films and gate electrodes of said first MISFET and said second MISFET at a common step over the principal surface of the different active regions of a substrate; the step of forming lightly doped semiconductor regions having the LDD structure at a common step over the principal surface portions of the individual active regions of said substrate in self-alignment with the individual gate electrodes of said first MISFET and said second MISFET; the step of forming side wall spacers at a common step on the side walls of the individual gate electrodes of said first MISFET and said second MISFET; and the step of forming highly doped semiconductor regions on the principal surface portions of the individual active regions of said substrate in self-alignment with the individual side wall spacers of said first MISFET and said second MISFET.

(8) There is provided a semiconductor integrated circuit device including an n-channel MISFET having the LDD structure and a p-type MISFET having the LDD structure, wherein the gate length of side wall spacers, which are formed on and in self-alignment with the gate electrodes of said p-channel MISFET, is made larger than that of side wall spacers which are formed on and in self-alignment with the side walls of the gate electrodes of said n-channel MISFET.

(9) There is provided a process for fabricating a semiconductor integrated circuit device comprising a DRAM including: a memory cell constructed of a series circuit of a memory cell selecting MISFET and an information storing capacity element of the stacked structure; and a complementary MISFET having the LDD structure and constructing a peripheral circuit, comprising: the step of sequentially forming the individual gate insulating films and gate electrodes of the memory cell selecting MISFET of said memory cell and the n-channel MISFET and p-type MISFET of said peripheral circuit; the step of forming lightly doped semiconductor regions in self-alignment with said gate electrodes for forming the individual LDD structures of said memory Cell selecting MISFET, said n-channel MISFET and said p-channel MISFET; the step of forming a first side wall spacer on the side walls of the individual gate electrodes of said memory cell selecting MISFET, said n-type MISFET and said p-channel MISFET; the step of forming the highly doped semiconductor regions of said n-channel MISFET in self-alignment with said first side wall spacer; the step of forming an information storing capacity element of a stacked structure of said memory cell; the step of forming a second side wall spacer on the side walls of the gate electrodes of said p-channel MISFET through said first side wall spacer and in self-alignment with said gate electrodes; and the step of forming the highly doped semiconductor regions of said p-channel MISFET in self-alignment with said second side wall spacer.

(10) In the foregoing item (9), further comprised is the step of forming an interlayer insulating film after the step of forming the highly doped semiconductor regions of said n-type MISFET and before the step of forming the information storing capacity element having the stacked structure of said memory cell, and wherein said second side wall spacer is formed of said interlayer insulating film after said interlayer insulating film has been formed.

(11) There is provided a semiconductor integrated circuit device including a DRAM having a memory cell constructed of a series circuit between a memory cell selecting MISFET and a information storing capacity element having a stacked structure, wherein the improvement resides in that the lower electrode layer of said information storing capacity element of the stacked structure at the side to be connected with one of the semiconductor regions of said memory cell selecting MISFET is constructed of the composite film which is prepared by sequentially laminating a silicon film lightly doped with an impurity for reducing the resistance and a silicon film highly doped with said impurity.

(12) There is provided a process for fabricating a semiconductor integrated circuit device having a memory cell constructed of a series circuit between a memory cell selecting MISFET and a information storing capacity element having a stacked structure, comprising: the step of doping a first-layer silicon film with an impurity for reducing a resistance after said first-layer silicon film has been deposited all over the surface of a substrate including the surface of said memory cell selecting MISFET; the second step of doping a second-layer silicon film with an impurity for reducing the resistance after said second-layer silicon film has been deposited all over said first-layer silicon film; and the step of forming the lower electrode layer of said information storing capacity element having the stacked structure by subjecting said second-layer silicon film and said first-layer silicon film individually and sequentially to a predetermined patterning by an anisotropic etching.

(13) There is provided a process for fabricating semiconductor integrated circuit device including a DRAM having a memory cell constructed of a series circuit between a memory cell selecting MISFET having one of its semiconductor regions connected with data lines and a information storing capacity element having a stacked structure and prepared by laminating a lower electrode, a dielectric film and an upper electrode layer formed over said memory cell selecting MISFET sequentially, comprising: the step of forming said upper electrode layer by depositing a silicon film over the dielectric film of said memory cell by the CVD method and by patterning said silicon film in a predetermined manner by an anisotropic etching; and the step of forming a silicon oxide film by an oxidizing method over the surface of said upper electrode layer.

(14) There is provided a semiconductor integrated circuit device including a DRAM having a memory cell constructed of a series circuit between a memory cell selecting MISFET having one of its semiconductor regions connected with data lines and a information storing capacity element having a stacked structure and prepared by laminating a lower electrode, a dielectric film and an upper electrode layer formed over said memory cell selecting MISFET sequentially, wherein the improvement resides: in that the data lines, which are formed of a composite film by sequentially laminating a silicon film deposited by the CVD method and a transition-metal silicide film through an interlayer insulating film over the upper electrode layer of said information storing capacity element having said stacked structure, are constructed; and in that the thickness of the interlayer insulating film between said upper electrode layer and said data lines is made as large as or larger than one half of the gap interposing said upper electrode layer between the lower electrode layer of the information storing capacity element of the stacked structure of said memory cell and the lower electrode layer of said information storing capacity element of said stacked structure of another memory cell adjoining the former with the minimum gap.

(15) There is provided a semiconductor integrated circuit device having a storing function and including: complementary data lines, word lines and column select signals lines over a memory cell array; and two-layered wiring layers in the regions of a peripheral circuit of said memory cell array, wherein the improvement resides: in that the complementary data lines over said memory cell array are formed of a composite film prepared by sequentially laminating a silicon film and a transition-metal silicide film deposited by the CVD method; in that said column select signal lines are formed of a transition-metal film deposited by the sputtering method over said complementary data lines; in that said word lines are formed of an aluminum film or its alloy film deposited by the sputtering method over said column select signal lines; in that the same conducting layer as said word lines and the same conducting layer as the column select signals underlying the former are connected through a transition metal film buried by the selective CVD method in the connecting holes formed in the interlayer insulating film inbetween; in that the lower wiring lines of the two wiring lines of the regions of said peripheral circuit are formed of the same conducting layer as said column select signal lines whereas the upper wiring lines of said two wiring layers are formed of the same conducting layer as said word lines; and in that the upper and lower wiring lines of said two wiring layers are individually connected through a transition metal film buried in said connecting holes by the selective CVD method.

(16) There is provided a semiconductor integrated circuit device including: a transition-metal film buried by the selective CVD method in connecting holes formed in an underlying interlayer insulating film; and a Si-added aluminum alloy wiring lines extending over said interlayer insulating film and connected with said transition-metal film, wherein the improvement resides in that a transition-metal silicide film or a transition-metal nitride film is formed between said aluminum alloy wiring lines and said underlying interlayer insulating film including the gaps between said transition-metal film buried in said connecting hole sand said aluminum alloy wiring lines.

(17) There is provided a semiconductor integrated circuit device including: a transition-metal film buried by the selective CVD method in connecting holes formed in an underlying interlayer insulating film; and Cu-added aluminum alloy wiring lines connected with said transition-metal film and extending over said interlayer insulating film, wherein the improvement resides in that a transition-metal nitride film acting as a barrier is formed between the transition-metal film buried in said connecting holes and said aluminum-alloy wiring lines.

(18) In the foregoing items (16) and (17), a TiN film having a crystal orientation (200) is interposed between said transition-metal film buried in said connecting holes and said aluminum-alloy wiring lines.

(19) There is provided a semiconductor integrated circuit device having a passivation film formed over a wiring layer formed of an aluminum film or its alloy film, wherein the improvement resides: in that said passivation film is formed of a composite film prepared by sequentially laminating a silicon oxide film deposited by the conformal plasma CVD method using tetra-ethoxysilane gases as its source gases and a silicon nitride film deposited by the plasma CVD method; and in that the lower silicon oxide film of said passivation film is formed to have a thickness as large as or more than one half of the wiring gap of the regions in which the aspect ratio of said wiring gap and the thickness of said wiring lines is 1 or more.

(20) There is provided a process for fabricating a semiconductor integrated circuit device having complementary MISFETs, comprising: the step of forming a first conductor region of a second conduction type having an impurity concentration for setting the threshold voltage of a first MISFET of a first conduction type channel and electrically separated from another region and a second semiconductor region of the first conduction type having an impurity concentration for setting the threshold voltage of a second MISFET of the second conduction type channel individually in the principal surface portions of the different regions of a semiconductor substrate; and the step of setting the threshold voltage of a third MISFET of the first conduction type channel different from the threshold voltage of said first MISFET by doping the principal surface portions of the regions of said first semiconductor regions different from said first MISFET with a threshold voltage adjusting impurity, and setting the threshold voltage of a fourth MISFET of a second conduction type channel different from the threshold voltage of said second MISFET by doping the principal surface portions of said second semiconductor regions different from said second MISFET with a threshold voltage adjusting impurity.

(21) In the foregoing item (20), said first semiconductor region and said second semiconductor region are well regions which are individually formed in self-alignment with the principal surface portions of said semiconductor substrate.

(22) There is provided a process for fabricating a semiconductor integrated circuit device, in which first and second MISFETs for generating a reference voltage and another third MISFET are individually formed to have a common conduction type channel, comprising: the step of forming a substrate or a well region with an impurity concentration for setting the threshold voltage of said first MISFET for generating said reference voltage; the step of setting the threshold voltage of said second MISFET for generating said reference voltage or the threshold voltage of said third MISFET by doping the regions of said substrate or said well regions different from said first MISFET with a threshold voltage adjusting impurity; and the step of setting the threshold voltage of said third MISFET or the threshold voltage of said second MISFET for generating said reference voltage by doping with the regions of said substrate or said well regions different from said first MISFET, said second MISFET or said third MISFET with a threshold voltage adjusting impurity.

(23) There is provided a semiconductor integrated circuit device including a DRAM arranged with memory cells formed of a series circuit between a memory cell selecting MISFET at the intersection between complementary data lines and word lines and a information storing capacity element having a stacked structure, and a laser cutting redundancy fuse element for relieving the defective ones of said complementary data lines or said word lines, wherein the improvement resides: in that said complementary data lines are formed of a composite film prepared by sequentially laminating a silicon film deposited by the CVD method and a transition-metal silicide film; and in that said laser cutting redundancy fuse elements are formed of a conducting layer shared with said complementary data lines.

(24) There is provided a process for depositing a conducting film or an insulating film over the surface of a semiconductor Wafer or the surface of a silicon film deposited on the surface of said semiconductor wafer, comprising: the step of exposing the surface of said semiconductor wafer or the surface of said silicon film to the outside by cleaning the surface of said semiconductor wafer or the surface of said silicon film in a vacuum system; and the step of depositing said conducting film or said insulating film on the surface of said semiconductor wafer or the surface of said silicon film in the vacuum system shared with said cleaning step.

(25) There is provided a film depositing process for depositing an insulating film either on the surface of a semiconductor wafer or the surface of a silicon film deposited on the surface of said semiconductor wafer, comprising: the step of exposing the surface of said semiconductor wafer or the surface of said silicon film by cleaning the surface of said semiconductor wafer or the surface of said silicon film in a vacuum system by the anisotropic etching using a halogen compound; the step of irradiating the exposed surface of said semiconductor wafer or the exposed surface of said silicon film with an ultraviolet ray in the vacuum system shared with said cleaning step; and the step of depositing said insulating film on the surface of said semiconductor wafer or the surface of said silicon film in the vacuum system shared with said cleaning step.

(26) There is provided a film depositing process for depositing a silicon film on an underlying surface having a stepped shape, comprising: the step of alternately depositing a plurality of layers of a silicon film containing an impurity for reducing the resistance and a silicon film containing none of said impurity over said underlying surface; and the step of diffusing said impurity from said silicon film containing said impurity to said silicon film containing none of said impurity by subjecting the laminated silicon films to a heat treatment.

(27) There is provided a film depositing process for depositing a silicon film on an underlying surface having a stepped shape, wherein the improvement resides: in that a silicon film containing no impurity as a result of thermal decompositions is deposited by feeding silane gases at a constant flow rate in a vacuum system for depositing said silicon film; and in that said deposited silicon film is periodically doped with phosphor by feeding phosphine gases by increasing or decreasing the flow rate periodically in said vacuum system.

(28) There is provided an alignment process for aligning different three-layer patterns in an X direction and in a Y direction, wherein the improvement resides: in that the second-layer pattern is aligned in the X direction and in the Y direction with respect to the first-layer pattern underlying the former; and in that the third-layer pattern formed over said second-layer pattern is aligned in the X direction and in the Y direction with respect to the second-layer pattern underlying the former and in the Y direction and in the X direction with respect to the first-layer pattern underlying the former.

(29) There is provided a semiconductor integrated circuit device in which an interlayer insulating film is formed over an underlying surface having a stepped shape, in which first connecting holes are formed in the upper regions of the stepped shape of said underlying surface of said interlayer insulating film whereas second connecting holes are formed in the lower regions of said stepped shape, and in which wiring lines are so extended over said interlayer insulating film that they may be connected with conducting films individually buried in said first connecting holes and said second connecting holes, wherein the improvement resides: in that the conducting films individually buried in said first connecting holes and said second connecting holes are formed of a transition-metal film which is made of a common conducting layer deposited by the selective CVD method; and in that said transition-metal film is deposited to have a thickness as large as the depth of said shallow first connecting holes.

(30) There is provided a semiconductor integrated circuit device having its wiring lines formed of a transition-metal film deposited over an underlying insulating film by the CVD method, wherein the improvement resides in that a transition-metal film of substantially the same kind as that of said wiring lines deposited by the sputtering method is formed between said underlying insulating film and said wiring lines.

(31) There is provided a semiconductor integrated circuit device having a DRAM arranged at the intersections between complementary data lines and word lines with memory cells each constructed of a series circuit between a memory cell selecting MISFET and a information storing capacity element having a stacked structure, in which a lower electrode layer, a dielectric film and an upper electrode layer are sequentially laminated, wherein the improvement resides in that an intermediate conducting film having its portion formed in self-alignment with one of the semiconductor regions of said memory cell selecting MISFET and its other portion led out over the gate electrodes of said memory cell selecting MISFET and formed below and separately of the lower electrode layer of said information storing capacity element of said stacked structure is formed between said complementary data lines and said one semiconductor region.

(32) In the foregoing item (31), said intermediate conducting film is formed to have a smaller thickness than that of the lower electrode layer of said information storing capacity element of said stacked structure.

(33) In the DRAM of the foregoing item (31), an intermediate conducting film formed of the conducting layer shared with the intermediate conducting film formed in said memory cells is interposed between the semiconductor regions of the MISFETs constructing the peripheral circuit of said DRAM and the wiring lines connected with the former.

According to the aforementioned means (1), the non-oxidizable mask of the aforementioned second mask can be thinned to reduce the amount of transverse oxidization of the element separating insulating film so that the element separating insulating film can be small-sized and thickened to increase the isolation size of the MISFETs in the depthwise direction of the substrate thereby to enhance the separatability of the MISFETs. The element separating insulating film can be thickened. Thus, when an impurity for forming the aforementioned channel stopper regions is to be introduced, the impurity to be introduced into the principal surface portions of the active regions of the substrate can be introduced deep into the substrate to reduce the fluctuations of the threshold voltage of the MISFETs as a result of the introduction of the aforementioned impurity.

According to the aforementioned second means (2), when the element separating insulating film is to be formed, the fluidicity of the silicon oxide film as a result of the hot oxidization method can be promoted to reduce the stress which is established between the element separating insulating film and the principal surface of the inactive regions of the substrate. As a result, it is possible to reduce the occurrences of the crystal defects at the corners of the grooves which are formed in the principal surface of the inactive regions of the substrate.

According to the aforementioned means (3), the threshold voltage of the parasitic MOSes can be raised at the aforementioned first channel stopper regions to retain the separating ability between the memory cells and the first MISFET and surrounding elements forming the former. At the same time, the aforementioned first channel stopper regions are formed in self-alignment with the aforementioned element separating insulating film, and the impurity for forming the first channel stopper regions can be made to have a small amount of diffusion to the active regions thereby to reduce the narrow channel effect of the aforementioned first MISFET. Since the impurity for forming the aforementioned second channel stopper regions is introduced only into the inactive regions but not the active regions for forming the aforementioned second MISFET, the influences of the substrate effect can be reduced to reduce the fluctuations of the threshold voltage. Since the second MISFET is formed to have a larger size than the first MISFET, it has a relative small amount of diffusion of the active regions for forming the second channel stopper regions to the active regions so that it raises substantially no narrow channel effect. Since, moreover, the second MISFET does not have its active regions doped with the impurity for forming the second channel stopper regions to reduce the impurity concentration in the surface of the aforementioned active regions, the threshold voltage can be reduced to augment the drivability. especially in case the second MISFET is sued as an output step circuit, the output signal level can be sufficiently retained.

According to the aforementioned means (4), the aforementioned well regions raise the impurity concentrations in the channel forming regions of the first and second MISFETs so that they can reduce the short channel effect. Since the difference between the impurity concentrations of the well regions and the aforementioned substrate, it is possible to improve the α-ray soft error withstand voltage especially of the memory cells. In case, moreover, the second MISFETs construct the column address decoder circuit or the sense amplifier circuit, they can likewise improve the α-ray soft error withstand voltage.

According to the aforementioned means (5), in case the aforementioned first channel stopper regions and second channel stopper regions are individually superposed at the aforementioned boundary regions, their impurity concentrations are increased. Since, however, the active regions are not arranged in the boundary regions, the junction withstand voltage between the substrate and the elements can be improved. In case, on the other hand, the first channel stopper regions and the second channel stopper regions are individually isolated at the aforementioned boundary regions, these boundary regions become liable to be formed with a large inversion layer corresponding to their area. If the active regions are present in the boundary regions, the area of the elements to be formed in the active regions is apparently increased by the addition of the aforementioned inversion layer so that the flow rate of the leakage current is augmented at the junction portions between the substrate and the elements. Since, however, the active regions are not arranged in the boundary regions, the flow rate of the leakage current can be reduced at the junction portions.

According to the aforementioned means (6), the aforementioned first MISFET has its hot carrier withstand voltage improved by enlarging its gate length so that the aging of the threshold voltage can be reduced to improve the electric characteristics. At the same time, the aforementioned second MISFET is enabled to reduce the power consumption by using a low voltage while retaining the hot carrier withstand voltage by using the low voltage. Since, moreover, the MISFET has its gate length enlarged and since the second MISFET is enabled to improve the hot carrier withstand voltage by using the low voltage, the gate length of the lightly doped semiconductor regions forming the aforementioned LDD structure can be independently controlled to substantially equalize the gate lengths of the individual lightly-doped semiconductor regions of the first MISFET and the second MISFET.

According to the aforementioned means (7), all the steps of forming the aforementioned first MISFET and second MISFET can be shared to form the individual side wall spacers at the common fabrication step so that the number of fabrication steps of the semiconductor integrated circuit device can be reduced.

According to the aforementioned means (8), the gate length of the side wall spacers of the aforementioned n-channel MISFET together with the gate length of the lightly doped semiconductor substrate forming the LDD structure so that the transmittance conductance of the n-channel MISFET can be improved to increase the operating speed. At the same time, the gate length of the side wall spacers of the p-channel MISFET can be enlarged to reduce the run-around of the highly doped semiconductor regions forming the source regions and the drain regions to the channel forming regions. As a result, the short channel effect of the p-channel MISFET can be reduced to increase the degree of integration.

According to the aforementioned means (9), the aforementioned n-channel MISFET specifies the gate length of the lightly doped semiconductor regions forming the LDD structure with the single-layered first side wall spacers so that the gate length of the lightly semiconductor regions can be reduced. The p-channel MISFET regulates the run-around of the highly doped semiconductor regions to the channel forming regions with the multi-layered first and second side wall spacers. After the heat treatment for forming the information storing capacity element of the stacked structure of the aforementioned memory cells, the highly doped semiconductor regions are formed so that the run-around of the highly doped semiconductor regions to the channel forming regions can be further reduced.

According to the aforementioned means (10), the step of forming the aforementioned second side wall spacers can be shared with the step of forming the aforementioned interlayer insulating film so that the number of steps of fabricating the semiconductor integrated circuit device can be accordingly reduced.

According to the aforementioned means (11), the lower electrode layer of the information storing capacity element of the stacked structure of the aforementioned memory cells is so thickened that the area of the side walls of the lower electrode layer can be vertically increased. As a result, the amount of charge storage can be increased to shrink the area of the memory cells thereby to improve the degree of integration. Since the impurity concentration in the surface of the upper silicon film of the aforementioned lower electrode layer is high, the amount of charge storage can be increased to improve the degree of integration likewise. Since, moreover, the impurity concentration of the silicon film of the lower electrode layer can be dropped to reduce the amount of diffusion of the impurity to one of the semiconductor regions of the memory cell selecting MISFET, the short channel effect of the memory cell selecting MISFET can be dropped to shrink the area of the memory cells thereby to improve the degree of integration better.

According to the aforementioned means (12), even the lower electrode layer of the information storing capacity element having the aforementioned stacked structure is thickened, the amount of the impurity introduced thereinto is retained to some extent and uniformed so that the anisotropy of the anisotropic etching can be enhanced while increasing the etching rate. This improvement in the anisotropy of the anisotropic etching can shrink the size of the lower electrode layer to shrink the memory cell area thereby to improve the degree of integration.

According to the aforementioned means (13), the residual of the aforementioned silicon film left unetched in the stepped portion of the underlying surface after the patterning of the silicon film can be oxidized by the subsequent oxidization step so that the aforementioned upper electrode layer and data lines can be prevented from being shorted to improve the fabrication yield. Especially if the lower electrode layer of the information storing capacity element of the stacked structure is thickened to improve the amount of charge storage, the stepped shape of the underlying surface of the upper electrode layer can be enlarged to make the aforementioned process effective.

According to the aforementioned means (14), the upper transition-metal silicide film of the aforementioned data lines is liable to experience the mutual diffusions of the impurity. As a result, the flattening of the underlying surface of the data lines cannot be promoted, but the thickness of the aforementioned interlayer insulating film can be controlled on the basis of the size of the gap between the lower electrode layers adjoining with the aforementioned minimum gap to flatten the surface of the interlayer insulating films by burying the gap between the lower electrode layers with the interlayer insulating film. As a result, the data lines can be prevented from being shorted due to the etching residual left at the stepped portion of the interlayer insulating film between the lower electrode layers, when the data lines are to be treated, to improve the electric reliability.

According to the aforementioned means (15), the complementary data lines on the aforementioned memory cell array can be excellent in the heat resistance and the non-oxidizability and can have a high step coverage age of the underlying silicon film deposited by the CVD method to reduce the defects such as the disconnections. The aforementioned column select signal lines are formed over the complementary data lines so that they can be extended substantially straight without avoiding the connected portions between the complementary data lines and the memory cells. As a result, the signal transmission speed can be increased to speed up the information writing operations and the information reading operations. Since the column select signal lines are formed of a layer different from that of the complementary data lines, the wiring gap between the lower complementary data lines can be shrunk to improve the degree of integration. Since the aforementioned word lines (i.e., the shunting word lines) are made to have a lower resistance than that of the lower complementary data lines of the column select signal lines, their resistance can be reduced to increase the individual speeds of the information writing operation and the information reading operation. The transition-metal films for connecting the same conducting layer as the column select signal lines and the same conducting layer as the word lines can compensate the step coverage at the connected portions of the same conducting layer as the upper word lines to reduce the defects such as the disconnections of that conducting layer. At the same time, the stress with the underlying transition-metal film can be reduced by making the underlying conducting layer of the transition-metal film of the same kind. The lower wiring lines of the regions of the aforementioned peripheral circuit, i.e., the direct peripheral circuit (e.g., the sense amplifier circuit or the decoder circuit) of the aforementioned memory cell array can have a high migration withstand voltage, because it is made of a transition-metal film, to shrink the wiring gap thereby to improve the degree of integration.

According to the aforementioned means (16), the underlying layer of the aforementioned aluminum alloy wiring lines is uniformed over the transition-metal film buried in the aforementioned connecting hole and the interlayer insulating film so that the deposition of the Si added to the aluminum alloy wiring lines, which might otherwise come into the boundary between the transition-metal film buried in the connecting holes and the aluminum alloy wiring lines, can be reduced to reduce the resistance of the aforementioned boundary. Moreover, the transition-metal silicide film formed below the aforementioned aluminum alloy wiring lines can connect the aluminum alloy wiring lines through the cut portions, if made by the migration phenomenon at the aluminum alloy wiring lines, to reduce the defects such as the disconnections of the wiring lines.

According to the aforementioned means (17), the alloying reaction due to the mutual diffusions of the transition metal and the aluminum can be prevented at the boundary between the transition-metal film buried in the aforementioned connecting holes and the aluminum alloy wiring lines to reduce the resistance of the boundary.

According to the aforementioned means (18), the TiN film having the aforementioned crystal orientation (200) can have a smaller Si deposition than that of the TiN film Having a mixed crystal orientation between (111) and (299) to reduce the resistance of the aforementioned boundary. Since, moreover, the TiN film having the crystal orientation (200) has a lower specific resistance than that of the TiN film having another crystal orientation, the resistance at the boundary can be reduced. Since the film density is high, it is possible to improve the action as the barrier.

According to the aforementioned means (19), the lower silicon oxide film of the aforementioned passivation film can be deposited at such a low temperature as to melt none of the aforementioned wiring lines and at a high step coverage so that the it can flatten the stepped shape to be formed in the aforementioned wiring layer. Thus, the silicon nitride film overlying the passivation film and having an excellent moisture resistance can be formed without any cavity based upon the aforementioned stepped shape. As a result, the no cavity is formed in the upper silicon nitride film of the passivation film to cause no cracking of the aforementioned silicon nitride film and no residual of the water content in the cavity so that the moisture resistance of the passivation film can be improved.

According to the aforementioned means (20), the threshold voltage of the aforementioned first MISFET can be set with the impurity concentration of the first semiconductor regions, and the threshold voltage of the aforementioned second MISFET can be set with the impurity concentration of the second semiconductor regions. Thus, the threshold voltage of the four kinds can be set by the twice introductions of the threshold voltage adjusting impurities so that the number of the steps of introducing the threshold voltage adjusting impurities can be reduced.

According to the aforementioned means (21), no step of exposing the surface of the semiconductor substrate other than the aforementioned well regions can be required to reduce the number of the fabrication steps accordingly.

According to the aforementioned means (22), the threshold voltage of the first MISFET for generating the aforementioned reference voltage can be set with the impurity concentration of the substrate or the well regions. Thus, the threshold voltages of the three kinds can be set by the twice introductions of the threshold voltage adjusting impurities to reduce the number of steps of introducing the threshold voltage adjusting impurities.

According to the aforementioned means (23), the aforementioned complementary data lines are formed over the aforementioned memory cell selecting MISFET and the information storing capacity element of the stacked structure so that the number of the upper insulating films of the aforementioned laser cutting redundancy fuse elements can be reduced to simplify the opening process of the upper insulating films of the laser cutting redundancy fuse elements. At the same time, the aforementioned composite film formed of the silicon film and the transition-metal silicide film has a higher laser beam absorptivity than that of the wiring lines (e.g., the aluminum wiring lines) formed over the complementary data lines so that the aforementioned laser cutting redundancy fuse elements can be easily out.

According to the aforementioned means (24), the conducting film or the insulating film can be deposited on the surface of the aforementioned semiconductor wafer or the surface of the silicon film without being exposed to the atmosphere, after the natural silicon oxide formed on the surface of the semiconductor wafer or the surface of the silicon film has been removed by the cleaning step. Thus, the aforementioned natural silicon oxide film is not left between the surface of the semiconductor wafer or the surface of the silicon film and the aforementioned conducting film or insulating film. As a result, the conduction can be ensured between the surface of the semiconductor wafer or the surface of the silicon film and the conducting film to be deposited on the surface of the former. Moreover, the surface of the semiconductor wafer or the surface of the silicon film and the insulating film such as the dielectric film deposited on the former can be thinned to an extent to the aforementioned natural silicon oxide film (or to have a large dielectric constant in case the dielectric film is formed of a silicon nitride film) to increase the amount of charge storage of the capacity elements.

According to the aforementioned means (25), the radicals of the halogen elements sticking to the surface of the semiconductor wafer or the surface of the silicon film can be removed with the aforementioned ultraviolet ray when that surface is cleaned. Thus, it is possible to reduce the leakage current of and the change in the insulating film such as the silicon nitride film to be deposited on the surface of the semiconductor wafer or the surface of the silicon nitride film.

According to the aforementioned means (26), in the regions of the stepped shape of the aforementioned underlying surface, the step coverage of the silicon film containing the impurity can be compensated with the silicon film containing none of the impurity so that the thickness of the silicon film can be uniformed. At the same time, the aforementioned impurity can be diffused from the silicon film containing the impurity to the silicon film containing no impurity so that the multi-layered silicon film can have its large thickness retained while uniforming the impurity concentration.

According to the aforementioned means (27), the silicon film containing the impurity of the foregoing item (26) and the silicon film containing no impurity can be continuously deposited in the common vacuum system so that the throughput can be improved.

According to the aforementioned means (28), the displacement of the alignment between the aforementioned first-layer pattern and second-layer pattern and the displacement of the alignment between the first-layer pattern and the second-layer pattern can be substantially equalized to reduce the displacement of the alignment between the first-layer pattern and the third-layer pattern. As a result, in case the aforementioned alignment process is applied to the semiconductor integrated circuit device, the element size can be shrunk to an extent corresponding to the masking allowance at the fabrication step to improve the degree of integration of the semiconductor integrated circuit device.

According to the aforementioned means (29), the transition-metal film individually buried in the aforementioned first connecting holes and second connecting holes is formed to have a thickness substantially equal to the depth of the shallow first connecting holes so that none of the transition-metal film will not protrude from the first connecting holes and the second connecting holes. As a result, it is possible to improve the treating accuracy and the reliability of the aforementioned wiring lines.

According to the aforementioned means (30), the transition-metal film deposited by the aforementioned sputtering method has individually high contactnesses with the aforementioned underlying insulating film and wiring lines so that the contactnesses between the underlying insulating film and the wiring lines can be improved. At the same time, the transition-metal film deposited by the sputtering method is formed of a transition-metal film belonging to substantially the same kind as what of the overlying wiring lines so that the treating accuracy of the wiring lines and the underlying transition-metal film can be improved.

According to the aforementioned means (31), thanks to the interposition of the aforementioned intermediate conducting film, the memory cell area can be shrunk to improve the degree of integration to an extent corresponding to the masking allowance at the fabrication step between one of the semiconductor regions of the memory cell selecting MISFET and the complementary data lines. At the same time, the gap between the intermediate conducting film and the lower electrode layer of the information storing capacity element of the stacked structure can be eliminated to increase the area of the lower electrode layer independently of the intermediate conducting film. Thus, the memory cell area can be shrunk by increasing the amount of charge storage of the information storing capacity element of the stacked structure to improve the degree of integration.

According to the aforementioned means (32), the information storing capacity element of the stacked structure can have its lower electrode layer thickened to increase the vertical area so that the amount of charge storage can be improved to shrink the memory cell area and improve the degree of integration. At the same time, the aforementioned intermediate conducting film can be thinned to simplify the treatment.

According to the aforementioned means (33), the intermediate conducting film of the peripheral circuit can be formed at the step of forming the intermediate conducting film formed in the memory cells of the DRAM to reduce the number of fabrication steps.

BRIEF DESCRIPTION OF THE DRAWINGS

FIG. 8 is a graph presenting the relations between the target voltage and the specific resistance when the film to be used in the aforementioned DRAM is sputtered;

FIGS. 9 and 10 are graphs presenting the relations of the incident angles of an X-ray and the X-ray diffraction spectra of the aforementioned film;

FIGS. 16 to 49 are sections showing an essential portion at the individual fabrication steps of the aforementioned DRAM;

FIG. 55 presents diagrams plotting the etching characteristics to be used in the aforementioned DRAM;

FIG. 89 is a diagram showing the alignment tree of the DRAM according to an embodiment VIII of the present invention;

FIGS. 105 and 106 are sections showing an essential portion at the individual fabrication steps of the aforementioned DRAM.

DETAILED DESCRIPTION OF THE PREFERRED EMBODIMENTS

Figure 1:
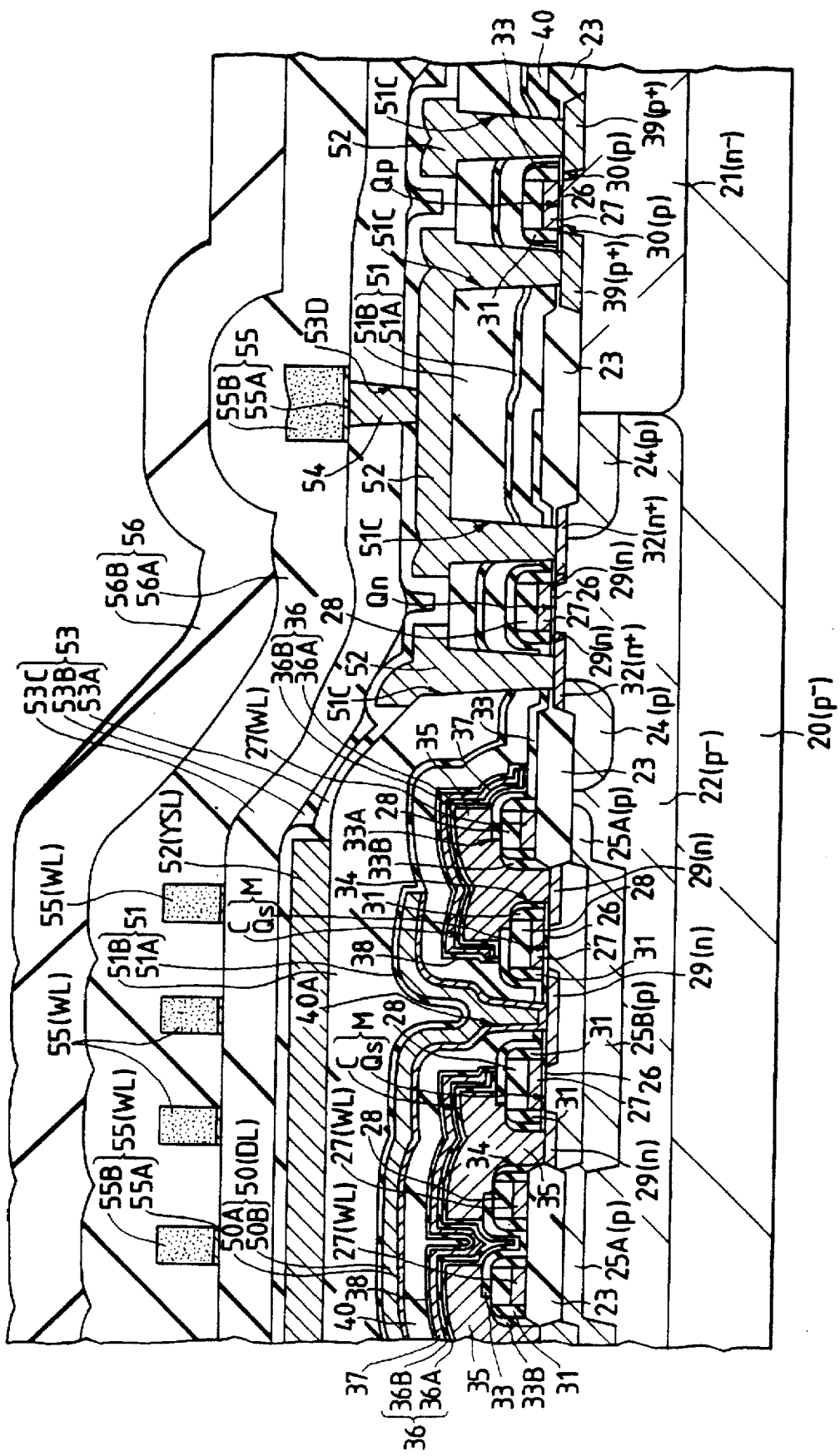
FIG. 1 is a section showing an essential portion of the DRAM according to an embodiment I of the present invention.

The structure of the present invention will be described in the following in connection with one embodiment thereof, in which the present invention is applied to a DRAM having its memory cell constructed of a series circuit of a memory cell selecting MISFET and an information storing capacity element of a stacked structure.

Incidentally, in all the Figures for describing the embodiments, parts having identical functions are designated at common reference numerals, and their repeated descriptions will be omitted.

(Embodiment I)

A resin-sealed type semiconductor device for sealing a DRAM according to the embodiment I of the present invention will be described with reference to FIG. 2 (of partially sectional, perspective view).

Figure 2:
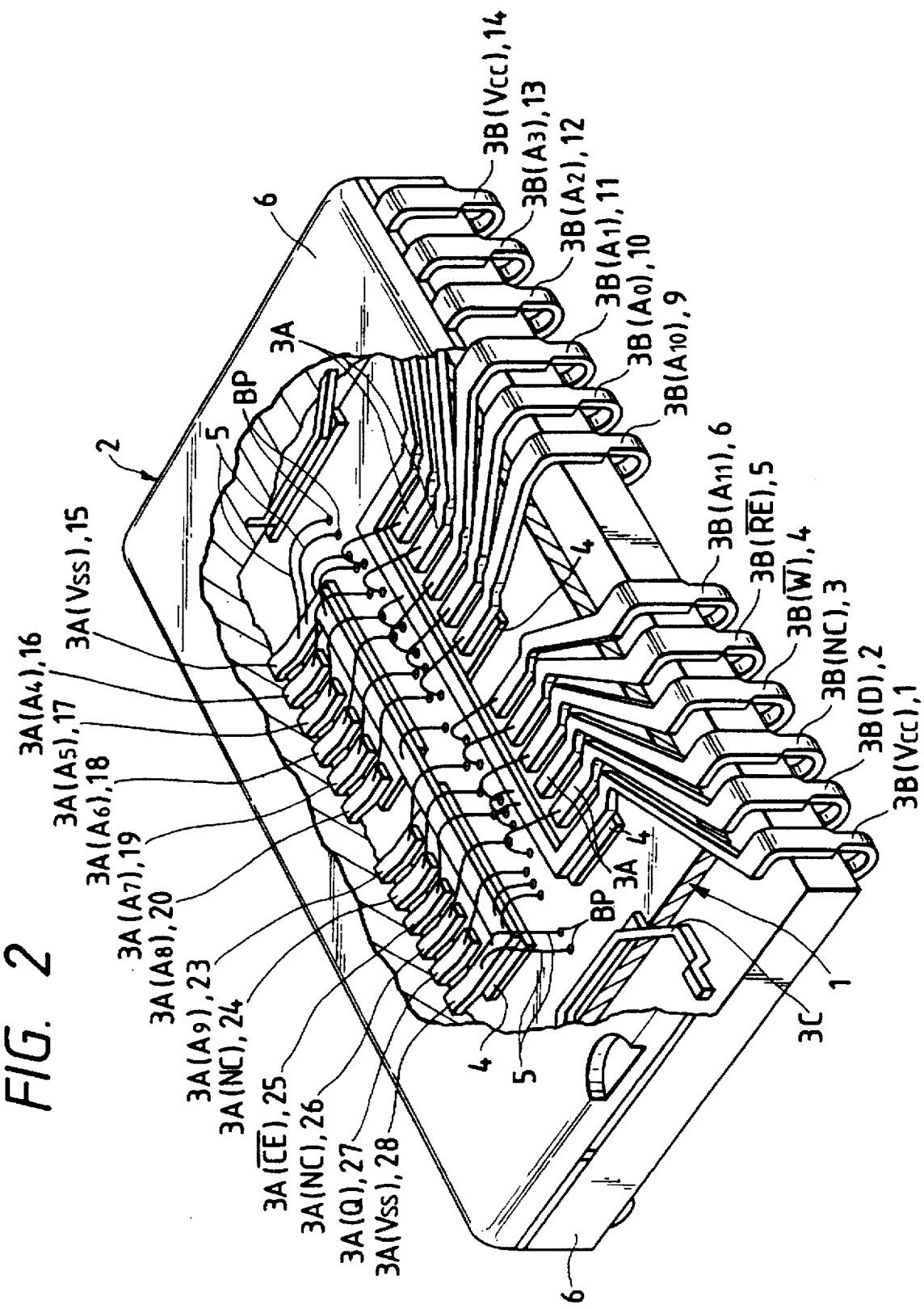
FIG. 2 is a partially sectional perspective view showing a resin-sealed type semiconductor device for sealing the aforementioned DRAM.

As shown in FIG. 2, the DRAM (of a semiconductor pellet) 1 is sealed by an SOJ (Small Out-line J-bend) type resin-sealed type semiconductor device 2. The DRAM 1 is made to have a large capacity of 16 [Mbits]×1 [bit] and a rectangular top plan size of 16.48 [mm]×8.54 [mm]. This DRAM 1 is sealed by the resin-sealed type semiconductor device 2 of 400 [mil].

The aforementioned DRAM 1 has its principal surface arranged mainly with memory cell arrays and peripheral circuits. Each of the memory cell arrays is arranged, as will be described in detail, with a matrix shape of a plurality memory cells (or storage elements) for storing an information of 1 [bit]. The aforementioned peripheral circuits are composed of direct peripheral circuits and indirect peripheral circuits. The direct peripheral circuits are circuits for directly controlling the information writing operations and the information reading operations of the memory cells. These direct peripheral circuits include row address decoder circuits, column address decoder circuits and sense amplifier circuits. The indirect peripheral circuits are circuits for indirectly controlling the operations of the aforementioned direct peripheral circuits. These indirect peripheral circuits include clock signal generators and buffer circuits.

The principal surface of the aforementioned DRAM 1, i.e., the surface arranged with the aforementioned memory cell arrays and peripheral circuits is arranged with inner leads 3A. Between the DRAM 1 and the inner leads 3A, there is sandwiched an insulating film 4. This insulating film 4 is made of a polyimide resin film, for example. The individual surfaces of the insulating film 4 at the sides of the DRAM 1 and the inner leads inner leads 3A are formed with adhesive layers (although not shown). This adhesive layer is made of a polyether amide-imide resin or an epoxy resin, for example. The resin-sealed type semiconductor device 2 of this type adopts the LOC (i.e., Lead On Chip) structure in which the inner leads 3A are arranged over the DRAM 1. The resin-sealed type semiconductor device 2 thus adopting the LOC structure can arrange the inner leads 3A freely without being regulated by the shape of the DRAM 1, so that the DRAM 1 having a large size can be sealed to a more extent corresponding to that arrangement. In other words, the resin-sealed type semiconductor device 2 adopting the LOC structure can have its sealed size suppressed, even if the size of the DRAM 1 is enlarged according to the large capacity, so that the packaging density can be enhanced.

The aforementioned inner leads 3A have their one-side ends integrated with outer leads 3B. These outer leads 3B have their individually fed signals and numerals specified on the basis of the standard specifications. In FIG. 2, the nearest lefthand one is the first terminal, and the nearest righthand one is the fourteenth terminal. The remotest righthand one (as numbered at the corresponding one of the inner leads 3A) is the fifteenth terminal, and the remotest lefthand one is the twenty eighth terminal. In other words, this resin-sealed type semiconductor device 2 is composed of totally twenty four terminals, i.e., the first to sixth terminals, ninth to fourteenth terminals, the fifteenth to twentieth terminals and twenty third to twenty eighth terminals.

The aforementioned first terminal is one for the power source voltage Vcc. This power source voltage Vcc is an operating voltage of 5 [V] of the circuit, for example. The second terminal is a data input signal terminal (D); the third terminal is a free terminal; the fourth terminal is a write enable signal terminal (W); the fifth terminal is a row address strobe signal terminal (RE); and the sixth terminal is an address signal terminal ($A_{11}$).

The ninth terminal is an address signal terminal ($A_{10}$); the tenth terminal is an address signal terminal ($A_0$); the eleventh terminal is an address signal terminal ($A_1$); the twelfth terminal is an address signal terminal ($A_2$); and the thirteenth terminal is an address signal terminal ($A_3$). The fourteenth terminal is a power source voltage Vcc terminal.

The fifteenth terminal is a reference voltage Vss terminal. This reference voltage Vss is the reference voltage of 0 [V] of the circuit, for example. The sixteenth terminal is an address signal terminal ($A_4$); the seventeenth terminal is an address signal terminal ($A_5$); the eighteenth terminal is an address signal terminal ($A_6$); the nineteenth terminal is an address signal terminal ($A_7$); and twentieth terminal is an address signal terminal ($A_8$).

The twenty third terminal is an address signal terminal ($A_9$); the twenty fifth terminal is a column address strobe signal terminal (CE); and the twenty sixth terminal is a free terminal; and twenty seventh terminal is a data output signal terminal. The twenty eight terminal is a reference voltage Vss terminal.

The other ends of the aforementioned inner leads 3A are extended across the individual longer sides of the rectangle of the DRAM 1 to the center of the DRAM 1. The other ends of the inner leads 3A have their leading ends are connected through bonding wires 5 with external terminals (or bonding pads) BP arranged at the center of the DRAM 1. The bonding wires 5 are made of aluminum (Al) wires. On the other hand, the bonding wires 5 to be used may be made of coated wires which are made by coating metal wires such as gold (Au) or copper (Cu) wires with an insulating resin. The bonding wires 5 are bonded by the bonding method using the ultrasonic vibrations together with the hot contact molding.

Of the aforementioned inner leads 3A, the individual inner leads 3A of the fourteenth terminal are made integral and extended in the central portion of the DRAM 1 in parallel with the longer sides of the same. Likewise, the respective inner leads (Vss) 3A of the fifteenth terminal and twenty eighth terminal are made integral and extended in the central portion of the DRAM 1 in parallel with the longer sides of the same. The inner leads (Vcc) 3A and inner leads (Vss) 3A are extended in parallel within the regions which are defined by the leading ends of the other ends of the remaining inner leads 3A. Those inner leads (Vcc) 3A and inner leads (Vss.) 3A are individually enabled to supply the power supply voltage Vcc and the reference voltage Vss no matter what position of the principal surface of the DRAM 1 they might be disposed in. In other words, the resin-sealed type semiconductor device 2 is constructed to absorb the power source noises easily thereby to increase the operating speed of the DRAM 1.

The rectangle of this DRAM 1 has its shorter sides equipped with pellet supporting leads 3C.

The inner leads 3A, outer leads 3B and pellet supporting leads 3C thus far described are individually cut from the lead frame and molded. This lead frame is made of a Fe—Ni (having a Ni content of 42 or 50 [%], for example) alloy or Cu, for example.

The DRAM 1, bonding wires 5, inner leads 8A and pellet supporting leads 3C thus far described are sealed with a resin-sealing portion 8. This resin-sealing portion 6 is made of an epoxy resin to which are added a phenol curing agent, silicone rubber and a filler. The silicon rubber has an action to drop the coefficient of thermal expansion of the epoxy resin. The filler is made of silicon oxide balls having an action to drop the coefficient of thermal expansion similarly.

Figure 3:
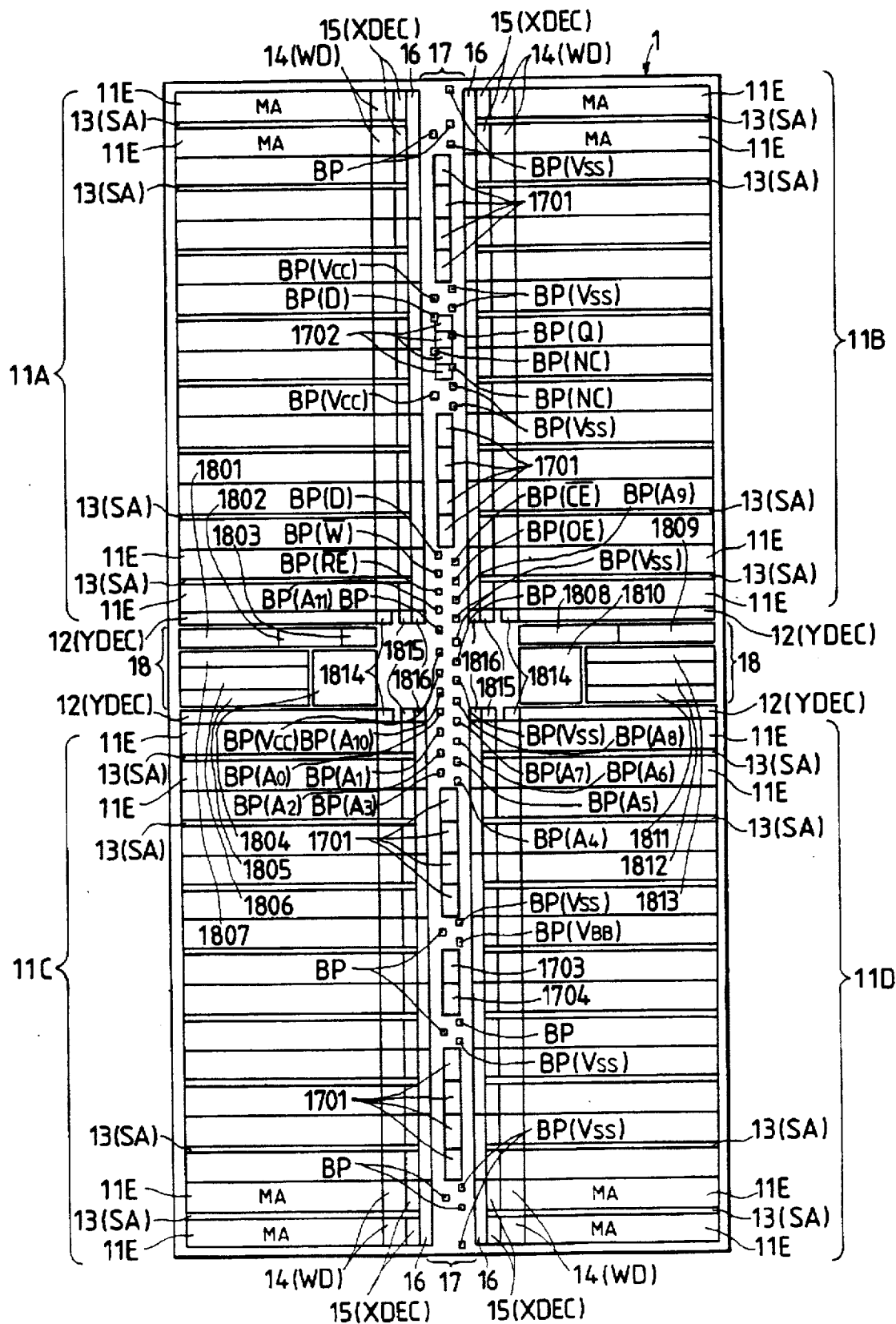
FIG. 3 is a layout diagram showing the chip of the aforementioned DRAM.

Next, FIG. 3 shows a schematic structure of the DRAM 1 which is sealed with the aforementioned resin-sealed type semiconductor device 2.

As shown in FIG. 3, the DRAM 1 is arranged substantially all over its surface with a memory cell array (MA) 11. The DRAM 1 of the present embodiment is roughly divided into four memory cell arrays 11A to 11C, although not limited thereto. In FIG. 3, the two memory cell arrays 11A and 11B are arranged over the DRAM 1, and the two memory cell arrays 11C and 11D are arranged under the same. Each of these four-divided memory cell arrays 11A to 11D is further divided into sixteen memory cell arrays (MA) 11E. In other words, the DRAM 1 is arranged sixty four memory cell arrays 11E. Each of the sixty four memory cell arrays 11E is made to have a capacity of 256 [Kbits].

Between every two of the sixteen memory cell arrays 11E of the aforementioned DRAM 1, there is interposed a sense amplifier circuit (SA) 13. This sense amplifier circuit 13 is composed of complementary MISFETs (i.e., CMOSes). A column address decoder circuit (i.e., YDEC) 12 is arranged at the lower one end of each of the two 11A and 11B of the four divided memory cell arrays of the DRAM 1. Likewise, a column address decoder circuit, (i.e., YDEC) 12 is arranged at the upper one end of each of the two memory cell arrays 11C and 11D.

Word driver circuits (WD) 14, row address decoder circuits (XDEC) 15 and unit mat control circuits 16 are individually arranged in the recited order from the lefthand to the righthand at one end of the righthand side of each of the two 11A and 11C of the four divided memory cell arrays of the aforementioned DRAM 1. Word driver circuits 14, row address decoder circuits 15 and unit mat control circuits 18 are individually arranged in the recited order from the righthand to the lefthand at one end of the righthand side of each of the two memory cell arrays 11B and 11D.

Each of the aforementioned sense amplifier circuits 13, column address decoder circuits 12, word driver circuits 14 and row address decoder circuits 15 constitutes a direct one of the peripheral circuits of the DRAM 1. This direct peripheral circuit is one for directly controlling the memory cells which are arranged in the finely divided memory cell arrays 11E of the memory cell array 11.

Between the two 11A and 11B and the two 11C and 11D of the four divided memory cells of the DRAM 1, respectively, there are interposed peripheral circuits 17 and the external terminals BP. As the peripheral circuits 17, there are arranged an output buffer circuit 1702, a substrate potential generator circuit (i.e., $V_{BB}$ generator circuit) 1703 and a power source circuit 1704. Four sets of totally sixteen main amplifier circuits 1701 are arranged. Totally four output buffer circuits 1702 are arranged.

The aforementioned external terminals BP are arranged at the central portion of the DRAM 1 because the aforementioned resin-sealed type semiconductor device 2 is constructed to have the LOC structure so that the inner leads 3A are extended to the central portion of the DRAM 1. The external terminals BP are so arranged within the regions defined by the memory cell arrays 11A and 11C, and 11B and 11D that they are directed from the upper end to the lower end of the DRAM 1. The descriptions of the signals to be fed to the external terminals BP will be omitted here because they have been accomplished in the resin-sealed type semiconductor device 2 shown in FIG. 2. Since the inner leads 3A fed with the reference voltage (Vss) and the power source voltage (Vcc) are arranged from the upper end to the lower end of the surface of the DRAM 1, this DRAM 1 is arranged in its extending direction with a plurality of external terminals BP for the reference voltage (Vss) and the power source voltage (Vcc). In other words, the DRAM 1 is enabled to supply the respective power sources of the reference voltage (Vss) and the power source voltage (Vcc). The data input signal (D), the data output signal (Q), the address signals ($A_0$ to $A_{11}$), the clock signals and control signals are concentratedly arranged at the central portion of the DRAM 1.

Between the two 11A and 11C and the two 11B and 11D of the four divided memory cells of the DRAM 1, respectively, there are interposed peripheral circuits 18. The lefthand side pheripheral circuits 18 include a row address strobe (RE) circuit 1801, a write enable (W) circuit 1802, a data input buffer circuit 1803, a VCC limiter circuit 1804, an X-address driver circuit (or a logical step) 1805, an X-ray redundancy circuit 1806 and an X-address buffer circuit 1807. The righthand side peripheral circuits include a column address strobe (CE) circuit 1808, a test circuit 1809, a VDL limiter circuit 1810, a Y-address driver circuit (or a logical step) 1811, a Y-redundancy circuit 1812 and a Y-address buffer circuit 1813. The central peripheral circuits 18 include a Y-address driver circuit (or a drive step) 1814, an X-address driver circuit (or a drive step) 1815 and a mat selection signal circuit (or a drive step) 1816.

The aforementioned peripheral circuits 17 and 18 (and 16) are used as the indirect peripheral circuits of the DRAM 1.

Next, the essential portions of the sixteen divided memory cell arrays 11E of the aforementioned DRAM 1 and the essential portions of their peripheral circuits will be described with reference to FIG. 4 (presenting an essential equivalent circuit diagram).

Figure 4:
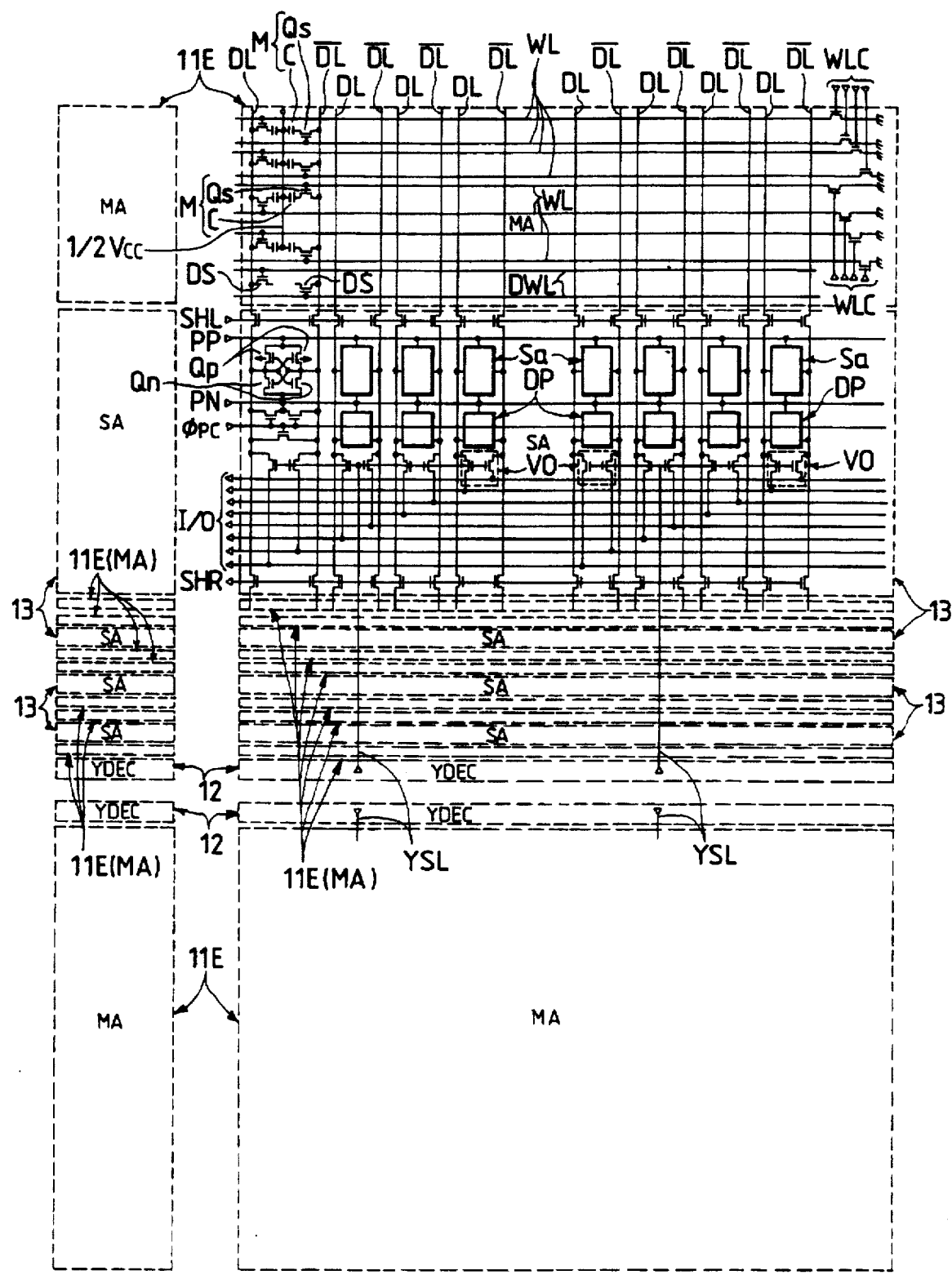
FIG. 4 is a circuit diagram showing an equivalent circuit of the memory cell array of the aforementioned DRAM.

As shown in FIG. 4, the aforementioned DRAM 1 is constructed to have the folded bit line structure (or the double-point intersection structure). In each of the sixteen divided memory cell arrays 11 of the DRAM 1, there are arranged in a matrix shape a plurality of memory cells M. These memory cells M are arranged at the intersections between complementary data lines (or complementary bit lines) DL and DL and word lines WL. The complementary data lines DL are extended in the row direction of FIG. 4 and arranged in plurality in the column direction. The word lines WL are extended in the column direction and arranged in plurality in the row direction. With the complementary data lines DL extended in the column direction, there are individually connected sense amplifier circuits Sa of the shared sense type, precharge circuits DP and input/output signal selector circuits VO. The aforementioned word lines WL are connected with the row address decoder circuits (XDEC) 15 through word driver circuits (WD) 14, as shown in FIG. 3. Although not shown in FIG. 4, shunting word lines WL extended in the column direction are arranged along the aforementioned word lines WL. The shunting word lines WL are shorted at predetermined portions (at every a predetermined number of memory cells, for example) with the word lines WL to reduce the specific resistances of the word lines WL.

Each of the aforementioned memory cells M is constructed of a series circuit composed of a memory cell selecting MISFET Qs and the information storing information storing capacity element C. The memory cell selecting MISFET Qs is made to have an n-channel. This memory cell selecting MISFET Qs has its one semiconductor region connected with the aforementioned complementary data line DL. The other semiconductor region is connected with one electrode (or a lower electrode layer) of the information storing capacity element C. The gate electrode is connected with the word line WL. The other electrode of the information storing capacity element C is connected with a lower power source voltage of ½·Vcc. The aforementioned DRAM 1 uses the aforementioned power source voltage Vcc, i.e., 5 [V] as the operating voltage of the input step circuit and the output step circuit to be used as the interface with an external unit. A lower power source voltage Vcc, e.g., 3.3 [V] than the power source voltage Vcc is used as the operating voltage of the internal circuits of the DRAM 1 e.g., the memory cell array 11, the direct peripheral circuits (12, 13, 14 and 15) and the indirect peripheral circuits (16, 17 and 18). The lower power source voltage Vcc can reduce the amount of charge and discharge of the complementary data lines DL especially in the information writing operations and the information reading operations so that the power consumption of the DRAM 1 can be reduced. Therefore, the aforementioned lower power source voltage ½·Vcc takes an intermediate value of about 1.65 [V] between the lower power source voltage Vcc and the reference voltage Vss.

The aforementioned precharge circuit DP is composed of: two precharging MISFETs having their gate electrodes connected with a precharge signal line φ pc; and a shorting MISFET having its gate electrode likewise connected with the precharge signal line φ pc. Each precharging MISFET has its one semiconductor region connected with the complementary data lines DL and its other semiconductor region connected with a common source line (or the reference voltage Vss) PN. The shorting MISFET has its individual semiconductor regions connected with the complementary data lines DL. The precharging MISFETs and the shorting MISFET are constructed to have the n-channel.

The sense amplifier circuits Sa is composed of two n-channel MISFETs Qn and two p-channel MISFETs Qp.

Each of the n-channel MISFETs Qn of the sense amplifier circuits Sa has its one semiconductor region connected with the complementary data lines DL and its other semiconductor region connected with the common source lines (at the reference potential Vss) PN. The n-channel MISFETs Qn have their individual gate electrodes intersecting each other and connected with the other of the complementary data lines DL, one of which is connected with the semiconductor region of one of them. Each of the p-channel MISFETs Qp of the sense amplifier Sa has its one semiconductor region connected with the complementary data lines DL and its other semiconductor region connected with a common source line (at Vcc of 3.3 [V]) PP. The p-channel MISFETs Qp have their individual gate electrodes intersecting each other and connected with the other of the complementary data lines DL, one of which is connected with the semiconductor region of one of them.

The input/output signal selector circuit VO is composed of n-channel input/output selecting MISFETs (or column switches). These input/output selecting MISFETs are arranged at every data lines of the complementary data lines DL. Each of the input/output selecting MISFET has its one semiconductor region connected with the complementary data lines DL and its other semiconductor region connected with any of complementary input/output signal lines I/O. With the gate electrode of the input/output selecting MISFET, there is connected a column select signal line YSL. This column select signal line YSL is connected with the column address decoder circuits 12.

The aforementioned sense amplifier circuit 13 is arranged with the mat selecting MISFETs between the complementary data lines DL of the upper memory cell arrays 11E and the sense amplifiers Sa and the complementary data lines DL of the lower memory cell arrays 11E and the input/output signal selector circuits. Those mat selecting MISFETs are constructed to have the n-channel and to be controlled by mat selection signals SHL and SHR. In the vicinity of the aforementioned sense amplifier circuits 13, the memory cell arrays 11E are arranged with dummy cells DS at the intersections between the complementary data lines DL and dummy word lines DWL. These dummy cells DS are composed of n-channel MISFETs.

Moreover, the word lines WL of the aforementioned memory cell array 11E are arranged with clearing MISFETs at their side opposite to the word driver circuits 14. The clearing MISFETs are controlled by clear signals WLC.

Figure 5:
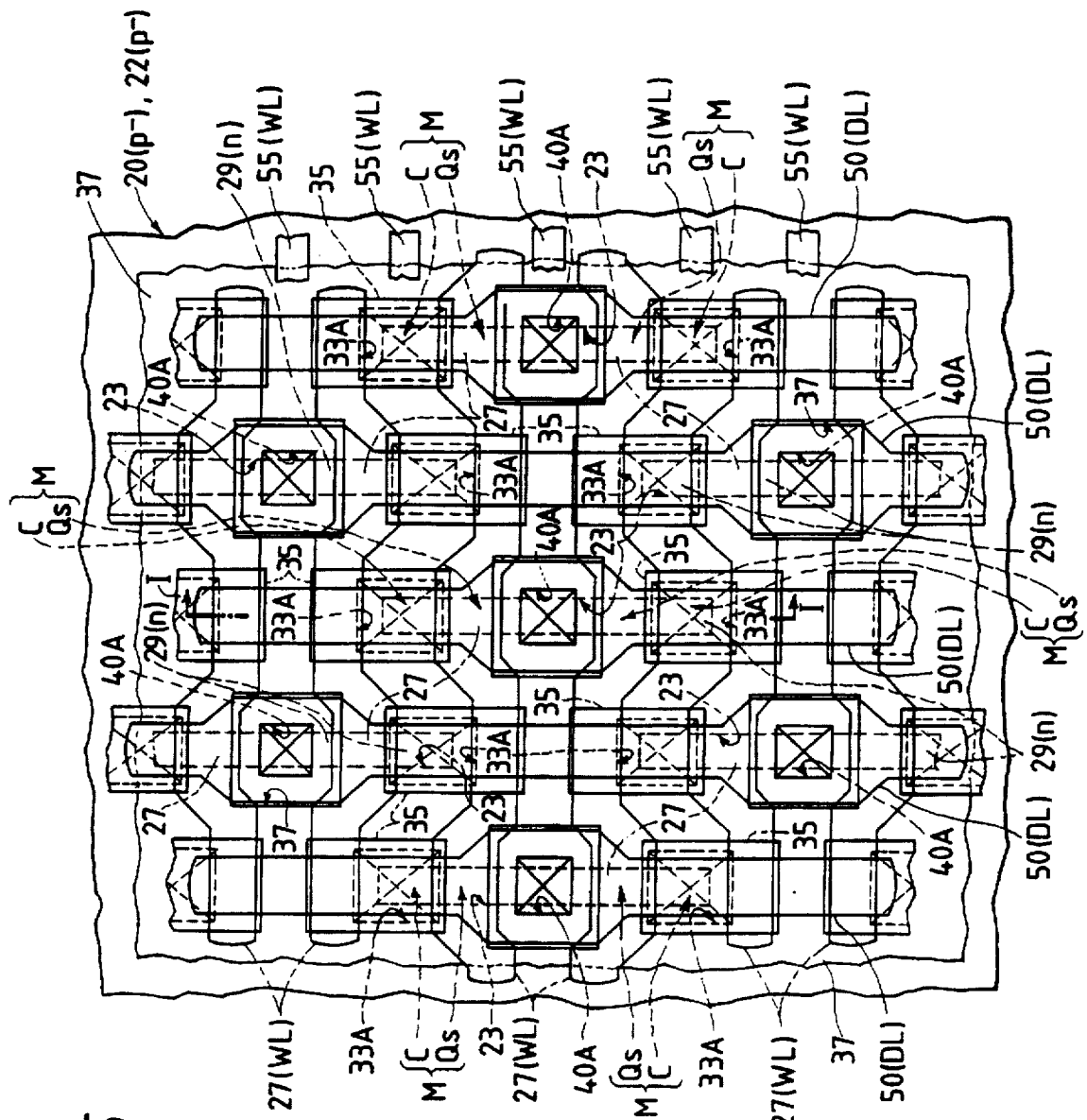
FIG. 5 is a top plan view showing an essential portion of the memory cell array of the aforementioned DRAM.

Next, the specific structures of the elements composing the memory cells M and the peripheral circuits (e.g., the sense amplifier circuits or the decoder circuits) of the aforementioned DRAM 1 will be described in the following. The structure of the memory cell array 11E is shown in FIG. 5 (in a partial top plan view). The sectional structures of the memory cell array 11E and the elements of the peripheral circuits are shown in FIG. 1 (in a partial section). Incidentally, the sectional structure of the memory cell M, as shown at the lefthand side of FIG. 1, presents the sectional structure of the portion taken from line I—I of FIG. 5. On the other hand, the righthand side of FIG. 1 presents the sectional structure of the complementary MISFET (i.e., CMOS) composing the peripheral circuits.

As shown in FIGS. 1 and 5, the DRAM 1 is constructed of a $p^-$-type semiconductor substrate 20 made of single crystalline silicon. This $p^-$-type semiconductor substrate 20 uses the (100) crystal plane as an element forming plane to have a resistance of about 10 [Ω/cm], for example. The principal surface of a portion of the $p^-$-type semiconductor substrate 20 is not doped with an n-type impurity more than about $10^{15}$ [atom/cm$^2$] by the ion implantation. The partial region is at least that of the memory cell array 11E. The introduction of the aforementioned n-type impurity will cause many crystal defects to leak the charges of information so that the area to be doped with the impurity is partially limited. In order to reduce the contamination with a heavy metal such as Fe, therefore, the DRAM 1 used in the present embodiment has a getter ring layer in a deep region of the p$^-$-type semiconductor substrate 20.

This p$^-$-type semiconductor substrate 20 is formed with a p$^-$-type well region 22 in the principal surface of the regions to be formed with the memory cells M (e.g., the memory cell arrays 11E) and the n-channel MISFET Qn. On the other hand, the p$^-$-type semiconductor substrate 20 is formed with an n$^-$-type well region 21 in the principal surface of the regions to be formed with the. p-channel MISFETs Qp. In other words, the DRAM 1 of the present embodiment is constructed to have the twin well structure. The p$^-$-type well region 22 is formed in a self-alignment with the n$^-$-type well region 21.

The individual regions of those well regions 21 and 22 to be formed with the semiconductor elements are formed over their intervening regions (i.e., inactive regions) with an element separating insulating film (i.e., a field insulating film) 23. The principal surface portions of the p$^-$-type well region 22 to be formed with the memory cell arrays 11E are formed with p-type channel stopper regions 25A below the element separating insulating film 23 (i.e., in the inactive regions). Since the parasitic MOSes using the element separating insulating film 23 as the gate insulating film are liable to be inverted to the n-type, the channel stopper regions are formed in at least the principal surface portions of the p$^-$-type well regions 22. The p-type channel stopper regions 25A are made to have a higher impurity concentration than those of the p$^-$-type semiconductor substrate 20 and the p$^-$-type well region 22.

The regions of the memory cell arrays 11E to be formed with the memory cells M are formed with p-type semiconductor regions 25B in the principal surface of the p$^-$-type well regions 22. The p-type semiconductor regions 25B are formed substantially all over the surface of the active regions of the memory cell arrays 11E. The p-type semiconductor regions 25B are formed at the step shared with the aforementioned p-type channel stopper regions 25A. The p-type semiconductor regions 25B and the p-type channel stopper regions 25A are formed, as will be described in detail hereinafter, by doping the individual principal surface portions of the active and inactive regions of the memory cell arrays 11E of the p$^-$-type well regions 22 with an impurity, after forming the aforementioned element separating insulating film 23, and by activating the impurity. This impurity to be used is B, for example, and is introduced by the ion implantation of high energy. The principal surface portions of the inactive regions of the p$^-$-type well regions 22 are passed through the element separating insulating film 23 so that they may be doped with the impurity. The principal surface portions of the active regions (to form the memory cells M) are doped with the aforementioned impurity in positions which are located so deep from the principle surface as to correspond to the thickness of the aforementioned element separating insulating film 23.

The p-type channel stopper regions 25A thus constructed are formed with in self-alignment with the element separating insulating film 23 and after a heat treatment for forming the element separating insulating film 23, as will be described hereinafter. This makes it possible to reduce the amount of diffusion of the p-type impurity forming the p-type channel stopper regions 25A into the active regions. This reduction in the diffusion amount of the p-type impurity can lead to a reduction in the narrow channel effect of the memory selecting MISFETs Qs of the memory cells M. On the other hand, the p-type semiconductor regions 25B are formed below the memory cells M to act as potential barrier regions against the minority carriers so that they can raise the resistance to the α-ray soft errors. Moreover, the p-type semiconductor regions 25B can increases the impurity concentration of the principal surface of the p$^-$-type well regions 22 to a slightly higher value to raise the threshold voltage of the memory cell selecting MISFETs Qs so that no erroneous conduction will arise even if noises are caused in the word lines WL or the line in non-selected states. Furthermore, the p-type semiconductor regions 25B can increase the pn junction capacitor, which is formed in semiconductor regions 29 at the side of the memory cell selecting MISFETs Qs to be connected with the electrodes of the information storing capacity elements C so that they can increase the charge storing amount of the information storing capacity elements C.

Figure 6:
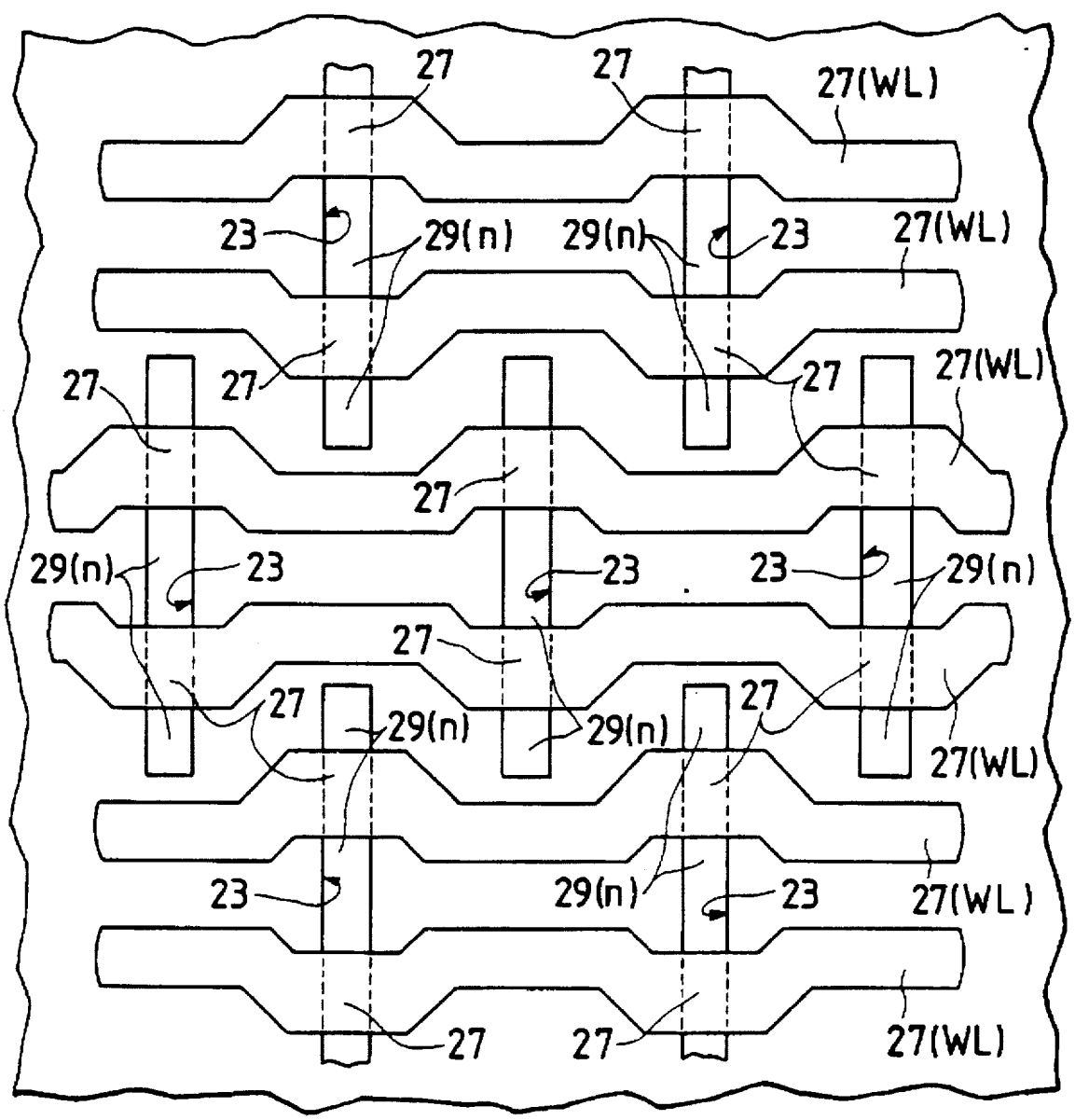
FIGS. 6 and 7 are top plan views showing an essential portion at a predetermined fabrication step of the memory cell array of the aforementioned DRAM.

The memory cell selecting MISFET Qs of the aforementioned memory cells M are formed in the principal surface portions of the p$^-$-type well regions 22, as shown in FIGS. 1, 5 and 6 (presenting top plan views of the essential portion at predetermined fabrication steps). As a matter of fact, the memory cell selecting MISFETs Qs are formed in the principal surface portions of the p$^-$-type well regions 22, which are surrounded by the p-type semiconductor regions 25B to have a slightly higher impurity concentration. The memory cell selecting MISFETs Qs are formed in the regions which are defined by the element separating insulating film 23 and the p-type channel stopper regions 25A. The memory cell selecting MISFETs Qs are constructed mainly of the p$^-$-type well regions 22, gate insulating film 26, gate electrodes 27 and a pair of semiconductor regions 29, i.e., source regions and drain regions.

The aforementioned p$^-$-type well regions 22 are used as channel forming regions. The gate insulating film 26 are formed of the silicon oxide film which is prepared by oxidizing the principal surfaces of the p$^-$-type well regions 22. In case, on the other hand, the insulating withstand voltage is to be retained as the gate insulating film 26 are thinned, this gate insulating film 26 may be formed of a composite film which is prepared by laminating silicon oxide films and silicon nitride films sequentially.

The gate electrodes 27 are formed over the gate insulating film 26. The gate electrodes 27 are formed of polycrystalline silicon films, which are deposited by the CVD method, for example, to have a thickness of about 200 to 300 [nm]. These polycrystalline silicon films are doped with an n-type impurity (P or As) for reducing the resistance. Moreover, the gate electrodes 27 may be made of a single layer of a transition metal (e.g., a metal of high melting point such as Mo, Ti, Ta or W) film or its silicide (MoSi$_2$, TiSi$_2$ TaSi$_2$ or WSi$_2$) film. Moreover, the gate electrodes 27 may be made of a composite film which is prepared by laminating the aforementioned transition-metal film or its silicide film.

The gate electrodes 27 are formed, as shown in FIGS. 5 and 6, integrally with the word lines (WL) 27 extending in the column direction. In other words, the gate electrodes 27 and the word lines 27 are formed of a common conductive layer. The word lines 27 are constructed to connect the individual gate electrodes 27 of the memory cell selecting MISFETs Qs of the plural memory cells M arranged in the column direction.

As shown in FIG. 6, the gate length of the gate electrodes 27 of the memory cell selecting MISFETs Qs is made longer than the width of the word lines 27. For example, the gate electrodes 27 have a gate length of 0.7 [μm] and a width of 0.5 [μm]. In short, the memory cell selecting MISFETs Qs are enabled to retain the effective gate (or channel) length thereby to reduce the short channel effect. On the other hand, the word lines 27 are constructed to minimize the gap inbetween thereby to reduce the area of the memory cells M so that they may improve the degree of integration. Those word lines 27 reduce the resistance with shunting word lines (WL) 55, as will be described hereinafter, so that their operating speeds such as the information writing operations or the information reading operations are not dropped even if the width is reduced. Incidentally in the present embodiment, the DRAM 1 adopts the so-called "0.5 [μm] fabrication process" having a minimum processing size of 0.5 [μm].

The semiconductor regions 29 are formed to have a lower impurity concentration than that of n⁻-type semiconductor region 32 of the MISFETs Qn composing the peripheral circuits. More specifically, the semiconductor regions 29 are formed at a low impurity concentration of 1×10¹⁴ [atoms/cm²] by the ion implantation. In other words, the semiconductor regions 29 are enabled to reduce the occurrence of the crystal defects to be caused as a result of the introduction of the impurity and to restore the crystal defects sufficiently by a heat treatment after the impurity introduction. Since the semiconductor regions 29 have a small leakage current amount at their pn junctions with the p⁻-type well regions 22, the information charges stored in the information storing capacity elements C can be stably held.

Since the semiconductor regions 29 are formed in a self-alignment with the gate electrodes 27 and made to have a lower impurity concentration at their side to be formed with the channels, they construct the memory cell selecting MISFETs Qs having the LDD (Lightly Doped Drain) structure.

On the other hand, one-side (at the side to be connected with complementary data lines 50) semiconductor regions 29 of the memory cell selecting MISFETs Qs are diffused, in the regions specified later-described connecting holes (40A), with an n-type impurity, which is introduced into polycrystalline silicon film (50A)below the complementary data lines (50), so that they have a slightly higher impurity concentration. Since the n-type impurity to be introduced into the n-type semiconductor regions can connect the n-type semiconductor regions 29 and the complementary data lines (50) ohmically, it can reduce the resistances of the connected portions. Moreover, the n-type impurity forms the n-type semiconductor regions so as to prevent the complementary data lines (50)and the p⁻-type well regions 22 from being shorted, even in case a masking misregistration is caused at the fabrication step between the semiconductor regions 29 and the aforementioned connecting holes (40A) to superpose the connecting holes (40A) and the element separating insulating film 23 so that the p⁻-type well regions 22 have their principal surfaces exposed to the inside of the connecting holes (40A).

The other-side (at the side to be connected with the information storing capacity elements C) semiconductor regions 29 of the memory cell selecting MISFETs Qs are diffused-with the n-type impurity, which is introduced into a lower electrode layer (35) of the information storing capacity elements C, so that the impurity concentration is made slightly higher. The n-type impurity to be introduced into the semiconductor regions 29 can connect the semiconductor regions 29 and the lower electrode layer (35)ohmically to reduce the resistances of the connected portions. Moreover, this n-type impurity can increase the impurity concentration of the semiconductor regions 29 to augment the capacity of the pn junctions, which are formed of the semiconductor regions 29 and the p⁻-type well regions 22, so that it can augment the charge store amount of the information storing capacity elements C.

The gate electrodes 27 of the aforementioned memory cell selecting MISFET Qs are formed thereover with a insulating film 28, and the gate electrodes 27 and the insulating film 28 are formed at their individual side walls with side wall spacers 31. The insulating film 28 are made mainly to separate the gate electrodes 27 and the individual electrodes (especially 35) of the information storing capacity elements C formed over the former. The side wall spacers 31 are so formed in the regions formed with the memory cells M and in a self-alignment with the gate electrodes, 27 of the memory cell selecting MISFETs Qs as to connect the other semiconductor regions 29 and the lower electrode layer (35) of the information storing capacity elements C. Moreover, the side wall spacers 31 are constructed to give the CMOSes the LDD structure in the regions formed with the peripheral circuits. The aforementioned insulating film 28 and side wall spacers 31 are formed of a silicon oxide film, which is deposited by the CVD method using inorganic silane gases and nitrogen oxide gases as its source gases, although their fabrication method will be described hereinafter. The silicon oxide film thus formed has a higher step coverage at the underlying stepped portions and a smaller film shrinkage than those of the silicon oxide film which is deposed by the CVD method using organic silane gases as its source gases. In other words, the insulating film 28 and side wall spacers 31 formed by this method can reduce their separations due to the film shrinkage to prevent the aforementioned gate electrodes 27 and the remaining conducting layer such as the lower electrode layer 35 from being shorted.

Figure 7:
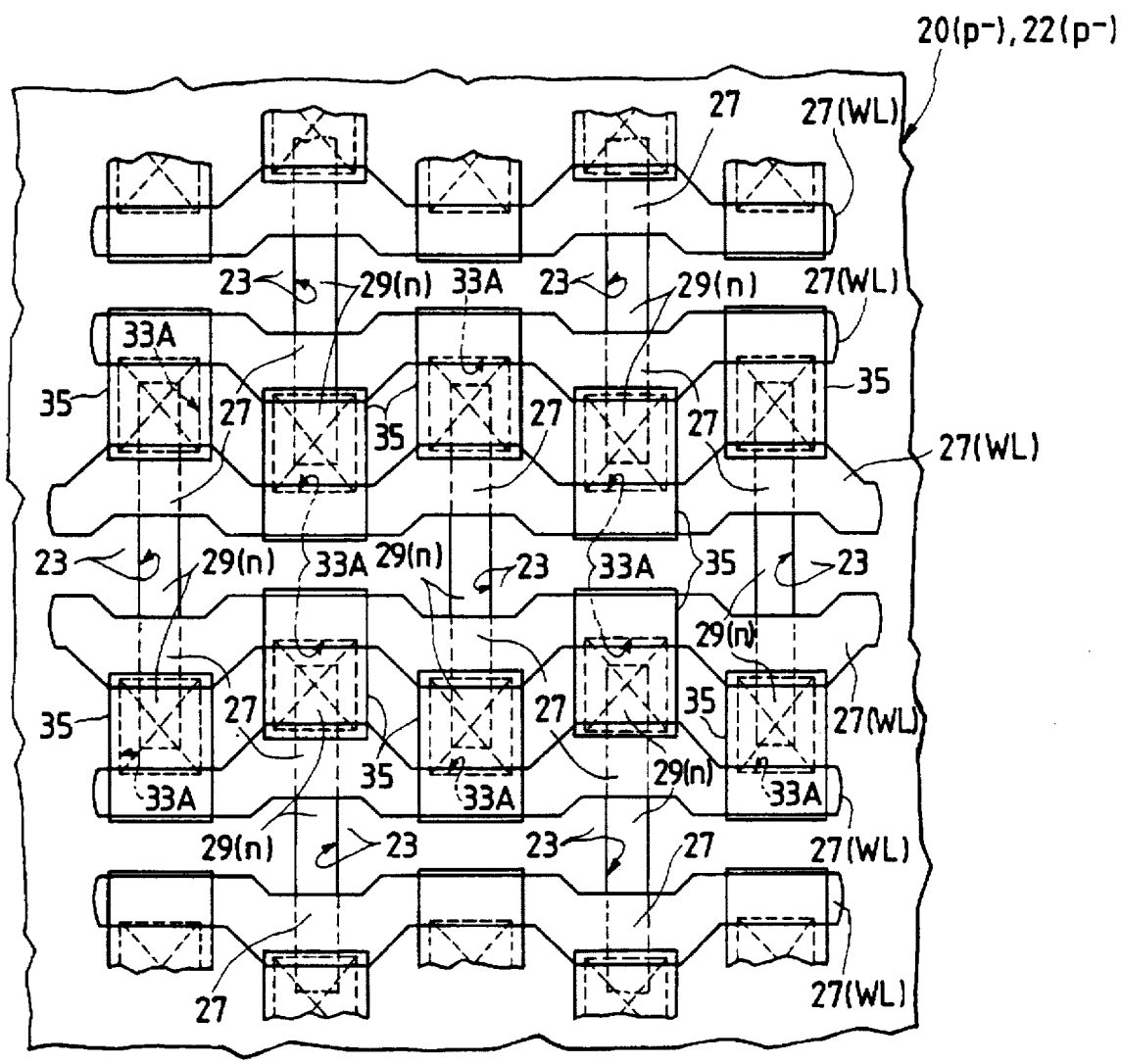

The information storing capacity elements C of the aforementioned memory cells M are constructed mainly by laminating the lower electrode layer 35, a dielectric film 36 and upper electrode layer 37 sequentially, as shown in FIGS. 1, 5 and 7 (presenting partial top plan views at predetermined fabrication steps). The information storing capacity elements C are constructed to have the so-called "stacked structure (of laminated type: STC)".

The lower electrode layer 35 of the information storing capacity elements C of this stacked structure is partially (at its central portion) with the other semiconductor regions 29 of the memory cell selecting MISFETs Qs. These connections are accomplished through both connecting holes 33A, which are formed in an inter-layer insulating film 33, and the connecting holes 34 which are defined by the side wall spacers 31 and 33B. The opening size of the connecting holes 34 in the row direction is specified by both the gaps of the gate electrodes 27 of the memory selecting MISFETs Qs and the word lines 27 adjoining the former and the individual film thicknesses of the side wall spacers 31 and 33B. The difference between the opening size of the connecting holes 33A aria the connecting holes 34 is made larger than at least that corresponding to the masking allowance at the fabrication steps. The other (or peripheral) portions of the lower electrode layer 35 are extended to above the gate electrodes 27 and the word lines 27.

The aforementioned inter-layer insulating film 33 is formed of an insulating film like that of the underlying insulating film 28 and side wall spacers 31. In other words, the inter-layer insulating film 33 is made of the silicon oxide film which is deposited by the CVD method using the inorganic silane gases and the nitrogen oxide gases as its source gases.

The aforementioned lower electrode layer 35 is made of the polycrystalline silicon film deposited by the CVD method, for example, and this polycrystalline silicon film is highly doped with an n-type impurity (e.g., As or P) for reducing the resistance. The lower electrode layer 35 is made to increase the area of the side walls of its surface and accordingly the charge storage capacity of the information storing capacity elements C having the stacked structure. The lower electrode layer 35 is formed to have a film thickness equal to or larger than the half size of the opening size in the gate length direction so that its surface may be flattened. For example, the lower electrode layer 35 is formed to have a relatively large film thickness of about 400 to 600 [nm]. The lower electrode layer 35 is constructed to have a rectangular top plan shape elongated in the row direction of the complementary data lines 50.

The dielectric film 36 is basically constructed to have a two-layered structure, in which there are laminated a silicon nitride film 36A deposited by the CVD method over (or on the surface of) the lower electrode layer (of the polycrystalline silicon film) 35 and a silicon oxide film 36B formed by oxidizing the silicon nitride film 36A under a high pressure. As a matter of fact, the dielectric film 36 is constructed to have a three-layered structure, in which a natural silicon oxide film (although not shown because it is thinner than 5 [nm]), the silicon nitride film 36A and the silicon oxide film 36B are sequentially laminated, because the natural silicon oxide film is formed on the surface of the polycrystalline silicon film of the lower electrode layer 35. Since the silicon nitride film 36A of the aforementioned dielectric film 36 is deposited by the CVD method, it can be formed under process conditions independent of the underlying layer with being influenced neither the crystal state nor the stepped shape of the underlying polycrystalline silicon film (i.e., the lower electrode layer 35). In short, the silicon nitride film 36A has a higher insulating breakdown voltage and a smaller number of defects per unit area than those of the silicon oxide film, which is formed by oxidizing the surface of the polycrystalline silicon film, and accordingly a very little leakage current. Moreover, the silicon nitride film 36A is featured by its a higher dielectric constant than that of the silicon oxide film. The silicon oxide film 38B can be formed of a very excellent film to improve the aforementioned characteristics of the silicon nitride film 36A better. Although will be described in more detail hereinafter, moreover,r the silicon oxide film 36B is oxidized under a high pressure (e.g., 1.5 to 10 [tolls]) so that it can be formed for a shorter oxidization or heat treatment time than that of the oxidization under a normal pressure.

The dielectric film 36 is formed on the upper surface and side walls of the lower electrode layer 35 to take an area in the vertical direction by making use of the side wall portions of the lower electrode layer 35. This increase of the area of the dielectric film 36 can improve the charge-storage of the information storing elements C having the stacked structure. The top plan shape of this dielectric film 36 is specified by that of the upper electrode layer 37 to have a substantially identical shape to that of the upper electrode layer 37.

This upper, electrode layer 37 is so formed over the lower electrode layer 35 as to cover it through the dielectric film 36. The upper electrode layer 37 is made integral with the upper electrode layer 37 of the information storing capacity elements C of the stacked structure of the adjoining other memory cells M. The upper electrode layer 37 is fed with the lower power source voltage of ½·Vcc. The upper electrode layer 37 is formed of the polycrystalline silicon film which is deposited by the CVD method, for example, and this polycrystalline silicon film is doped with an n-type impurity for reducing the resistance. The upper electrode layer 37 is made thinner than the aforementioned lower electrode layer 35. The upper electrode layer 37 is formed on its surface with an insulating film 38. This insulating film 38 is formed when the stepped portion of the underlying surface left unetched when the upper electrode layer 37 is treated is removed, as will be described hereinafter.

The dielectric film 36 of the information storing capacity elements C having the aforementioned stacked structure is formed over the inter-layer insulating film 33 at the regions other than the lower electrode layer 35. The inter-layer insulating film 33 is formed of the silicon oxide film which is deposited by the CVD method using the inorganic silane gases and the nitrogen oxide gases as its source gases, as has been described hereinbefore. In other words, the dielectric film 38, especially its underlying silicon nitride film 36A contacts with the inter-layer insulating film 33 having less film shrinkage so that the information storing capacity elements C of this stacked structure can prevent any breakage due to the stress of the dielectric film 36.

The aforementioned memory cell M are connected with another memory cell which is adjacent in the row direction, as shown in FIGS. 1, 5, 6 and 7. In other words, the two memory cells M adjoining in the row direction have one of their individual memory cell selecting MISFETs Qs integrated at its n-type semiconductor regions to form an inverted pattern at those portions. These two memory cells M are arranged in plurality in the column directions and at an offset of a half pitch in the row direction from the other two memory cells M which are adjacent thereto in the row direction.

With one n-type semiconductor regions 29 of the memory cell selecting MISFETs Qs of the memory cells M, as shown in FIGS. 1 and 5, there are connected the complementary data lines (DL) 50. These complementary data lines 50 are connected with the n-type semiconductor regions 29 through the connecting holes 40A which are formed in the interlayer insulating films 33 and 40.

These interlayer insulating film 40 is formed of an silicon oxide film which is deposited by the CVD method using inorganic silane gases and nitrogen oxide gases as its source gases, for example. The information storing capacity elements C having the aforementioned stacked structure are highly stepped partly because the lower electrode layer 35, the dielectric film 36 and the upper electrode layer 37 are sequentially superposed and partly because the lower electrode layer 35 is made thick. Thus, the interlayer insulating film 40 has its surface flattened. Specifically, the interlayer insulating film 40 has its stepped surface shape grown to an extent corresponding to the thickness of the lower electrode layer 35 so that its surface is flattened by burying the interlayer insulating film 40 between the aforementioned lower electrode layer 35 and another adjacent lower electrode layer 35. The regions of the minimum gap between the lower electrode layers 35 of the information storing capacity elements C of the stacked structure of the adjoining memory cells M are formed into a large stepped shape having an aspect ratio of 1 or more. The minimum gap between the lower electrode layers 35 is about 0.5 [μm]. Between these lower electrode layers 35, there are interposed the dielectric film 38 and the upper electrode layer 37. Thus, the interlayer insulating film 40 is made to have one half or more thickness of the minimum gap between the lower electrode layers 35 which interpose the dielectric film 36 and the upper electrode layer 37 inbetween. Moreover, the interlayer insulating film 40 is made so thick as to retain the insulating breakdown voltage and reduce the parasitic capacity. For example, the interlayer insulating film 40 is made to have a thickness of 250 to 350 [nm].

The complementary data lines 50 are made of a composite film having a two-layered structure, in which the polycrystalline silicon film 50A and the transition-metal silicide film 50B are sequentially laminated. The lower polycrystalline silicon film 50A is deposited by the CVD method to have a thickness of about 100 to 150 [nm], for example. The lower polycrystalline silicon film 50A is doped with an n-type impurity such as P for reducing the resistance. The lower polycrystalline silicon film 50A has an excellent step coverage at the underlying stepped portion so that it can reduce the defects such as the disconnections. An upper transition-metal silicide film 50B is deposited by the CVD (or sputtering method) to have a thickness of about 100 to 200 [nm], for example. The upper transition-metal silicide film 50B can reduce the resistance of the complementary data lines 50 to increase the operating speeds such as the information writing operations and the information reading operations. Moreover, the upper transition-metal silicide film 50B has an excellent step coverage in the underlying stepped portion so that it can reduce the defects such as the disconnections of the complementary data lines 50. The individual lower polycrystalline silicon film 50A and upper transition-metal silicide film 50B of the complementary data lines 50 have resistances to heat and oxidation. The complementary data lines 50 are made to have a winding width of about 0.6 [μ.m].

In the DRAM 1 constructed of the series circuit which is composed of: the memory cell selecting MISFETs Qs having the complementary data lines 50 connected with one of the n-type semiconductor regions 29; and the information storing capacity elements C of the stacked structure laminated sequentially thereover with the lower electrode layer 35, the dielectric film 36 and the upper electrode layer 37, the aforementioned complementary data lines 50 formed of the composite film, in which the polycrystalline silicon film 50A and transition-metal silicide film 50B having the interlayer insulating film 40 interposed inbetween and deposited by the CVD method are sequentially laminated, are formed over the upper electrode layer 37 of the information storing capacity elements C of the aforementioned stacked structure, and the thickness of the interlayer insulating film 40 between the upper electrode layer 37 and the complementary data lines 50 is larger than one half of the gap interposing the upper electrode layer 37 between the lower electrode layer 35 of the information storing capacity elements C of the stacked structure of the aforementioned memory cells M and the lower electrode layer 35 of the information storing capacity elements C of the stacked structure of other memory cells adjacent to the former lower electrode layer 35 with the minimum gap. Since, according to this construction, the transition-metal silicide film 50B over the aforementioned complementary data lines 50 causes the mutual diffusions of the impurity, the flattening of the underlying surface of the complementary data lines 50 cannot be promoted by effecting the flow using the BPSG film or the PSG film as the interlayer insulating film 40. By controlling the thickness of the interlayer insulating film 40 on the basis of the size of the gap between the lower electrode layers 35 adjacent to each other at the aforementioned minimum gap, however, the gap between the lower electrode layers 35 can be buried with the interlayer insulating film 40 to flatten the surface of the interlayer insulating film 40. As a result, the shortening between the complementary data lines 50, which might otherwise be caused by the residual left unetched at the stepped portions of the interlayer insulating film 40 between the lower electrode layers 35 when in the working of the complementary data lines 50, can be prevented to improve the electrical reliability.

Over the complementary data lines 50, there are constructed column select signal lines (YSL) 52 through an interlayer insulating film 51.

This interlayer insulating film 51 is constructed, for example, of a composite film of the two-layered structure, in which are sequentially laminated a silicon oxide film 51A deposited by the CVD method and a BPSG film 51B which is deposited by the CVD method. The lower silicon oxide film 51A is formed to prevent the B or P added to the upper BPSG film 51B from leaking to the lower layer. The lower silicon oxide film 51A is formed of a silicon oxide film which is deposited by the CVD method using the inorganic silane gases and the nitrogen oxide gases as its source gases, for example. The lower silicon oxide film 51A is formed to have a thickness of about 100 to 200 [nm], for example. The upper BPSG film 51B has its surface subjected to a flowing treatment so that it may be flattened. The BPSG film 51B is formed to have a thickness of about 250 to 350 [nm], for example.

The aforementioned column select signal lines 52 is made of a transition-metal film deposited by the sputtering method, for example, because it is deposited on the surface of the underlying interlayer insulating film 51. This transition-metal film is made of a W film, for example. The column select signal lines 52 are formed to have a thickness of about 350 to 450 [nm], for example. Since these column select signal lines 52 are formed in an upper layer different from the aforementioned complementary data lines 50, they are neither regulated by the wiring pitch of the complementary data lines 50 nor avoid the connected portions of the complementary data lines 50 and the memory cells M. In order words, the column select signal lines 52 can be extended wider than the wiring width of the complementary data lines 50 and substantially straight so that they can reduce the resistance. The column select signal lines 52 are formed to have a wiring width of about 2.0 [μm], for example.

Over the column select signal lines 52, there are constructed the shunting word lines (WL) 55 through an interlayer insulating film 53. The shunting word lines 55 are connected with the aforementioned word lines (WL) 27, although not shown, in predetermined regions corresponding to the individual several tens to hundreds memory cells M. The word lines 27 are divided into plurality in the extending direction in the memory cell arrays 11E, and the shunting word lines 55 are connected with the divided individual word lines 27. The shunting word lines 55 are enabled to reduce the resistance of the word lines 27 thereby to increase the selecting speed of the memory cells M in the information writing operations and the information reading operations.

The aforementioned interlayer insulating film 53 is constructed, as shown in FIG. 1, of a three-layered structure made of a composite film, in which a silicon oxide film (e.g., a deposited type insulating film) 53A, a silicon oxide film (e.g., an applied type insulating film) 53B and silicon oxide film (e.g., a deposited type insulating film) 53C are sequentially laminated. The silicon oxide film 53A under and the silicon oxide film 53C over the interlayer insulating film 53 are deposited by the conformal plasma CVD (which will be shortly referred to as the "C-CYD") method using tetraethoxysilane (TEOS: $Si(OC_2H_5)_4$) gases as its source gases.

The under silicon oxide film 53A and the upper silicon oxide film 53C thus deposited by the C-CVD method can be deposited at low temperatures (not higher than about 400 [°C.]) to have a high step coverage. These lower silicon oxide film 53A and upper silicon oxide film 53C are formed to have thicknesses of about 250 to 350 [nm], for example. The intermediate silicon oxide film 53B of the interlayer insulating film 53 is formed of a silicon oxide film which is baked after having been applied by the SOG (Spin On Glass) method. This intermediate silicon oxide film 53B is formed to flatten the surface of the interlayer insulating film 53. The intermediate silicon oxide film 53B is baked after the application and has its whole surface etched until it is buried only in the recess of the stepped portion. Specifically, the intermediate silicon oxide film 53B is so etched off, as will be described hereinafter, that it may not be left in the surfaces of the inner walls of connecting holes 53d in the interlayer insulating film 53. In other words, the intermediate silicon oxide film 53B is enabled to reduce the corrosion of the aluminum film or its alloy film of the aforementioned shunting word lines 55 by the water contained in the silicon oxide film 53B. This intermediate silicon oxide film 53B is applied to have a thickness of about 100 [nm], for example.

The aforementioned shunting word lines 55 are constructed of a composite film in which the transition-metal nitride film (or the transition-metal silicide film) 55A and the aluminum alloy film (or an aluminum film) 55B are sequentially laminated.

The lower transition-metal nitride film 55A is made of a TiN film acting as a barrier, for example, in case Cu is added to the upper aluminum alloy film 55B. On the other hand, the lower transition-metal nitride film 55A is made of a TiN film, for example, in case Si is added to the upper aluminum alloy film 55B. In this case, moreover, the lower transition-metal nitride film 55A is formed of a transition-metal silicide film such as $MoSi_2$. This lower transition-metal nitride film 55A is deposited by the sputtering method, for example, to have a thickness of about 100 [nm]. In case the TiN film is used as the lower transition-metal nitride film 55A, it has a crystal orientation of (200), as will be described in detail hereinafter.

The upper aluminum alloy film 55B has additional contents of Cu and Si. The Cu is added at about 0.5 [wt. %], for example, to reduce the migration phenomena. The Si is added at about 1.5 [wt. %], for example, to reduce the alloy spike phenomena. The aluminum alloy film 55B is deposited by the sputtering method, for example, to have a thickness of about 600 to 800 [nm].

The aforementioned shunting word lines 55 are formed to have a wiring width of about 0.7 [μm], for example.

Thus, the memory cell array 11E of the DRAM 1 of the present embodiment is constructed of a totally six-layered multi-wiring structure which is composed of a four-layered gate wiring structure and an overlying two-layered wiring structure. The former four-layered gate wiring structure is composed of the gate electrodes 27 (or the word lines 27) of the memory cell selecting MISFETs Qs, the lower electrode layer 35 and the upper electrode layer 37 of the information storing capacity elements C of the stacked structure, and the complementary data lines 50. The latter two-layered wiring structure is composed of the column select signal lines 52 and the shunting word lines The CMOSes composing the peripheral circuits of the aforementioned DRAM 1 are constructed, as shown at the righthand side of FIG. 1. The n-channel MISFETs Qn of the CMOS are formed in the principal surface portion of the p⁻-type well regions 22 in the region which is enclosed by the element separating insulating film 23 and the p-type channel stopper region 24. The n-channel MISFETs On are composed mainly of the p⁻-type well regions 22, the gate insulating film 26, the gate electrodes 27, and a pair of n-type semiconductor regions 29 and a pair of n⁺-type semiconductor region 32 providing the source regions and the drain regions, respectively.

The p-type channel stopper region 24 enclosing the n-channel MISFETs Qn are formed at a fabrication step other than the p-type channel stopper regions 25A enclosing the memory cell selecting MISFETs Qs of the aforementioned memory cell M. The p-type channel stopper region 24 is formed by introducing a p-type impurity with the use of a mask shared with the mask for forming the element separating insulating film 23 and by activating the p-type impurity by a heat treatment of forming the element separating insulating film 23. Since the p-type channel stopper region 24 is formed at the step shared with the element separating insulating film 23, the amount of diffusion of the p-type impurity into the side of the active regions is slightly large. Since, however, the n-channel MISFETs Qn are made to have a larger size than that of the memory cell selecting MISFETs Qs, the amount of diffusion of the aforementioned p-type impurity is relatively small. As a result, the n-channel MISFETs Qn have small influences of the narrow channel effect. On the contrary, none of the p-type impurity forming the p-type channel stopper region 24 is introduced into other than the principal surface portion of the inactive regions of the p⁻-type well regions 22 so that the impurity concentration of the principal surface of the active regions of the p⁻-type well regions 22 can be dropped. In short, the n-channel MISFETs Qn can have their threshold voltages dropped to reduce the substrate effect and to enhance the driving ability. Especially in case the n-channel MISFETs Qn are used as the output step circuit, a sufficient output signal level can be retained.

The aforementioned p⁻-type well regions 22, gate insulating fill 26, gate electrodes 27 and n-type semiconductor regions 29 are individually formed at the fabrication step shared with the aforementioned memory cell selecting MISFETs Qs to have substantially similar functions. In short, the n-channel MISFETs Qn are constructed to have the LDD structure.

The highly doped n⁺-type semiconductor region 32 is constructed to reduce the individual specific resistances of the source regions and the drain regions. The n⁻-type semiconductor region 32 is regulated by the side wall-spacers 31, which are formed in self-alignment on the side walls of the gate electrodes 26, so that it is formed in self-alignment with the gate electrodes 27. The side wall spacers 31 regulates the length, as taken in the gate length, of the n-type semiconductor regions 29 constructing the aforementioned LDD structure. Since the side wall spacers 31 are formed of a single layer in the regions formed with the n-channel MISFETs Qn, they can shorten the gate length of the n-type semiconductor regions 29. These n-type semiconductor regions 29 are lightly doped to have a high resistance but are made short so that the n-channel MISFETs Qn can improve the transmission conductance.

Of the n-channel MISFETs Qn, the n-channel MISFET Qn to be used in the input/output step circuit is interfaced at the single power source voltage Vcc (5 [V]) with the external devices so that it is driven at the power source voltage Vcc. This n-channel MISFET Qn is constructed to have a gate length of about 8 [μm], for example, to damp the intensity of the electric field in the vicinity of the drain regions. On the other hand, the n-channel MISFET Qn to be used in the internal circuits such as the direct peripheral circuits or the indirect peripheral circuit is driven by the lower power source voltage (about 3.3 [V]) so as to reduce the power consumption. This n-channel MISFET Qn is constructed to have a gate length within a range of about 0.8 to 1.4 [μm], for example, so as to increase the degree of integration, and the intensity of the electric field in the vicinity of the drain regions is damped by introducing the lower power source voltage Vcc. The individual n-channel MISFETs Qn of those input/output step circuits and the internal circuits are constructed to have a substantially identical structure merely by changing the gate lengths and the power sources to be used. In other words, each of the n-channel MISFETs Qn of the input/output step circuits and the internal circuits can be composed of the gate insulating film 26, the gate electrodes 27, the n-type semiconductor regions 29 and the n$^+$-type semiconductor region 32. Moreover, the individual n-channel MISFETs Qn can be constructed to have a substantially equal size in the gate length direction of the side wall spacers 31.

Thus, in the DRAM 1 including the n-channel MISFETs Qn of the LDD structure to be used as the input/output step circuits and the n-channel MISFETs Qn of the LDD structure to be used as the internal circuits: the used voltage of the n-channel MISFETs Qs of the input/output step circuits is higher than the used voltage of the n-channel MISFETs Qn of the internal circuits; the gate length of the n-channel MISFETs Qn of the input/output step circuits is made longer than that of the n-channel MISFETs Qn of the internal circuits; and the gate lengths of the lightly doped n-type semiconductor regions 29 forming the LDD structure of the n-channel MISFETs Qn of the input/output step circuits and the internal circuits are made substantially equal. Thanks to this construction, the n-channel MISFETs Qn are enabled to improve the hot carrier withstand voltage by enlarging the gate length thereby to reduce the aging of the threshold voltage and improve the electric characteristics. At the same time, The n-channel MISFETs Qn of the internal circuits are enabled to retain the hot carrier withstand voltage by using the lower power source voltage Vcc and to reduce the power consumption by using the lower power source voltage Vcc. Moreover, the n-channel MISFETs Qn of the input/output step circuit have their gate length enlarged, and the n-channel MISFETs Qn of the internal circuits are enabled to improve the hot carrier withstand voltage by using the lower power source voltage Vcc. As a result, the gate lengths of the lightly doped n-type semiconductor regions 29 forming the aforementioned LDD structure can be independently controlled so that the late lengths of the lightly doped n-type semiconductor regions 29 of the n-channel MISFETs Qn of the internal circuits (or the late lengths of the side wall spacers 31) can be made substantially equal. In short, the DRAM 1 can reduce the power consumption and improve the hot carrier withstand voltage, and the number of steps for fabricating the n-channel MISFETs Qn can be reduced, as will be described hereinafter.

With the n$^-$-type semiconductor region 32 of the n-channel MISFETs Qn thus far described, there are connected wiring lines 52 through connecting holes 51C which are formed in the interlayer insulating film 40 and the interlayer insulating film 51. The wiring lines 52 are formed of the lower wiring line of the two-layered wiring structure which is made common with the aforementioned column select signal lines 52.

The p-channel MISFETs Qp of the CMOS are constructed in the principal surface portions of the n$^-$-type well regions 21 within regions enclosed by the element separating insulating film 23. The p-channel MISFETs Qp are composed mainly of the n$^-$-type well region 21, the gate insulating film 26, the late electrodes 27, and a pair of p-type semiconductor regions 30 and a pair of p$^+$-type semiconductor region 39 providing the source regions and the drain regions.

The n$^-$-type well region 21, the gate insulating film 28 and the gate electrodes 27 are constructed to have functions substantially similar to those of the memory cell selecting MISFETs Qs and the n-channel MISFETs Qn.

The lightly doped p-type semiconductor regions 30 are composed of the p-channel MISFETs Qp having the LDD structure. Densely doped p$^+$-type semiconductor regions 39 are formed in self-alignment with the side wall spacers 31 and 33C which are formed on and in self-alignment with the side walls of the gate electrodes 27. In other words, the densely doped p$^+$-type semiconductor regions 39 of the p-channel MISFETs Qp are formed to have a two-layered structure in which the side wall spacers 33C are laminated on the side walls of the side wall spacers 31. These side wall spacers 31 and 33C are constructed to have a longer gate length to an extent corresponding to the side wall spacers 33C than that of the side wall spacers 31 of the n-channel MISFETs Qn. More specifically, the side wall spacers 31 and 33C are enabled to reduce the amount of diffusion of the p$^+$-type semiconductor regions 39 into the channel forming regions of the p-type impurity by having their gate lengths enlarged, so that they can reduce the short channel effect of the p-channel MISFETs Qp while retaining the effective channel length. Since the p-type impurity has a larger diffusion coefficient than that of the n-type impurity, the p-channel MISFETs Qp are constructed to have the aforementioned structure.

In the DRAM 1 including the n-channel MISFETs Qn of the LDD structure and the p-channel MISFETs Qp of the LDD structure, the gate lengths of the side wall spacers 31 and 33C formed on and in self-alignment with the side walls of the gate electrodes of the p-channel MISFETs Qp are made longer than the gate lengths of the side wall spacers 31 which are on and in self-alignment with the gate electrodes 27 of the n-channel MISFETs Qn. Thanks to this construction, the gate lengths of the side wall spacers 31 of the n-channel MISFETs Qn can be made shorter than the gate lengths of the lightly doped n-type semiconductor regions forming the LDD structure. As a result, the transmission conductance of the n-channel MISFETs Qn can Be improved to increase the operating speed. At the same time, the gate lengths of the side wall spacers 31 and 33C of the p-channel MISFETs Qp can be elongated to reduce the go-round of the densely doped p$^+$-type semiconductor regions 39 to the channel forming regions thereby to reduce the short channel effect of the p-channel MISFETs Qp so that a high degree of integration can be achieved.

With the p$^+$-type semiconductor regions 39 of the p-channel MISFETs Qp, there are connected with the wiring lines 52 through the aforementioned connecting holes 51C.

As shown at the righthand side of FIG. 1, the wiring lines 52 are connected with the upper wiring lines 55 through a transition-metal film 54 which is buried in connecting holes 53D formed in the interlayer insulating film 53. The wiring lines 55 extending over the interlayer insulating film 53 are formed of the upper wiring layer having a two-layered wiring structure which, is shared with the aforementioned shunting word lines 55. The transition-metal film 54 buried in the connecting holes 53D is formed of a W film which is deposited by the selective CVD method selectively over the surfaces of the wiring lines 52 exposed from the insides of the connecting holes 53D. The transition-metal film 54 is formed to improve the step coverage in the stepped shape which is formed by the connecting holes 53D of the wiring lines 55.

The wiring lines 55 (including the shunting word lines 55) are formed of a composite film in which the transition-metal nitride film 55A and the aluminum alloy film 55B are sequentially laminated, as has been described hereinbefore. The wiring lines 55 have their signal transmission rate determined mainly by the upper aluminum alloy film 55B. In case Si is added to the upper aluminum alloy film 55B, the lower transition-metal nitride film (or the transition-metal silicide film) 5SA of the wiring lines 55 is formed all over those regions between the upper aluminum alloy film 55B and the interlayer insulating film 53, which include the connected portions of the wiring lines 55 and the transition-metal film 54 buried in the connecting holes 53D. In short, the wiring lines 55 have their underlying material below the upper aluminum alloy film 55B homogenized at the portions of the connecting holes 53D and the interlayer insulating film 53. On the other hand, the lower transition-metal nitride film 55A of the wiring lines 55 has a higher migration withstand voltage than that of the upper aluminum alloy film 55B. In short, even if the aluminum alloy film 55B is broken due to the migration phenomena, the signals can be transmitted through the lower transition-metal nitride film 55A so that the defects such as the disconnections of the wiring lines 55 can be reduced.

Thus, in the DRAM 1 for connecting the transition-metal film 54, which are buried by the selective CVD method in the connecting holes 53D formed in the underlying interlayer insulating film 53 and the aluminum alloy film 55B extending over the interlayer insulating film 53 and containing the Si added thereto, the transition-metal nitride film (or the transition-metal silicide film) 55A is formed between the aluminum alloy film 55B and the underlying interlayer insulating film 53 and between the transition-metal film 54 buried in the connecting holes interlayer insulating film 53 and the aluminum alloy film 55B. Thanks to this construction, the underlying layer of the aluminum alloy film 55B can be homogenized over the transition-metal film 54 buried in the connecting holes 53D and the interlayer insulating film 53 so that the Si added to the aluminum alloy film 55B can be less deposited at the interface between the transition-metal film 54 buried in the connecting holes 53D and the aluminum alloy film 55B thereby to reduce the resistance of the aforementioned interface. Even if, moreover, the aluminum alloy film 55B is broken due to the migration phenomena, for example, the transition-metal nitride film 55A formed below the aluminum alloy film 55B can connect the aluminum alloy film 55B through those broken portions to reduce the defects of the disconnections of the wiring lines 55.

In case the Cu is added to the upper aluminum alloy film 55B, the wiring lines 55 (including the shunting word lines 55) are formed with the transition-metal nitride film 55A at the connected portions (including their interface portions) at least between the aluminum alloy film 55B and the transition-metal film 54 buried in the connecting holes 53D. The transition-metal nitride film 55A have actions as a barrier, as has been described hereinbefore. In short, the wiring lines 55 are formed to prevent the alloying reaction due to the mutual diffusions between the aluminum of the upper aluminum alloy film 55B and the W of the transition-metal film 54 buried in the connecting holes 53D.

Thus, in the DRAM 1 for connecting the transition-metal film 54 buried by the selective CVD method in the connecting holes 53D formed in the underlying interlayer insulating film 53 and the aluminum alloy film 55B extending over the interlayer insulating film 53 and containing the Cu added thereto, the transition-metal nitride film 55A having the barrier action is sandwiched between the transition-metal film 54 buried in the connecting holes 53D and the aluminum alloy film 55B. Thanks to this construction, in the interface between the transition-metal film 54 buried in the connecting holes 53D and the aluminum alloy film 55B, the alloying reaction due to the mutual diffusions of the transition metal and the aluminum can be prevented to reduce the resistance of the aforementioned interface.

The lower transition-metal nitride film 55A of the wiring lines 55 to be positively used has a crystal orientation of (200), as has been described hereinbefore. FIG. 8 presents the relations between the target voltage [KW] and the specific resistances [µΩ-cm] when in the sputtering treatment. Data (A) and (B) plot the distances of the TiN film, which is deposited by the sputtering method on the surface of the semiconductor wafer, from the center of the semiconductor wafer. The data (A) indicates the characteristics of the TiN film for the 0 [µm] from the center of the semiconductor wafer, i.e., at the center of the semiconductor wafer. The data (B) indicates the characteristics of the TiN film for the 50 [µm] from the center of the semiconductor wafer.

As seen from the data (B) in FIG. 8, the TiN film has the lower specific resistance for the longer distance from the center of the semiconductor wafer. FIG. 9 (plotting the relation between the incidental angle of an X-ray and the X-ray diffraction intensity) presents the result of the experiment that the TiN film was exposed to the X-ray diffraction spectrum in a region C having a high specific resistance such as about 460 [µΩQ -cm]. On the other hand, FIG. 10 (plotting the relation between the incidental angle of an X-ray and the X-ray diffraction intensity) presents the result of the experiment that the TiN film was exposed to the X-ray diffraction spectrum in a region D having a low specific resistance such as about 400 [µΩ-cm]. In the region having the high specific resistance, as shown in FIG. 9, the TiN film has mixed crystal orientations of (111) and (200). As shown in FIG. 10, on the contrary, the TiN film has a single crystal orientation of (200). In other words, the TiN film having the crystal orientation of (200) has a lower specific resistance than that of the TiN film having the mixed crystal orientations of (111) and (200), as shown in FIG. 8, so that it has physical properties of the higher film density. As a result, the TiN film having the crystal orientation of (200) is featured by an excellent heat resistance (acting as the barrier) and can reduce the deposition of the Si.

Thus, the lower transition-metal nitride film 55A of the aforementioned (33-18) wiring lines 55, namely, at least the transition-metal nitride film 55A between the transition-metal film 54 buried in the aforementioned connecting holes 53D and the upper aluminum alloy film 55B is made of the TiN film having the crystal orientation of (200). Thanks to this construction, the TiN film having the crystal orientation of (200) can have a lower deposition of the Si than that of the TiN film having the crystal orientation of (111) or the TiN film having the mixed crystal orientation of (111) and (200), so that it can reduce the resistance of the aforementioned interface (i.e., the interface between 54 and 54B) the more. Because of the lower specific resistance than that of the TiN film having the-above-specified other crystal orientations, moreover, the resistance at the interface can be reduced the more. Because of the higher film density, still moreover, the barrier action can be improved the better.

Figure 15:
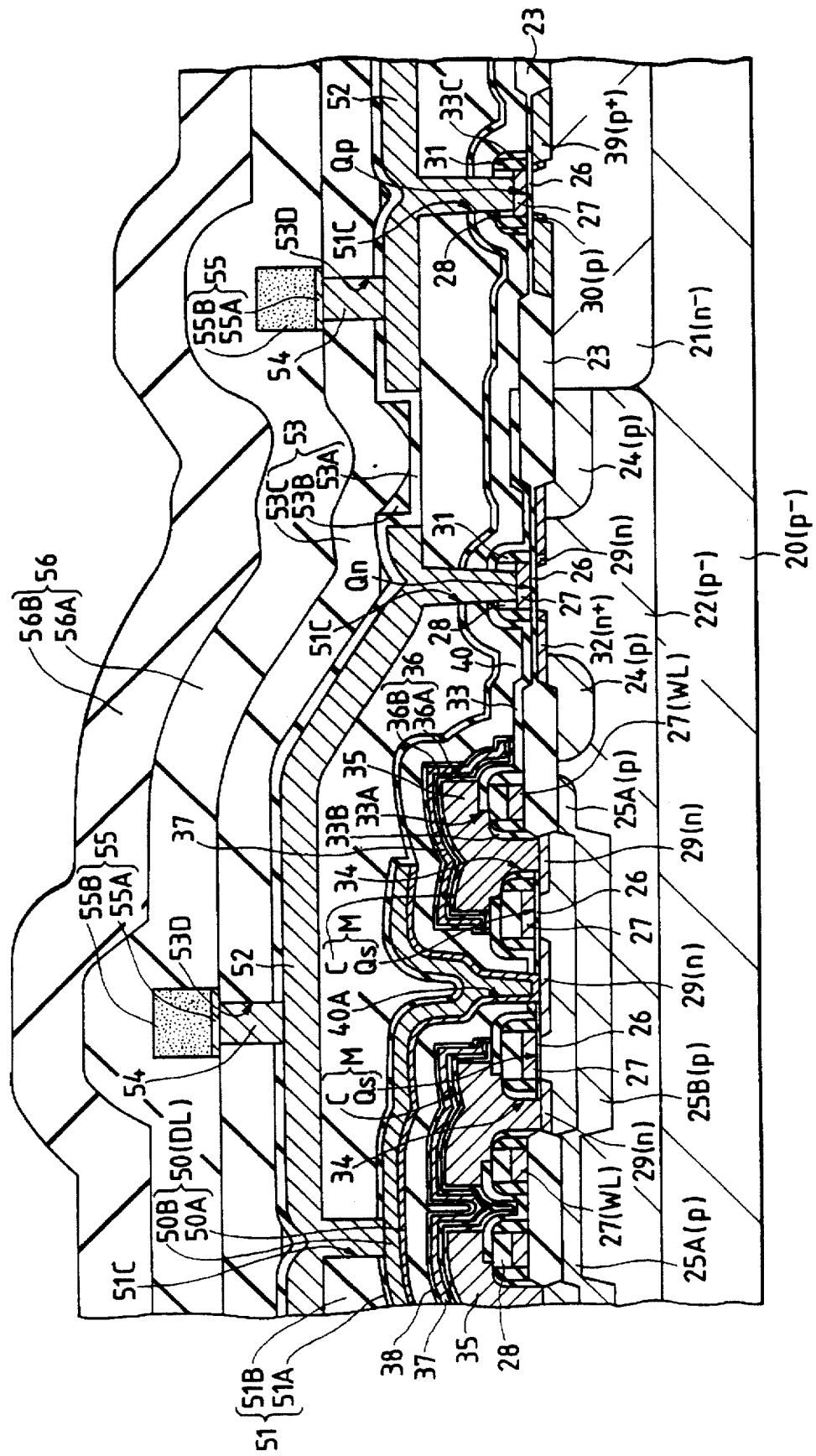
FIG. 15 is a section showing an essential portion at another position of the aforementioned DRAM.

As shown in FIG. 1 and FIG. 15 (presenting an essential section showing the sectional structure at a position different from that of FIG. 1), in the regions of the peripheral circuits of the DRAM 1, the lower wiring lines of the two-layered wiring structure are formed of the aforementioned transition-metal film, because their wiring width is shrunk by the high integration so that the migration withstand voltage cannot be retained by the aluminum film or its alloy film. The peripheral circuits, especially the direct peripheral circuits are arranged with the n-channel MISFETs Qn and the p-channel MISFETs Qp in a manner to correspond to the array pitch of the memory cells M of the memory cell arrays 11E so that the wiring lines 52 have strict layout rules.

In the regions of the peripheral circuits, on the other hand, the mutual diffusions of the impurities are caused in case the n⁺-type semiconductor region 32 of the n-channel MISFETs Qn and the p⁺-type semiconductor regions 39 of the p-channel MISFETs Qp are connected or in case the wiring lines are formed of the transition-metal silicide film or its laminated film (e.g., the same conducting layer as that of the complementary data lines 50). Therefore, the wiring lines 52 used are made of not the same conducting layer as that of the complementary data lines 50 used in the aforementioned memory cell arrays 11E but the aforementioned transition-metal film freed from the aforementioned mutual diffusions of the impurities.

Thus, in the DRAM 1 including: the complementary data lines, the shunting word lines and the column select signal lines over the memory cell arrays 11E; and the two wiring layers in the regions of the peripheral circuits of the memory cell arrays 11E: the complementary data lines 50 over the memory cell arrays 11E are formed of the composite film, in which the polycrystalline silicon film 50A and the transition-metal silicide film 50B deposited by the CVD method are sequentially laminated; the aforementioned column select signal lines 52 are formed of the transition-metal film which is deposited over the complementary data lines 50 by the sputtering method; the aforementioned shunting word lines 55 are formed of the aluminum alloy film 55B (including the transition-metal nitride film 55A) deposited by the sputtering method; the same conducting layer (55) as the shunting word lines 55 and the same conducting layer (52) as the underlying column select signal lines 52 are connected through the transition-metal film 54 which is buried by the selective CVD method in the connecting holes 53D formed in the interlayer insulating film 53 inbetween; the upper wiring lines 52 of the two wiring layers in the regions of the aforementioned peripheral circuits are formed of the same conducting layer as that of the aforementioned column select signal lines 52 whereas the upper wiring lines 55 are formed of the same conducting layer as that of the aforementioned shunting word lines 55; and the lower wiring lines 52 and upper wiring lines 55 of the two wiring line layers are connected through the transition-metal film 54 which is buried in the connecting holes 53D by the aforementioned selective CVD method. Thanks to this construction, the following effects can be achieved:

(1) The complementary data lines 50 over the aforementioned memory cell arrays 11E can reduce the defects such as the disconnections because they are excellent in the resistances to the heat treatment and the oxidation and because they have a high step coverage for the polycrystalline silicon film 50A deposited by the CVD method the lower layer. Moreover, the complementary data lines 50 can improve the step coverage better to reduce the defects such as the disconnections because their upper transition-metal silicide film 50B is deposited by the CVD method.

(2) The aforementioned column select signal lines 52 are formed over the complementary data lines 50 so that they can be extended substantially straight without bypassing the connected portions (i.e., the connecting holes 40A) between the complementary data lines 50 and the memory cells M. As a result, the signal transmission rate can be raised to increase the speeds of the information writing operations and the information reading operations. At the same time, the column select signal lines 52 are formed of a layer different from that of the complementary data lines 50 so that the wiring gap between the lower complementary data lines 50 can be shrunk to improve the degree of integration.

(3) The wiring lines 55 have a lower resistance than the lower complementary data lines 50 and the column select signal lines 52 so that their resistance can be reduced to increase the speeds of the information writing operations and the information reading operations.

(4) The transition-metal film 54 for connecting the same conductive, layer 52 as the aforementioned column select signals 52 and the same conducting layer as the shunting word lines 55 can compensate the step coverage at the connected portions of the same conducting layer (55) as the upper shunting word lines to reduce the defects such as the disconnections of the conducting layer (55). The transition-metal film 54 is enabled to reduce the stress with the underlying transition-metal film (52) by forming the underlying conducting layer (52) of the same transition-metal film (52).

(5) The lower wiring lines 52 of the regions of the aforementioned peripheral circuits, especially the direct peripheral circuits)e.g., the sense amplifier circuits or the decoder circuits) of the aforementioned memory cell arrays 11E are formed of the transition-metal film so that their migration withstand voltage can be raised to shrink the width of the wiring lines 52 (by aligning them with the arrangement pitch of the memory cells M) thereby to improve the degree of integration.

As shown in FIG. 1, the shunting word lines 55 and the wiring lines 55 of the DRAM 1 are overlaid by a passivation film 56. This passivation film 56 is formed of a composite film in which a silicon oxide film 56A and a silicon nitride film 56B are sequentially laminated.

The lower silicon oxide film 56A is constructed to flatten its surface, i.e., the underlying surface of the upper silicon nitride film 56B. The lower silicon oxide film 56A is deposited at such a temperature as to leave the aluminum alloy film 55B unmelted, because the aluminum alloy film 55B is formed over the underlying shunting word lines 55 and wiring lines 55. Specifically, the lower silicon oxide film 56A is deposited by the C-CVD method using the tetraethoxysilane gases as its source gases, for example. Since the step coverage at the stepped portions of the underlying surface is excellent, the lower silicon oxide film 56A is formed to have a thickness as large as or more than one half between the shunting word lines 55 or the wiring lines 55 in the regions, in which the aspect ratio of the gap between the shunting word lines 55 or the wiring lines 55 to their film thickness, so that it may have its surface flattened. The regions having the aforementioned aspect ratio of 1 or more correspond to or near the minimum wiring gap, and the step coverage of the aforementioned upper passivation film 56 raises no problem in the regions having the aspect ratio of 1 or less. Since the shunting word lines 55 are formed to have a wiring gap of about 0.7 [μm], the aforementioned 56a are formed to have a thickness of about 350 to 500 [nm].

The upper silicon nitride film 56B of the aforementioned passivation film 56 is formed to improve the moisture resistance. The silicon nitride film 58B is deposited by the plasma CVD method, for example, to have a thickness of about 1,000 to 1,200 [nm]. This upper silicon nitride film 56B can prevent any formation of cavities due to the growth of the overhang shape at the underlying stepped portions, because the lower silicon oxide film 56A has its surface flattened.

Thus, in the DRAM 1 having the passivation film 56 formed over the wiring lines 55 formed mainly of the aluminum alloy film 55B, the passivation film 56 is formed of the composite film, in which the silicon oxide film 56A deposited by the C-CVD method using the tetraethoxysilane gases as its source gases and the silicon nitride film 56B deposited by the plasma CVD method are sequentially laminated, and the lower silicon oxide film 56A of the passivation film 56 is formed to have a thickness equal to or more than one half of the gap of the wiring lines 55 of the regions, in which the aspect ratio of the gap of the wiring lines 55 and the thickness of the wiring lines 55 is 1 or more. Thanks to this construction, the lower silicon oxide film 56A of the passivation film 56 can be deposited at such a low temperature as to leave the aluminum alloy film 55B of the wiring lines 55 unmelted and at a high step coverage, so that the step shape formed of the wiring lines 55 can be flattened. The upper silicon nitride film 56B of an excellent moisture resistance of the aforementioned passivation film 56 can be formed without forming any cavity due to the aforementioned stepped shape. As a result, no cavity is formed in the upper silicon nitride film 56B of the passivation film 56 is formed so that neither the cracking of the passivation film 56 nor the water reservation in the cavity can be caused to improve the moisture resistance of the passivation film 56.

Figure 12:
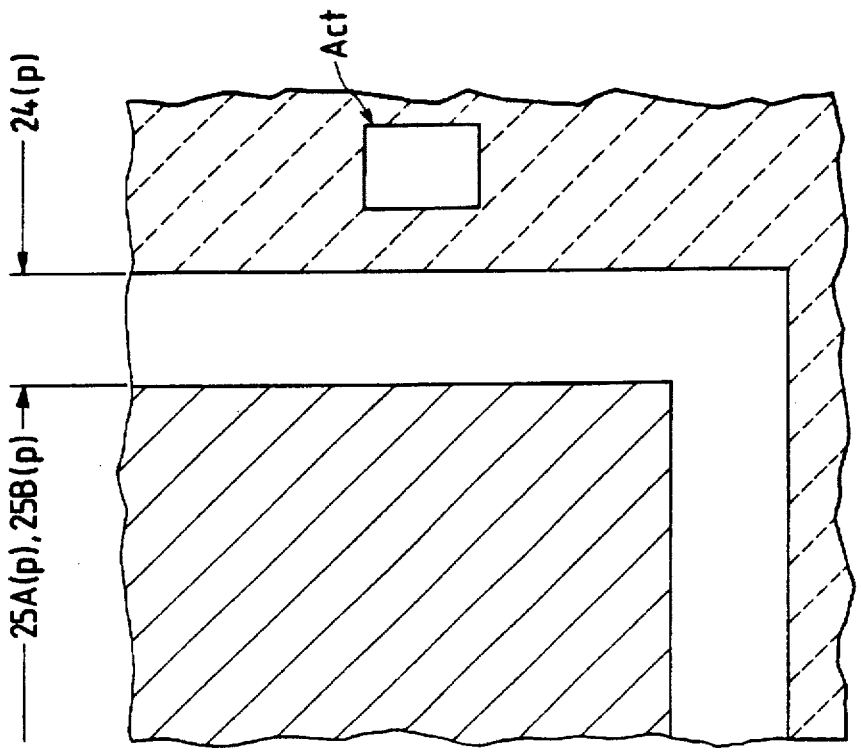
FIGS. 12 and 14 are enlarged top plan views showing an essential portion of the aforementioned boundary region.
Figure 11:
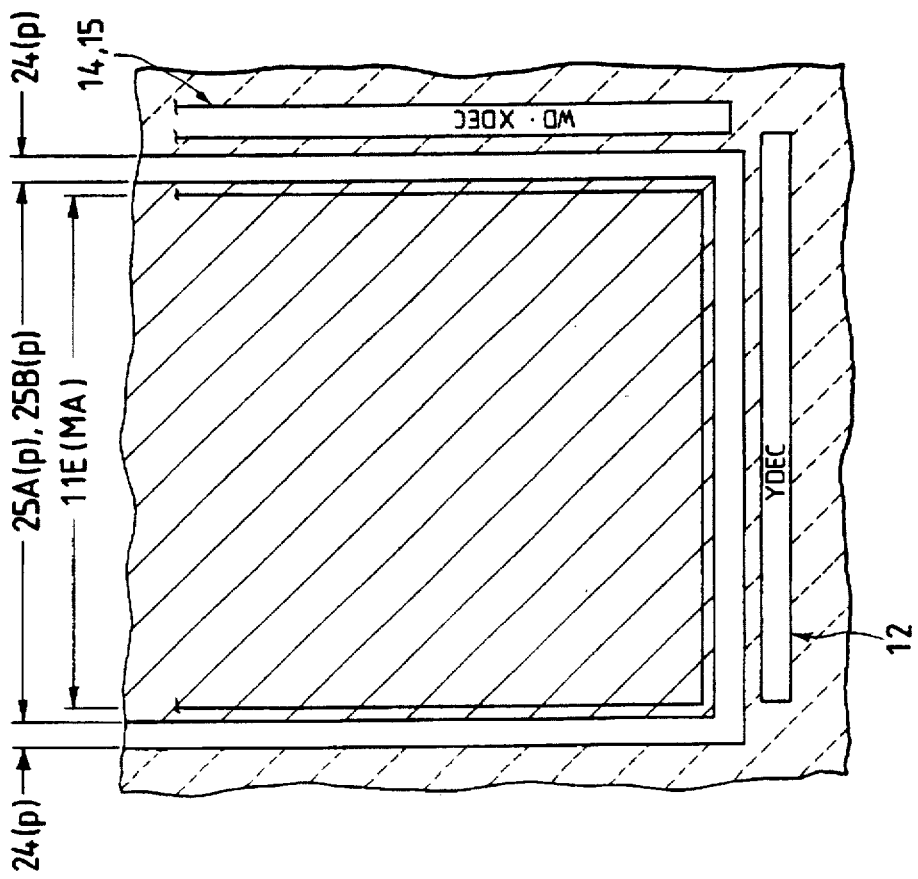
FIGS. 11 and 13 are schematic top plan views showing the boundary regions between the aforementioned memory cell array and a peripheral circuit.

The boundary regions of the memory cell arrays (MA) 11E and the peripheral circuits of the aforementioned DRAM 1 are constructed, as shown in FIG. 11 (presenting a schematic top plan view) and FIG. 12 (presenting an enlarged top plan view of the essential portion of FIG. 11). Specifically, the p-type channel stopper regions 25A, which are formed in the inactive regions of the memory cell array 11E, and the p-type channel stopper regions 24, which are formed in the inactive regions of the peripheral circuits, are not overlapped at the aforementioned boundary regions. Since the p-type channel stopper regions 25A of the memory cell arrays 11E and the p-type channel stopper regions 24 of the peripheral circuits are formed at different fabrication steps, they are not overlapped at the boundary regions to drop the impurity concentration of the inactive regions or the boundary regions. As a result, it is possible to raise the pn junction withstand voltage between each of the n-type semiconductor regions 29 and $n^+$-type semiconductor region 32 formed in the active regions and the principal surface portions of the boundary regions of the $p^-$-type well regions 22. Since, however, the principal surface of the inactive regions of the boundary regions of the $p^-$-type well regions 22 has a low impurity concentration, the threshold voltage of the parasitic MOS is liable to be dropped to form the n-type inverted layer. This n-type inverted layer is formed to have a large area to enclose the memory cell array 11E. If an active region is present across or near the aforementioned boundary regions, its area is increased to an extent corresponding to the area of the aforementioned n-type inverted layer. This apparently augments the pn-junction area to increase the amount of the leakage current at the pn junction. As shown in FIG. 12, therefore, the n-channel MISFET Qn of an active region Act, e.g., the peripheral circuit is isolated from the boundary region (nor across the boundary region). This isolation is sized by considering at least the masking displacement at the fabrication step and the amount of diffusions of the n-type impurity of the n-type semiconductor regions 29 and the $n^+$-type semiconductor region 32.

Figure 14:
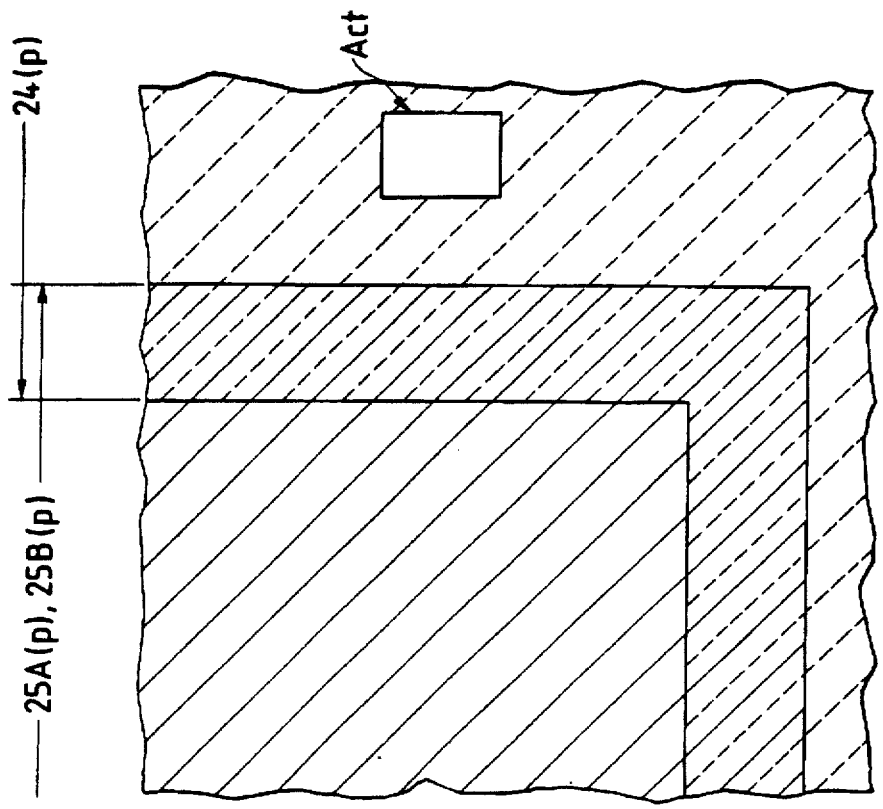
Figure 13:
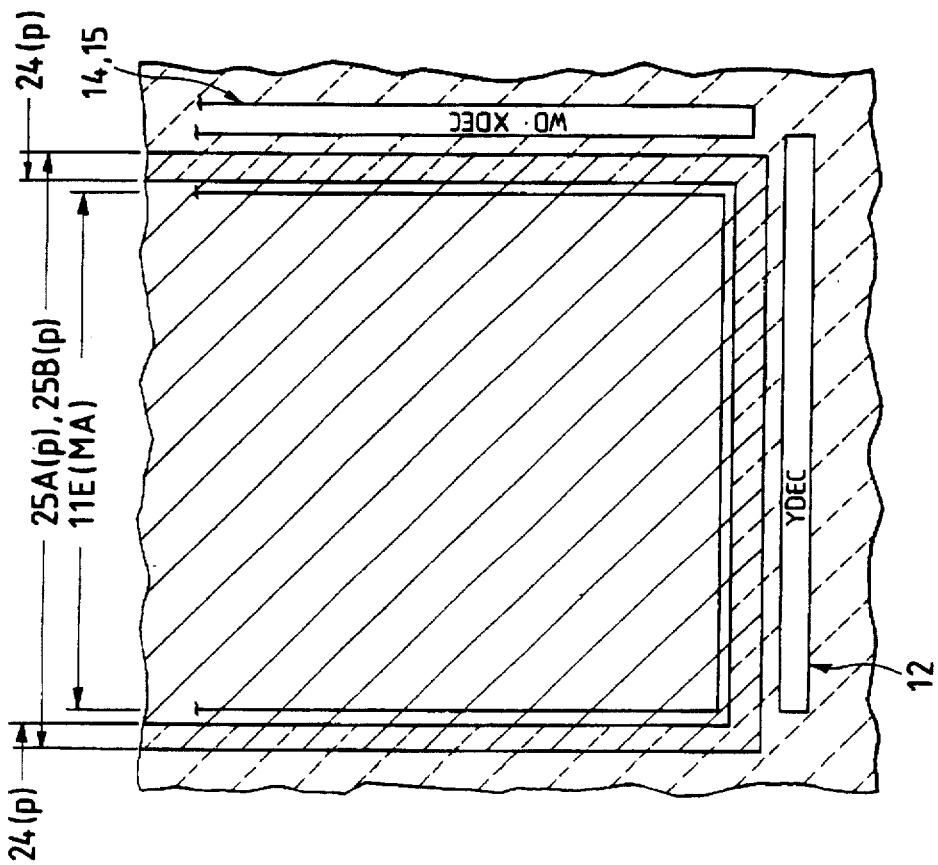

On the other hand, the boundary regions between the aforementioned memory cell array (MA) 11E and the peripheral circuit may be constructed, as shown in FIG. 13 (presenting a schematic top plan view) and FIG. 14 (presenting an enlarged top plan view showing the essential portion of FIG. 13). Specifically, the p-type channel stopper regions 25A of the memory cell array 11E and the p-type channel stopper regions 24 of the peripheral circuit are superposed at the aforementioned boundary region. This superposition corresponds to at least the masking allowance at the fabrication step. In case the p-type channel stopper regions 24 and 25A are superposed, the impurity concentration of the boundary region of the inactive regions is increased. If the impurity concentration of the principal surface portion of the inactive region of the $p^-$-type well regions 22 is raised, the threshold voltage of the parasitic MOS can be raised to improve the isolating ability but to deteriorate the pn junction withstand voltage between the n-type semiconductor regions 29 and the $n^+$-type semiconductor region 32 formed in the boundary region and the active region. As shown in FIG. 14, therefore, the n-channel MISFET Qn of the active region Act, e.g., the peripheral circuit is isolated from the boundary region. This isolation is sized by considering at least the masking displacement at the fabrication step and the amounts of diffusions of the n-type impurities of the p-type channel stopper regions 24 and 25A and the n-type impurities of the n-type semiconductor regions 29 and the $n^+$-type semiconductor region 32.

The aforementioned boundary region is usually arranged with a not-shown guard ring region for preventing the minority carriers generated by the substrate potential generator circuit (i.e., the $V_{BB}$ generator circuit) 1703 from migrating into the memory cell array 11E. This guard ring region is arranged around the memory cell array 11E and is composed of the n-type semiconductor regions 29 or the $n^+$-type semiconductor region 32. The guard ring region is formed in the memory cell array 11E (isolated from the boundary region) or inside of the boundary region of each of the aforementioned p-type channel stopper regions and 24. Above the guard ring region, there are formed either the lower electrode layers 35 and the upper electrode layers 37 of the information storing capacity elements C of the stacked structure of the aforementioned memory cells or a step damping layer formed of the same conducting layer as the former layers. This step damping layer damps the stepped shape, which is formed between the memory cell array 11E and the peripheral circuit, to improve the treating accuracy of the upper wiring lines such as the column select signal lines 52 and the shunting word lines 55 and to reduce the defects such as the disconnections.

Thus, in the DRAM 1 arranged with the n-channel MISFETs Qn of the memory cells M and the peripheral circuits in the different active regions of the $p^-$-type well regions 22, which are enclosed by the p-type channel stopper regions formed in the principal surface portions of the inactive regions of the $p^-$-type well regions 22, the p-type channel stopper regions 25A enclosing the memory cells M and the p-type channel stopper regions 24 enclosing the n-channel MISFETs Qn of the peripheral circuits are independently formed at the different fabrication steps, and the individual boundary regions of the p-type channel stopper regions 24 are not arranged with the active regions Act such as the n-channel MISFETs Qn of the memory cells M and the peripheral circuits. Thanks to this construction, in case the p-type channel stopper regions 25A and the p-type channel stopper regions 24 are isolated by the aforementioned boundary region, this boundary region is liable to be formed with a large n-type inverted layer corresponding to the area thereof. If the active region Act is present in the boundary region, the areas of the $n^-$-type semiconductor regions 29 and the $n^+$-type semiconductor region 32 to be formed in the active region is apparently increased to an added extent of the aforementioned n-type inverted layer so that the amount of the leakage current is augmented at the junction between the $p^-$-type well regions 22 and the n-type semiconductor regions 29 or the $n^+$-type semiconductor region 32. Since, however, the active region Act is not arranged in the aforementioned boundary region, the amount of the leakage current can be reduced at the aforementioned junction. In case, on the other hand, the p-type channel stopper regions 25A and the p-type channel stopper regions 24 are superposed at the boundary region, this region has its impurity concentration increased. Since, however, the boundary region is not arranged with the active region Act, it is possible to improve the pn junction withstand voltage between the $p^-$-type well regions 22 and the n-type semiconductor regions 29 or the $n^+$-type semiconductor region 32.

Next, the specific process for fabricating the aforementioned DRAM 1 will be briefly described with reference to FIGS. 16 to 49 (presenting sectional views showing the essential portions at the individual fabrication steps).

Fist of all, the $p^-$-type semiconductor substrate 20 made of single crystalline silicon is prepared.

[Well Forming Step]

Next, there are sequentially laminated over the principal surface of the aforementioned $p^-$-type semiconductor substrate 20 a silicon oxide film 60 and a silicon nitride film 61. The silicon oxide film 60 is formed by the steam oxidization method at a temperature as high as about 900 to 1,000 [°C.] to have a thickness of about 40 to 50 [nm]. This silicon oxide film 60 is used as a buffer layer. The latter silicon nitride film 61 is used as an impurity introducing mask and an non-oxidizable mask. This silicon nitride film 61 is deposited by the CVD method, for example, to have a thickness of about 40 to 60 [nm].

Next, the silicon nitride film 61 is removed from the $n^-$-type well region (21) to form the mask. This formation of the mask (61) is accomplished by using the photolithography technology (i.e., the technology for forming a photoresist mask) and the etching technology.

Next, as shown in FIG. 16, the aforementioned mask (61) is used to dope the principal surface portion of the $p^-$-type semiconductor substrate 20 with an n-type impurity 21n through the silicon oxide film 60. The n-type impurity 21n used is P having an impurity concentration of $10^{13}$ [atoms/ cm$_2$], for example, and is introduced by the ion implantation having an energy of about 120 to 130 [KeV].

Next, the aforementioned mask 16 is used, as shown in FIG. 17, to grow the silicon oxide film 60 exposed from the mask, thereby to form a thicker silicon oxide film 60A. This silicon oxide film 60A is formed only in the $n^-$-type well region (21) and is used as the mask for removing the aforementioned mask (61) and the impurity introducing mask. The silicon oxide film 60A is formed by the steam oxidation method at a temperature as high as about 900 to 1,000 [°C.] until it has a thickness of about 110 to 130 [nm], for example. The heat treatment step for forming this silicon oxide film 60A diffuses the introduced n-type impurity 21n slightly.

Next, the aforementioned mask (61) is selectively removed with hot phosphoric acid, for example.

Figure 18:
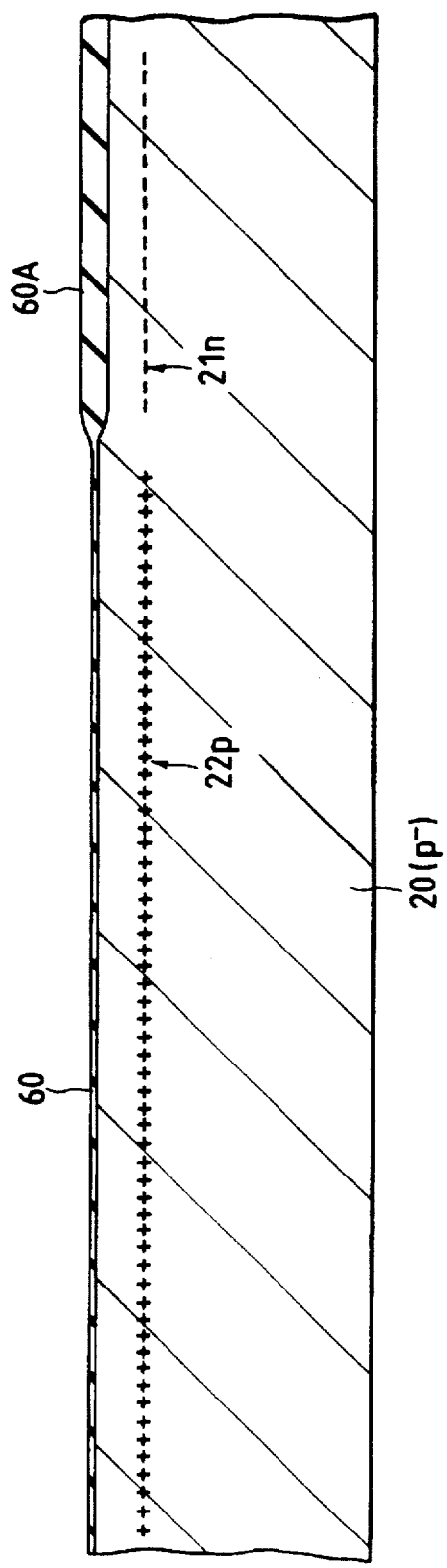

Next, as shown in FIG. 18, the aforementioned silicon oxide film 60A is used as the impurity introduction mask to dope the principal surface portion of the $p^-$-type semiconductor substrate 20 with a p-type impurity 22p through the silicon oxide film 60. This p-type impurity 22p used is B (or BF$_2$) at an impurity concentration of about $10^{12}$ to $10^{13}$ [atom/cm$^2$ and is implanted by the ion implantation with the energy of about 20 to 80 [KeV]. This p-type impurity 22p is not introduced into the region to be formed with the $n^-$-type well region (21), because the silicon oxide film 60A is made thick.

Figure 19:
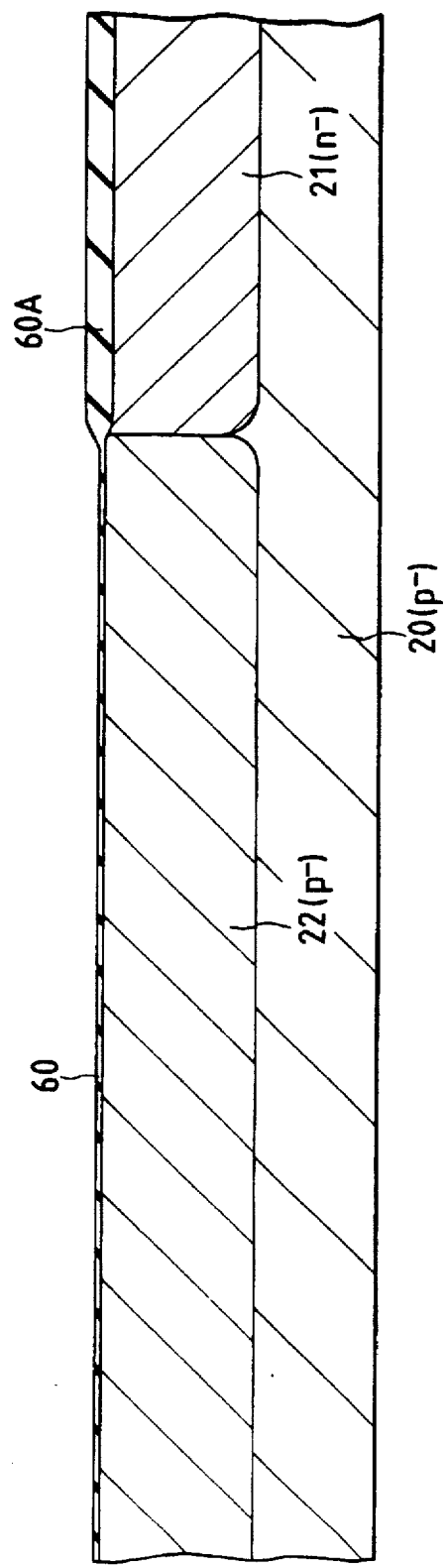

Next, the aforementioned n-type impurity 21n and p-type impurity 22p are individually extended and diffused to form the $n^-$-type well regions 21 and the $p^-$-type well regions 22, as shown in FIG. 19. These $n^-$-type well regions 21 and $p^-$-type well regions 22 are formed by the heat treatment in the atmosphere at a temperature as high as about 1,100 to 1,300 [°C.]. As a result, the $p^-$-type well regions 22 is formed in self-alignment with the $n^-$-type well regions 21.

[Separate Region Forming Step]

Next, the aforementioned silicon oxide films 60 and 60A are removed to expose the individual principal surfaces of the $n^-$-type well regions 21 and the $p^-$-type well regions 22 to the outside.

Figure 20:
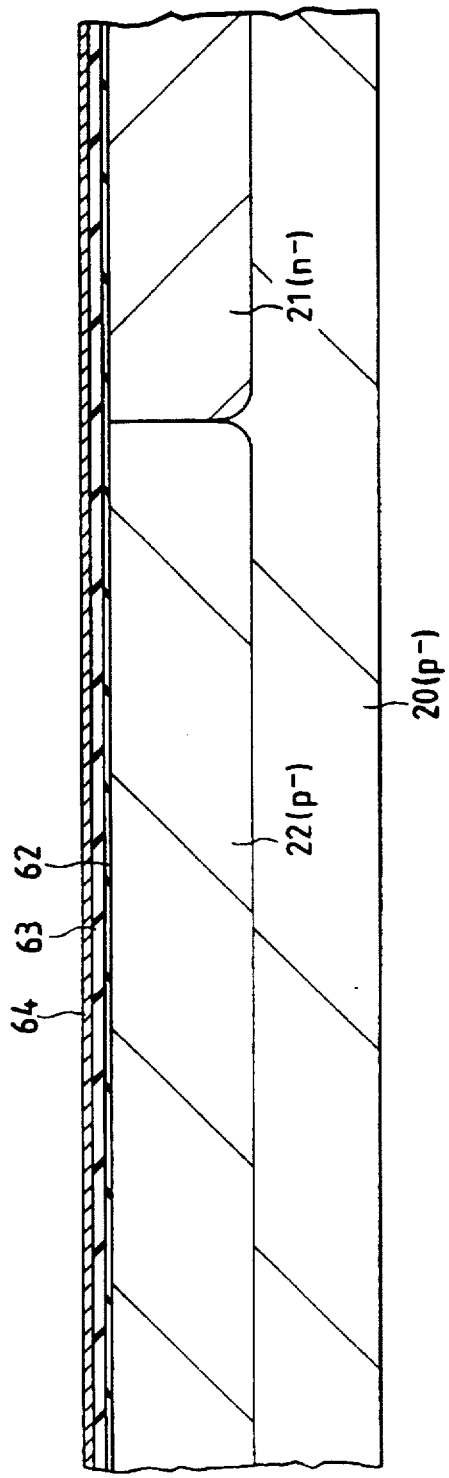

Next, as shown in FIG. 20, a silicon oxide film 62, a silicon nitride film 63 and a polycrystalline silicon film 64 are sequentially laminated over the individual principal surfaces of the $n^-$-type well regions 21 and the $p^-$-type well regions 22. The lower silicon oxide film 62 is formed by the steam oxidization method at a high temperature of about 900 to 1,000 [°C.], for example, to have a thickness of about 15 to 25 [nm]. The intermediate silicon nitride film 63 is used mainly as a non-oxidizable mask. This silicon nitride film 63 is deposited by the CVD method, for example, to have a thickness of 150 to 250 [nm]. The upper polycrystalline silicon film 64 is used mainly as an etching mask of the lower silicon nitride film 63, a groove depth judging mask and a side wall spacer length controlling mask. The polycrystalline silicon film 64 is deposited by the CVD method, for example, to have a thickness of about 80 to 120 [nm].

Figure 21:
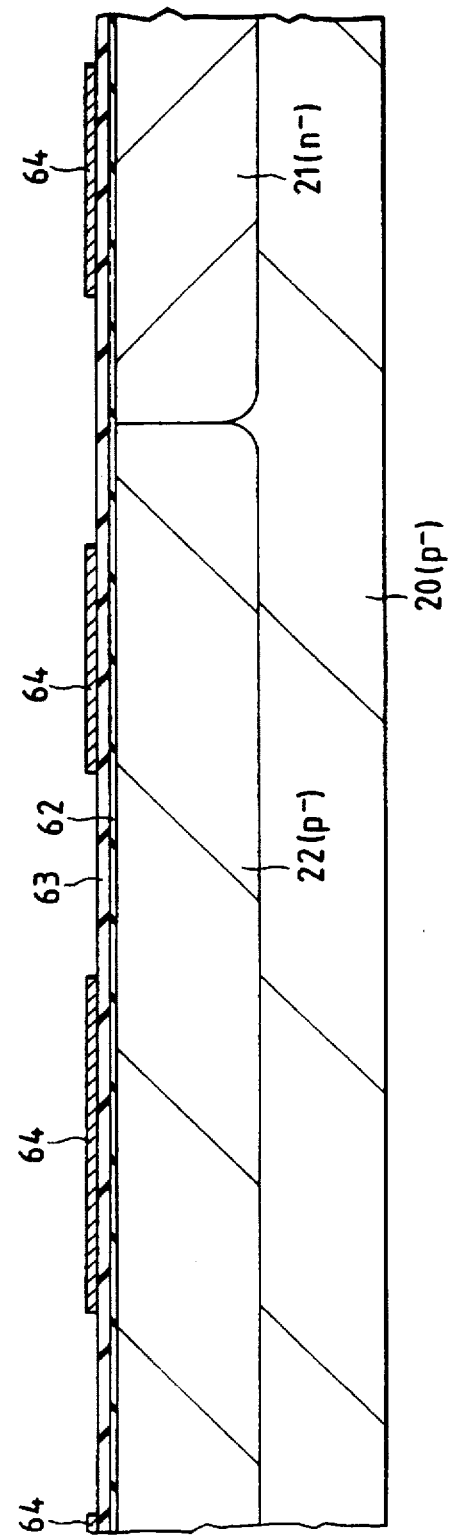

Next, as shown in FIG. 21, the upper polycrystalline silicon film 64 is removed from the principal surfaces of the individual inactive regions of the $n^-$-type well region $n^-$-type well regions 21 and the $p^-$-type well regions 22 to form the mask of the polycrystalline silicon film 64 remaining on the active regions. This mask (64) is formed by the photolithography technology and the etching technology. After the mask (64) has been formed, there is removed the etching mask (i.e., the photoresist film) which is formed by the aforementioned photolithography technology.

Next, as shown in FIG. 22, the aforementioned mask (64) is used to remove the silicon nitride film 63, which is exposed to the inactive regions, thereby to form the mask (63) below the mask (64). The patterning of the mask (63) is accomplished by using not the photoresist film for patterning the mask (64) but the mask (64) so that the contaminants from the photoresist film may be prevented from being trapped by the individual principal surfaces of the $n^-$-type well regions 21 and the $p^-$-type well regions 22 and by the silicon oxide film 62.

Next, as shown in FIG. 23, a silicon nitride film 65 and a silicon oxide film 66 are sequentially laminated all over the surfaces including that of the aforementioned mask (64). The lower silicon nitride film 65 is used mainly as a non-oxidizable mask and is made thinner than the aforementioned mask (63). This silicon nitride film 65 is deposited by the CVD method, for example, to have a thickness of about 15 to 25 [nm]. The upper silicon oxide film is used mainly as an etching mask. This silicon oxide film 66 is deposited by the CVD method using inorganic silane gases (SiH$_4$ or SiH$_2$Cl$_2$) and nitrogen oxide gases (N$_2$O), for example, as its source gases to have a thickness of about 150 to 250 [nm].

Figure 24:
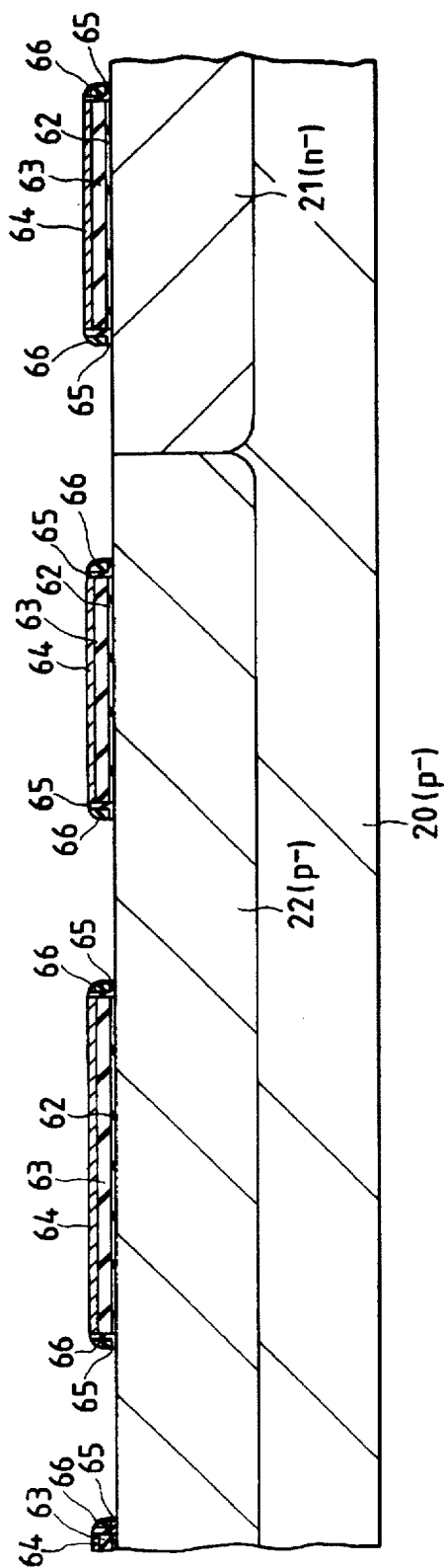

Next, as shown in FIG. 24, the aforementioned silicon oxide film 66 and silicon nitride film 65 are anisotropically etched to an extent corresponding to the individual deposited thicknesses to form the masks (65) and (66) on and in self-alignment with the individual side walls of the aforementioned masks (63) and (64). The masks (65) and (66) are formed as the so-called "side wall spacers".

Figure 25:
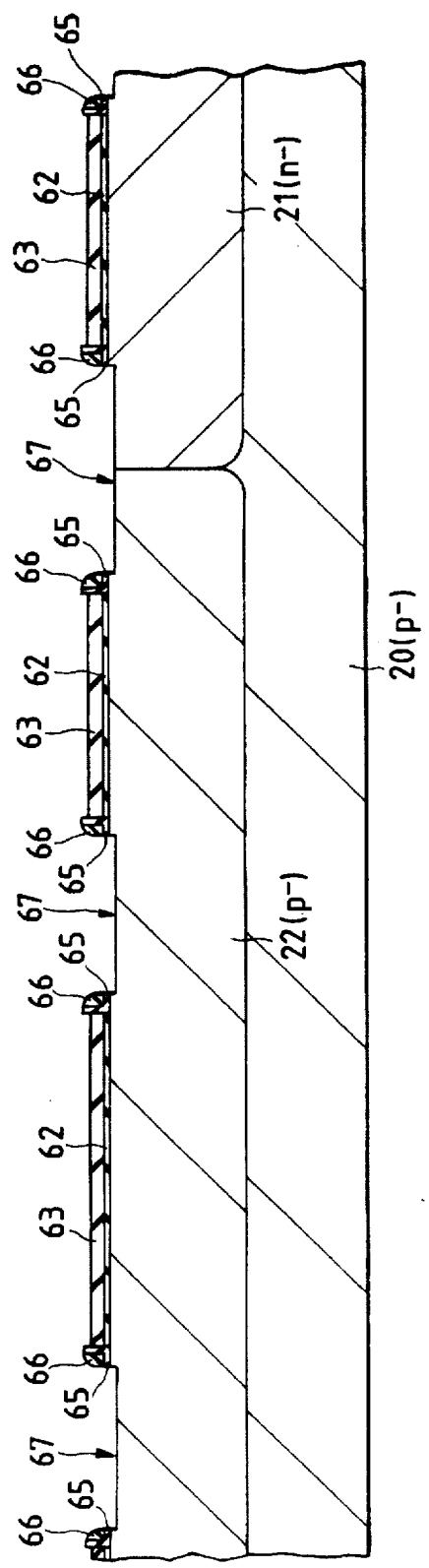

Next, as shown in FIG. 25, the aforementioned masks (64) and (66) are used as the etching masks to form shallow grooves 67 in the individual inactive regions of the n$^-$-type well regions 21 and the p$^-$-type well regions 22. These shallow grooves 67 are so formed to enhance the element separating ability that the depths below the element separating insulating film (23) to be formed at a later step than the junction depth of the n-type semiconductor regions (29) and (32), for example. The depth of the shallow grooves 67 is controlled by the thickness of the aforementioned mask (64). Specifically, the shallow grooves 67 are formed, and the mask (64) is removed. The reactive gas components of this mask (64) are detected so that the etching step for forming the shallow grooves 67 is stopped at or neat the instant when the reactive gas components of the mask (64) are exhausted. The shallow grooves 67 are formed by the anisotropic etching such as the RIE method to have a depth of about 80 to 120 [nm].

Thus, the mask (64) made of a material having an etching rate substantially equal to those of the n$^-$-type well regions 21 and the p$^-$-type well regions 22 is used to form the shallow grooves by etching the principal surfaces of the individual inactive regions of the n$^-$-type well regions 21 and the p$^-$-type well regions 22 to an extent corresponding to the thickness of the aforementioned mask (64). Thanks to this construction, the depth of the shallow grooves 67 can be controlled by the thickness of the mask (64) so that its controllability can be improved.

Next, a silicon oxide film 62A is formed over the principal surfaces of the individual inactive regions of the n$^-$-type well regions 21 and the p$^-$type well regions 22, which are exposed as a result of forming the shallow grooves 67. This silicon oxide film 62A is used as a buffer layer when an impurity is introduced. The silicon oxide film 62A is formed by the thermal oxidization method to have a thickness of about 8 to 12 [nm].

Figure 26:
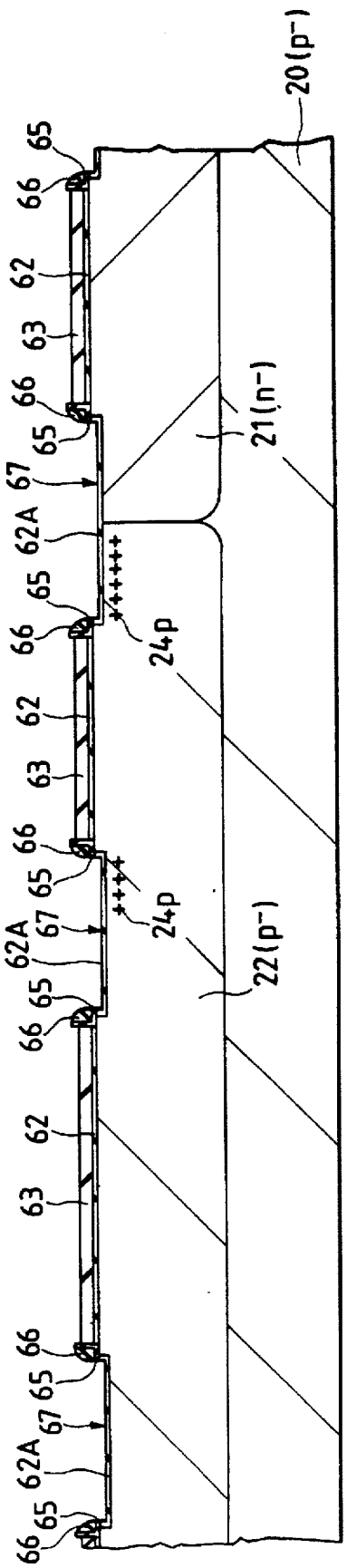

Next, in the regions to be formed with the peripheral circuits, as shown in FIG. 26, the principal surface portions of the inactive regions of the p$^-$-type well regions 22 are doped with a p-type impurity 24p through the aforementioned silicon oxide film 62A. For introducing this p-type impurity 24p, the aforementioned masks (63) and (66) and a not-shown photoresist mask are used as the impurity introduction mask. The p-type impurity 24p used is BF$_2$ having an impurity concentration of about 10$^{13}$ [atoms/cm$^2$], for example, and is introduced by the ion implantation using an energy of about 50 to 70 [KeV]. This p-type impurity 24p is introduced in self-alignment with the active regions into the regions to be formed with the peripheral circuits.

Next, the aforementioned masks (63) and (65) are used mainly as the non-oxidizable masks to form the element separating insulating film (or the field insulating film) 23 at the portions of the silicon oxide film 62A of the individual inactive regions of the n$^-$-type well regions 21 and the p$^-$-type well regions 22. At this time, the silicon oxide film 66 is removed with an etching liquid of a hydrofluoric acid before the element separating insulating film 23 is formed. This element separating insulating film 23 can be formed by a heat treatment for about 30 to 40 (minutes) in the nitrogen gas atmosphere containing a trace amount (no more than about 1 [%]) of oxygen at a considerably high temperature of about 1,050 to 1,150 [°C.], for example, and by a subsequent steam oxidization method for about 30 to 50 [minutes]. The element separating insulating film 23 is formed to have a thickness of about 400 to 600 [nm], for example.

Since the end portions at the side of the active regions of the element separating insulating film 23 hold the thin mask (659 in direct contact with the substrate, the growth in the transverse direction (toward the active regions) at the initial stage of the oxidization is reduced. Since, moreover, the thick mask (63) can reduce the transverse growth even if the oxidization proceeds, the bird's beak can be reduced. As the oxidization proceeds, on the other hand, the thin mask (65) can rise in the form of the bird's beak to damp the stress thereby to reduce the defects. In short, the element separating insulating film 23 has such a small bird's beak to that it can be made thick. As a result, the element separating insulating film 23 can be sized substantially equally to the mask (63) for forming it, so that it can shrink the separating area between the elements and increase the effective area of the active regions.

As a result of the heat treatment for forming the element separating insulating film 23,the p-type impurity 24p introduced into the principal surface portions of the aforementioned p$^-$-type well regions 22 is extended and diffused at the substantially identical fabrication step to form the p-channel stopper regions 24. The p-type impurity 24p is diffused in the transverse direction (toward the active regions), too, but its amount of transverse diffusion itself is relatively small because the n-channel MISFETs Qn of the peripheral circuits are made larger than the memory cell selecting MISFETs Qs of the peripheral circuits. In short, the n-channel MISFETs Qn have light influences of the narrow channel effect.

Figure 27:
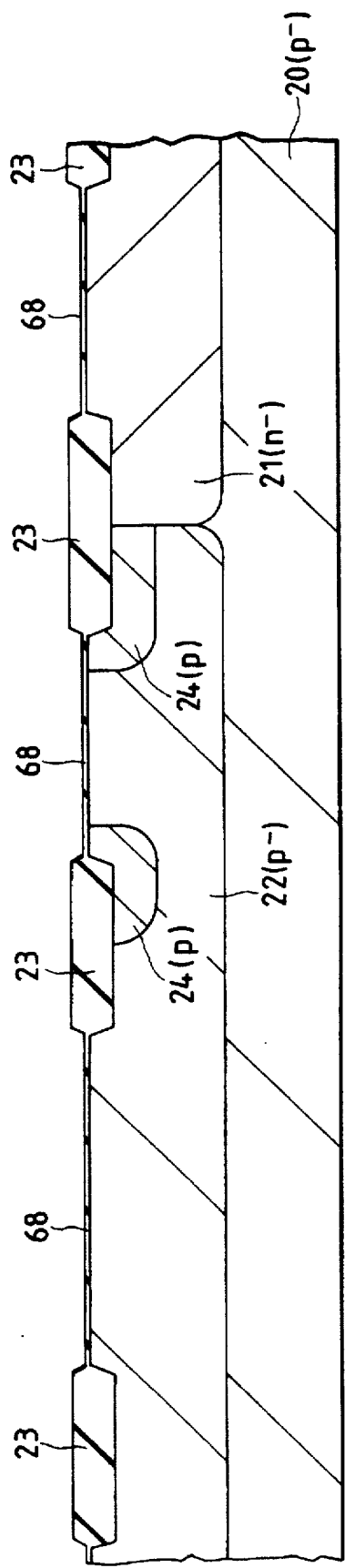

Next, the aforementioned masks (63) and (65) and the silicon oxide film 62 are removed to expose the principal surfaces of the individual active regions of the n$^-$-type well regions 21 and the p$^-$-type well regions 22. After this, as shown in FIG. 27, a silicon oxide film 68 is formed over the individual principal surfaces of the n$^-$-type well regions 21 and p$^-$-type well regions 22 thus exposed to the outside. This silicon oxide film 68 is used mainly to oxidize the so-called "white ribbon" of silicon nitrides which are formed at the end portions of the element separating insulating firm 23 by the silicon nitride films (i.e., masks) 63 and 65 used for forming the element separating insulating film 23. The silicon oxide film 68 is formed by the steam oxidization method at a high temperature of about 900 to 1,000 [°C.], for example, to have a thickness of about 40 to 100 [nm].

Next, in the regions to be formed with the memory cell array 11E, as shown in FIG. 28, the p$^-$-type well regions 22 has its principal surface portions formed thereover with the p-channel stopper regions 25A and the p-type semiconductor regions 25B. The p-type channel stopper regions 25A are formed in the inactive regions below the element separating insulating film 23. The p-type semiconductor regions 25B are formed in the active regions for forming the memory cells M. The p-type channel stopper regions 25A and the p-type semiconductor regions 25B are individually formed, for example, by introducing B of an impurity concentration of about $10^{12}$ to $10^{13}$ [atoms/cm$^2$] by the ion implantation method using a high energy of about 200 to 300 [KeV]. The p-type impurity is introduced through the element separating insulating film 23 into the principal surface portions of the inactive regions of the p$^-$-type well regions 22. In the principal surface portions of the active regions, the p-type impurity is introduced so deep into the principal surface portions of the p$^-$-type well regions 22 as to correspond to the thickness of the element separating insulating film 23. The p-type channel stopper regions 25A and p-type semiconductor regions 25B thus formed are individually self-aligned with the element separating insulating film 23.

Thus, in the DRAM 1 formed with the memory cell selecting MISFETs Qs over the principal surface in the active regions enclosed by the inactive regions of the p$^-$-type well regions 22, the fabrication process comprises: the step of forming the first mask, in which the masks (63) and (64) are sequentially laminated over the principal surface of the active regions of the p$^-$-type well regions 22; the step of forming the second mask, in which the masks (65) and (66) made thinner than the mask (63) of said first mask and formed on and in self-alignment with the side walls of said first mask are sequentially laminated; the step of forming the shallow grooves 67 in the inactive regions of the p$^-$-type well regions 22 by etching the principal surface of the inactive regions of the p$^-$-type well regions 22 by the use of said first mask and said second mask; the step of forming the element separating insulating film (or the field insulating film) 23 over the principal surface of the inactive regions of the p$^-$-type well regions 22 by the hot oxidizing treatment using said first mask and said second mask; and the step of forming the p-type channel stopper regions 25A over the principal surface portions of the p$^-$-type well regions 22 below the element separating insulating film 23 by introducing the p-type impurity into all the principal surface portions including the active regions and inactive regions of the p$^-$-type well regions 22 after said first mask and said second mask have been removed. Thanks to this construction, the amount of oxygen in the transverse direction of the element separating insulating film 23 can be reduced to reduce the size of the element separating insulating film 23 while thickening the same. By making use of the shallow grooves 67, the lower surface of the element separating insulating film 23 can be made deeper than the principal surface of the active regions of the p$^-$-type well regions 22 so that the separating size between the memory cell selecting MISFETs Qs can be increased in the depthwise direction of the p$^-$-type well regions 22. As a result, the separating ability between the memory cell selecting MISFET Qs can be enhanced to thicken the element separating insulating film 23 so that the p-type impurity to be introduced into the principal surface portions of the active regions of the p$^-$-type well regions 22 when it is introduced to form the p-type channel stopper regions 25A can be introduced deep into the p$^-$-type well regions 22. As a result, it is possible to reduce the fluctuations of the threshold voltage of the memory cell selecting MISFETs Qs on the basis of the introduction of the p-type impurity.

On the other hand, the step of forming the element separating insulating film 23 is accomplished at the hot oxidization method at a temperature within a range of about 1,050 to 1,150 [°C.]. Thanks to this construction, the fluidity of the silicon oxide film based upon the hot oxidization method is promoted when the element separating insulating film 23 is to be formed, so that the stress to be caused between the element separating insulating film 23 and the principal surfaces of the individual inactive regions of the n$^-$-type well regions 21 and the p$^-$-type well regions 22 can be reduced. As a result, it is possible to reduce the crystal defects at the corners of the shallow grooves 67 which are formed in the principal surface of the individual active regions of the n$^-$-type well regions 21 and the p$^-$-type well regions 22.

On the other hand, the shallow grooves 67 to be formed in the principal surfaces of the individual inactive regions of the n$^-$-type well regions 21 and the p$^-$-type well regions 22 may not be formed in case the crystal defects cannot be restored or in case they are not especially necessary. In this case, the mask (64) may be eliminated, and the mask (65) may be made to have a thickness of 200 to 300 [nm].

Moreover, in the DRAM 1 in which the memory cell selecting MISFETs Qs forming the memory cells M and the n-channel MISFETs Qn forming the peripheral circuits are individually formed over the principal surface of the active regions of the p$^-$-type well regions 22 in the regions enclosed by the inactive regions of the formed of the element separating insulating film 23 and the p-channel stopper regions, the principal surface portions of the active regions of the p$^-$-type well regions 22 forming the memory cell selecting MISFETs Qs and the inactive regions enclosing the former regions are formed at said inactive regions with the p-channel stopper regions 25A by introducing the p-type impurity through the element separating insulating film and, at the inactive regions enclosing the active regions for forming the n-channel MISFETs Qn of the p$^-$-type well regions 22, with the p-type channel stopper regions 24 by introducing the p-type impurity 24p thereinto. Thanks to this construction, the threshold voltage of the parasitic MOS is raised at the aforementioned p-type channel stopper regions 25A to retain the separating ability between the memory cells M and the memory cell selecting MISFETs Qs for forming the former and the memory cells M therearound. Moreover, the p-channel stopper regions 25A are formed in self-alignment with the aforementioned element separating insulating film so that the p-type impurity for forming the p-channel stopper regions 25A can be little diffused to the active regions. As a result, it is possible to reduce the narrow channel effect of the memory cell selecting MISFETs Qs. At the same time, the p-type impurity 24p for forming the aforementioned p-type channel stopper regions 24 is introduced only into the inactive regions but not into the active regions for forming the aforementioned n-channel MISFETs Qn. As a result, the influences of the substrate effect can be reduced to reduce the fluctuations of the threshold voltage of the n-channel MISFETs Qn. Since the n-channel MISFETs Qn are sized more than the memory cell selecting MISFETs Qs of the memory cells M, the n-channel MISFETs Qn have a relatively small amount of diffusion of the p-type impurity 24p for forming the p-channel stopper regions 24p to the active regions so that they hardly establish the narrow channel effect. In the n-channel MISFETs Qn, moreover, the p-type impurity 24p for forming the p-type channel stopper regions 24 is not introduced into the active regions so that the impurity concentration in the surface of the active regions can be reduced. As a result, the threshold voltage can be dropped to augment the drivability. The n-channel MISFETs Qn can retain the output signal level sufficiently especially in case they are used in the output step circuit.

On the other hand, the memory cell selecting MISFETs Qs of the memory cells M and the n-channel MISFETs Qn are individually formed in the principal surface portions of the p$^-$-type well regions 22 having a higher impurity concentration than that of the p$^-$-type semiconductor substrate 20. Thanks to this construction, the individual channel forming regions of the memory cell selecting MISFETs Qs and the n-channel MISFETs Qn of the p⁻-type well regions 22 can have their impurity concentrations increased to reduce the short channel effect. At the same time, potential barrier regions can be formed by the difference between the individual impurity concentrations of the p⁻-type well regions 22 and the p⁻-type semiconductor substrate 20 so that especially the memory cells M can have their α-ray soft error withstand voltage improved. Moreover, the n-channel MISFETs Qn can also have their α-ray soft error withstand voltage improved in case they construct the direct peripheral circuits such as the column address decoder circuits (YDEC) 12 or the sense amplifier circuits (SA) 13.

[Gate insulating Film Forming Step]

Next, a silicon oxide film 68A is formed over the principal surface of the individual active regions of the n⁻-type well regions 21 and the p⁻-type well regions 22. The silicon oxide film 68A is newly formed after the aforementioned silicon oxide film 68 has been removed. This new silicon oxide film 68A may have a thickness of about 15 to 25 [nm].

Next in the regions to be formed with the peripheral circuits, as shown in FIG. 29, the principal surface portions of the active regions of the n⁻-type well regions 21 and the p⁻-type well regions 22, which are defined by the element separating insulating film 23, are doped with a p-type impurity 69p for adjusting the threshold voltage. This p-type impurity 69 used is B having an impurity concentration of about $10^{12}$ [atoms/cm$^2$], for example, and is introduced by the ion implantation method using an energy of about 20 to 30 [KeV]. This p-type impurity 69p is introduced mainly to adjust the individual threshold voltages of the n-channel MISFETs Qn and Qp. On the other hand, the p-type impurity 69p may be introduced at different steps into the individual primary surface portions of the n⁻-type well regions 21 and the p⁻-type well regions 22.

Next, the silicon oxide film 68A is selectively removed to expose the individual principal surfaces of the p⁻-type well regions 22 and the n⁻-type well regions 21.

Next, the gate insulating film 26 is formed over the individual principal surface of the p⁻-type well regions 22 and n⁻-type well regions 21 thus exposed to the outside. The gate insulating film 26 is formed by the steam oxidization method at a temperature as high as about 800 to 1,000 [°C.] to have a thickness of about 12 to 18 [nm].

[Gate Wiring Line Forming Step 1]

Next, the whole surface of the substrate including the surfaces of the gate insulating film 26 and the element separating insulating film 23 is formed with a polycrystalline silicon film. This polycrystalline silicon silicon film is deposited by the CVD method to have a thickness of about 200 to 300 [nm]. The polycrystalline silicon film is doped by the hot diffusion method with an n-type impurity such as P for reducing the resistance. After this, the polycrystalline silicon film is formed thereover with a not-shown silicon oxide film by the hot oxidization method. The polycrystalline silicon film is formed at the gate wiring line forming step of the first layer of the fabrication process.

Next, the polycrystalline silicon film is formed all over its surface with the interlayer insulating film 28. This insulating film 28 is formed by the CVD method using inorganic silane gases and nitrogen oxide gases as its source gases. The interlayer insulating film 28 is formed to have a thickness of about 250 to 350 [nm], for example.

Next, as shown in FIG. 30, a not-shown etching mask is sued to etch the interlayer insulating film 28 and the polycrystalline silicon film sequentially to form the gate electrodes 27 and the word lines (WL) 27. Moreover, the interlayer insulating film 28 is left over the gate electrodes 27 and the word lines 27. The aforementioned etching is anisotropically accomplished.

[Lightly Doped Semiconductor Region Forming Step]

Next, in order to reduce the contaminations due to the introduction of the impurity, the substrate is formed all over its surface with an silicon oxide film (although not numbered). This silicon oxide film is formed over the individual principal surfaces of the p⁻-type well regions 22 and n⁻-type well regions 21 exposed by the aforementioned etching and on the individual side walls of the gate electrodes 27 and the word lines 27. The silicon oxide film is formed in the oxygen atmosphere at a temperature as high as about 850 to 950 [°C.], for example, to have a thickness of about 10 to 20 [nm].

Next, the element separating insulating film 23 and the interlayer insulating film 28 (and the gate electrodes 27) are used as impurity introduction masks to introduce an n-type impurity 29n into the principal surface portions of the p⁻-type well regions 22 at the individual regions for forming the memory cell arrays 11E and the n-channel MISFETs Qn. The n-type impurity 29n is introduced in self-alignment with the gate electrodes 27. The n-type impurity 29n is introduced by the ion implantation method of an energy of about 30 to 50 [KeV] by using P (or As) having an impurity concentration of about $10^{13}$ [atom/cm$^2$]. When this n-type impurity 29n is to be introduced, although not shown, the regions for forming the p-channel MISFETs Qp are covered with an impurity introduction mask (e.g., a photoresist film).

Next, as shown in FIG. 31, the element separating insulating film 23 and the inter-layer insulating film (and the gate electrodes 27) are used as the impurity introduction mask to dope the principal surface portions of the n⁻-type well regions 21 with a p-type impurity 30p in the regions for forming the p-channel MISFETs Qp. This p-type impurity 30p is introduced in self-alignment with the gate electrodes 27. The p-type impurity 30p used is B (or BF$_2$) having an impurity concentration of about $10^{12}$ [atoms/cm$^2$], for example, and is introduced by the ion implantation method having an energy of about 20 to 30 [KeV]. When the p-type impurity 30p is introduced, although not shown, the individual regions for forming the memory cell arrays 11E and the n-channel MISFETs Qn are covered with an impurity introduction mask (or a photoresist film).

[Densely Doped Semiconductor Region Forming Step 1]

Next, the side wall spacers 31 are formed on the individual side walls of the aforementioned gate electrodes 27 and word lines 27 and the overlying interlayer insulating film 28. These side wall spacers 31 can be formed by depositing a silicon oxide film and by etching the silicon oxide film anisotropically by the RIE of the like to an extent corresponding to the deposited thickness. The silicon oxide film of the side wall spacers 31 is formed by the CVD method using inorganic silane gases and nitrogen oxide gases as its source gases to have a thickness equal to that of the aforementioned interlayer insulating film 28. This silicon oxide film is made to have a thickness of about 130 to 180 [nm], for example. The side wall spacers 31 acquire a gate length (taken in the direction of the channel length) of about 150 [nm].

Figure 32:
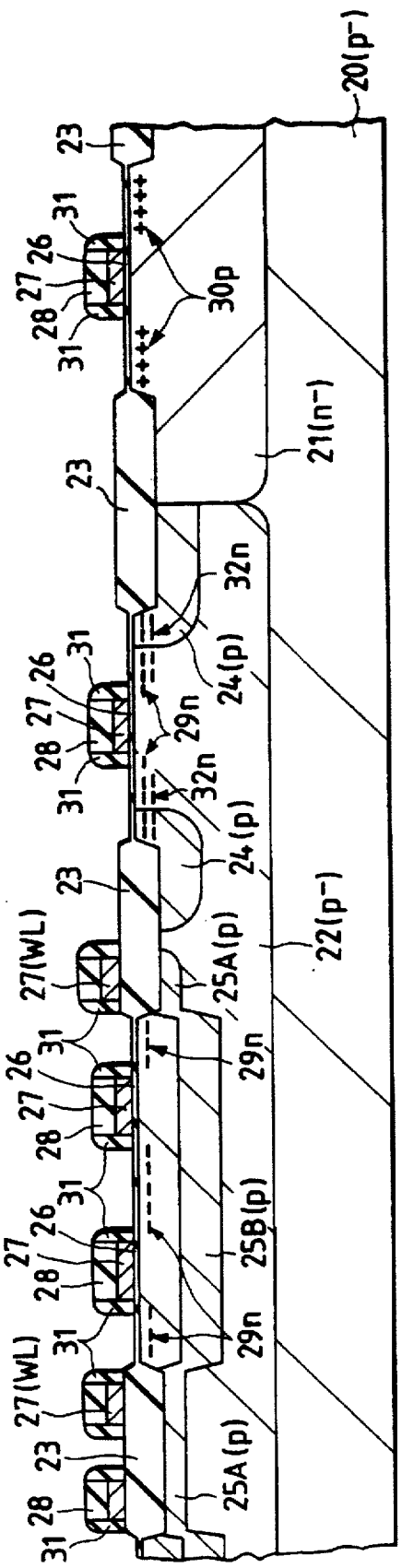

Next, as shown in FIG. 32, an n-type impurity 32n is introduced into the regions for forming the n-channel MISFETs Qn of the peripheral circuits. When the n-type impurity 32n is to be introduced, the side wall spacers 31 are mainly used as an impurity introduction mask. On the other hand, the regions other than those for forming the n-channel MISFETs Qn, i.e., the regions for forming the memory cell arrays 11E and the p-channel MISFETs Qp are covered, when they are to be doped with the n-type impurity 32n, with an impurity introduction mask (or a photoresist film). The n-type impurity 32n used is As (or P) having an impurity concentration of about $10^{15}$ [atoms/cm$^2$], for example, and is introduced by the ion implantation method of an energy of about 70 to 90 [KeV].

Figure 33:
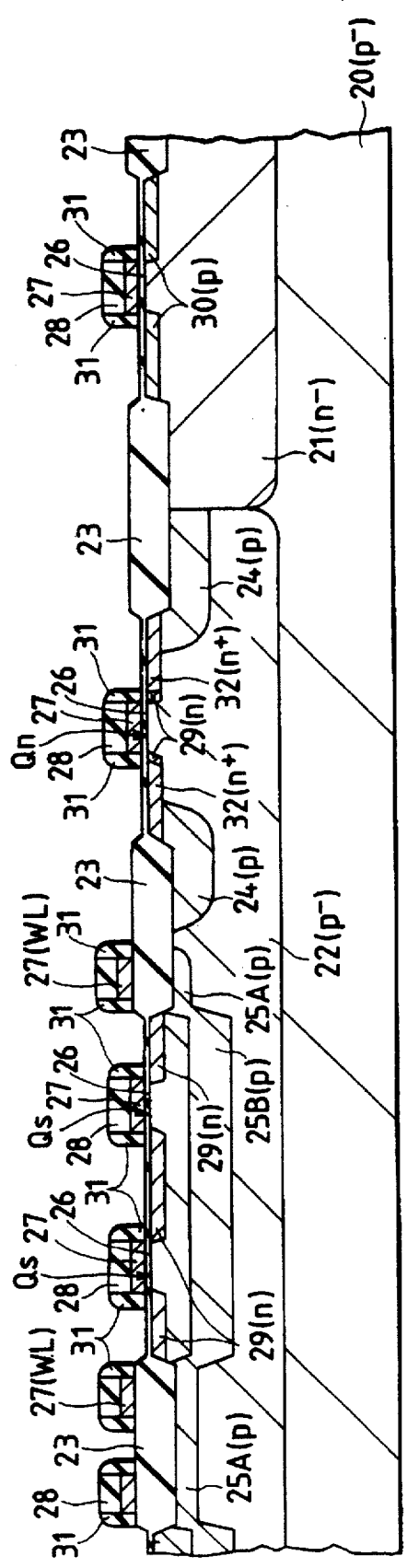

Next, as shown in FIG. 33, the aforementioned n-type impurity 29n, n-type impurity 32n and p-type impurity 30p are individually extended and diffused by a heat treatment to form the n-type semiconductor regions 29, the n$^+$-type semiconductor regions 32 and the p-type semiconductor regions 30 individually. The aforementioned heat treatment is accomplished at a temperature as high as about 900 to 1,000 [°C.], for example, for 20 to 40 [minutes]. By forming the n-type semiconductor regions 29, the memory cell selecting MISFETs Qs having the LDD structure of the memory cells M are completed. By forming the n-type semiconductor regions 29 and the n$^+$-type semiconductor regions 32, moreover, the n-channel MISFETs Qn having the LDD structure are completed. These n-channel MISFETs Qn are used in the peripheral circuits (for low voltages) and the input/output step circuits (for high voltages) of the DRAM 1. On the other hand, the p-type semiconductor regions 30 having the LDD structure of the p-channel MISFETs Qp are completed, but the p$^+$-type semiconductor regions 39 are formed after the completion of the memory cells M. Therefore, the p-channel MISFETs Qp are formed at a later step.

Thus, in the DRAM1 comprising the n-channel MISFETs Qn having the LDD structure for the high voltages and used as the input/output step circuit and the n-channel MISFETs Qn having the LDD structure for the low voltages and used as the peripheral circuits, the fabrication process comprises: the step of forming the individual gate insulating film 26 and gate electrodes 27 of the n-channel MISFETs Qn for the high voltages and the n-channel MISFETs Qn for the low voltages at a common step over the principal surface of the different active regions of the p$^-$-type well regions 22; the step of forming at a common step the lightly doped n-type semiconductor regions 29 for forming the LDD structure in self-alignment with the individual gate electrodes 27 of the n-channel MISFETs Qn for the high voltages and the n-channel MISFETs Qn for the low voltages over the principal surface portions of the individual active regions of the p$^-$-type well regions 22; the step of forming the side wall spacers 31 at a common step on the side walls of the individual gate electrodes 27 of the n-channel MISFETs Qn for the high voltages and the n-channel MISFETs Qn for the low voltages; and the step of forming the densely doped n$^+$-type semiconductor regions 32 in self-alignment with the side wall spacers 31 over the individual principal surface portions of the active regions of the p$^-$-type well regions 22 for forming the n-channel MISFETs Qn for the high voltages and the n-channel MISFETs Qn for the low voltages. Thanks to this construction, all the individual steps for forming the n-channel MISFETs Qn for the high voltages and the n-channel MISFETs Qn for the low voltages can be shared to form the individual side wall spacers 31 at the common step so that the number of steps of fabricating the DRAM 1 can be reduced.

[Interlayer Insulating Film Forming Step 1]

Next, the inter-layer insulating film 33 is formed all over the surface of the substrate including the surfaces of the aforementioned interlayer insulating film 28 and side wall spacers 31. This inter-layer insulating film 33 is used as an etching stopper layer when the individual electrode layers of the information storing capacity elements C having the stacked structure are to be treated. The inter-layer insulating film 33 is also used for electrically separating the lower electrode layers (35) of the information storing capacity elements C of the stacked structure and the gate electrodes 27 and word lines 27 of the memory cell selecting MISFETs Qs individually. Moreover, the inter-layer insulating film 33 is constructed to thicken the side wall spacers 31 of the p-channel MISFETs Qp. The inter-layer insulating film 33 is formed to have a thickness considering mainly the scrapes by the overetching of the upper conducting layer and by the cleaning step. The inter-layer insulating film 33 is formed of a silicon oxide film which is deposited by the CVD method using inorganic silane gases and nitrogen oxide gases as its source gases. In other words, this inter-layer insulating film 33 can reduce the stress which is caused on the basis of the difference in the coefficients of linear expansion between the dielectric film (36) of the information storing capacity elements C having the stacked structure and the underlying interlayer insulating film 28. The inter-layer insulating film 33 is formed to have a thickness of about 130 to 180 [nm], for example.

Figure 34:
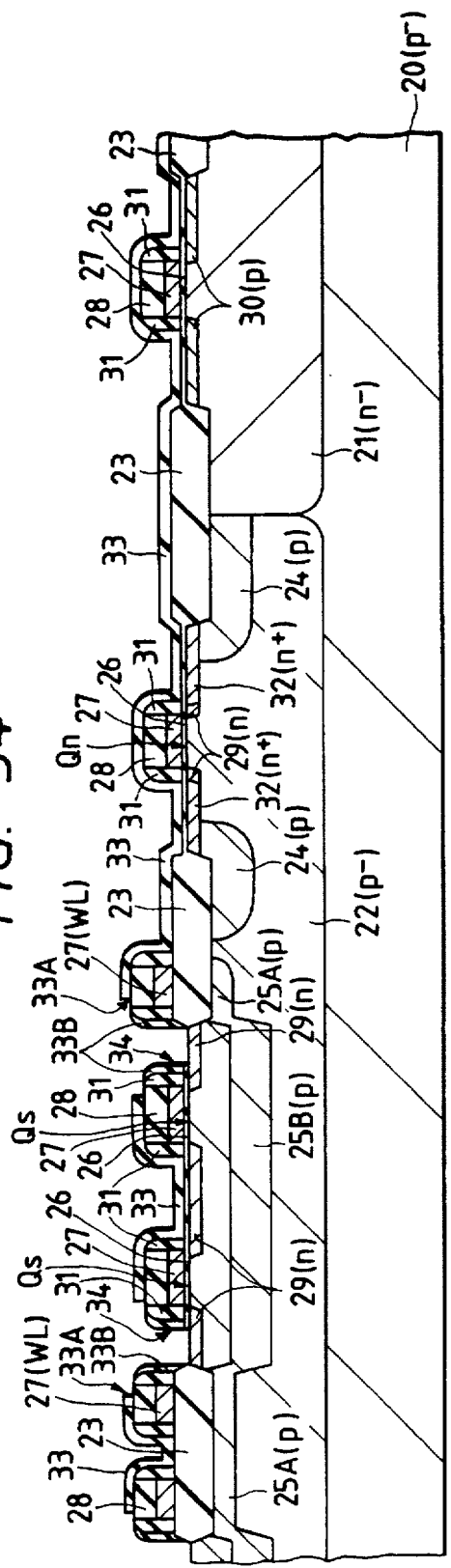

Next, as shown in FIG. 34, the inter-layer insulating film 33 is removed, to form the connecting holes 33A and 34 individually, from the n-type semiconductor regions 29 at the other (i.e., at the side where the lower lower electrode layers are connected) of the memory cell selecting MISFETs Qs for the memory cell M forming regions. The connecting holes 34 are formed in the regions which are defined by the side wall spacers 33B deposited on the side wall spacers 31 when the side wall spacers 31 and the interlayer insulating film 33 are etched.

[Gate Wiring Line Forming Step 2]

Figure 35:
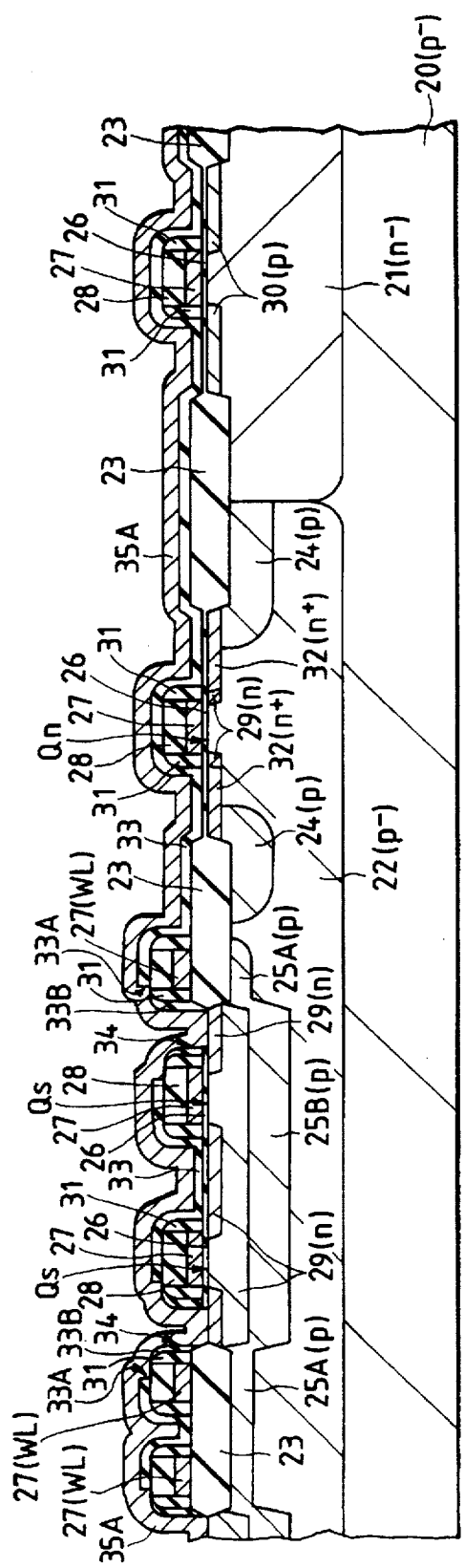

Next, as shown in FIG. 35, all over the surface of the substrate including the upper surface of the interlayer insulating film 33, there is deposited a polycrystalline silicon film which is formed with the lower lower electrode layers 35 of the information storing capacity elements C of the stacked structure of the memory cells M. This polycrystalline silicon film is partially connected with the n-type semiconductor regions 29 through the aforementioned connecting holes 33A and 34. The polycrystalline silicon film is formed of a polycrystalline silicon film deposited by the CVD method, to have a thickness of about 150 to 250 [nm]. The polycrystalline silicon film is formed at the step of forming the second-layer gate wiring lines of the fabrication process. After the deposition, the polycrystalline silicon film is doped by the hot diffusion method with an n-type impurity such as P for reducing the resistance. This n-type impurity is diffused with a large amount of n-type impurity through the aforementioned connecting holes 34, but the n-type impurity is in such a low dope that it may not be diffused to the channel forming regions of the memory cell selecting MISFETs Qs.

Next, as shown in FIG. 36,.another polycrystalline silicon film is deposited on the aforementioned polycrystalline silicon film. This upper polycrystalline silicon film is deposited by the CVD method to have a thickness of about 250 to 350 [nm]. The upper polycrystalline silicon film is doped after the deposition by the hot diffusion method with an n-type impurity such as P for reducing the resistance. This n-type impurity is densely introduced to improve the charge storage of the information storing capacity elements C having the stacked structure.

Next, as shown in FIG. 37, the polycrystalline silicon film of the aforementioned two-layered structure is treated into a predetermined shape to form the lower electrode layer 35 by using the photolithography technology and the anisotropic etching technology. This photolithography technology includes the step of forming the etching mask (or the photoresist film) and the step of removing the etching mask. This etching mask removing step is accomplished by the plasma treatment using the downstream of the mixed gases of freon gases ($CHF_3$) and oxygen gases ($O_2$). This treatment is effective for reducing the damages of the individual elements of the DRAM 1.

Thus, in the DRAM 1 having its memory cells M constructed of a series circuit of the memory cell selecting MISFETs Qs and the information storing capacity elements C of the stacked structure, the lower electrode layers 35 to be connected with one of the n-type semiconductor regions 29 of the memory cell selecting MISFETs Qs of the information storing capacity elements C of the stacked structure is formed of the composite film in which the polycrystalline silicon film lightly doped with the n-type impurity for reducing the resistance and the polycrystalline silicon film densely doped with the n-type impurity are sequentially laminated. Thanks to this construction, the lower electrode layers 35 of the information storing capacity elements C of the stacked structure of the memory cells M can be thickened to increase the area of the side walls of the lower electrode layers 35 in the vertical direction so that the charge storage can be increased while reducing the area of the memory cells M to improve the degree of integration. Since the surface of the polycrystalline silicon film over the lower electrode layers 35 has a high impurity concentration, the amount of electric charges can be increased to further improve the degree of integration likewise. Since, moreover, the impurity concentration of the polycrystalline silicon film of the aforementioned lower electrode layers 35 can be dropped to reduce the amount of diffusion of the n-type impurity to one of the n-type semiconductor regions 29 of the memory cell selecting MISFETs Qs, the short channel effect of the memory cell selecting MISFETs Qs can be reduced to shrink the area of the memory cells M thereby to further improve the degree of integration. The present invention may be modified such that three or more polycrystalline silicon films are deposited and are individually doped with the n-type impurity to form the aforementioned lower electrode layers 35.

In the DRAM 1 having the memory cells M constructed of a series-circuit of the memory cell selecting MISFETs Qs and the information storing capacity elements C of the stacked structure, moreover, the fabrication process comprises: the step of introducing the n-type impurity for reducing the resistance into the first-layer polycrystalline silicon film after this first-layer polycrystalline silicon film has been deposited all over the interlayer insulating film 33 of the $p^-$-type well regions 22 including the surfaces of the memory cell selecting MISFETs Qs; the step of introducing the n-type impurity for reducing the resistance into the second-layer polycrystalline silicon film after this second-layer polycrystalline silicon film has been deposited all over the first-layer polycrystalline silicon film; and the step of forming the lower electrode layers 35 of the information storing capacity elements C of the stacked structure by anisotropically etching the second-layer polycrystalline silicon film and the first-layer polycrystalline silicon film to subject them to the predetermined patterning. Thanks to this construction, even if the lower electrode layers 35 of the information storing capacity elements C of the stacked structure is thickened, the amount of the impurity introduced thereinto can be retained to some extent and homogenized.

As a result, it is possible to enhance the anisotropy of the anisotropical etching and to increase the etching rate. Since the improvement in the anisotropy of the anisotropic etching can reduce the size of the lower electrode layers 35, the area of the memory cells M can be shrunk to improve the degree of integration of the DRAM 1.

[Dielectric Film Forming Step]

Figure 38:
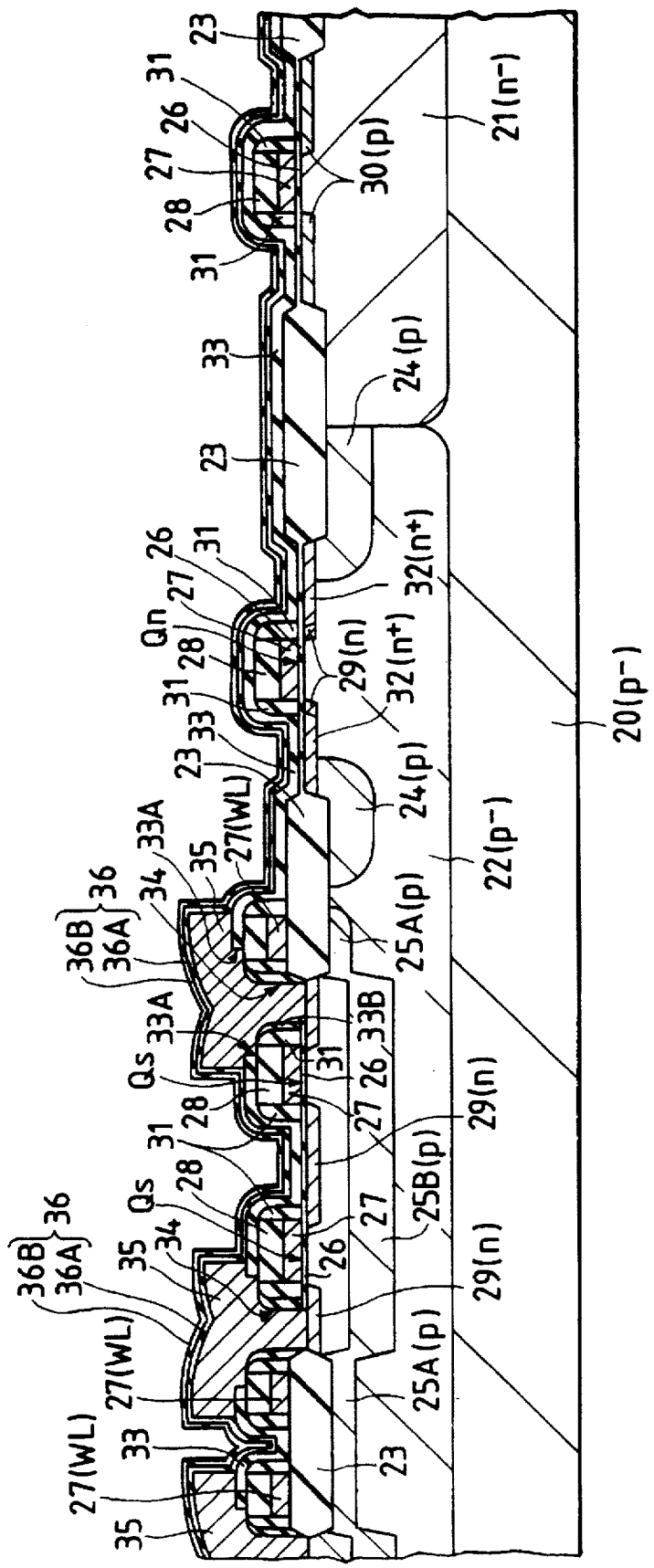

Next, as shown in FIG. 38, the dielectric film 36 is formed all over the substrate including the surface of the lower electrode layers 35 of the information storing capacity elements C of the stacked structure of the memory cells M. This dielectric film 36 is formed of the two-layered structure in which the silicon nitride film 36A and the silicon oxide film 36B are basically laminated in the sequential manner, as has been described hereinbefore. The lower silicon nitride film 36A is deposited by the CVD method, for example, to have a thickness of about 5 to 7 [nm]. For forming this silicon nitride film 36A, the runaround of the oxygen is suppressed as much as possible. In case the silicon nitride film 36A is formed over the lower electrode layers (i.e., the polycrystalline silicon film) 35 at the ordinary production level, a natural silicon nitride film (although not shown) is formed between the lower electrode layers 35 and the silicon nitride film 36A.

The upper silicon oxide film 36B of the aforementioned dielectric film 36 is formed by subjecting the lower silicon nitride film 36A to a high-pressure oxidization method to have a thickness of about 1 to 3 [nm]. When the silicon oxide film 36B is formed, the lower silicon nitride film 36A has its thickness slightly reduced. The silicon oxide film 36B is basically formed in an oxygen gas atmosphere under a pressure as high as 1.5 to 10 [Torrs] and at a temperature as high as 800 to 1,000 [°C.]. In the present embodiment, the silicon oxide film 36B is formed under a high pressure of 3 to 3.8 [Torrs], at an oxygen flow rate (of the source gases) of 2 [l/min.] for oxidization, and at a hydrogen flow rate (of the source gases) of 3 to 8 [l/min.]. The silicon oxide film 36B to be formed by the high-pressure oxidization method can be made to have a desired thickness within a shorter time than that of the silicon oxide film to be formed under a normal pressure (i.e., 1 [Torr]). In short, the high-pressure oxidization method can shorten the heat treatment time at a high temperature so that it can reduce the pn junction depth of the source regions and the drain regions of the memory cell selecting MISFETs Qs. The aforementioned natural silicon oxide film can be thinned if the run-around of the oxygen is reduced. Although the number of the fabrication steps is increased, on the other hand, the natural silicon oxide film can be nitrized to form the dielectric film 36 of the two-layered structure.

[Gate Wiring Line Forming Step 3]

Next, a polycrystalline silicon film is deposited over the whole surface of the substrate including the dielectric film 36. The polycrystalline silicon film is deposited by the CVD method to have a thickness of about 80 to 120 [nm]. This polycrystalline silicon film is formed at the third-layer gate wiring line forming step of the fabrication process. After this, an n-type impurity such as P for reducing the resistance is introduced into the polycrystalline silicon film by the hot diffusion method.

Figure 39:
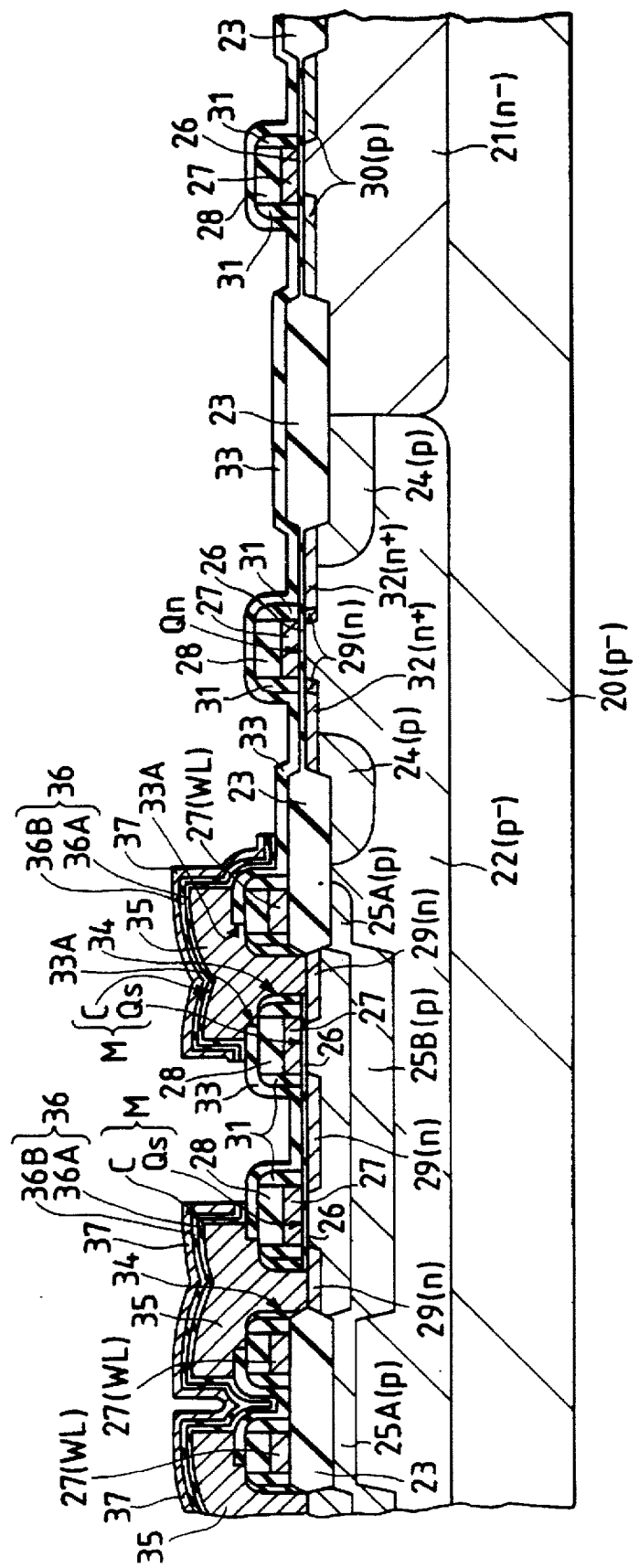

Next, the etching mask is formed over the aforementioned polycrystalline silicon film all over the surface of the memory cell array 11E excepting the connected regions between one of the n-type semiconductor regions 29 of the memory cell selecting MISFETs Qs and the complementary data lines (50). This etching mask is formed by the photoresist film using the photolithography technology, for example. After this, as shown in FIG. 39, the etching mask is used to sequentially etch the polycrystalline silicon film and the dielectric film 36 anisotropically to form the upper electrode layer 37. By forming the upper electrode layer 37, the information storing capacity elements C of the stacked structure are substantially completed so that the memory cells M of the DRAM 1 are completed. After the completion of the memory cells M, the aforementioned etching mask is removed.

Figure 40:
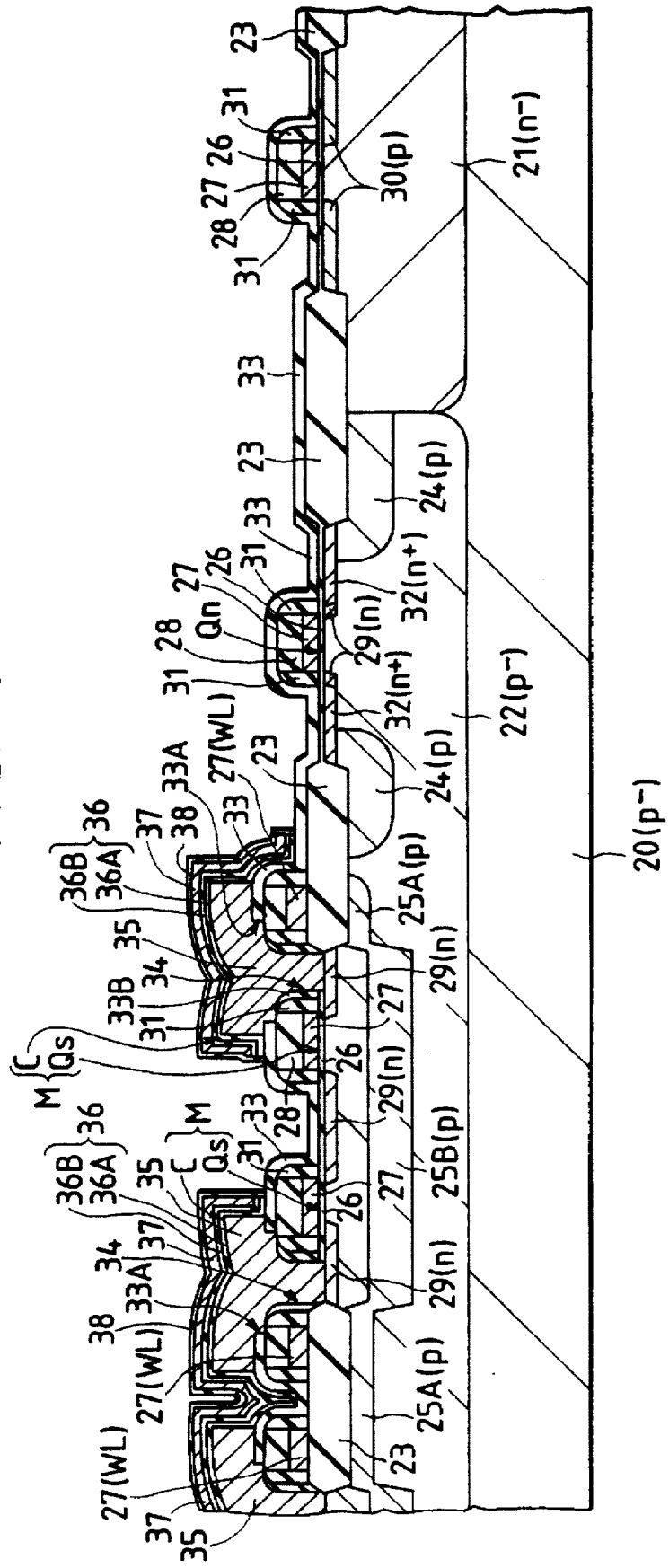

Next, as shown in FIG. 40, the hot oxidization treatment is accomplished to form the insulating film (of the silicon oxide film) 38 is formed over the surface of the upper electrode layer 37. The step of forming the insulating film 38 is to oxidize the etching residual (of the polycrystalline silicon film) left on the underlying surface (i.e., the surface of the interlayer insulating film 33) when the aforementioned upper electrode layer 37 is patterned. In the information storing capacity elements C of the stacked structure, the two-layered lower electrode layer 35 and upper electrode layer 37 of the memory cell selecting MISFETs Qs are deposited. As a result, the stepped shape is enlarged at the connected portions especially between the complementary data lines (50) and the memory cells M so that the etching residual is liable to be left. This etching residual shorts the complementary data lines (50) and the upper electrode layer 37.

In the DRAM 1 including the memory cells M constructed of the series circuit of the memory cell selecting MISFETs Qs having one of the n-type semiconductor regions connected with the complementary data lines (50) and the information storing capacity elements C of the stacked structure in which the overlying lower electrode layer 35, dielectric film 36 and upper electrode layer 37 are sequentially laminated, the fabrication process comprises: the step of forming the upper electrode layer 37 by depositing the polycrystalline silicon film by the CVD method over the dielectric film 36 of the aforementioned memory cells M and by subjecting the polycrystalline silicon film to the predetermined patterning by the anisotropic etching; and the step of forming the insulating film (of the silicon oxide film) 38 over-the surface of the upper electrode layer 37 by the hot oxidization method. Thanks to this construction, the etching residual of the polycrystalline silicon film left at the stepped portion of the underlying surface can be oxidized after the patterning of the polycrystalline silicon film by the subsequent hot oxidizing step so that the upper electrode layer 37 and the complementary data lines (50) can be prevented from being shorted to improve the production yield.

[Densely Doped Semiconductor Region Forming Step 2]

Figure 41:
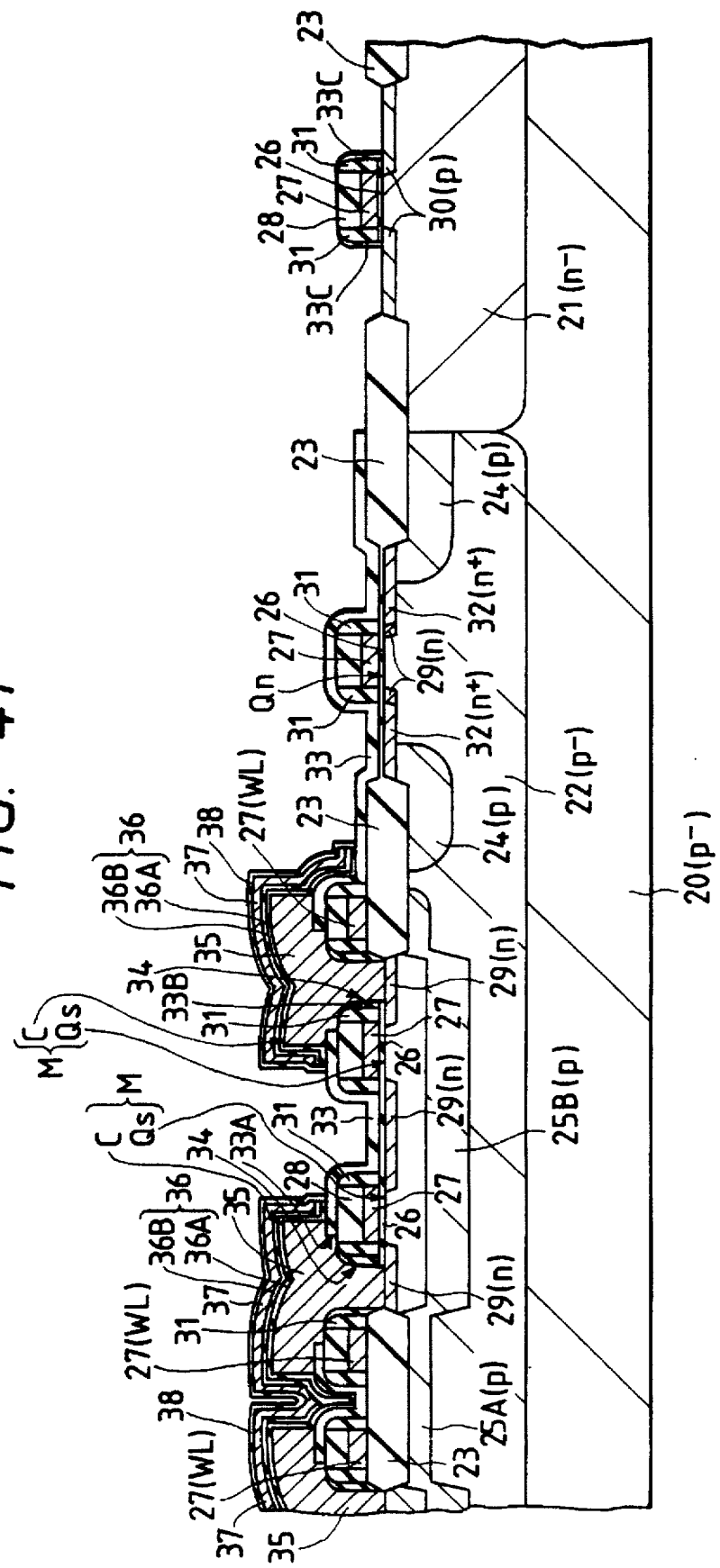

Next, in the regions for forming the p-channel MISFETs Qp of the aforementioned peripheral circuits, the interlayer insulating film 33 formed at the aforementioned step is anisotropically etched to form the side wall spacers 33C, as shown in FIG. 41. These side wall spacers 33C are formed on the side walls of the aforementioned side wall spacers 31 and in self-alignment with the aforementioned gate electrodes 27. The side wall spacers 33C are formed to enlarge the gate length of the side wall spacers 31 of the p-channel MISFETs Qp. The total gate length of the side wall spacers 31 and 33C is made to be about 200 [nm], as has been described hereinbefore.

Next, a not-shown insulating film is formed all over the surface of the substrate including the surface of the upper electrode layer 37 of the information storing capacity elements C of the stacked structure, the surface of the n-channel MISFETs Qn and the surface of the regions forming the p-channel MISFETs Qp. This insulating film is used mainly as the contamination preventing film when the impurity is introduced. The insulating film is formed of the silicon oxide film, which is deposited by the CVD method using inorganic silane gases and nitrogen oxide gases, for example, as its source gases, to have a small thickness of about 10 [nm].

Figure 42:
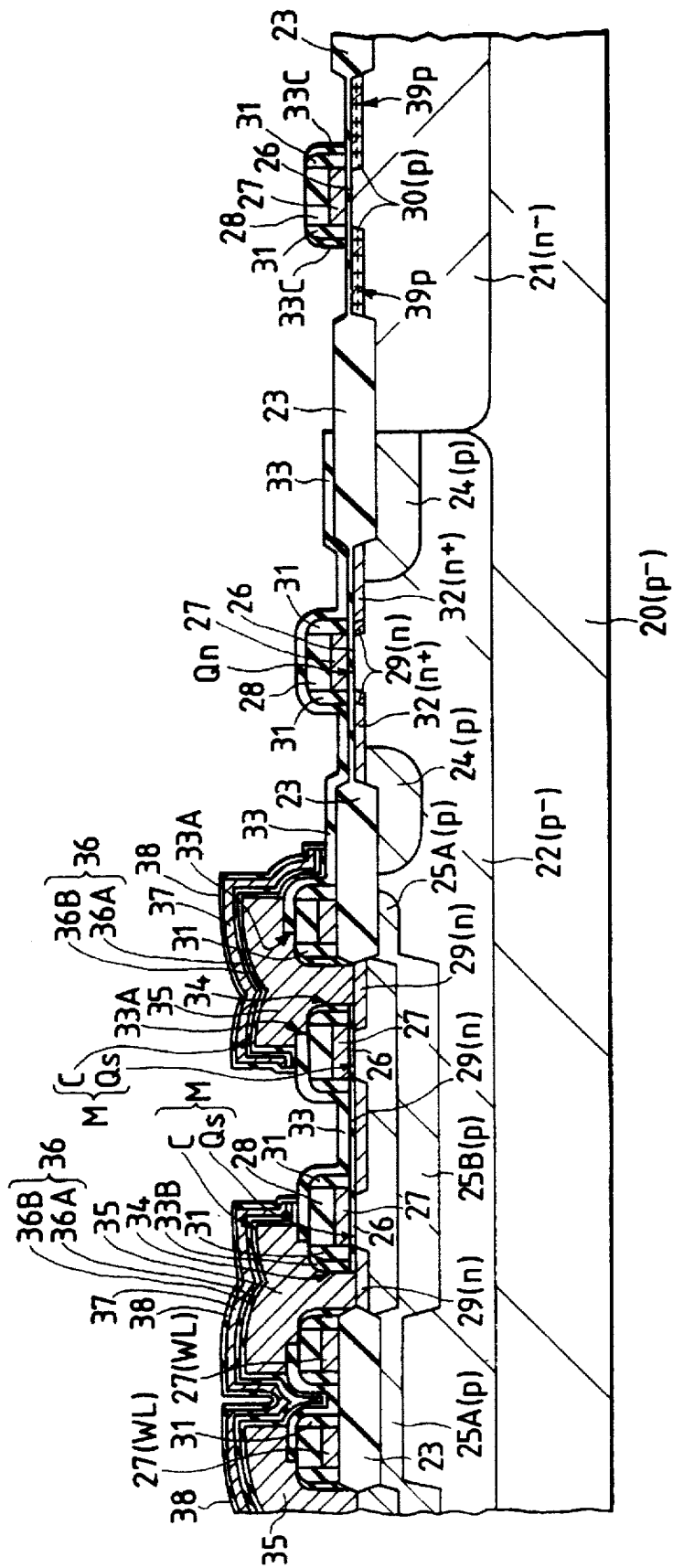

Next, a p-type impurity 39p is introduced, as shown in FIG. 42, into the regions forming the p-channel MISFETs Qp of the peripheral circuits. When this p-type impurity 39p is introduced, mainly the side wall spacers 31 and 33C are used as the impurity introduction mask. When the p-type impurity 39p is introduced, moreover, the regions to be formed with the p-channel MISFETs Qp, namely, the regions to be formed with the memory cell arrays 11E and the n-channel MISFETs Qn are covered with the not-shown impurity introduction mask (of the photoresist film). The aforementioned p-type impurity 39p used is $BF_2$ (or B) having an impurity concentration of about $10^{15}$ [atoms/$cm_2$], for example, by the ion implantation method of an energy of about 50 to 70 [KeV].

After this, a heat treatment is accomplished to elongate and diffuse the aforementioned p-type impurity 39p to form the $p^+$-type semiconductor regions 39. This heat treatment is accomplished at a temperature as high as about 900 to 1,000 [°C.], for example, for 20 to 40 [min.]. The p-channel MISFETs Qp having the LDD structure are completed by forming the $p^+$-type semiconductor regions 39. The p-channel MISFETs Qp enlarge the gate length of the side wall spacers 31 with the side wall spacers 33C and are formed after the heat treatment (of the dielectric film 36, for example) for forming the information storing capacity element C of the stacked structure of the memory cells M. In short, the p-channel MISFETs Qp can reduce the diffusions of the $p^+$-type semiconductor regions 39 to the channel forming regions and the short channel effect.

Thus, in the DRAM 1 including the memory cells M having the series circuit of the memory cell selecting MISFETs Qs and the information storing capacity elements C of the stacked structure and the complementary MISFETs of the LDD structure constituting the peripheral circuits, the fabrication process comprises: the step of sequentially forming the individual gate insulating film 26 and gate electrodes 27 of the memory cell selecting MISFETs Qs of the memory cells M and the n-channel MISFETs Qn and the p-channel MISFETs Qp of the peripheral circuits; the step of forming the individual lightly doped n-type semiconductor region 29 and p-type semiconductor regions 30 for forming the LDD structures of the memory cell selecting MISFETs Qs, the n-channel MISFETs Qn and the p-channel MISFETs Qp in self-alignment with the gate electrodes 27; the step of forming the side wall spacers 31 on the side walls of the individual gate electrodes 27 of the memory cell selecting MISFETs Qs, the n-channel MISFETs Qn and the p-channel MISFETs Qp; the step of forming the densely doped $n^+$-type semiconductor regions 32 of the n-channel MISFETs Qn in self-alignment of the side wall spacers 31; the step of forming the information storing capacity elements C of the stacked structure of the memory cells M; the step of forming the side wall spacers 33C on the side walls of the gate electrodes 27 of the p-channel MISFETs Qp through the aforementioned side wall spacers 31 in self-alignment with the gate electrodes 27; and the step of forming the densely doped $p^+$-type semiconductor regions 39 of the p-channel MISFETs Qp in self-alignment with the side wall, spacers 33C. Thanks to this construction, the n-channel MISFETs Qn regulates the gate length of the lightly doped n-type semiconductor regions 29 for forming the LDD structure with the single-layered side wall spacers 31so that they can shorten the gate length of the n-type semiconductor regions 29. The p-channel MISFETs Qp regulates the runabout of the densely doped p$^+$-type semiconductor regions 39 to the channel forming regions with the multi-layered side wall spacers 31 and 35C, and the densely doped p$^+$-type semiconductor regions 39 is formed after the heat treatment for forming the information storage capacity elements C of the stacked structure of the memory cells M. As a result, it is possible to further reduce the runabout of the p$^+$-type semiconductor regions 39 to the channel forming regions.

The fabrication process further comprises the step of forming the interlayer insulating films 33 after the step of forming the densely doped n$^+$-type semiconductor regions 32 of the n-channel MISFETs Qn and before the step of forming the information storing capacity elements C of the stacked structure of the memory cells M. After the interlayer insulating film 33 have been formed, the aforementioned side wall spacers 33C are formed by making use of the aforementioned interlayer insulating film 33. Thanks to this construction, the step of forming the side wall spacers 33C can be partially (for depositing the film) shared by the step of forming the interlayer insulating film 33. As a result, the number of fabrication steps of the DRAM 1 can be reduced to an extent corresponding to that share.

[Interlayer Insulating Film Forming Step 2]

Next, an interlayer insulating film 40 is formed all over the surface of the substrate including the individual elements of the aforementioned DRAM 1. This interlayer insulating film 40 is formed of the silicon oxide film which is deposited by the CVD method using inorganic silane gases and nitrogen oxide gases, for example, as its source gases. The interlayer insulating film 40 is formed to have a thickness of about 250 to 350 [nm], for example.

Figure 43:
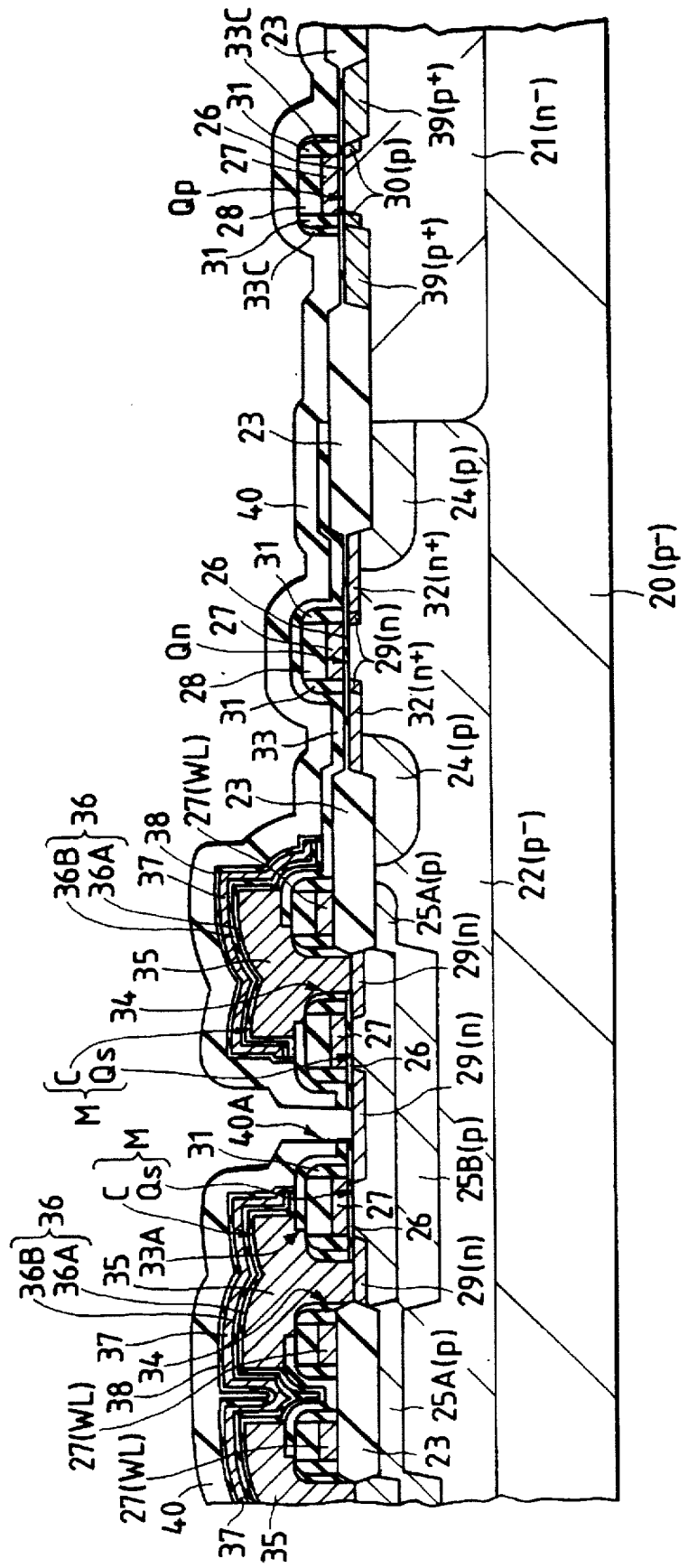

Next, as shown in FIG. 43, the interlayer insulating film 40 is formed with the connecting holes 40A at the connected portions between the memory cells M and the complementary data lines 50. These connecting holes 40A are formed by the anisotropic etching, for example.

[Gate Wiring Line Forming Step 4]

Figure 44:
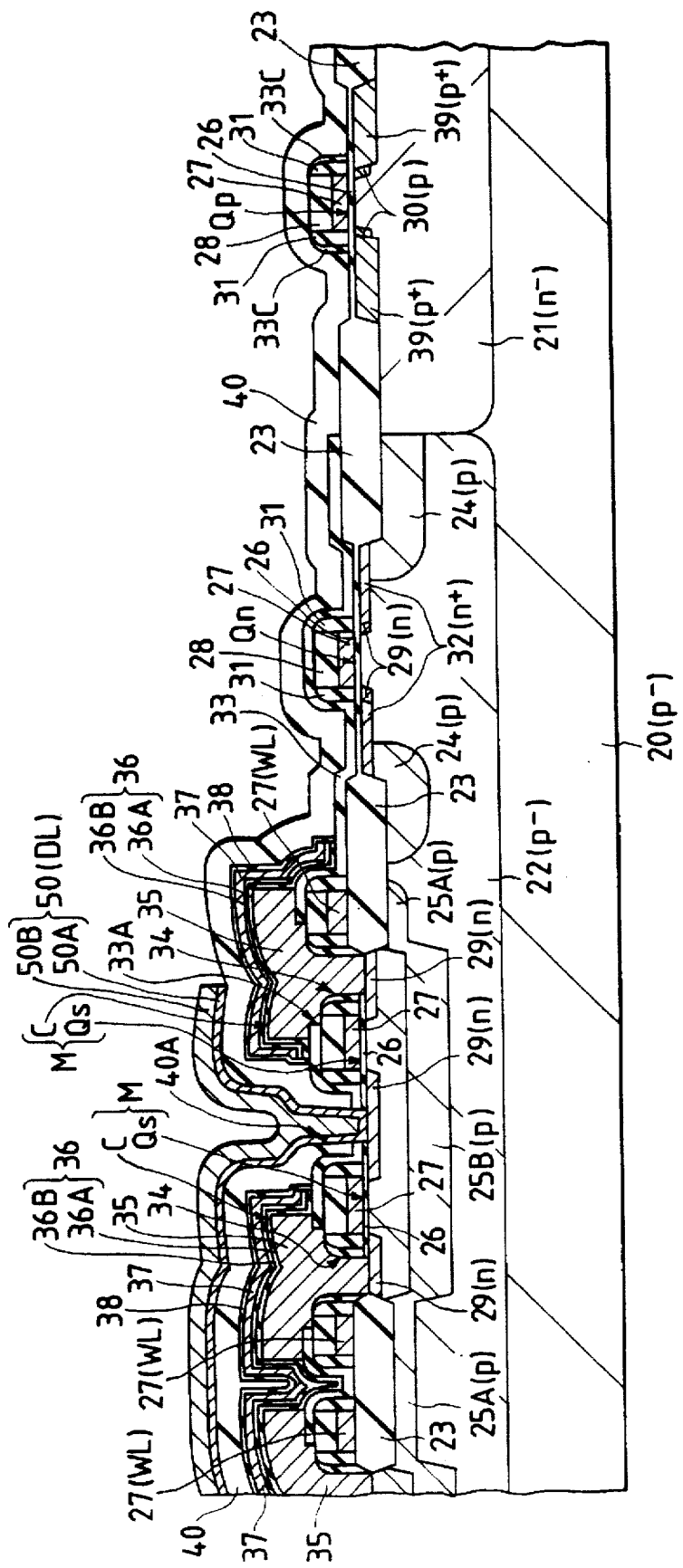

Next, as shown in FIG. 44, there are formed the complementary data lines (DL) 50 which are connected with one of the n-type semiconductor regions 29 of the memory cell selecting MISFETs Qs through the aforementioned connecting holes 40A and which are extended over the interlayer insulating film 40. The complementary data lines 50 are formed at the fourth-layer gate wiring line forming step of the fabrication process. The complementary data lines 50 are constructed of the two-layered structure in which the polycrystalline silicon film 50A and the complementary data lines 50 are sequentially laminated. The lower polycrystalline silicon film 50A are deposited by the CVD method to have a thickness of about 80 to 120 [nm], for example. The polycrystalline silicon film 50A are doped after the deposition with an n-type impurity such as P by the hot oxidization method. The polycrystalline silicon film 50A thus deposited by the CVD method has a high step coverage at the stepped portions of the connecting holes 40A so that they can reduce the defects such as the disconnections of the complementary data lines 50. In case the connecting holes 40A are partially superposed over the element separating insulating film 23 in the connected portions between the memory cells M and the complementary data lines 50 due to the masking misalignment at the step of forming the connecting holes 40A and the element separating insulating film 23, the n-type impurity can be diffused from the polycrystalline silicon film 50A to the principal surface portions of the p$^-$-type well regions 22 to connect the n-type semiconductor regions 29 and the complementary data lines 50 so that they can prevent the complementary data lines 50 and the p$^-$-type well regions 22 from being shorted. The upper transition-metal silicide film 50B is made of the WSi$_2$ film, which is deposited by the CVD method, for example, to have a thickness of 100 to 200 [nm], for example. This upper transition-metal silicide film 50B is formed mainly to reduce the resistance of the complementary data lines 50 and to increase the individual speeds of the information writing operations and the information reading operations. Since, moreover, the upper transition-metal silicide film 50B is deposited by the CVD method, it can further reduce the defects such as the disconnections of the complementary data lines 50.

These complementary data lines 50 are formed by patterning the individual deposited upper transition-metal silicide film 50B into a predetermined shape by the anisotropic etching, for example.

[Interlayer Insulating Film Forming Step 3]

Next, all the surface of the substrate including the complementary data lines 50 is formed with the interlayer insulating film 51. This interlayer insulating film 51 is formed of the two-layered structure in which the silicon oxide film 51A and the BPSG film 51B are sequentially laminated. The lower silicon oxide film 51A is deposited by the CVD method using inorganic silane gases and nitrogen oxide gases, for example, as its source gases, to have a thickness of about 100 to 200 [nm]. The lower silicon oxide film 51A is formed to prevent the leakage of the impurities (e.g., P and B) of the upper BPSG film 51B. This upper BFSG film 51B is deposited by the CVD method, for example, to have a thickness of about 250 to 350 [nm]. The BPSG film 51B is subjected to the flowing treatment in the atmosphere of the nitrogen oxide gases at a temperature equal to or higher than about 800 [°C.].

Figure 45:
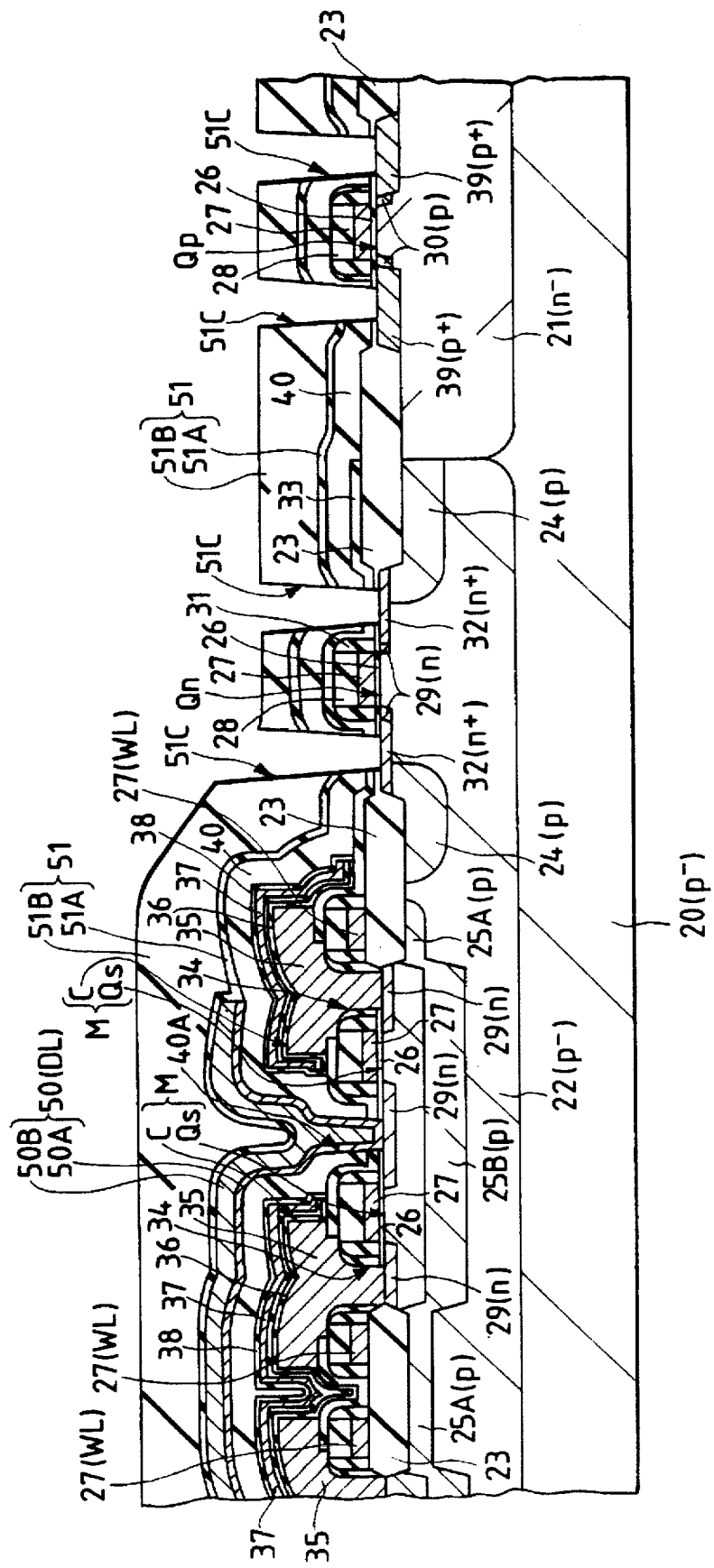

Next, as-shown in FIG. 45, the aforementioned interlayer insulating film 51 is formed with the connecting holes 51C. These connecting holes 51C are formed by removing the overlying interlayer insulating film 51 from the n$^+$-type semiconductor regions 32 and the p$^+$-type semiconductor regions 39 of the individual elements of the DRAM 1, the not-shown wiring lines 50 and the upper electrode layer 37. The connecting holes 51c are formed by the anisotropic etching, for example.

In the regions forming the aforementioned p-channel MISFETs Qp, moreover, the p$^+$-type semiconductor regions 39 have a large diffusion coefficient of the p-type impurity so that the surface impurity concentration is lower than that of the n$^+$-type semiconductor regions 32. Moreover, the n$^+$-type semiconductor regions 32 is etched at its surface of high impurity concentration overetched when the aforementioned connecting holes 51C are formed, so that its surface impurity concentration is further dropped. Still moreover, the p$^+$-type semiconductor regions 39 has a larger work function difference than that of the n$^+$-type semiconductor regions 32 because the wiring lines to be connected therewith are formed of the transition-metal (e.g., W) film. In the regions defined by the connecting holes 51C, therefore, the p-channel MISFETs Qp may have the surfaces of the p$^+$-type semiconductor regions 39 doped with a p-type impurity to increase the impurity concentration of the surfaces of the p$^+$-type semiconductor regions 39. Thanks to this construction, the connection resistance between the p$^+$-type semiconductor regions 39 of the p-channel MISFETs Qp and the wiring lines (52) can be reduced.

[Wiring Line Forming Step 1]

Figure 46:
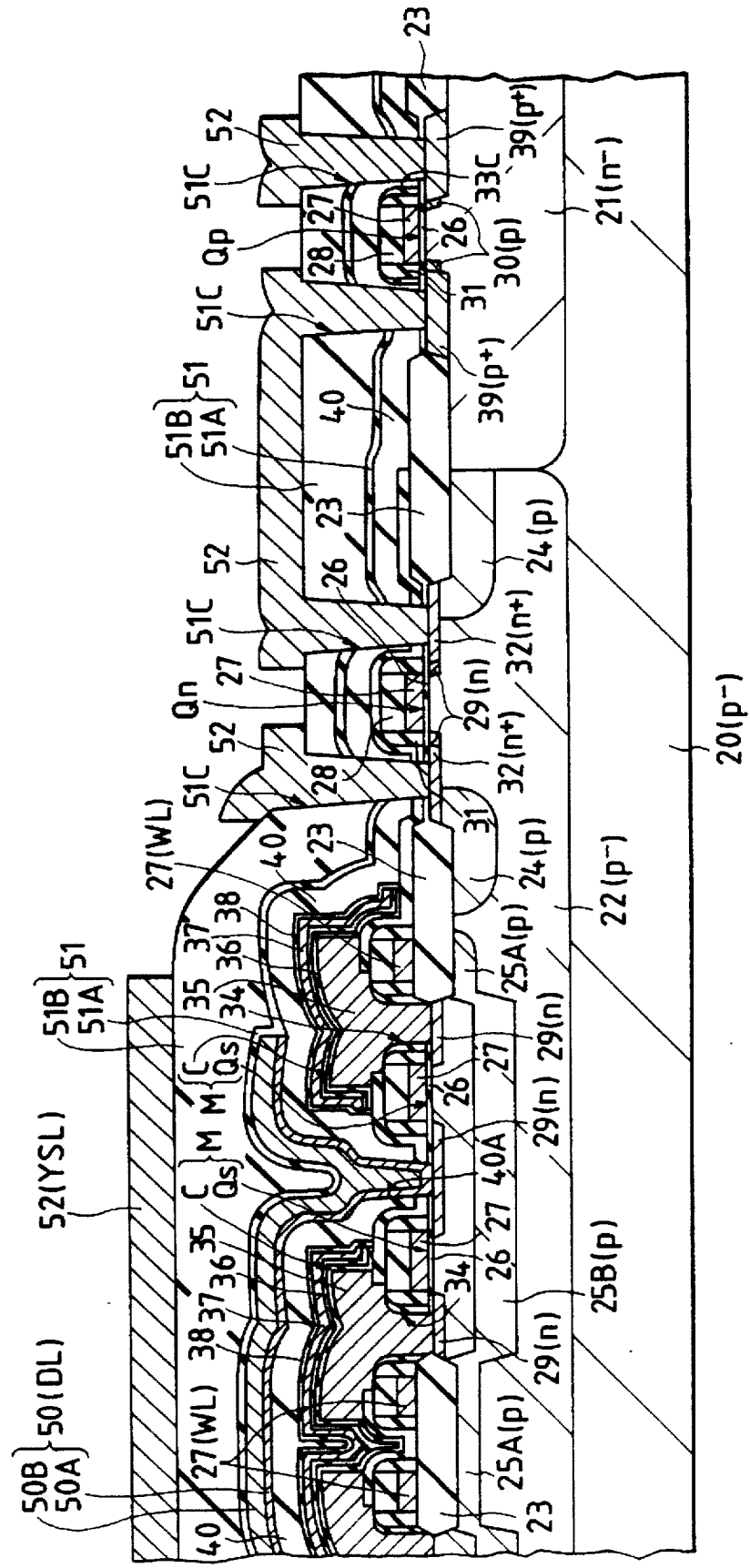

Next, as shown in FIG. 46, the wiring lines (including the column select signal lines) 52 are so formed over the interlayer insulating film 51 as to connect the n⁺-type semiconductor regions 32 and p⁺-type semiconductor regions 39 through the aforementioned connecting holes 51C. The wiring lines 52 are formed of the transition-metal film, e.g., the W film deposited by the sputtering method, to have a thickness of about 350 to 450 [nm], for example. The wiring lines 52 can be formed by patterning them in a predetermined shape by the anisotropic etching, for example, after they have been deposited all over the surface of the interlayer insulating film 51.

[Interlayer Insulating Film Forming Step 4]

Figure 47:
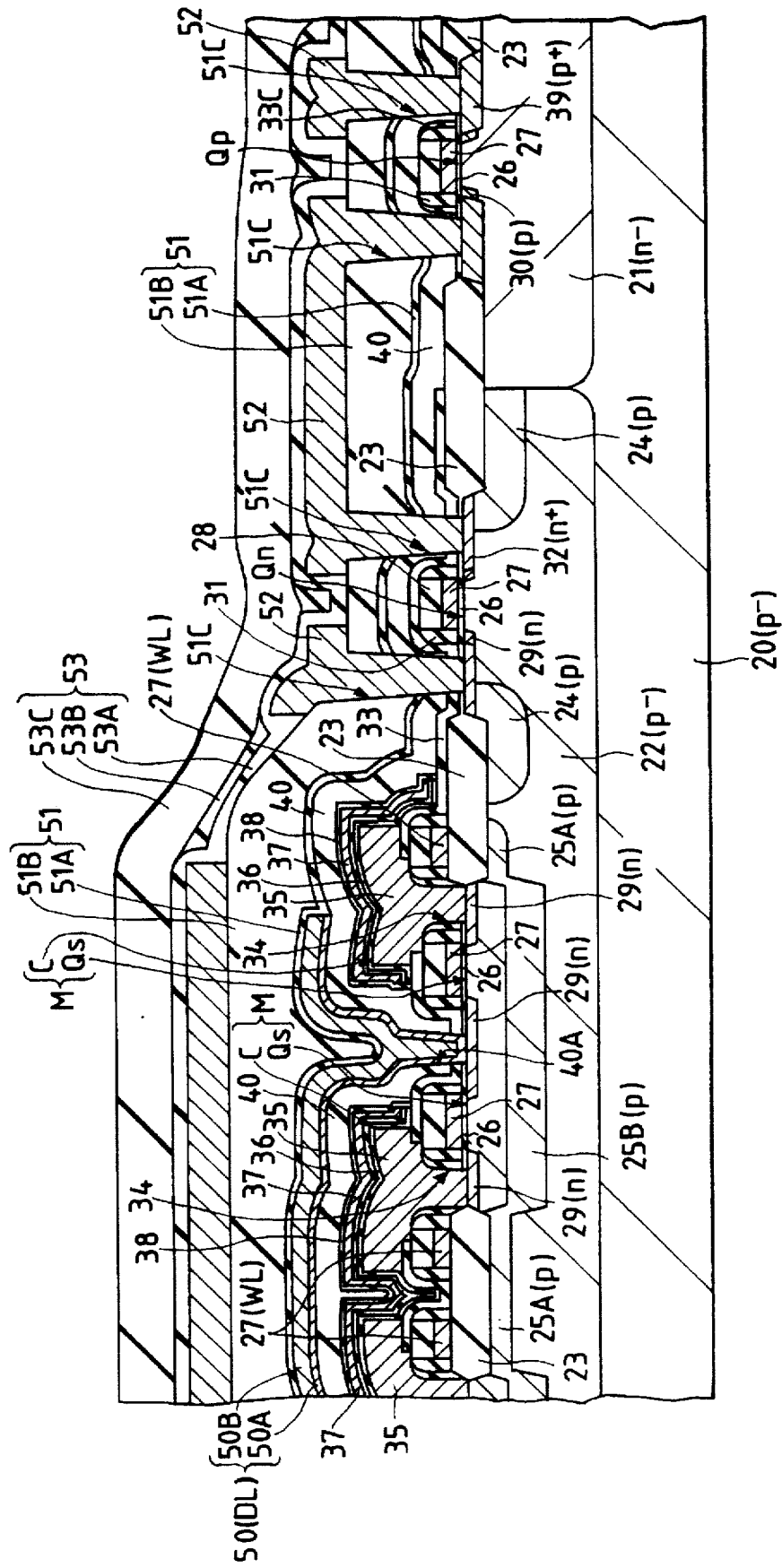
Figure 48:
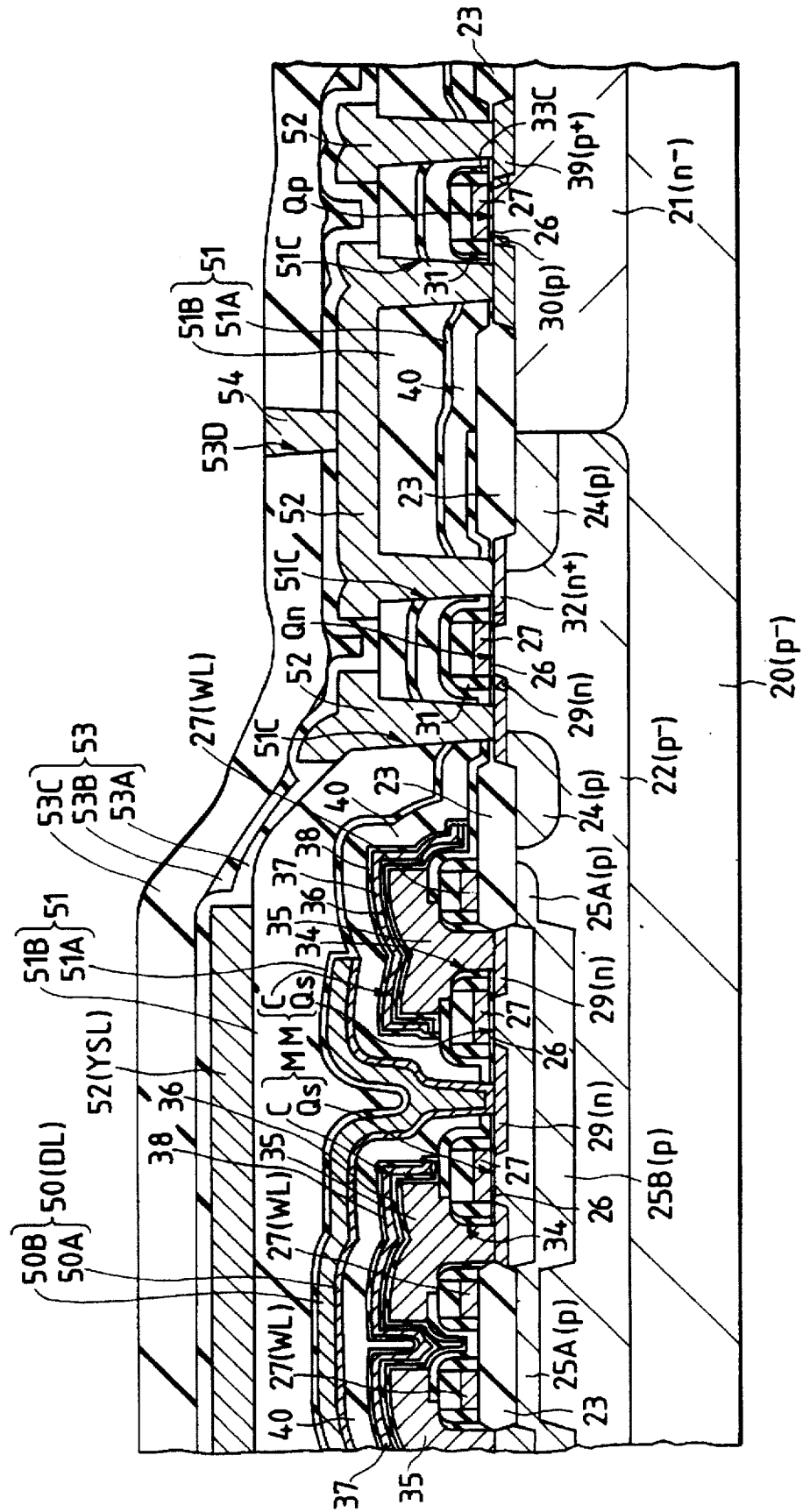

Next, as shown in FIG. 47, all the surface of the substrate including the aforementioned wiring lines 52 is formed thereover with the interlayer insulating film 53. This interlayer insulating film 53 is formed of the three-layered structure, in which the silicon oxide film (i.e., the deposited type insulating film) 53A, the silicon oxide film (i.e., the applied type insulating film) 53B and the silicon oxide film (i.e., the deposited type insulating film) 53C are sequentially laminated. The lower silicon oxide film 53A is deposited by the C-CVD method using tetraethoxysilane gases as its source gases, to have a thickness of about 250 to 350 [nm]. The intermediate silicon oxide film 53B is formed to flatten the surface of the interlayer insulating film 53. This silicon oxide film 3B is formed by several (two to five) times of applications (to have a total film thickness of about 100 to 150 [nm]) by the SOG method, by a subsequent baking treatment (at about 450 [°C.]) and by retarding the surface by the etching. As a result of the retardation by this etching, the silicon oxide film 53B is formed only in the recesses of the stepped shape of the surface of the lower silicon oxide film 53A. On the other hand, the intermediate layer of the interlayer insulating film 53 may be formed of an organic film such as a polyimide resin film in place of the aforementioned silicon oxide film 53B. In order to enhance the strength of the interlayer insulating film 53 as a whole, the upper silicon oxide film 53C is deposited by the C-CVD method using tetraethoxysilane gases, for example, as its source gases, to have a thickness of about 250 to 350 [nm].

Next, the predetermined wiring lines 52 of the aforementioned interlayer insulating film are removed to form the connecting holes 53D. These connecting holes 53D are formed by the anisotropic etching, for example.

Next, the transition-metal film 54 is laminated (or buried) on the surface of the wiring lines 52 which are exposed to the insides of the connecting holes 53D. The transition-Metal film 54 is formed of a W film deposited by the selective CVD method, for example, to have a thickness of about 600 to 800 [nm]. This W film has the following reaction formula:

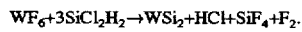

$$WF_6 + 3SiCl_2H_2 \xrightarrow{650°-700°C.} WSi_2 + HCl + SiF_4 + F_2.$$

[Wiring Line Forming Step 2]

Figure 49:
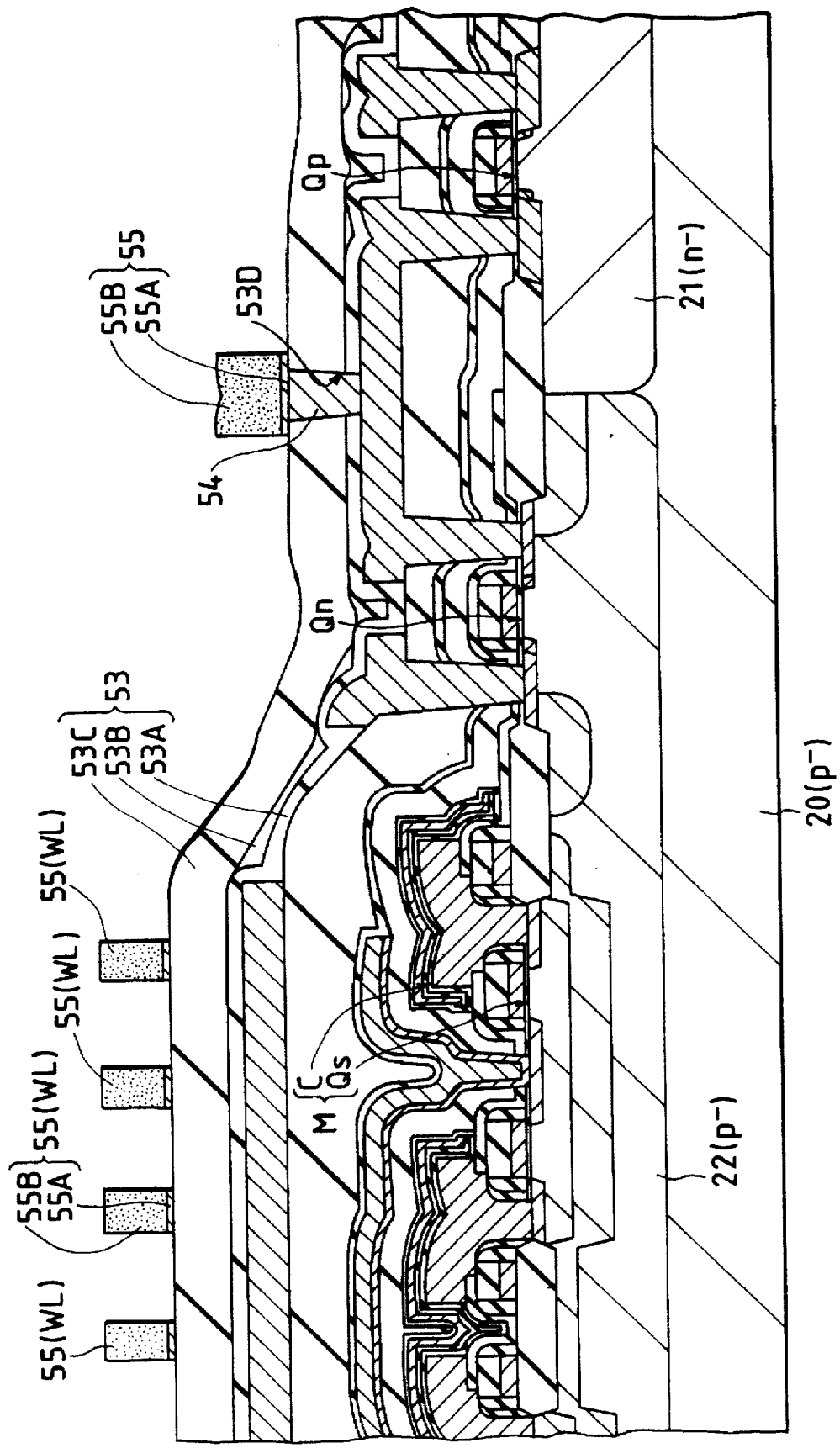

Next, as shown in FIG. 49, the wiring lines (including the shunting word lines) 55 are so formed over the interlayer insulating film 53 that they may be connected with the transition-metal film 54 buried in the aforementioned connecting holes 53D. These shunting word lines 55 are formed of the two-layered structure in which the transition-metal nitride film (or the transition-metal film) 55A and the aluminum alloy film 55B are sequentially laminated. The lower transition-metal nitride film 55A is formed of a TiN film deposited by the sputtering method, for example, to have a thickness of about 130 to 180 [nm]. The transition-metal nitride film 55A is formed to prevent the deposition of the Si and the alloying reaction with the aluminum at the portions of the aforementioned connecting holes 53D, as has been described hereinbefore. The upper aluminum alloy film 55B is deposited by the sputtering method, for example, to have a thickness of about 600 to 800 [nm]. The wiring lines 55 can be formed by laminating the lower transition-metal nitride film 55A and the upper aluminum alloy film 55B sequentially and then by patterning lamination into a predetermined shape by the anisotropic etching, for example.

[Passivation Film Forming Step]

Next, as shown in FIG. 1, all the surface of the substrate including the aforementioned wiring lines 55 is formed thereover with the passivation film 56. This passivation film 56 is formed of the composite film in which the silicon oxide film 56A and the silicon nitride film 56B are sequentially laminated, as has been described hereinbefore. The lower silicon oxide film 56A is deposited by the C-CVD method using the tetraethoxysilane gases as its source gases, as has been described hereinbefore. The upper silicon nitride film 56B is deposited by the plasma CVD method.

Incidentally, although not shown in FIG. 1, a resin film is applied to the upper surface of the passivation film 56. This resin film is formed to improve the α-ray soft error withstand voltage. This resin film is formed of a polyimide resin film, which is applied by a potting technology (including the dropping application step, the baking step and the patterning step of the resin), for example, to have a thickness of about 8 to 12 [μm]. The resin film is basically applied to the whole surface of the DRAM 1 excepting the regions which are opened to correspond to the external terminals. Moreover, the resin film may be divided in plurality and arranged over the surface of the DRAM 1. In other words, the resin film is arranged in the regions, which are desired to retain the α-ray soft error withstand voltage of the DRAM 1, such as the memory cell arrays 11E and the portions (12 and 13) of the direct peripheral circuits but not in the indirect peripheral circuits and the remaining portions of the direct peripheral circuits so that the regions left unarranged may be used as the divided ones. By thus dividing the resin film, the stress of the resin film can be reduced to prevent the cracking of the passivation film.

[Fuse Opening Step]

On the other hand, the aforementioned DRAM 1 is arranged with the Y-redundancy circuit 1812 and the X-redundancy circuit 1806 for relieving the defective complementary data lines (DL) 50, the defective word lines (WL) 27 (or the shunting word lines 55). The Y-redundancy circuit 1812 accomplishes the switching from the defective complementary data lines 50 to the redundancy complementary data lines 50 in dependence upon whether or not a fuse element F is to be cut. Likewise, the X-redundancy circuit 1806 accomplishes the switching from the defective word lines 27 to the redundancy word lines 27 in dependence upon whether or not the fuse element F is to be cut.

Figure 50:
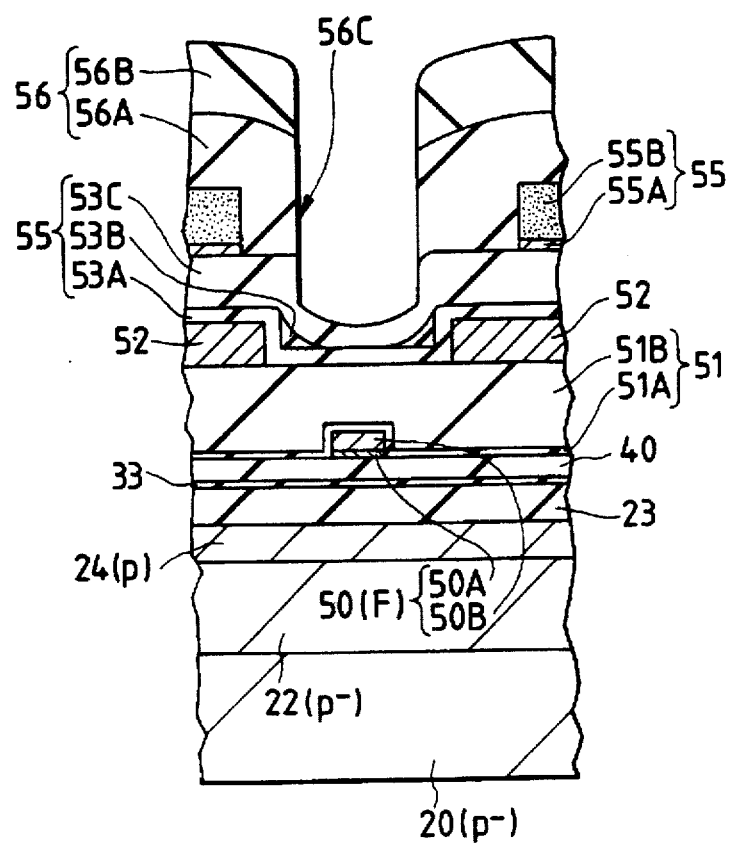
FIG. 50 is a section showing an essential portion of a fuse element of the aforementioned DRAM.

This fuse element F is formed of a conducting layer shared with the complementary data lines 50 and the wiring lines 50, as shown in FIG. 50 (presenting a section showing an essential portion). Since the DRAM 1 of the present embodiment adopts the laser cutting method, the fuse element 50 is cut with the laser beam. Since this fuse element 50 has an unstable cutting in the presence of a thick passivation film 56, there is provided over the fuse element 50 a fuse opening 56C which is formed in the passivation film 56. Since the etching gases to be used for forming the fuse opening 56C is also used for etching the fuse element 50, there is left over the fuse element 50 an insulating film having a suitable thickness (no more than 800 [nm]) such as the interlayer insulating film 51 and the interlayer insulating film 53. The conducting layer below the fuse element 50 such as the same conducting layer as the upper electrode layer 37 of the information storing capacity elements C of the stacked structure is too thin and highly resistive to suit the fuse element F. Moreover, the same conducting layers as the lower electrode layer 35 and the gate electrodes 27 are overlaid by a number of insulating films so that the steps of forming the fuse opening are increased and complicated. Since, moreover, the conducting layers identical to the wiring lines 52 and 55 over the fuse element 50 have properties to reflect the laser beam, they are not suitable for the fuse element F.

The method of forming the fuse element 50 and the fuse opening 56C will be briefly described with reference to FIGS. 51 to 53 (presenting sections showing the essential portion at the individual fabrication steps).

Figure 51:
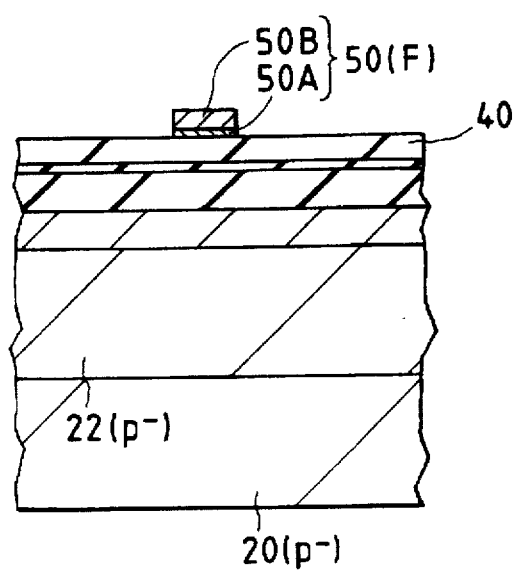
FIGS. 51 to 53 are sections showing an essential portion at the individual fabrication steps of the aforementioned fuse element.

First of all, as shown in FIG. 51, the fuse element 50 is formed at the same fabricating step as that of the complementary data lines 50 over the regions of the interlayer insulating film 40 for forming the fuse element F.

Figure 52:
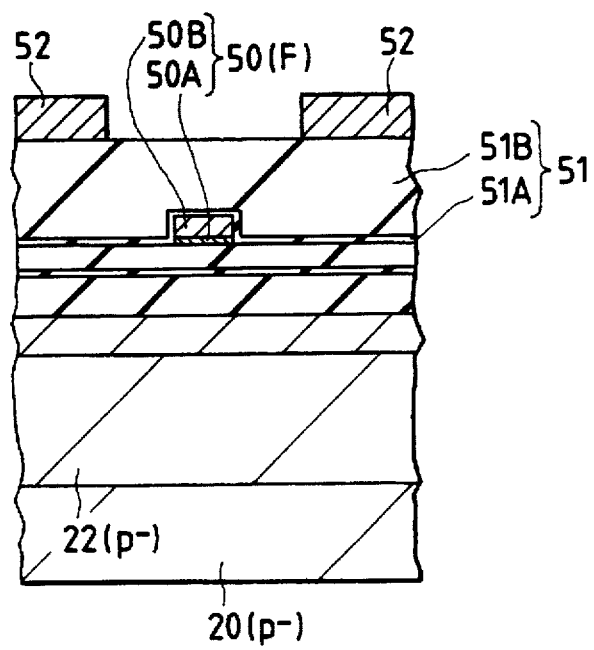

Next, the interlayer insulating films 51 (or 51A and 51B) are formed, and the wiring lines 52 are then formed, as shown in FIG. 52. No wiring line 52 is present over the fuse element 50, as shown in FIG 52.

Figure 53:
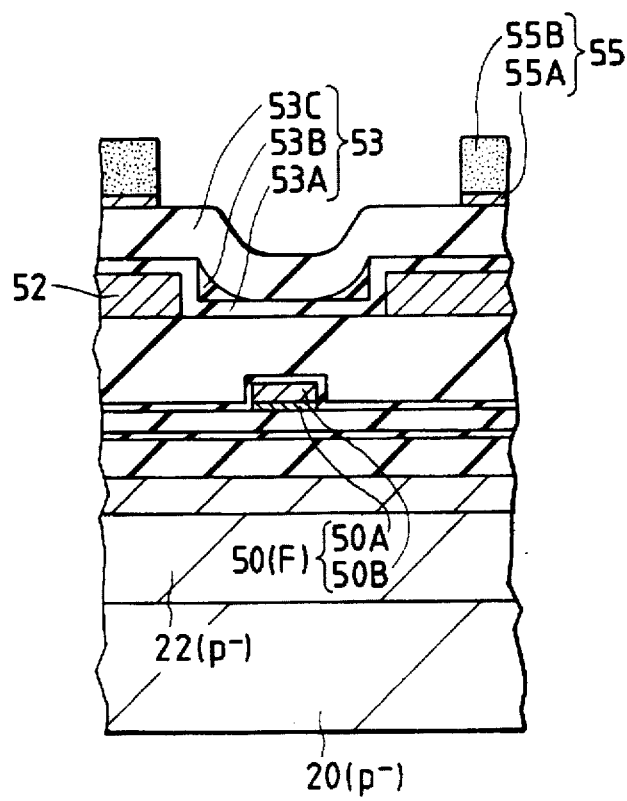

Next, the interlayer insulating films 53 (or 53A, 53B and 53C) are formed, and the wiring lines 55 are then formed, as shown in FIG. 53. No wiring line 55 is present over the aforementioned fuse element 50.

Next, the passivation film 56 is formed, and the fuse opening 56C is formed in the passivation film 56 over the fuse element 50, as shown in FIG. 50. This fuse opening 56C can be formed, although not described, at the fabrication step shared with that of opening the (bonding) portion in which the external terminals BP of the passivation film 56 are present.

Thus, in the DRAM 1 including: the memory cells M formed of the series circuit of the memory cell selecting MISFETs Qs and the information storing capacity elements C of the stacked structure at the intersections between the complementary data lines 50 and the word lines 27; and the laser cutting redundancy fuse element 50 for relieving the defective ones of the complementary data lines 50 and the word lines, the complementary data lines 50 are formed of the composite film, in which the polycrystalline silicon film 50A and the transition-metal silicide film 50B deposited by the CVD method are sequentially laminated, the laser cutting redundancy fuse element 50 is formed of the conducting layer shared with the complementary data lines 50. Thanks to this construction, the complementary data, lines 50 are formed over the memory cell selecting MISFETs Qs of the aforementioned memory cells M and the information storing capacity elements C of the stacked structure. As a result, the number of the insulating films over the laser cutting redundancy fuse element 50 can be reduced to simplify the process of opening the insulating films over the laser cutting redundancy fuse element 50. At the same time, the composite film formed of the polycrystalline silicon film 50A and the transition-metal silicide film 50B has a higher absorptivity of the laser beam than those of the wiring lines 52 and 55 formed over the complementary data lines 50. As a result, the laser cutting redundancy fuse element 50 can be cut simply and reliably.

The DRAM 1 of the present embodiment is completed by a series of steps for forming and opening the aforementioned passivation film 56.

Next, in the fabrication process of the DRAM 1, the steps of fabricating the individual essential portions will be described in detail in the following.

[Wiring Line & Connecting Hole Forming Steps]

In the fabrication process of the DRAM 1, the complementary data lines (DL) 50, the wiring lines 52, the wiring lines 55 and the connecting holes 40A, 51C and 53D are basically and individually treated by the photolithography technology using a multi-layered resist mask. This multi-layered resist mask is formed of a three-layered structure, for example, in which an inphotosensitive resin film (e.g., an organic film such as a polyimide resin film), an intermediate film (e.g., an inorganic film such as a silicon oxide film applied by the SOG method) and a photosensitive resin film are sequentially laminated.

The multi-layered resist mask is used to damp the stepped shape growing by the multi-layered structure mainly with the lower film and the intermediate film and to improve the treating accuracy of the upper photosensitive resin film and the treating accuracy of the material to be etched. The multi-layered resist mask is formed by the following method.

First of all, the inphotosensitive resin film, the intermediate film and the photosensitive resin film are sequentially laminated over the surface of the material to be etched (e.g., the aforementioned complementary data lines 50) to form the multi-layered resist film.

Next, the upper photosensitive resin film of the multi-layered resin film is treated by the ordinary exposure and development to form an etching mask.

Next, this etching mask is used to pattern the intermediate film and inphotosensitive resin film of the multi-layered resist film sequentially by the anisotropic etching to form the multi-layered resist mask. In this patterning, the lower inphotosensitive resin film is patterned by the anisotropic technology using oxygen ($O_2$) gases and halogen (e.g., $Cl_2$ or $Br_2$) gases. The etching apparatus used is exemplified by the reactive ion etching (i.e., BIE) apparatus, the magnetron type RIE apparatus or the μ-wave ECR apparatus. The etching pressure used is about 1 to 10 [mTorrs], and the high-frequency output used is about 0.25 to 30 [/cm$^2$]. On the other hand, the halogen gases used in the aforementioned anisotropic etching are not the halogen gases (which are produced together with halogen compounds) as the out gases of a solid such as vinyl chloride but are supplied from the outside of a vacuum chamber by placing the vinyl chloride in the vacuum chamber.

The anisotropic gases of the aforementioned oxygen gases and the halogen gases will produce carboxylic acid, if the lower inphotosensitive resin film is etched with the oxygen gases, so that an acid chloride having a lower-vapor pressure is produced if the halogen gases are added to that carboxylic acid. As a result, thee produced gases can be easily relieved to reduce the amount of the side etching of the lower inphotosensitive resin film.

Thus, the multi-layered resist film is formed to have the three layers, of which the lower inphotosensitive resin film if patterned by the anisotropic etching using the oxygen gases and the halogen gases. Thanks to this construction, the anisotropic etching gases used are the halogen gases so that the side etching amount of the lower inphotosensitive resin film can be reduced to improve the treating accuracy. At the same time, any halogen compound (e.g., $CF_4$ or $CCl_4$) is used as the anisotropic etching gases so that any organic substance can be prevented from sticking to the patterned sides of the lower inphotosensitive resin film. Thanks to this prevention, the removing step of the organic substance can be reduced together with the contaminations of the inner walls of the vacuum chamber of the etching apparatus. Moreover, the contaminations of the vacuum chamber inner walls can be reduced together with the repeated sticks of the organic substances which may drop from the aforementioned inner walls onto the surface of the semiconductor wafer being fabricated, so that the production yield can be improved.

Since, moreover, the halogen compound such as carbon (C) is not used as the anisotropic etching gases, the anisotropic etching rate can be increased.

In this anisotropic etching, still moreover, not the halogen gases as the solid out gases but the pure halogen gases coming from the outside of the vacuum chamber are used so that similar effects can be achieved.

[Wiring Line Forming Step 1]

In the fabrication process of the aforementioned RAM 1, the treating accuracy of the wiring lines 52, i.e., the W film can be improved by adopting the cold anisotropic etching.

Figure 54:
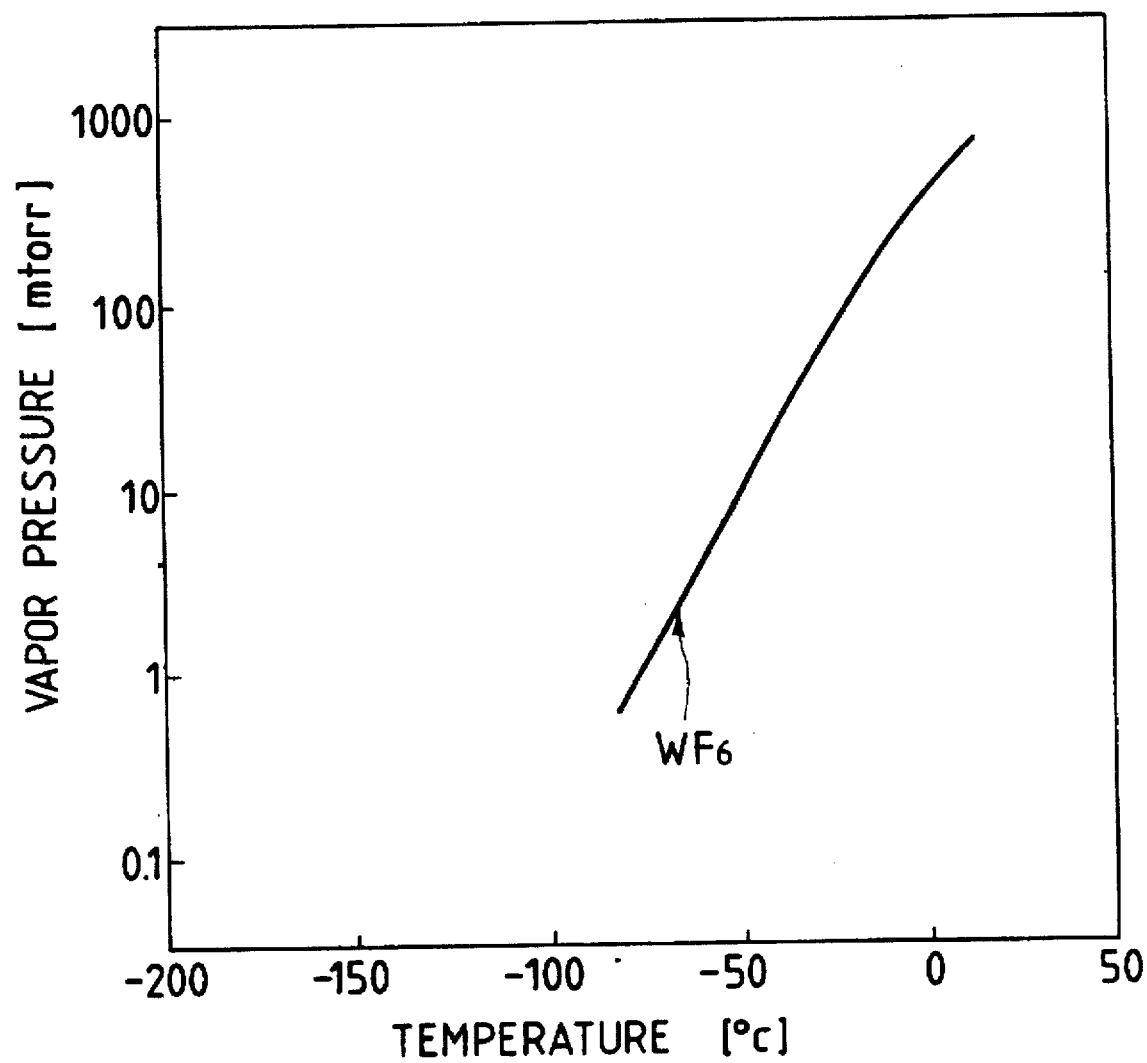
FIG. 54 is a graph presenting the relation between the temperature and the vacuum pressure of the film used in the aforementioned DRAM.

The anisotropic etching of the wiring lines 52 is accomplished in the vacuum chamber of the RIE apparatus or the like. This vacuum chamber is evacuated under a vacuum within about $10^{-2}$ to $10^{-3}$ [Torrs], in which the anisotropic etching is accomplished. As shown in FIG. 54 (presenting a relation between the temperature and vacuum pressure of tungsten hexafluoride $WF_6$), the $WF_6$ has its vacuum pressure dropped to or near 0 [mTorrs] against the degree of vacuum in the vacuum chamber at a low temperature equal to or lower than about −40 [°C.]. More specifically, the wiring lines 52 can have their etching anisotropy improved, because the ions will impinge, as a result of the anisotropic etching at the above-specified low temperature range, upon not the treated side walls but the bottom being treated so that they are evaporated. As a result, it is possible to improve the treating accuracy of the wiring lines 52.

[Connecting Hole Forming Step]

In the fabrication process of the aforementioned DRAM 1, the aforementioned connecting holes 51C (or 53D) can be individually formed into a taper shape by making use of the magnetron RIE apparatus or the μ-wave ECR apparatus.

The connecting holes 51C can control their taper angle (i.e., their step angle) by controlling the etching pressure, the etching gas flow rate or the high-frequency output of the etching conditions. In order to control the above-specified taper angle without deteriorating the etching performance, it is desirable to control the etching pressure or the etching gas flow rate. The etching rate of the anisotropic etching is determined by the product of the ion current and the mean ion energy, and the taper angle is determined by the mean ion energy for a constant ion current. On the other hand, this ion current has a tendency to be proportional to the high-frequency output and adversely proportional to the voltage Vdc between the semiconductor wafer (or electrodes) and the plasma in case the high-frequency output is constant.

As seen from a relation between the etching pressure and the energy in FIG. 55(A), the anisotropic etching using the RIE apparatus has a narrow stable discharge region against the etching pressure, a steep change of the voltage Vdc, and a steep change of the mean ion energy. In other words, the controllability of the taper angle is not good.

As seen from a relation between the etching pressure and the energy in FIG. 55(B), on the contrary, the anisotropic etching using the magnetron RIE apparatus (or the μ-wave ECR apparatus) has a more ion amount by 1to 2 orders so that the stable discharge region against the etching pressure is widened. As seen from a relation between the ion energy and the etching rate in FIG. 55(C) and from a relation between the ion energy and the taper angle in FIG. 55(D), therefore, the controllability of the taper angle is enhanced. The etching rate of the stepped portion is one which is determined by the ion energy corresponding to cosθ times as high as that of the flat portion. This means that the ion current density of the stepped portion of the taper angle cosθ times as high as that of the flat portion. Incidentally, as the taper angle θ comes the closer to 90 degrees, the stepped portion of the connecting holes grows the steeper. As the taper angle θ comes the closer to 0 degrees, the stepped portions grow the gentler.

Thus, the connecting holes 51C are formed by the anisotropic etching using the magnetron RIE apparatus (or the μ-wave ECR apparatus) so that the stable discharge region against the etching pressure can be widened to reduce the individual changes of the voltage Vdc and the mean ion energy. As a result, the controllability of the taper angle can be improved without deteriorating the etching performance. In short, the taper angle can be simply decided without any dispersion to 60 to 80 degrees, as shown in FIG. 55(D). As a result, the connecting holes 51C can be tapered to reduce the defects such as the disconnections of the wiring lines 52 at the stepped portions of the connecting holes 51C. Incidentally, there arises no problem in the present embodiment because the transition-metal film 54 is buried in the connecting holes 53D. Otherwise, however, similar tapers are formed.

[Connecting Hole Forming Step]

In the fabrication process of the aforementioned DRAM 1, the insulating film such as the aforementioned connecting holes 51C and 53D is treated by the cold anisotropic etching.

First of all, the DRAM 1 (i.e., the semiconductor wafer to be diced) is directly attracted to the lower electrodes in the vacuum chamber of the etching apparatus by an interposed electrostatic attracting plate. The lower electrodes are cooled at all times so that the semiconductor wafer is held at normal or lower temperatures. In this state, the interlayer insulating films 51 and 53 are individually anisotropically etched to form the connecting holes 51C and 53D.

Since the anisotropic etching gases (i.e., the halogen compound $CHF_3$) are deposited more on the surface of the semiconductor wafer at a lower temperature than that of the inner walls of the etching chamber. As a result, the adoption of this cold anisotropic etching can reduce the flow rate of the above-specified anisotropic etching gases and reduce the contaminations of the inner walls of the vacuum chamber.

(Embodiment II)

The present embodiment II is a second embodiment of the present invention, which adopts the leaf type in the step of burying the transition-metal film in the connecting holes for connecting the different wiring layers, so as to improve the production yield of the DRAM 1 of the foregoing embodiment I.

Figure 56:
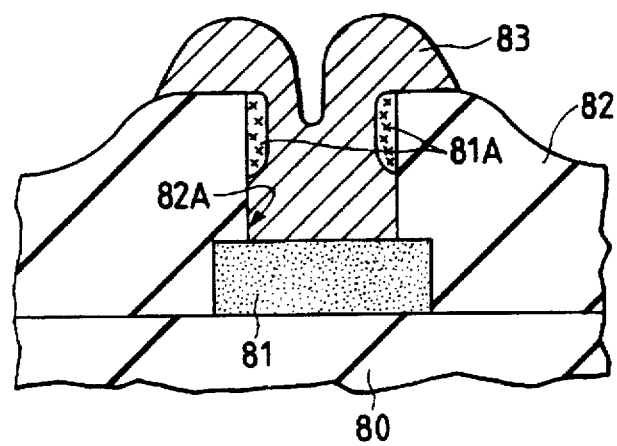
FIGS. 56 to 58 are sections showing an essential portion of the DRAM according to an embodiment II of the present invention.

An essential portion of the DRAM 1 according to the embodiment II of the present invention is shown in FIG. 56 (presenting the essential portion in section).

Figure 58:
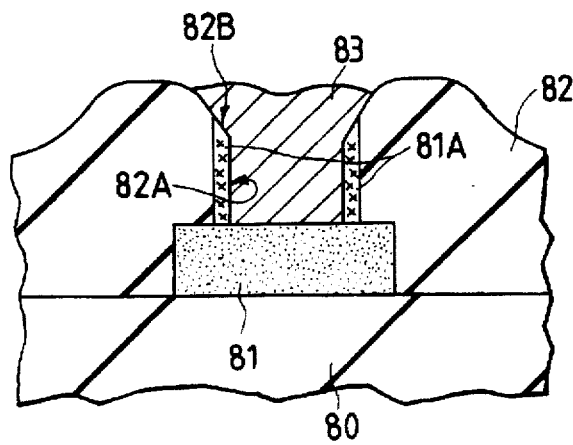

In the DRAM 1, as shown in FIG. 58, a transition-metal film 83 buried in a connecting hole 82A formed in an interlayer insulating film 82 is connected with a wiring line 81 formed over an under insulating film 80. The wiring line 81 is formed of an aluminum film or its alloy film. The interlayer insulating film 82 is formed of either a single layer of a silicon oxide film or a composite composed mainly of the former. The transition-metal film 83 buried in the connecting hole 82A is formed of the W film which is deposited by the selective CVD method. This transition-metal film 83 is connected with a not-shown wiring line which extends over the interlayer insulating film 82.

The structure shown in FIG. 56 can be formed by the fabrication method using the following leaf type.

First of all, the connecting hole 82A is formed in the interlayer insulating film 82, and the wiring line 81 has its surface exposed to the inside of the connecting hole 82A. The surface of this wiring line 81 thus exposed-is oxidized to form alumina ($Al_2O_3$)

Next, the alumina thus formed over the aforementioned wiring line 81 is removed by the sputtering method. This puttering method uses the mixed gases of argon (Ar) gases and fluorine group ($NF_3$, XeF, $CF_4$ or $CHF_3$) gases. The aforementioned argon gases can remove the alumina, which is formed over the wiring line 81, by the sputtering with their argon ions. The fluorine group gases can promote the sputtering rate of the alumina. Moreover, the fluorine group gases remove the uncoupled layer, which is formed over the interlayer insulating film 82 as a result of the collisions of the argon ions, to improve the selectivity of the transition-metal film 83 while protecting the surface of the wiring line 81 against the corrosion. More specifically, only the argon gases would form the uncoupled hands on the surface of the interlayer insulating film 82 to lose the selectivity of the transition-metal film 83. In case, however, a halogen compound such as $Cl_2$ were mixed in the argon gases, the uncoupled layer could be removed, but the surface of the 81 would be corroded. Therefore, the sputtering method uses the mixed gases of the argon gases and the fluorine group gases, as has been described hereinbefore.

Next, the transition-metal film 83 is selectively deposited over the wiring line 81 in the aforementioned connecting hole 82A so that it is buried in the connecting hole 82A.

Thus, since the alumina is removed from the surface of the wiring line 81 by the sputtering method using the aforementioned mixed gases, it is possible to connect the wiring line 81 and the transition-metal film 83 excellently and to retain the selectivity of the transition-metal film 83.

As shown in FIG. 56, moreover, the fluorine (F) used in the sputtering method sputters the surface of the wiring line 81 to hit away the aluminum particles. These aluminum particles stick to the inner walls of the connecting hole 82A to form a cross contamination 81A. This cross contamination 81A gives a higher deposition rate to the transition-metal film 83 than that of the surface of the interlayer insulating film 82 so that the upper portion of the transition-metal film 83 is protruded from the surface of the interlayer insulating film 82. This protrusion of the transition-metal film 83 drops the treating accuracy of an upper wiring line to be connected therewith.

Figure 57:
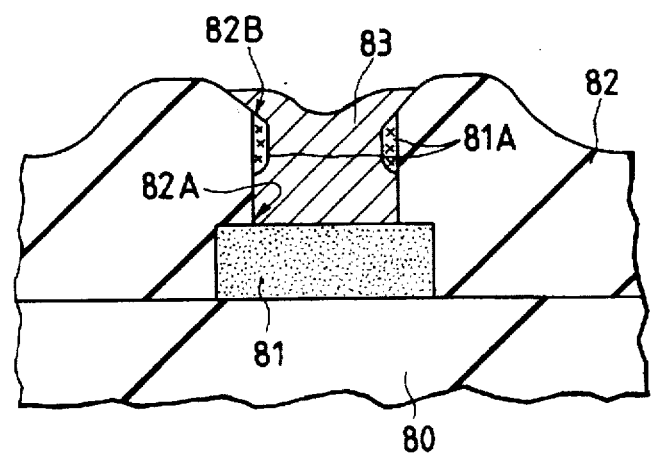

In order to reduce the protrusion of the transition-metal film 83, the DRAM 1 shown in FIG. 57 (presenting an essential portion in section) has its cross contamination 81A left as it is but is formed with a taper portion 82B at the upper portion of the connecting hole 82A. This taper portion 82B can be formed by an isotropic etching. The connecting hole 82A can be formed by an anisotropic etching. Specifically, the taper portion 82B can remove an upper portion of the cross contamination 81A to expose the surface of the interlayer insulating film 82 and to drop the deposition rate of the transition-metal film 83 at that portion thereby to prevent the protrusion of the transition-metal film 83. Since, on the contrary, the deposition rate of the transition-metal film 83 can be increased by leaving the cross contamination 81A, the fabrication time can be shortened.

In the DRAM 1 shown in FIG. 58 (presenting an essential portion in section), on the other hand, the cross contamination 81A is positively formed on the inner wall of the aforementioned connecting hole 82A to accelerate the deposition rate of the transition-metal film 83.

Although the deposition rate of the transition-metal film 83 is slightly retarded, the cross contamination 81A may be removed substantially wholly to give a complete taper to the connecting hole 82A.

Thanks to the adoption of the leaf type, moreover, the controllability of the thickness of the aforementioned transition-metal film 83 can be improved better than that of the batch type.

(Embodiment III)

The present embodiment III is directed to a third embodiment of the present invention, in which the transition-metal film is buried in the connecting hole for connecting the semiconductor substrate and the wiring layer, although having different a structure from that of the DRAM 1 of the foregoing embodiment II, and in which the leaf type is adopted in the burying step.

Figure 59:
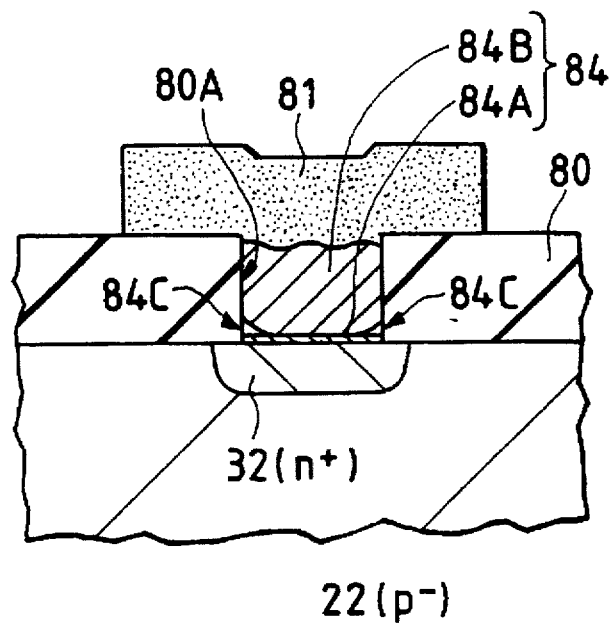
FIGS. 59 to 60 are sections showing an essential portion of the DRAM according to an embodiment III of the present invention.

An essential portion of the DRAM 1 according to the embodiment III of the present invention is shown in FIG. 59 (presenting the essential portion in section).

In the DRAM 1 of the present embodiment III, as shown in FIG. 59, with the $n^+$-type semiconductor region 32 formed over in the principal portion of the $p^-$-type well region 22, there is connected a transition-metal film 84 which is buried in the connecting hole 80A formed in the interlayer insulating film 80. The $n^+$-type semiconductor region 32 is made of silicon (Si), as has been described in connection with the foregoing embodiment I. The interlayer insulating film 80 is formed of either a single layer of a silicon oxide film or a composite film made mainly of the former. The transition-metal film 84 buried in the connecting hole 80A is formed of the composite film, in which a W film 84A deposited by the selective CVD method using the silicon reducing reaction (i.e., the reaction between the Si of the $n^+$-type semiconductor region 32 and $WF_6$) and a W film deposited by the selective CVD method using a silane reducing reaction (i.e., the reaction between $SiH_4$ and $WF_6$) are sequentially laminated. The lower W film 84A is prepared by the silicon reducing reaction so that it can improve the contactnesses between the $n^+$-type semiconductor region 32 and the transition-metal film 84. The upper W film 84B is prepared by the silane reducing reaction so that it can reduce the amount of reduction of the surface of the $n^+$-type semiconductor region 32 thereby to form the $n^+$-type semiconductor region 32 having a small pn junction depth. The transition-metal film 84 has its upper portion connected with the wiring line (e.g., the aluminum alloy film) 81 extending over the interlayer insulating film 80.

In the structure shown in FIG. 59, if the upper W film 84B is deposited after lapse of a short time from the formation of the lower W film 84A at the step forming the transition-metal film 84 deposited in the aforementioned connecting hole 80A, they are separated at their interface (as indicated at numeral 84C). This separation is caused because the upper W film 84B has a higher stress than that of the lower W film 84A. On the other hand, this separation is also caused in case reaction by-products such as fluorine group gases are present.

Figure 60:
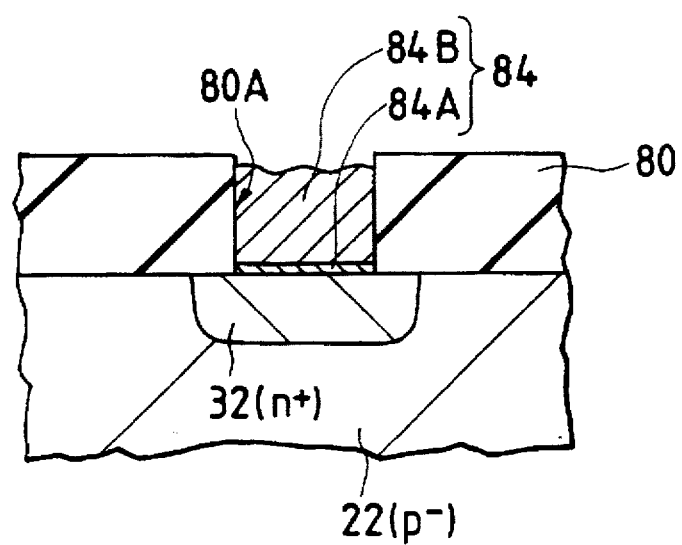

In the DRAM 1 shown in FIG. 60 (presenting an essential portion in section, the lower W film 84A and the upper W film 84B of the aforementioned transition-metal film 84 are continuously formed so that they are prevented from being separated at their interface. The method of continuously forming the lower W film 84A and the higher W film 84B of the transition-metal film 84 will be described in the following.

Figure 61A:
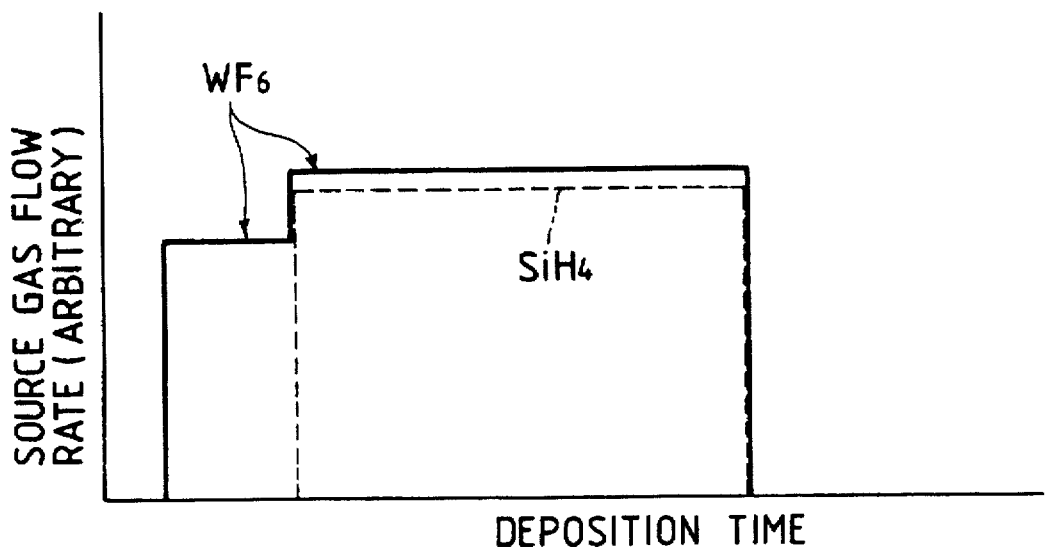
FIG. 61(A) is a graph presenting the relation between the deposition time of the film used in the aforementioned DRAM and the gas flow rate.
Figure 61B:
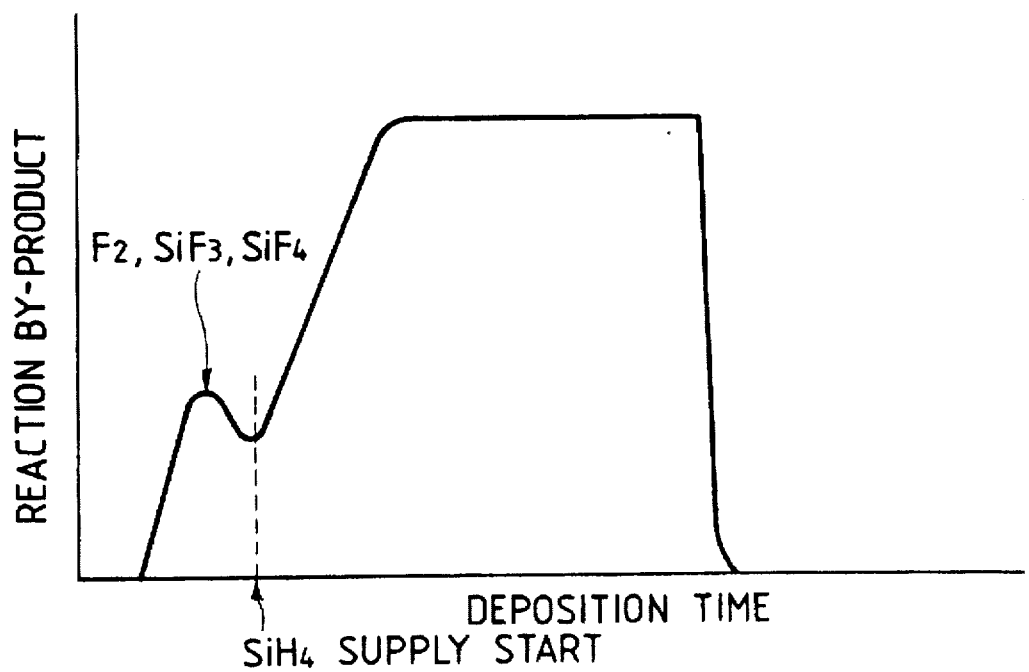
FIG. 61(B) is a graph presenting the relation between the deposition time of the aforementioned film and the yield of the reaction by-product.

First of all, in the selective CVD method adopting the leaf type, as shown in FIG. 61(A), the $WF_6$ is supplied as the source gases to the reaction chamber of the CVD apparatus, as plotted the relation between the deposition time of the W film and the source gas flow rate. The $WF_6$ reacts with the Si at the surface of the $n^+$-type semiconductor region 32 exposed to the inside of the connecting hole 80A, as shown in. FIG. 60, to form the lower W film 84A. With supply of the $WF_6$, as shown in FIG. 61(B), a relation between the deposition time and the amount of the reaction by-products ($F_2$, $SiF_3$ and $SiF_4$) is monitored. This amount of the reaction by-products can be monitored by either a gas mass spectrometer (i.e., a gas mass analyzer) arranged in the exhaust gas supply tube from the reaction chamber or a plasma emission monitor arranged in the reaction chamber (i.e., the chamber).

Next, when the lower W film 84A is formed, the Si of the surface of the $n^+$-type semiconductor region 32 is not exposed so that the deposition of the W film is automatically stopped. As shown at (A) and (B) in FIG. 61, however, the silane gases are supplied to the reaction chamber before the end of the aforementioned silicon reducing reaction from the reduction in the amount of the reaction by-products to deposit the upper W film 84B. In short, the reaction is changed from the silicon reducing reaction to the silane reducing reaction to form the lower W film 84A and the upper W film 84B continuously and sequentially.

Thus, the lower W film 84A and the upper W film 84B of the aforementioned transition-metal film 84 can be continuously formed to prevent the separations at their interface.

Thanks to the adoption of the leaf type, moreover, the controllability of the thickness of the transition-metal film 84 can be improved better than that of the batch type.
(Embodiment IV)

The present embodiment IV is directed to a fourth embodiment of the present invention describing the suitable method of forming the dielectric film 36 and the apparatus for executing the process in the information storing capacity element C of the stacked structure of the memory cell M of the DRAM 1 of the foregoing embodiment I.

Figure 62:
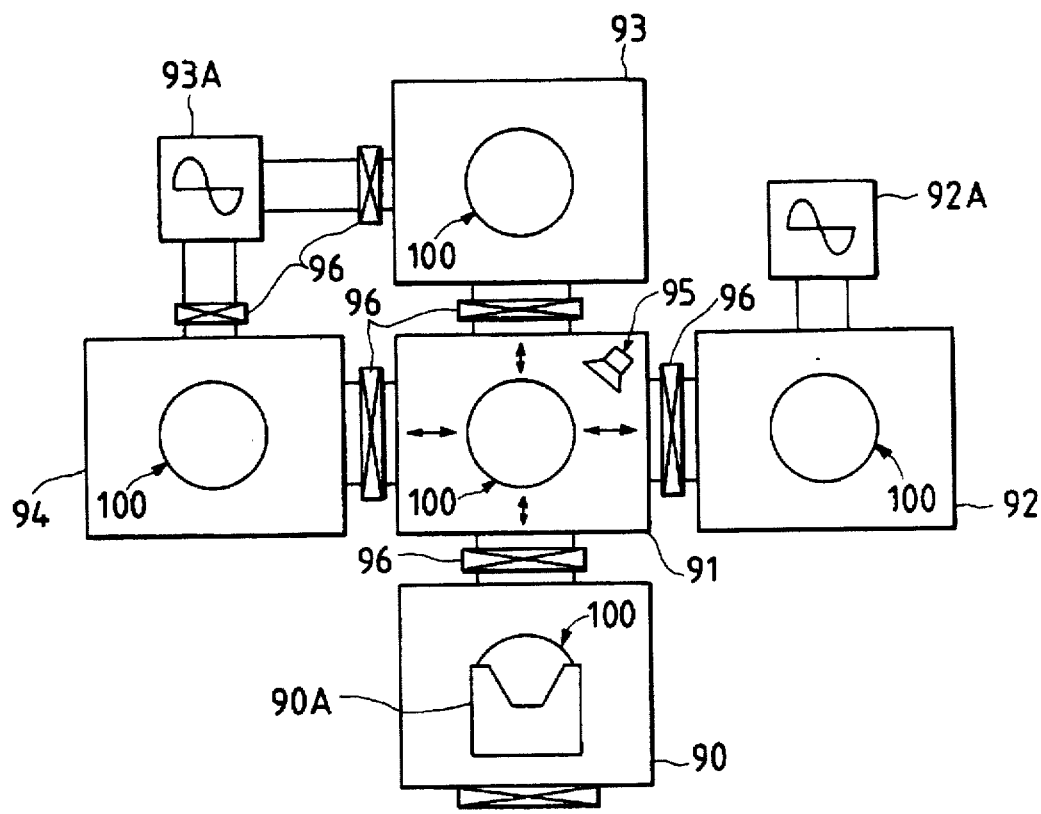
FIG. 62 is a schematic diagram showing a CVD apparatus according to an embodiment IV of the present invention.

The leaf type CVD apparatus according to the embodiment IV of the present invention is shown in FIG. 62.

As shown in FIG. 62, the leaf type CVD apparatus is constructed mainly of a load/unload chamber 90, a transfer chamber 91, a pretreating chamber 92, a first reactor chamber 93 and a second reactor chamber 94. These treating chambers 90 to 94 are connected through gate valves 96.

The load/unload chamber 90 is so constructed that a cassette 90A accommodating a plurality of semiconductor wafers 100 may be removably attached thereto. This load/unload chamber 90 supplies the semiconductor Wafers 100 untreated to the transfer chamber 91 and accommodates the semiconductor wafers 100 treated from the transfer chamber 91.

Figure 63:
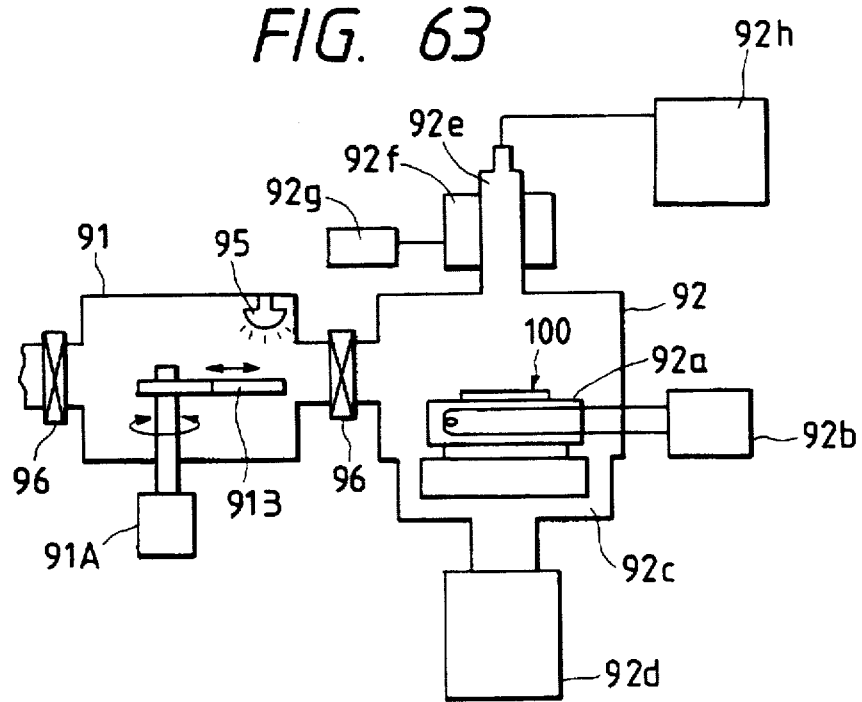
FIGS. 63 and 64 are schematic diagrams showing essential portions of the aforementioned CVD apparatus.

This transfer chamber 91 is so constructed that the untreated semiconductor wafers 100 may be supplied to the individual pretreating chambers 92 and 93 and that the treated semiconductor wafers 100 may be extracted from the pretreating chambers 92 and 93. As shown in FIG. 63 (presenting an essential portion schematically), the supply and take-out of the semiconductor wafers 100 are accomplished by a wafer transfer arm/tray 91B which is connected to and driven by a rotational drive unit 91A. This transfer chamber 91 is so shielded like the treating chambers 90 and 92 to 93 from the atmosphere of the outside of the apparatus that it is held under a high vacuum having no $H_2O$ or $O_2$.

The transfer chamber 91 is equipped with an ultraviolet ray irradiation lamp 95, as shown in FIGS. 62 and 63. This ultraviolet ray irradiation lamp 95 is constructed to irradiate the surface of the semiconductor wafers 100 conveyed to the transfer chamber 91 with an ultraviolet ray having an energy of at least about 5 to 6 [eV] thereby to break the coupling between the Si and the F, as will be described hereinafter.

The aforementioned pretreating chamber 92 is equipped with a pretreating module 92A. This pretreating module 92A is composed mainly of a hot plate 92a, a temperature controller 92b, an exhaust pipe 92c, a vacuum pump 92d, a radical generator tube 92e, a microwave generator unit 92f, a microwave power source 92g and a gas control unit 92h. In short, the pretreating chamber 92 is enabled to anisotropically etch off the natural silicon oxide film which is formed on the surface of the polycrystalline silicon film over the surface of the semiconductor wafers 100. This polycrystalline silicon film corresponds to the lower electrode layer 35 of the information storing capacity element C of the stacked structure in the DRAM 1 of the aforementioned embodiment I. The anisotropic (or dry) etching uses oxygen gases and a halogen compound (e.g., $CHF_3$ or $CF_4$).

Figure 64:
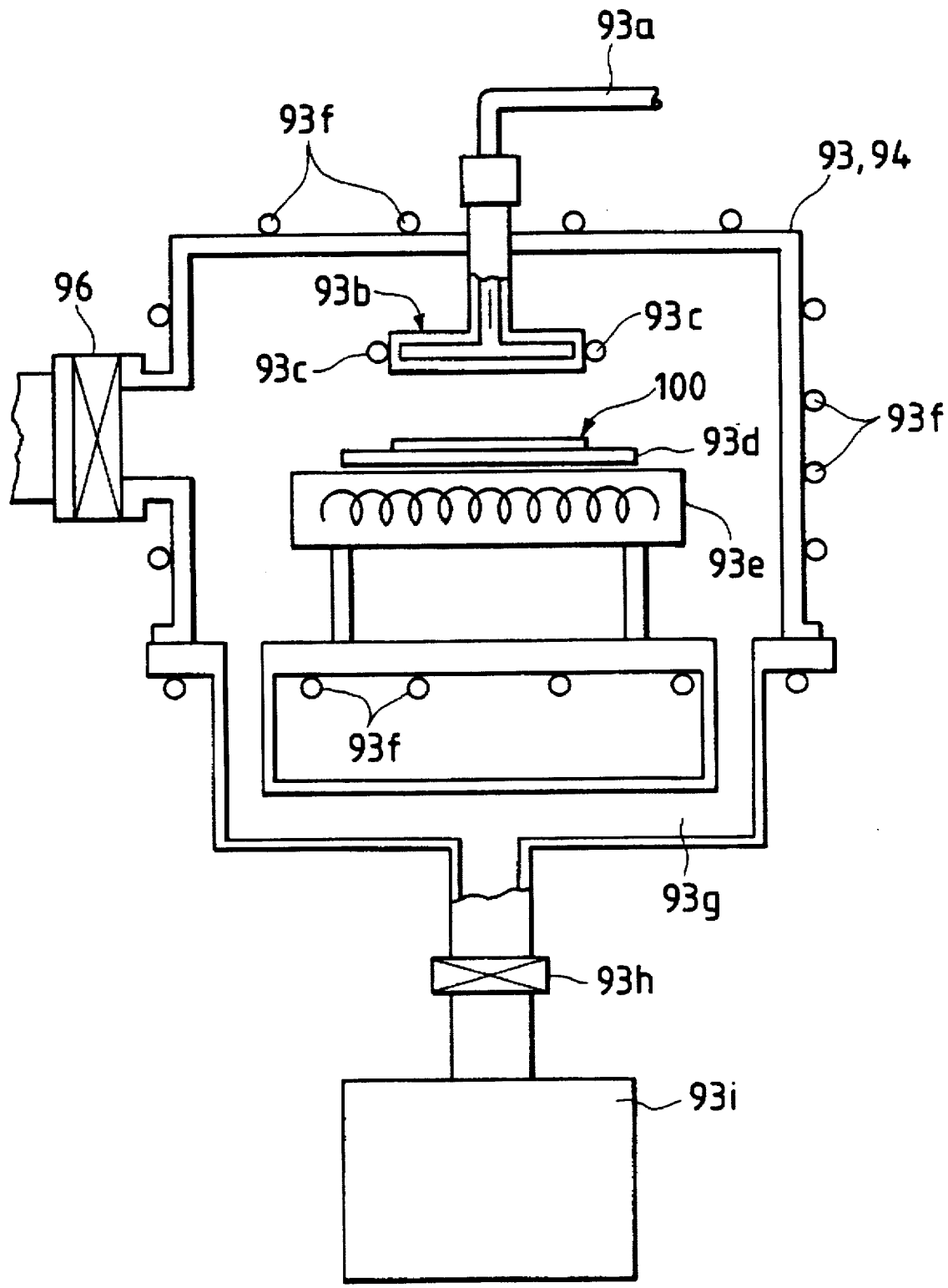

The first reactor chamber 93 and the second reactor chamber 94 are individually equipped with the common (or independent) cleaning modules 93A. Each of the first reactor chamber 93 and the second reactor chamber 94 is composed, as shown in FIG. 64 (presenting an essential portion schematically), mainly of a source gas supply tube 93a, a source gas blow-off plate 93b, plate cooling pipes 93c, a succeptor 93d, a wafer heating heater 93e, reaction chamber cooling pipes 93f, a exhaust pipe 93g a vacuum gate valve 93h and a vacuum pump 93i. Although not limitative thereto, the first reactor chamber 93 is enabled to deposit the silicon nitride film (i.e., the lower silicon nitride film 36A of the dielectric film 36), and the second reactor chamber 94 is enabled to deposit the polycrystalline silicon film (i.e., the lower electrode layer 35 or the upper electrode layer 37).

If the DRAM 1 is constructed to have a high capacity city of 16 [Mbits], it is required of a high controllability of the thickness of the lower electrode layer 35 or the dielectric film 36 of the information storing capacity element C of the stacked structure, for example. Therefore, the leaf type CVD apparatus is suited for the fabrication of the DRAM 1. Each of the first reactor chamber 93 and the second reactor chamber 94 is arranged with the source gas blow-off plate 93b in a position facing the surface, on which the semiconductor wafer 100 held on the succeptor 93d is to be deposited, so that it can deposit a-film of homogeneous thickness and quality on the surface of the semiconductor wafer 100. Each of the first reactor chamber 93 and the second reactor chamber 94 is held as a whole at a low temperature so that only the semiconductor wafer 100 is heated to a temperature optimum for the reaction by the wafer heating heater 93e.

On the other hand, the aforementioned source gas blow-off plate 93b is equipped with the plate cooling pipes 93c so as to drop the temperature rise of the semiconductor wafers 100 due to the radiation heat. Since the fine particles generated instantly by the reaction in the vicinity of the blow-off port of the source gases will grow to large particles or foreign substance at an instant when they reach the surface of the semiconductor wafer 100, the source gas blow-off plate 93b has to be cooled by the plate cooling pipes 93c.

The aforementioned leaf type CVD apparatus is constructed to accomplish a series of continuous treatments, for which the pretreating chamber 92 is disposed upstream of each of the first reactor chamber 93 and the second reactor chamber 94, as will be described in the following.

First of all, as shown in FIG. 62, the semiconductor wafer 100 is transferred from the load/unload chamber 90 through the transfer chamber 91 to the pretreating chamber 92. The polycrystalline silicon film is deposited on the surface of the semiconductor wafer 100.

Next, as shown in FIGS. 62 and 63, the pretreating chamber 92 anisotropically etches off the natural silicon oxide film which is formed on the surface of the polycrystalline silicon film of the semiconductor wafer 100. This anisotropic etching is accomplished by using the oxide gases and the halogen compound as the etching gases.

Next, the semiconductor wafer 100 having its natural silicon oxide film removed by the pretreating chamber 92 is transferred to the transfer chamber 91, in which the surface of the aforementioned polycrystalline silicon film is exposed to the ultraviolet ray by the ultraviolet ray irradiation lamp 95. This irradiation of the ultraviolet ray released the fluorine (F), which is produced by the anisotropic etching on the surface of the aforementioned polycrystalline silicon film, as the radicals from the surface of the polycrystalline silicon film.

Next, the semiconductor wafer 100 is transferred through the transfer chamber 91 sequentially to the first reactor chamber 93 and the second reactor chamber 94, in which the silicon nitride film or the like is deposited on the surface of the polycrystalline silicon film.

Then, the semiconductor wafer 100 thus treated is accommodated through the transfer chamber by the load/unload chamber 90.

Thus, a film depositing method of depositing the insulating film or the conducting film on the polycrystalline silicon film (or the surface of the semiconductor wafer 100) deposited on the surface of the semiconductor wafer 100, comprises: the step of exposing the surface of the polycrystalline film of the surface of the semiconductor wafer 100 by cleaning the surface of said polycrystalline silicon film in the vacuum system in the pretreating chamber 92: and the step of depositing the insulating film or the conducting film on the surface of said polycrystalline silicon film in the same vacuum system as that of said cleaning step in said first reactor chamber 93 or said second reactor chamber 94. Thanks to this construction, after the natural silicon oxide film film formed on the surface of the aforementioned polycrystalline silicon film has been cleaned off, the insulating film or the conducting film can be deposited on the surface of the aforementioned polycrystalline silicon film without contact with the atmosphere so that the natural silicon oxide film need not be sandwiched between the surface of the aforementioned polycrystalline silicon film and the aforementioned insulating film or conducting film. As a result, the thicknesses of the surface of the aforementioned polycrystalline silicon film and the insulating film to be deposited on the former surface such as the silicon nitride film 36A of the dielectric film 36 can be reduced to an extent corresponding to the aforementioned natural silicon oxide film so that the amount of charge storage of the information storing capacity element C of the stacked structure can be increased. Moreover, the conduction between the surface of the polycrystalline silicon film and the conducting film to he deposited on the former surface can be ensured.

On the other hand, a film depositing film of depositing the insulating film on the surface of the polycrystalline silicon film (or the semiconductor wafer 100) overlying the semiconductor wafer 100 comprises: the step of exposing the surface of the polycrystalline silicon film overlying the aforementioned semiconductor wafer 100 to the outside by cleaning the surface of said polycrystalline silicon film in the vacuum system by the anisotropic etching using the halogen compound; the step of exposing the surface of the polycrystalline silicon film to the outside; the step of irradiating the exposed surface of the polycrystalline silicon film with the ultraviolet ray in the same vacuum system as that of said cleaning step; and the step of depositing the aforementioned insulating film (e.g., the silicon nitride film) on the surface of the aforementioned polycrystalline silicon film in the same vacuum system as that of said cleaning step. Thanks to this construction, the radicals of the halogen element sticking to the surface of the aforementioned polycrystalline silicon film, when said surface is cleaned, can be removed by the aforementioned ultraviolet ray. As result, it is possible to reduce the augmentation of the leakage current and the changes of the etching rate of the insulating film deposited on the surface of the aforementioned polycrystalline silicon film, such as the silicon nitride film.

(Embodiment V)

The present embodiment V is directed to a fifth embodiment of the present invention, in which the suitable process for forming the lower electrode layer 35 and the apparatus for executing the process have been described in the information storing capacity element C of the stacked structure of the memory cell M of the DRAM 1 of the foregoing embodiment I.

Figure 65:
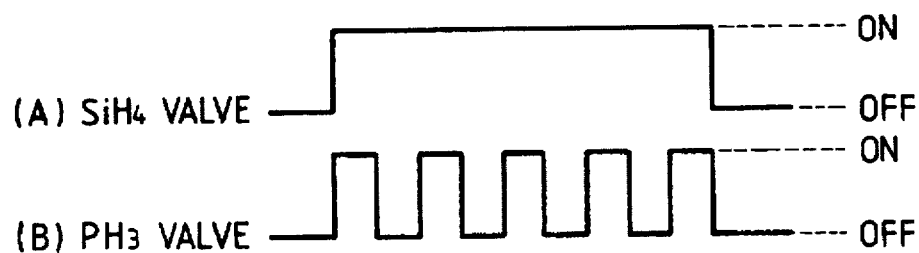
FIG. 65 is a time chart presenting the opening and closing operations of the gas valves of the CVD apparatus according to an embodiment V of the present invention.
Figure 66:
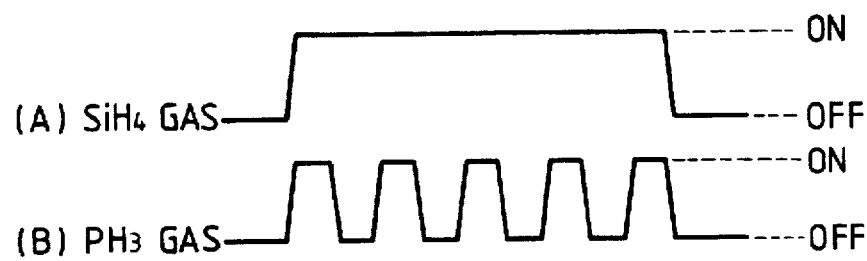
FIG. 66 is a time chart presenting the gas flow rates of the aforementioned CVD apparatus.

The leaf type CVD method according to the embodiment V of the present invention is shown in FIG. 65 (presenting a time chart showing the controlling operations of the source gas valves of the CVD apparatus) and FIG. 66 (presenting a timing chart showing the flow rate of the aforementioned source gases.

The lower electrode layer 35 of the information storing capacity element C of the stacked structure of the memory cell M of the DRAM 1 of the foregoing embodiment I of the foregoing embodiment I is thickened to increase the amount of charge storage, as has been described hereinbefore. In case the lower electrode layer 35 is thick, it is difficult to introduce the n-type impurity for reducing the resistance. In the present embodiment V, the so-called "doped polysilicon technology", i.e., the technology for depositing the polycrystalline silicon film doped with the aforementioned n-type impurity is used to form the aforementioned lower electrode layer 35.

The polycrystalline silicon film to be deposited by the CVD method but not doped with the n-type impurity usually has a high step coverage at the underlying stepped portion, but it is difficult to introduce the n-type impurity after the deposition if the thickness is enlarged. On the contrary, the polycrystalline silicon film to be deposited by the CVD method and doped with the n-type impurity is easy to introduce the n-type impurity but has an inferior step coverage at the underlying stepped portion. In the present embodiment V, therefore, the polycrystalline silicon film underpaid with the n-type impurity and the polycrystalline silicon film doped with the n-type impurity are alternately laminated to improve the step coverage at the underlying stepped portion. After the individual polycrystalline silicon films have been deposited, they are subjected to the heat treatment to introduce the n-type impurity from the polycrystalline silicon film doped with the n-type impurity to the polycrystalline silicon film underpaid with the n-type impurity.

FIG. 65 presents the opening and closing operations of the control values which are arranged at the source gas supply pipes of the CVD apparatus. The source gases used are inorganic silane (e.g., $SiH_4$ or $Si_2H_6$) gases and phosphine (i.e., $PH_3$) gases. The valve for controlling the supply of the inorganic silane gases of the source gases is opened for such a constant time as to achieve a predetermined film thickness, as shown in FIG. 65(A). On the contrary, the control valve for supplying the phosphine gases periodically repeats its opening and closing operations, as shown in FIG. 65(B), while the inorganic silane gas control valve is open. FIG. 66(A) indicates the flow rate of the inorganic silane gases, the supply of which is controlled by the aforementioned control valve, and FIG. 56(B) indicates the flow rate of the phosphine gases. Moreover, the interrupted supply of the phosphine gases can also be controlled by varying the set value of the mass flow controller. The switching of the interrupted supply of the phosphine gases by the control valve or the mass flow controller can be accomplished at a speed as high as about 1 to 2 [sec.].

Figure 67:
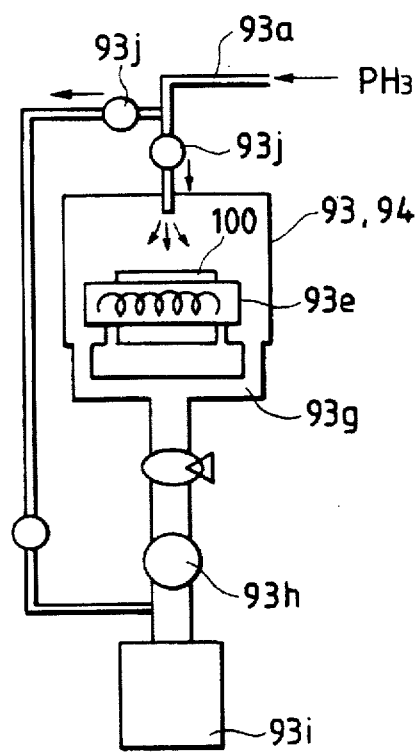
FIG. 67 is a schematic diagram showing the aforementioned CVD apparatus.

As shown in FIG. 67 (presenting the leaf type CVD apparatus schematically), on the other hand, stop valves 93j may be disposed in the vicinity of the reaction chamber 93 (or 94) of the source gas ($PH_3$) supply tube 93a so that they may supply the source gases to the reaction chamber 83 and the vacuum pump 93i individually at high rates. The CVD apparatus, as shown in FIG. 67, can interchange the interrupted supply of the phosphine gases at an interval of about 0.1 [sec.].

Thus, a film depositing process for depositing the polycrystalline silicon film (e.g., the lower electrode layer 35) on the underlying surface having the stepped shape, comprising: the step of alternately depositing pluralities of polycrystalline silicon films containing the n-type impurity for reducing the resistance and polycrystalline silicon film containing none of said n-type impurity over said underlying surface; and the step of diffusing said n-type impurity from the polycrystalline silicon film containing said n-type impurity to the polycrystalline silicon film containing none of said n-type impurity by heat-treating the polycrystalline silicon films thus laminated. Thanks to this construction, in the regions of the stepped shape of the aforementioned underlying surface so that the thicknesses of the polycrystalline silicon films can be uniformed. At the same time, the aforementioned n-type impurity can be diffused from the polycrystalline silicon films containing the n-type impurity to the polycrystalline silicon films containing none of the n-type impurity so that the polycrystalline silicon films thus laminated can retaining a large thickness while having their impurity concentrations uniformed.

In a film depositing method of depositing the polycrystalline silicon films on the underlying surface having the stepped shape, on the other hand, the inorganic silane gases are supplied at the constant flow rate to the inside of the vacuum system for depositing the polycrystalline silicon films to deposit the polycrystalline silicon films containing no impurity on the basis of the thermal decomposition, and the phosphine gases are supplied at the periodically varying flow rate to the inside of the vacuum system so that the polycrystalline silicon films deposited may contain the n-type impurity (e.g., P) periodically. Thanks to this construction, the polycrystalline silicon films containing the aforementioned n-type impurity and the polycrystalline silicon films containing none of the n-type impurity can be individually and continuously in the common vacuum system so that the deposition time of the polycrystalline silicon films can be shortened. In short, the throughput of the DRAM 1 can be improved.

(Embodiment VI)

In the process for fabricating the aforementioned DRAM 1, the present embodiment VI is directed to a fifth embodiment of the present invention, in which the number of steps of setting the threshold voltage of the MISFETs is reduced.

The process for fabricating the DRAM 1 according to the embodiment VI of the present invention will be briefly described with reference to FIGS. 68 to 71 (presenting an essential portion in section at the individual fabrication steps).

In the present embodiment VI, the threshold voltages of the six MISFETs used in the DRAM 1 of the foregoing embodiment I are set. Specifically, the n-channel MISFETs are exemplified by the memory cell selecting MISFETs Qs of the memory cells M, the n-channel MISFETs Qn having the standard threshold voltage, and the n-channel MISFETs Qn having a low threshold voltage. The p-channel MISFETs are exemplified by the p-channel MISFETs Qp having the standard threshold voltage, the p-channel MISFETs Qp having a low threshold voltage, and the p-channel MISFETs Qp having a high threshold voltage.

The aforementioned memory cell selecting MISFETs Qs (to be formed in a region in the later-described fabrication process) have their threshold voltage set at the highest level of the n-channel MISFETs. Specifically, the memory cell selecting MISFETs Qs have their surface impurity concentrations increased to have their threshold voltage set at the high level, because the p-type semiconductor regions 25B are formed over the principal surface portions of the $p^-$-type well region 22 in the memory cell array 11E. More specifically, the memory cell selecting MISFETs Qs have their threshold voltages set at 0.8 [V] in case they are formed to have a gate length of 0.8 [μm].

The n-channel MISFETs Qn (to be formed in regions III) having the aforementioned standard threshold voltage are used in most of the peripheral circuits excepting the sense amplifiers (SA) 13, namely, in the regions to be operated at the low power source voltage Vcc. The n-channel MISFETs Qn having the standard threshold voltage have their threshold voltage set at 0.5 [V] in case they are formed to have a gate length of 0.8 [μm].

The n-channel MISFETs Qn (to be formed in regions II) having the aforementioned low threshold voltage are used mainly in the aforementioned sense amplifier circuits 13 and the output buffer circuits 1702. These n-channel MISFETs Qn having the low threshold voltage are constructed to have a large gate length so as to reduce the fluctuations of the threshold voltage based on the treating dispersions of the gate electrodes 27, especially on the fluctuations of the gate length. Since the sense amplifier circuits 13 have their information decision sensitivity dropped for the large gate length, the threshold voltage of the n-channel MISFETs Qn is set at the low level. Since, moreover, the output buffer circuits 1702 have their downstream unit drivability dropped for the large gate length, the n-channel MISFETs Qn have their threshold voltage set at the low level. The n-channel MISFETs Qn having this low threshold voltage are formed to have a gate length of 1.4 [μm] to set the threshold voltage set at 0.5 [V]. In other words, the n-channel MISFETs Qn having the low threshold voltage is set to have a threshold voltage of 0.3 [V] if the gate length is converted to 0.8 [μm].

On the other hand, the p-channel MISFETs Qp (to be formed in regions IV) having the aforementioned standard threshold voltage are used in most portions of the peripheral circuits excepting the sense amplifier circuits 13, namely, in the regions to be operated at the low power source voltage Vcc. The p-channel MISFETs Qp having this standard threshold voltage are set to have a threshold voltage of −0.5 [V] in case they are formed to have a gate length of 0.8 [μm].

The p-channel MISFETs Qp (to be formed in regions V) having the aforementioned low threshold voltage are used in the aforementioned sense amplifier circuits 13. Moreover, the p-channel MISFETs Qp having the low threshold voltage are used as one of the p-channel MISFETs Qp for establishing the reference potential (e.g., the reference potential of −1.0 [V] for generating the aforementioned low power source voltage Vcc of about 3.3 [V]) of the VCC limiter circuits 1804 and the VDL limiter circuits 1810. The p-channel MISFETs Qp having the low threshold voltage used as the sense amplifier circuits 13 are formed to have a gate length of 1.4 [μm] and a threshold voltage of −0.5 [V] (which is low in its absolute value). In other words, the p-channel MISFETs Qp having the low threshold voltage are set to have a threshold voltage of −0.2 [V] if the gate length is converted to 0.8 [μm]. On the other hand, the p-channel MISFETs Qp having the low threshold voltage used in the reference voltage generator circuits are formed to have a gate length of 8 [μm] and a threshold voltage of −0.6 [V]. In other words, the p-channel MISFETs Qp having the low threshold voltage are set to have a threshold voltage of −0.2 [V] if the gate length is converted to 0.8 [μm].

The p-channel MISFETs Qp (to be formed in regions VI) having the aforementioned high threshold voltage are used as the other p-channel MISFETs Qp for establishing the reference potential of the aforementioned reference voltage generator circuits. The p-channel MISFETs Qp having the high threshold voltage to be used in the reference voltage generator circuits are set to have a gate length of 8 [μm] and a threshold voltage of −1.6 [V] (which is high in its absolute value). In other words, the p-channel MISFETs Qp having the high threshold voltage is set to have a threshold voltage of −1.2 [V] if the gate length is converted to 0.8 [μm].

Next, the process for forming the individual MISFETs of this DRAM 1 will be brief described in the following.

Figure 68:
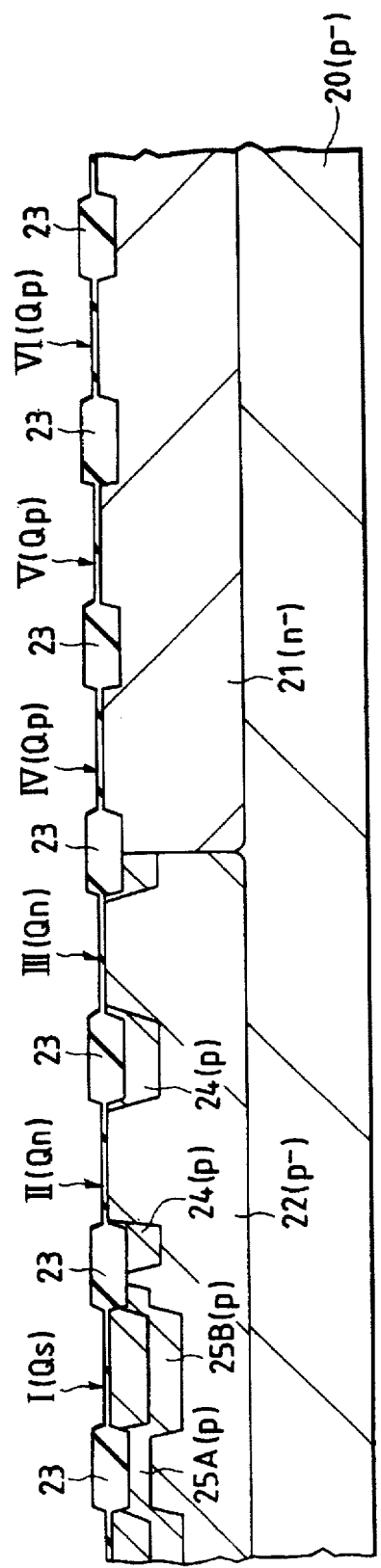
FIGS. 68 to 71 are sections showing an essential portion at the individual fabrication steps of the DRAM according to an embodiment VI of the present invention.

First of all, like the process for fabricating the DRAM 1 of the foregoing embodiment I, the principal surface portions of the p⁻-type semiconductor substrate 20 are formed sequentially with the n⁻-type well regions 21 and the p⁻-type well regions 22 and then with the interlayer separating insulating film 23, the p-type channel stopper regions 25A and the p-type semiconductor regions 25B. The state thus formed is shown in FIG. 68. Since the gap between the p-channel MISFETs Qp is reduced to drop the separating ability as a result of the high integration of the aforementioned DRAM 1, the n⁻-type well regions 21 have their impurity concentration set at a slightly high value. Specifically, the n⁻-type well regions 21 are set to have an impurity concentration of about 1×10¹³ to 3×10¹³ [atoms/cm²], for example. This impurity concentration of the n⁻-type well regions 21 can set the high threshold voltage (in its absolute value) of the p-channel MISFETs Qp to be formed in the regions VI. Since, on the other hand, the gate length of the n-channel MISFETs Qn having the standard threshold voltage is reduced as a result of the high integration of the DRAM 1, the substrate effect constant is dropped so that the impurity concentration of the p⁻-type well regions 22 can be set at a slightly high value so as to suppress the short channel effect. Specifically, the p⁻-type well regions 22 is set to have an impurity concentration of about 7×10¹² to 9×10¹² [atoms/cm²], for example. This impurity concentration of the p⁻-type well regions 22 can set the low threshold voltage of the n-channel MISFETs Qn to be formed in the regions II. The high threshold voltage of the memory cell selecting MISFETs Qs of the regions I can be set as a result of the gush of the impurity from the p⁻-type well regions 22 and the p-type semiconductor regions 25B.

Figure 69:
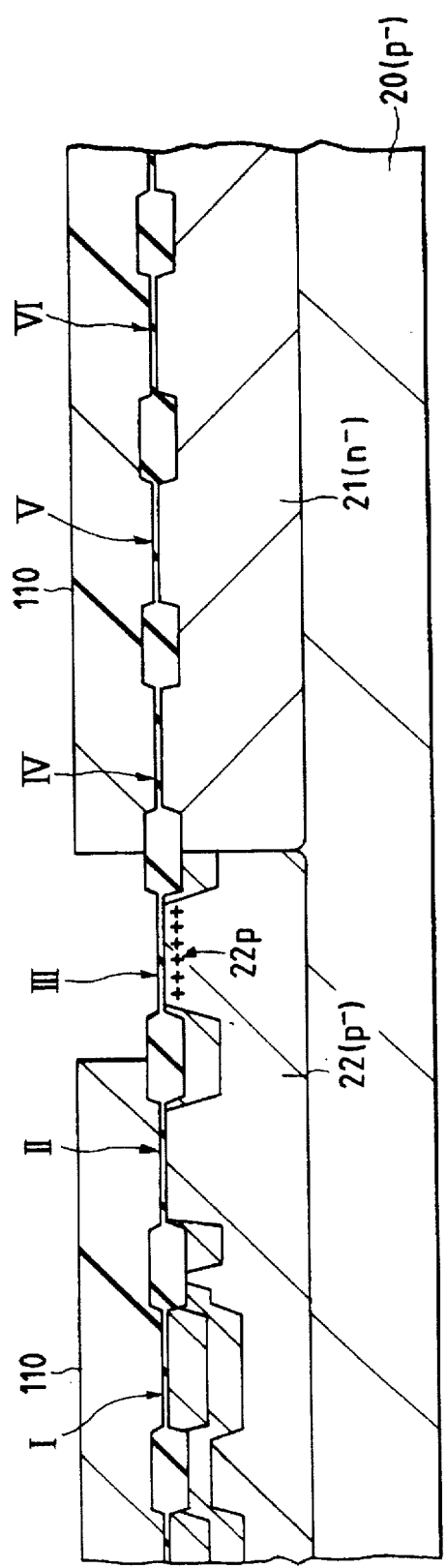
Figure 70:
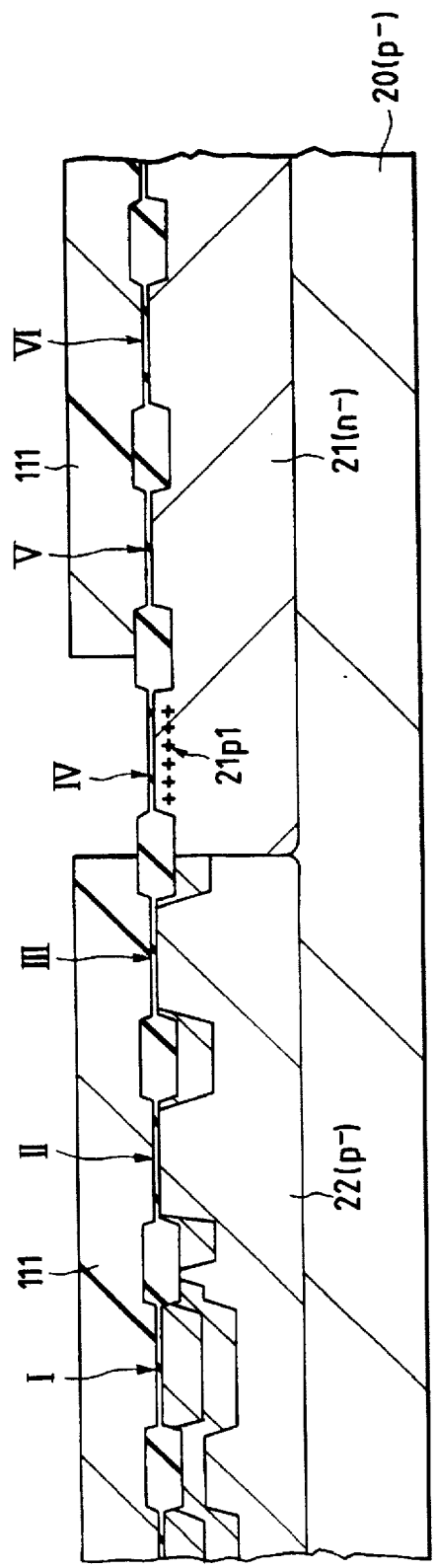

Next, as shown in FIG. 69, the p-type impurity 22p is introduced into the regions III to set the standard threshold voltage of the n-channel MISFETs Qn. This p-type impurity 22p used is the B having an impurity concentration of about 1×10¹² to 2×10¹² [atoms/cm²], for example, and is introduced by the ion implantation having an energy of about 15 to 25 [KeV]. Upon the introduction of the p-type impurity 22p, there is used an impurity introduction mask (of a photoresist film, for example) 110, as shown in FIG. 69. Next, as shown in FIG. 70, the standard voltage of the p-channel MISFETs Qp is set by introducing a p-type impurity 21p₁ into the regions IV. This p-type impurity 21p₂ used is the B having an impurity concentration of about 2.0×10¹² to 2.2×10¹² [atoms/cm²], for example, and is introduced by the ion implantation of about 15 to 25 [KeV]. Upon the introduction of the p-type impurity 21p₁, there is used an impurity introduction mask (of a photoresist film, for example) 111, as shown in FIG. 70.

Figure 71:
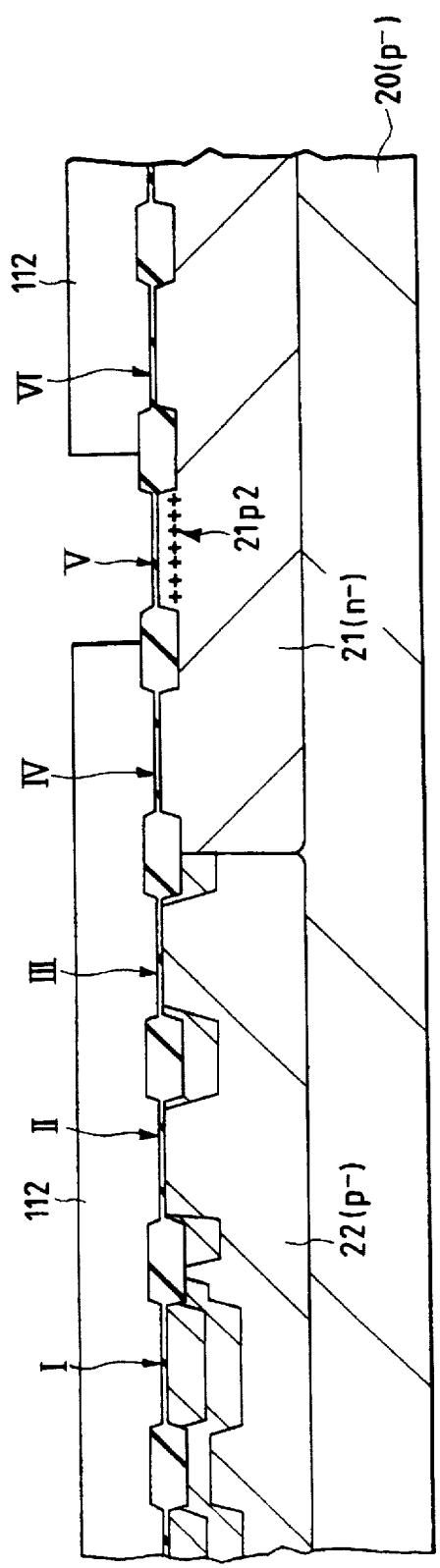

Next, as shown in FIG. 71, a p-type impurity 21p₂ is introduced into the regions V to set the low threshold voltage of the p-channel MISFETs Qp. This p-type impurity 21p₂ used is the B having an impurity concentration of about 2.4×10¹² to 2.6×10¹² [atoms/cm²], for example, and is introduced by the ion implantation having an energy of about 15 to 25 [KeV]. Upon the introduction of this p-type impurity 21p₂, there is used an impurity introduction mask (of a photoresist film) 112, as shown in FIG. 70.

Incidentally, the introduction order of the aforementioned threshold voltage adjusting impurities should not be limited to the above-specified one, but either of the impurities may be introduced earlier or later.

Thus, in the DRAM 1 having the complementary MISFETs, the process comprises: the step of forming at the principal portions of the different regions of the p⁻-type semiconductor substrate 20 with the p⁻-type well regions 22 at the impurity concentration for setting the low threshold voltage of the n-channel MISFETs Qn and the n⁻-type well regions 21 at the impurity concentration for setting the high threshold voltage (in its absolute value of the p-channel MISFETs Qp; and the step of setting the standard threshold voltage of the n-channel MISFETs Qn by introducing the threshold voltage adjusting p-type impurity 22p into the principal surface portions of the p⁻-type well regions 22 and setting the standard (or low in its absolute value) threshold voltage of the p-channel MISFETs by introducing the threshold voltage adjusting impurity 21p₁ (or 21p₂) into the principal surface portions of the n⁻-type well regions 21. Thanks to this construction, the low threshold voltage of the n-channel MISFETs Qn can be set by the impurity concentration of the p⁻-type well regions 22, and the high threshold voltage of the p-channel MISFETs Qp can be set by the impurity concentration of the n⁻-type well regions 21. Thus, the four kinds of threshold voltages can be set by the individually twice introductions of the threshold voltage adjusting p-type impurities 22p and 21p₁ (or 21p₂) so that the number of the introduction steps of the threshold voltage adjusting impurities can be reduced.

Moreover, the n⁻-type well regions 21 and the p⁻-type well regions 22 are individually formed in self-alignment with the principal surface portions of the p⁻-type semiconductor substrate 20. Thanks to this construction, the step of exposing the surface of the p⁻-type semiconductor substrate 20 other than the n⁻-type well regions 21 and p⁻-type well regions 22 is eliminated so that the number of the fabrication steps of the DRAM 1 can be reduced to an extent corresponding to the eliminated step.

Moreover, in the DRAM 1 including the p-channel MISFETs Qp for generating the reference voltage and the p-channel MISFETs Qp for generating the standard reference voltage, the process comprises: the step of forming the n⁻-type well regions 21 at an impurity concentration for setting the high (in its absolute value) threshold voltage of the p-channel MISFETs Qp for generating the reference voltage; the step of setting the standard threshold voltage (or the low threshold voltage) of the p-channel MISFETs Qp by introducing the threshold voltage adjusting impurity $21p_1$ (or $21p_2$) into the different regions of the $n^-$-type well regions 21; and the step of setting the low threshold voltage (or the standard threshold voltage) of the p-channel MISFETs Qp by introducing the threshold adjusting impurity $21p_2$ (or $21p_1$) into the different regions of the $n^-$-type well regions 21. Thanks to this construction, the low threshold voltage of the p-channel MISFETs Qp for generating the reference voltage can be set by the impurity concentration of the $n^-$-type well regions 21 so that the three kinds of threshold voltages can be set by the individual twice threshold voltage adjusting impurities $21p_1$ and $21p_2$. As a result, it is possible to reduce the number of steps of introducing the threshold voltage adjusting impurities.

(Embodiment VII)

In the DRAM 1 of the foregoing embodiment I, the present embodiment VII is directed to a seventh embodiment of the present invention, in which the amount of charge storage of the information storing capacity elements C of the stacked structure of the memory cells M is increased.

Figure 72:
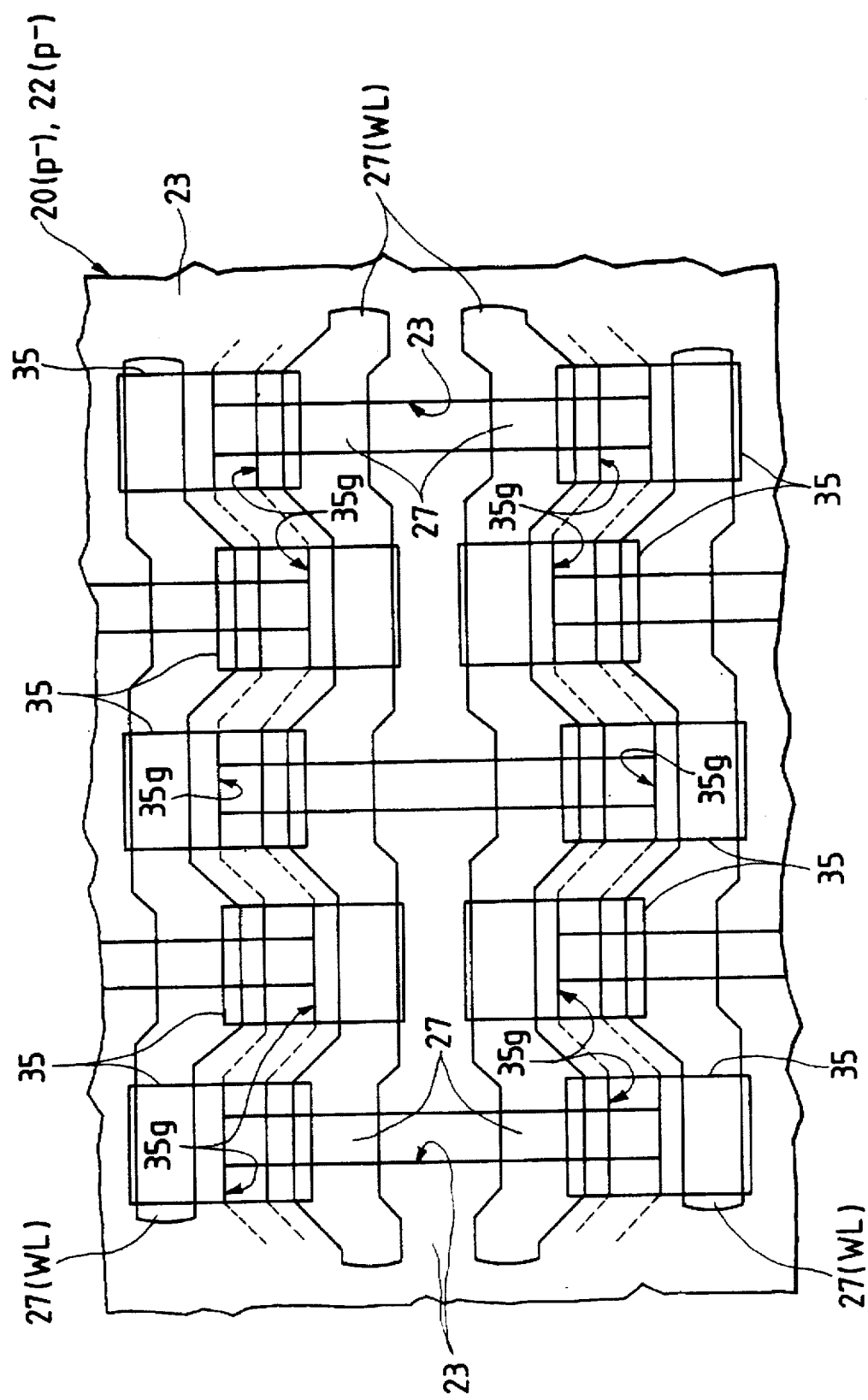
FIG. 72 is a top plan view showing an essential portion at a predetermined fabrication step of the DRAM according to an embodiment VII of the present invention.

An essential portion of the DRAM 1 according to the embodiment VII of the present invention is shown in FIG. 72 (presenting an essential portion of the memory cell array at a predetermined fabrication step in section).

As shown in FIG. 72, the memory cell M of the DRAM 1 of the present embodiment VII is formed with grooves 35g in the lower electrode layer 35 of the information storing capacity element C of the stacked structure. Specifically, the information storing capacity element C of the stacked structure is enabled to increase the surface in the vertical direction by the inner walls of the grooves 35g of the lower electrode layer 35 so that it can improve the charge storage. Those grooves 35g are formed to cross the lower electrode layer 35 in the direction of extending the word lines (WL) 27.

Next, the process for forming the information storing capacity element C of the stacked structure of the aforementioned memory cell M will be briefly described with reference to FIGS. 73 to 76 (presenting an essential portion at the individual fabrication steps in section).

Figure 73:
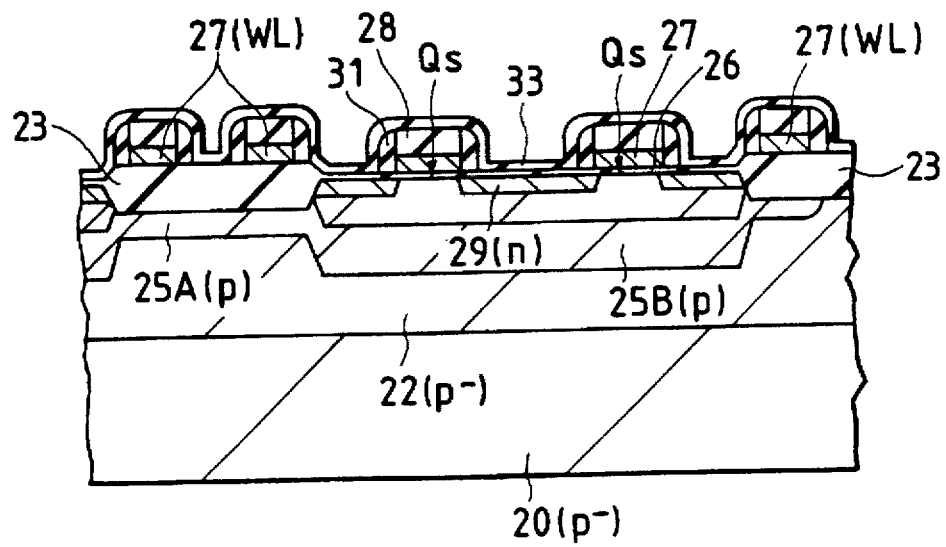
FIGS. 73 to 76 are sections showing an essential portion at the individual fabrication steps of the aforementioned DRAM.

First of all, like the process of fabricating the DRAM 1 of the foregoing embodiment I, the memory cell selecting MISFETs Qs of the memory cells M are formed, and the interlayer insulating film 33 is then formed, as shown in FIG. 73.

Figure 74:
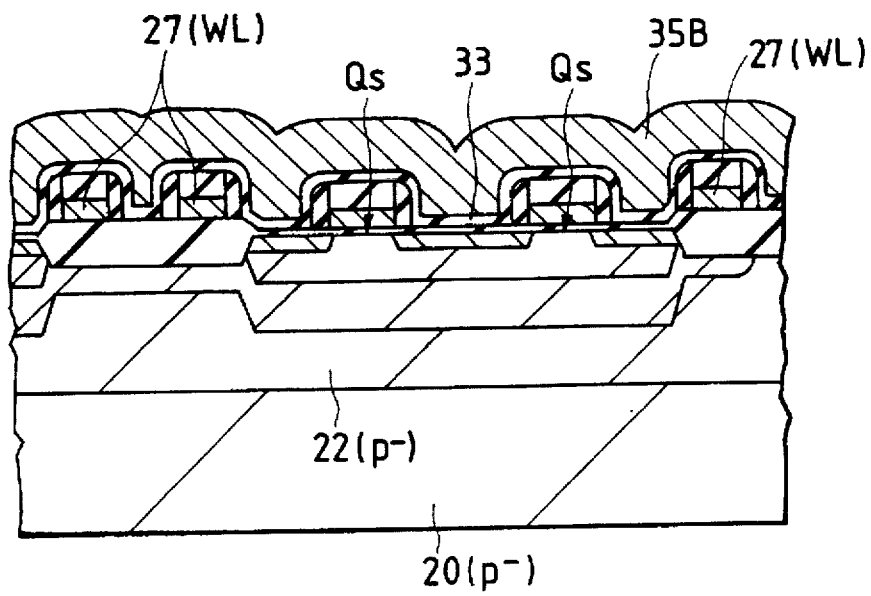

Next, as shown in FIG. 74, a polycrystalline silicon film 35B is formed over all the surface of the substrate including the surface of the interlayer insulating film 33. The polycrystalline silicon film 35B is formed to have a large thickness, as has been described hereinbefore, and is doped with an n-type impurity for reducing the resistance. This n-type impurity is introduced, according to the method described in connection with the foregoing embodiment I, by depositing the divided plural layers of the polycrystalline silicon film and by introducing the n-type impurity for each of the depositions by the hot diffusion method. On the other hand, the n-type impurity is also introduced, according to the method described in connection with the foregoing embodiment V, by alternately laminating the polycrystalline silicon film doped with none of the n-type impurity and the polycrystalline silicon film doped with the n-type impurity and by the subsequent heat treatment.

Figure 75:
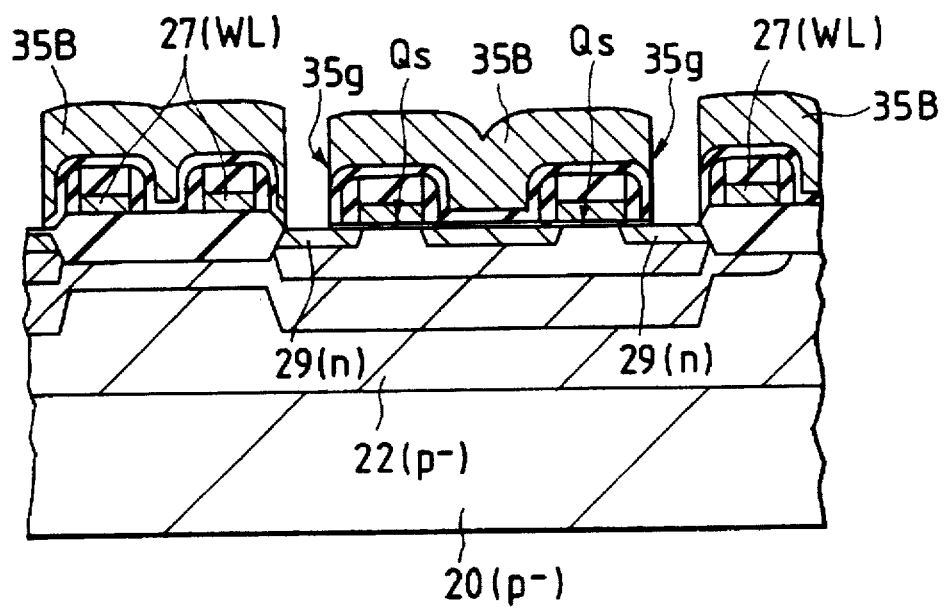

Next, as shown in FIG. 75, at the connected portions between the memory cell selecting MISFETs Qs and the lower electrode layer 35 of the information storing capacity elements C of the stacked structure, the polycrystalline silicon film 35B and the interlayer insulating film 33 are individually and sequentially removed to form the grooves 35g. These grooves are formed by the anisotropic etching, for example. When these grooves 35g are formed, the surfaces of the other n-type semiconductor regions 29 of the memory cell selecting MISFETs Qs are exposed to the outside.

Next, all the surfaces of the polycrystalline silicon film 35B including the surfaces of the inner walls of the aforementioned grooves 35g and the surface of the exposed n-type semiconductor regions 29 are formed thereover with a polycrystalline silicon film 35C. This polycrystalline silicon film 35C is formed to have such a small thickness as not to bury the insides of the aforementioned grooves 35g (i.e., to retain the stepped shape). The polycrystalline silicon film 35C is doped with an n-type impurity, this n-type impurity is introduced at such a lower impurity concentration than that of the polycrystalline silicon film 35B as to reduce the short channel effect of the memory cell selecting MISFETs Qs.

Figure 76:
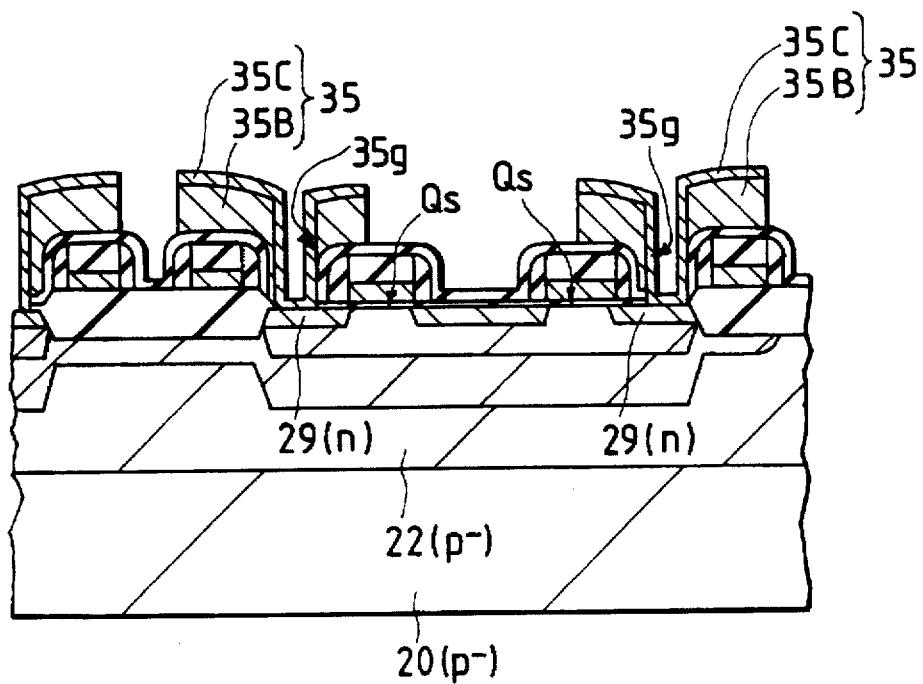

Next, as shown in FIG. 76, the aforementioned polycrystalline silicon films 35C and 35B are individually and sequentially patterned to form the lower electrode layer 35. The subsequent fabrication process is substantially similar to that of the DRAM 1 of the foregoing embodiment I, and its description will be omitted here.

Thus, in the information capacity storing elements C of the memory cells M of the DRAM 1, the amount of the charge storage can be improved to an extent corresponding to the aforementioned grooves 35g by forming the grooves 35g in the lower electrode layer 35.

Figure 77:
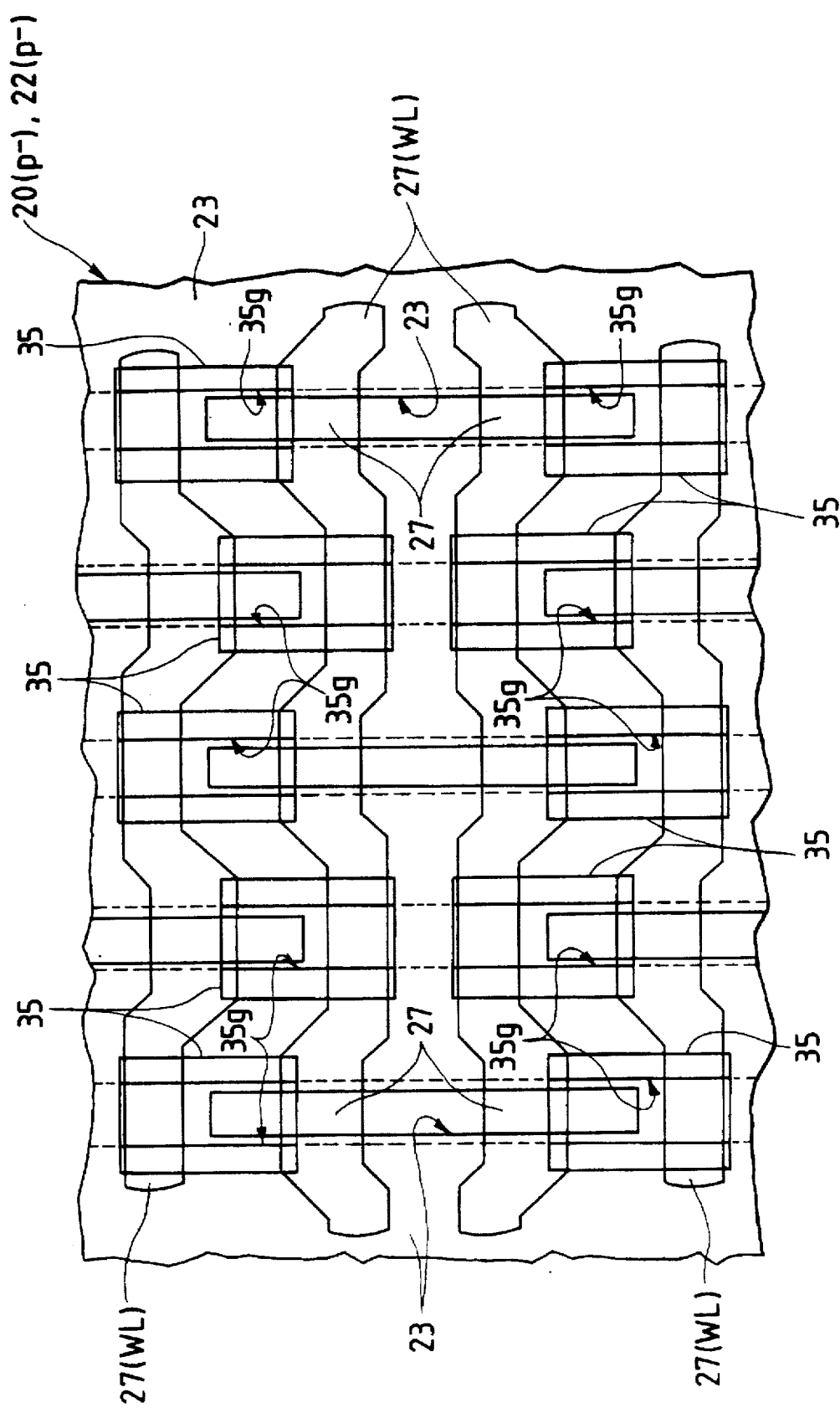
FIG. 77 is a top plan view showing an essential portion at a predetermined fabrication step of another example of the aforementioned DRAM.

On the other hand, the lower electrode layer 35 of the information storing capacity elements C of the stacked structure may be formed with the grooves 35g across the extending direction of the complementary data lines (DL) 50, as shown in FIG. 77 (presenting the essential portion of the memory cell at a predetermined fabrication step in section). Since the DRAM 1 of the present embodiment VII adopts the folded bit line method, the arrangement gap of the lower electrode layer 35 in the extending direction of the word lines 27 is so small that the lower electrode layer 35 is formed in the rectangular shape which is elongated in the extending direction of the complementary data lines 50. As a result, the increase in the surface area of the lower electrode layer 35 due to the aforementioned grooves 35g is far larger than those of the aforementioned ones.

The process of forming the information storing capacity elements C of the stacked structure, as shown in FIG. 77, will be briefly described with reference to FIGS. 78 to 80 (presenting essential portions at the individual fabrication steps in section).

Figure 78:
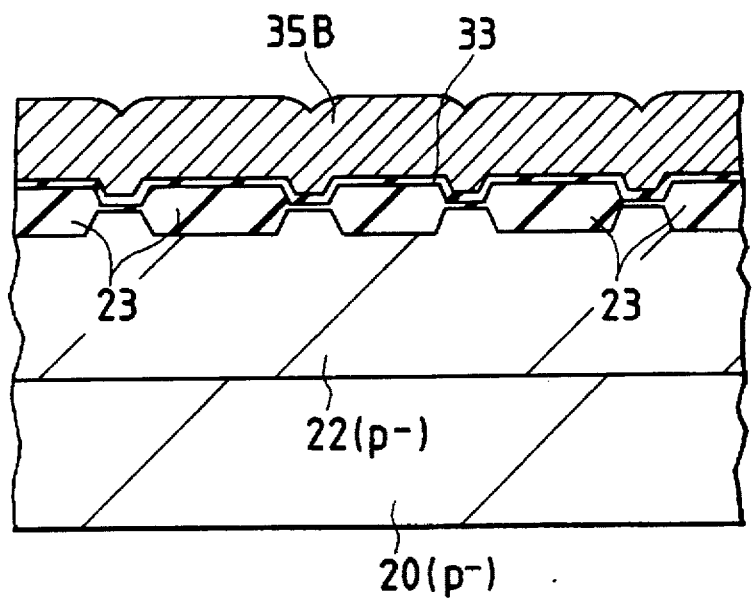
FIGS. 78 to 80 are sections showing an essential portion at the individual fabrication steps of another example of the aforementioned DRAM.

First of all, as shown in FIG. 78, the whole surface of the substrate including the surface of the interlayer insulating film 33 is formed thereover with the polycrystalline silicon film 35B.

Figure 79:
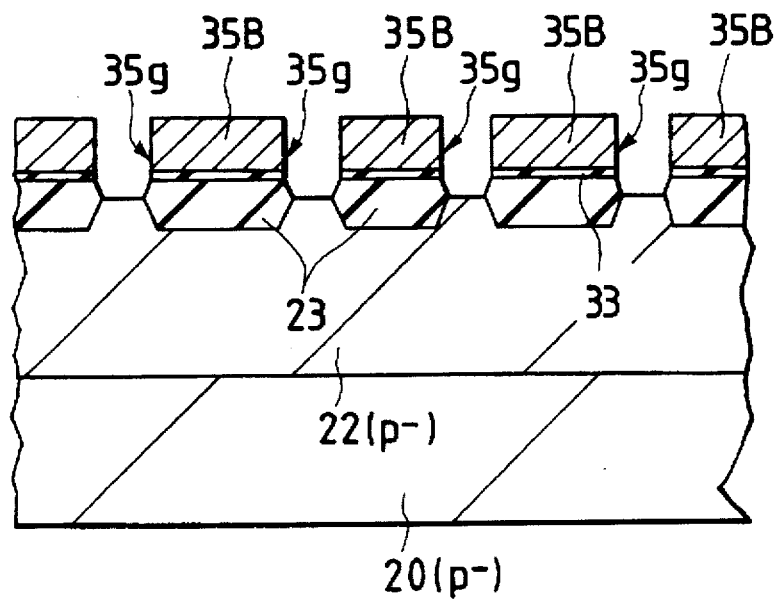

Next, as shown in FIG. 79, the grooves 35g are formed in the polycrystalline silicon film 35B.

Figure 80:
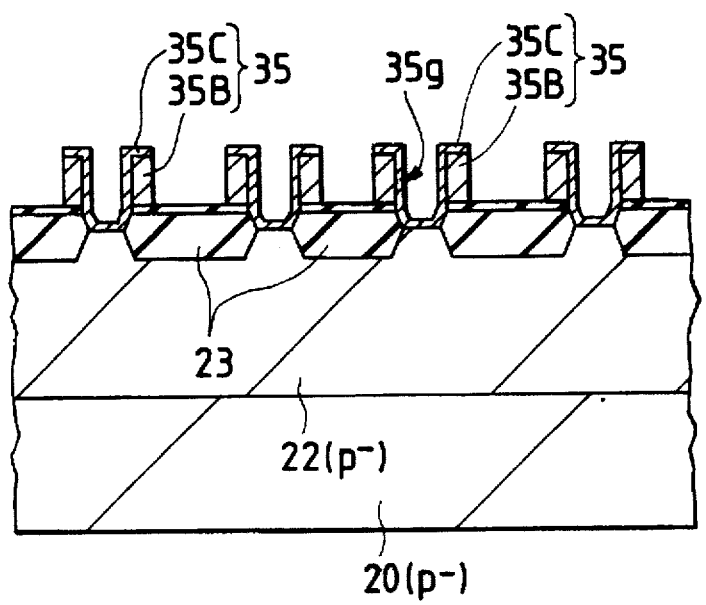

Next, the polycrystalline silicon film 35C is formed over the aforementioned polycrystalline silicon film 35B, and these polycrystalline silicon films 35C and 35B can be individually patterned to form the lower electrode layer 35, as shown in FIG. 80.

Moreover, the lower electrode layer 35 of the information storing capacity elements C of the stacked structure, as has been described with reference to FIGS. 72 to 76, can improve the amount of charge Storage, as shown in FIGS. 81 to 84 (presenting essential portions at the individual fabrication steps in section).

Figure 81:
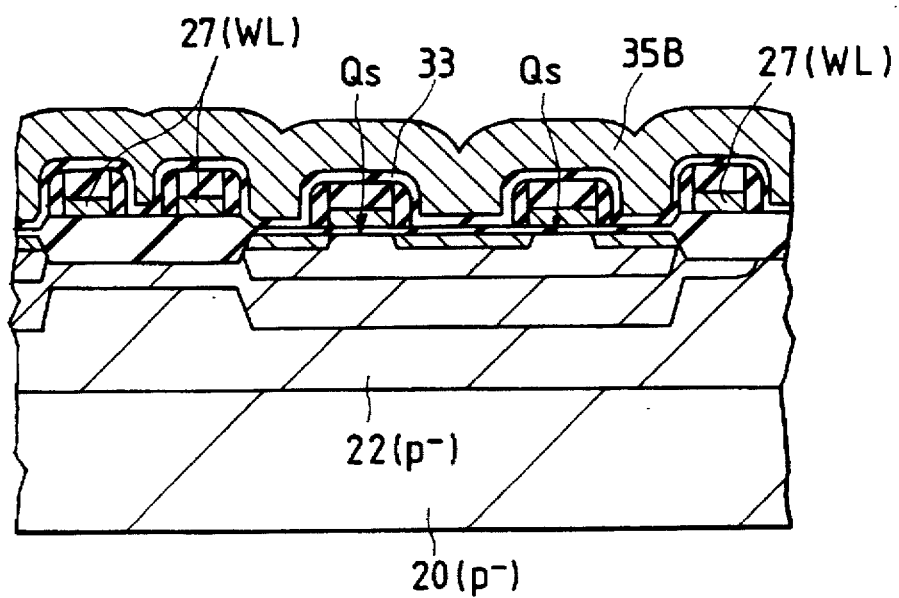
FIGS. 81 to 84 are sections showing an essential portion at the individual fabrication steps of another example of the aforementioned DRAM.
Figure 82:
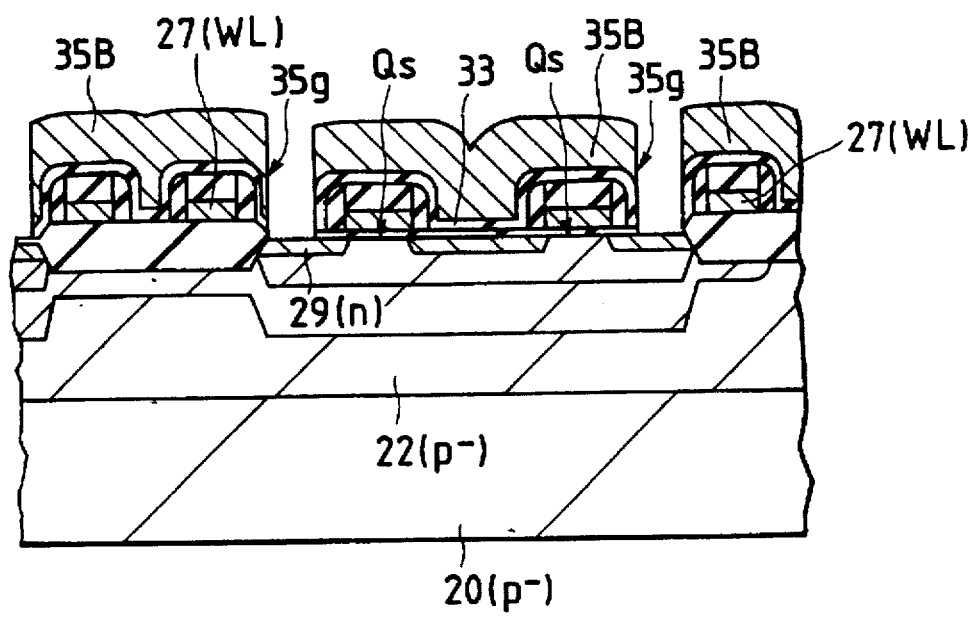

First of all, as shown in FIG. 81, the polycrystalline silicon film 35B is formed, and the grooves 35g are then formed, as shown in FIG. 82.

Figure 83:
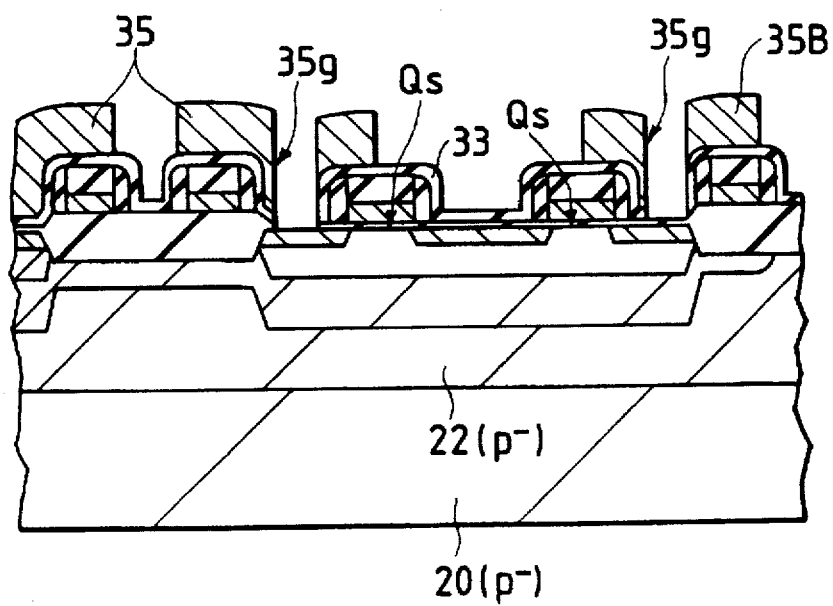
Figure 84:
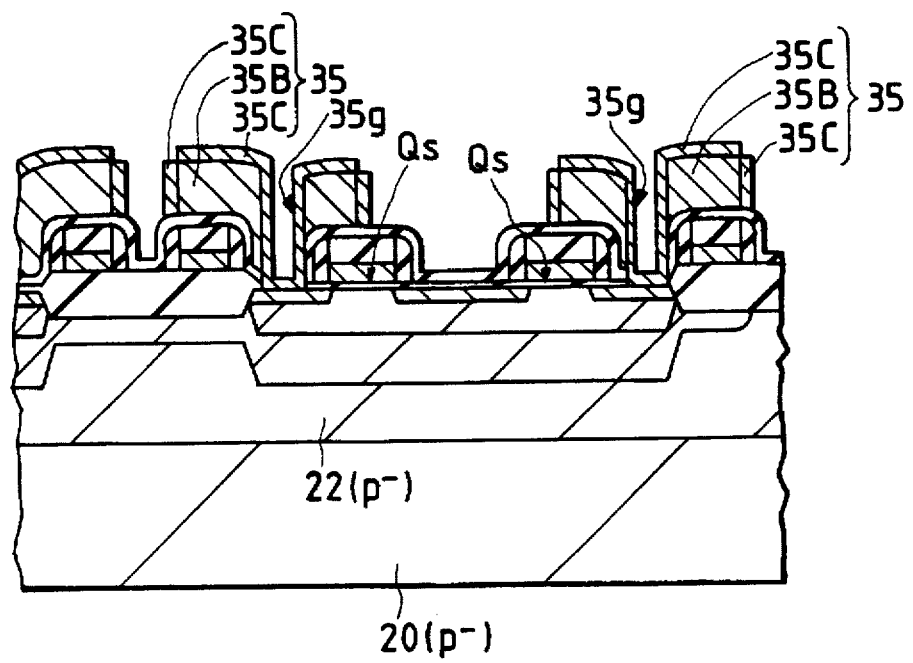

Next, as shown in FIG. 83, the polycrystalline silicon film 35B is patterned in advance in the shape of the lower electrode layer 35, and the grooves 35g are formed.

Next, the whole surface of the substrate including the surfaces of the inner walls of the aforementioned grooves 35g, the surface of the polycrystalline silicon film 35B and the exposed surface of the n-type semiconductor region 29 is formed with the polycrystalline silicon film 35C.

Next, this polycrystalline silicon film 35C is patterned by the anisotropic etching to form the lower electrode layer 35. This lower electrode layer 35 is enabled to improve the amount of charge storage like before by the aforementioned grooves 35g and to leave the polycrystalline silicon film 35C on the outer circumference side walls of the polycrystalline silicon film 35B of the lower electrode layer 35. As a result, it is possible to improve the amount of charge storage to an extent corresponding to the thickness of the polycrystalline silicon film 35C thus left.

Moreover, the lower electrode layer 35 of the information storing capacity elements C of the stacked structure, which has been described with reference to FIGS. 77 to 80, can also improve the amount of charge storage, as shown in FIGS. 85 to 88 (presenting essential portions at the individual fabrication steps in section).

Figure 85:
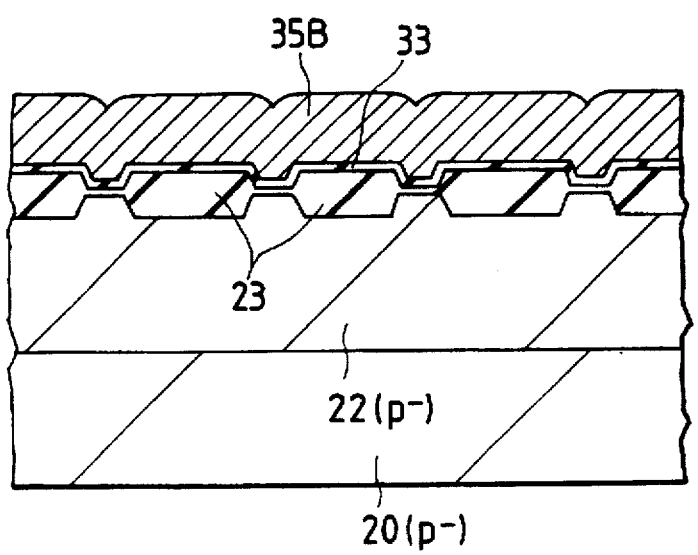
FIGS. 85 to 88 are sections showing an essential portion at the individual fabrication steps of another example of the aforementioned DRAM.
Figure 86:
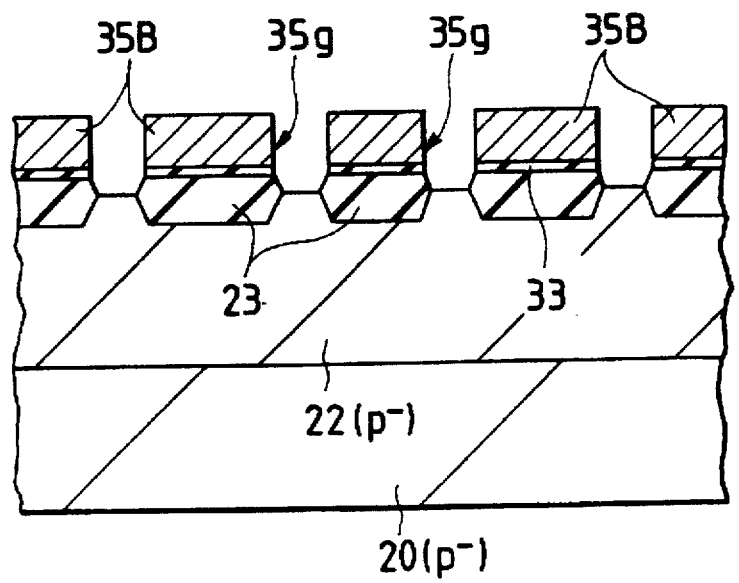

First of-all, the polycrystalline silicon film 35B is formed, as shown in FIG. 85, and the grooves 35g are then formed, as shown in FIG. 86.

Figure 87:
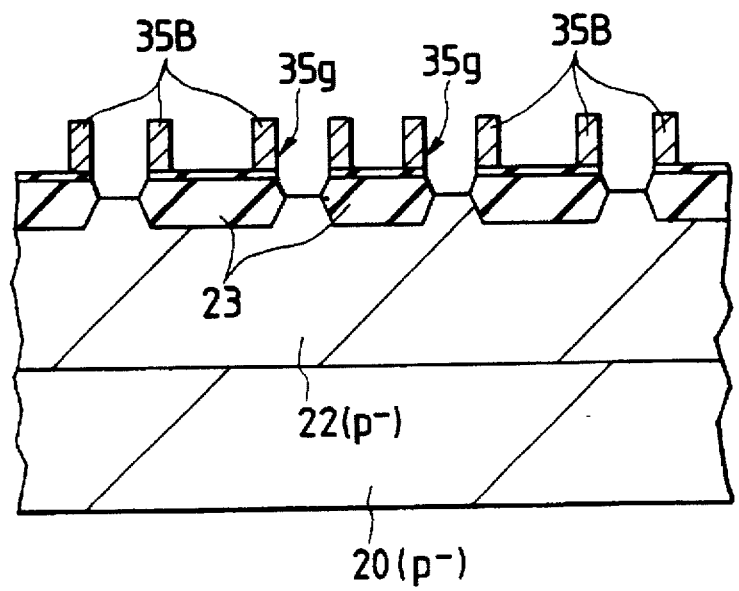
Figure 88:
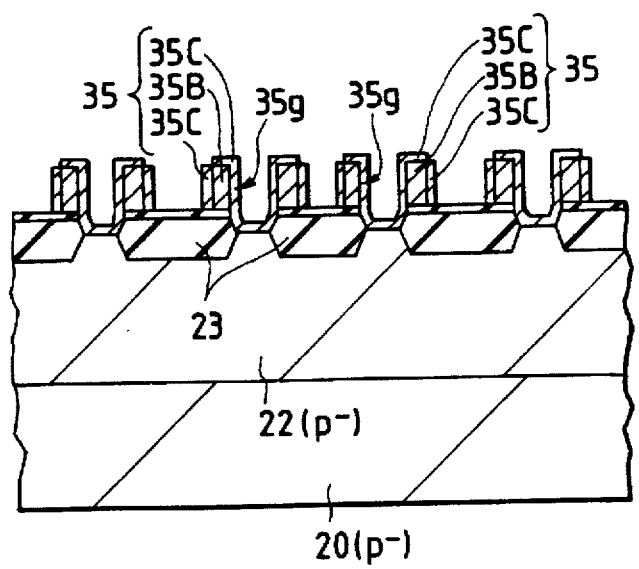

Next, as shown in FIG. 87, the polycrystalline silicon film 35B is patterned in advance in the shape of the lower electrode layer 35.

Next, the whole surface of the substrate including the surfaces of the inner walls of the aforementioned grooves 35g, the surface of the polycrystalline silicon film 35B and the exposed surface of the n-type semiconductor region 29 is formed thereover with the polycrystalline silicon film 35C.

Next, this polycrystalline silicon film 35C is patterned by the anisotropic etching to form the lower electrode layer 35. Since this lower electrode layer 35 can leave the polycrystalline silicon film 35C on the outer circumference side walls of the polycrystalline silicon film 35B, it can improve the amount of electric charge further to an extent corresponding to the thickness of the polycrystalline silicon film 35C thus left.

(Embodiment VIII)

In the fabrication method of the DRAM 1 of the foregoing embodiment I, the present embodiment VIII is directed to an eighth embodiment of the present invention, in which the degree of integration is improved by reducing the mask registration (or alignment) displacement.

In the fabrication process of the DRAM 1 of the embodiment VIII of the present invention has its alignment relations shown in FIG. 89 (presenting an alignment tree).

The DRAM 1 of the foregoing embodiment I has its upper layer pattern aligned (or registered) with its lower layer pattern at the fabrication step. FIG. 89(A) shows the relations of the alignment in the X direction (e.g., in the extending direction of the word lines). The DRAM 1 of the present embodiment VIII has its alignment referred to the n⁻-type well regions 21. The element separating insulating films 23 have their X direction aligned to the n⁻-type well regions 21. The gate electrodes 27 (or the word lines) 27 have their X direction aligned to the element separating insulating films 23. The gate electrodes 27 provide the reference for the alignment of their upper layer. The lower electrode layer 35, the upper electrode layer 37 and the connecting holes 40 of the information storing capacity elements C of the stacked structure individually have their X direction aligned to the aforementioned gate electrodes 27.

On the contrary, FIG. 89(B) shows the relations of the alignment in the Y direction (i.e., in the extending direction of the complementary data lines). The DRAM 1 of the present embodiment VIII is aligned in the two X and Y directions. Likewise, the n⁻-type well regions 21 provide the reference for the alignment, and the element separating insulating films 23 alien the n⁻-type well regions 21 in the Y direction. The gate electrodes 27 align the element separating insulating films 23 in the Y direction. Unlike the alignment in the X direction, the lower electrode layer 35 aligns the element separating insulating films 23 in the Y direction. The upper electrode layer 37 and the connecting holes 40A individually align the aforementioned gate electrodes 27 in the Y direction.

In case the lower electrode layer 35 of the information storing capacity elements C of the stacked structure are seriously misaligned from the aforementioned element separating insulating films 23, the connecting holes 34 for connecting the other n-type semiconductor regions 29 of the memory cell selecting MISFETs Qs and the lower electrode layer 35 are opened (as shown in FIG. 1). This opening causes the surfaces of the n-type semiconductor regions 29 exposed from the connecting holes 34, when the lower electrode layer 35 is treated, to be etched. As a result, the misalignment of the lower electrode layer 35 from the element separating insulating films 23 has to be minimized.

In case the aforementioned lower electrode layer 35 is aligned simply in the X and Y directions with respect to the gate electrodes 27, there are established misalignments σ between the element separating insulating films 23 and the gate electrodes 27 and between the gate electrodes 27 and the lower electrode layer 35, so that the misalignment of the lower electrode layer 35 to the element separating insulating films 23 is 1.4σ.

In the present embodiment VIII, therefore, the lower electrode layer 35 is aligned in the X direction (or in the Y direction) with respect to the gate electrodes 27, i.e., the pattern underlying the former just by one layer, as shown in FIG. 89(A), and in the Y direction (or in the X direction) with respect to the element separating insulating films 23, i.e., the pattern underlying the former by two layers, as shown in FIG. 89(B). In other words, the lower electrode layer 35 of the information storing capacity elements C of the stacked structure is misaligned only by the value σ from the element separating insulating films 23 or the gate electrodes 27. Since the lower electrode layer 35 provides no reference for the alignment, it can be aligned across the aforementioned different layers.

Thus, in an alignment method of aligning the patterns of the three different layers of the element separating insulating films 23, the gate electrodes 27 and the lower electrode layer 35 in the X direction and the Y direction, the gate electrodes (i.e., the second layer pattern) 27 are aligned in the X direction and the Y direction with respect to the underlying element separating insulating films (i.e., the first layer pattern) 23, the lower electrode layer (i.e., the third layer pattern) 35 to be formed over the gate electrodes 27 is aligned in the X direction (or in the Y direction) with respect to the underlying gate electrode 27 and in the Y direction (or in the X direction) with respect to the underlying element separating insulating films 23. Thanks to this construction, it is possible to substantially equalize the misalignment between the element separating insulating films 23 and the gate electrodes 27 and the misalignment between the element separating insulating films 23 and the lower electrode layer 35 so that the misalignment between the element separating insulating films 23 and the lower electrode layer 35 can be reduced. As a result, the degree of integration of the DRAM 1 can be improved to an extent corresponding to the masking allowance at the fabrication step. As has been described hereinbefore, moreover, the connecting holes 34 for connecting the other n-type semiconductor regions 29 of the memory cell selecting MISFETs Qs and the lower electrode layer 35 are not excessively opened.

(Embodiment IX)

In the DRAM 1 of the foregoing embodiment I, the present embodiment IX is directed to a ninth embodiment of the present invention for describing a suitable process for forming a target mark when the alignment method described in the foregoing embodiment VIII is executed.

Figure 90:
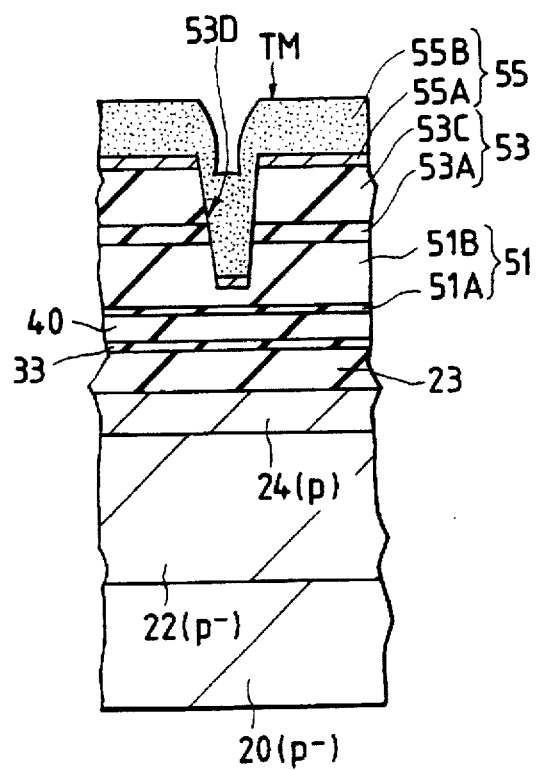
FIG. 90 is a section showing an essential portion of the target mark portion of the DRAM according to an embodiment IX of the present invention.

The structure of the target mark portion of the DRAM 1 according to the present embodiment IX is shown in FIG. 90 (presenting an essential portion in section).

As shown in FIG. 90, a target mask TM is defined by the connecting holes 53D, which are formed in the interlayer insulating film 53 of the DRAM 1, and the wiring lines 55 which are formed over the interlayer insulating film 53. The target mark M is arranged in the semiconductor wafer in the scribe area between the regions for forming the DRAM 1, the inside of the regions for forming the DRAM 1, and the regions for forming the dummy DRAM 1 (which is not used as the DRAM but as the target mark for alignment).

The target mark TM thus formed is formed by forming the connecting holes 53D in the regions in which the wiring lines (of a transition-metal film) 52 are not over the interlayer insulating film 51). Since none of the wiring lines 52 is present below, the transition-metal film 54 to be buried by the selective CVD method is not deposited in the connecting holes 53D. Since the wiring lines 55 used are made of the aluminum alloy film 55B having an inferior step coverage, the stepped shape is formed on the surface of the wiring lines 55 by the stepped shape of the connecting holes 53D. This stepped shape is used as the aforementioned target mark TM.

Thus, the target mark TM can be formed at the step shared with the step of forming the connecting holes 53D of the fabrication step of the DRAM 1 and the step of forming the wiring lines 55 so that the number of the fabrication steps can be reduced.

(Embodiment X)

In the process of fabricating the DRAM I of the foregoing embodiment I, the present embodiment X is directed to a tenth embodiment of the present invention, in which the focal depth and resolution of the exposure of the photolithography technology are improved.

Figure 91:
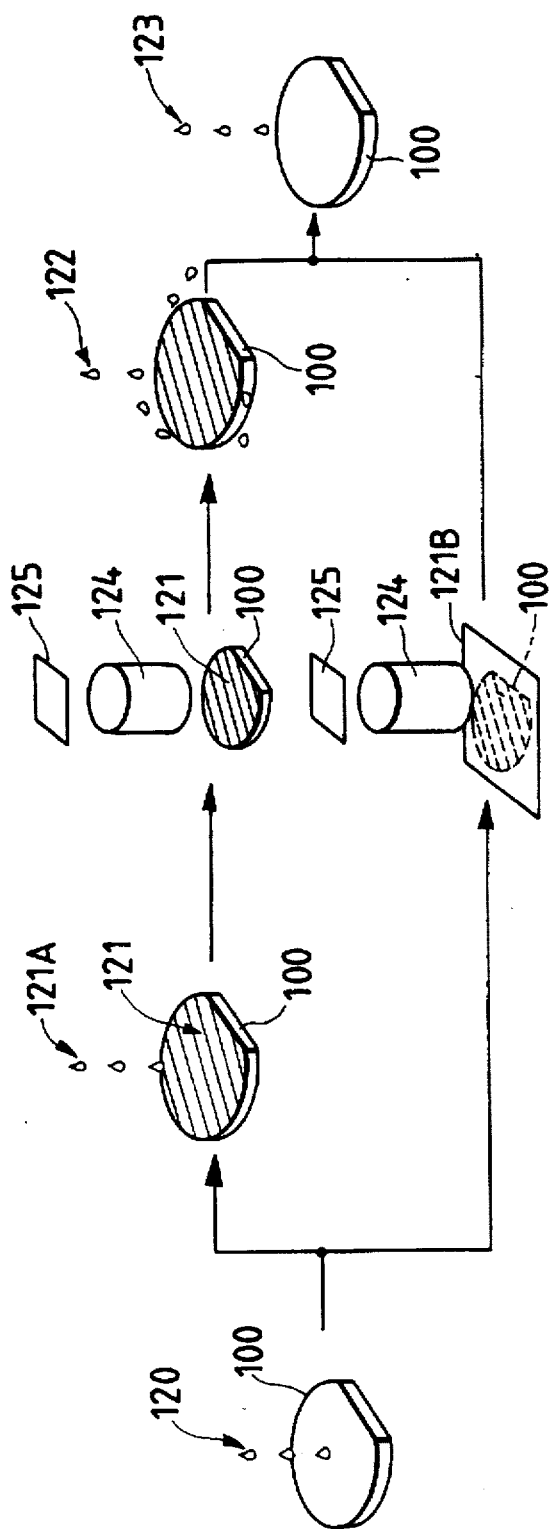
FIG. 91 is a conceptional diagram showing the photolithography technology to be used in the fabrication process of the DRAM according to an embodiment X of the present invention.

The individual steps of the photolithography used in the fabrication process of the DRAM I according to the embodiment X of the present invention are shown in FIG. 91 (presenting a conceptional diagram) and FIG. 2 (presenting a step flow chart).

Figure 92:
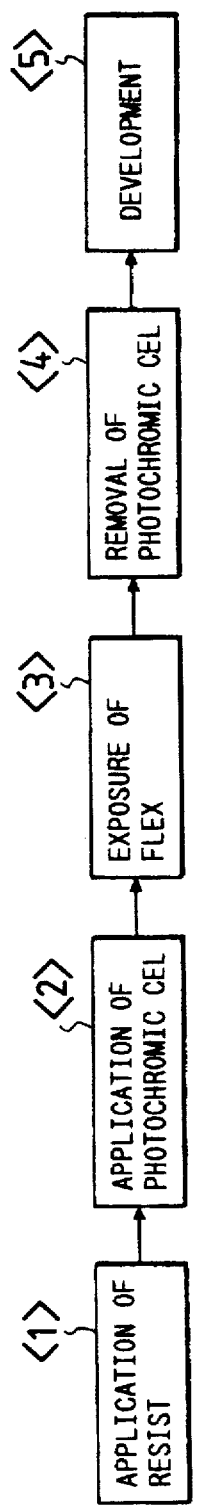
FIG. 92 is a flow chart showing the steps of the aforementioned photolithography technology.

The photolithography technology of the present embodiment X uses the FLEX (Focus Latitude Enhancement Exposure) method and the CEL (Contrast Enhancement Lithography) method to improve the focal depth and the resolution for the exposure of the photo resist film. The exposing procedures of the photolithography technology are as follows:

First of all, as shown in FIGS. 91 and 92, a photoresist film 120 is applied <1> to the semiconductor wafer 100.

Figure 93:
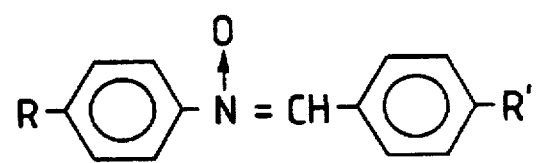
FIG. 93 is a diagram showing the structure of a substance to be used in the photolithography technology.
Figure 94:
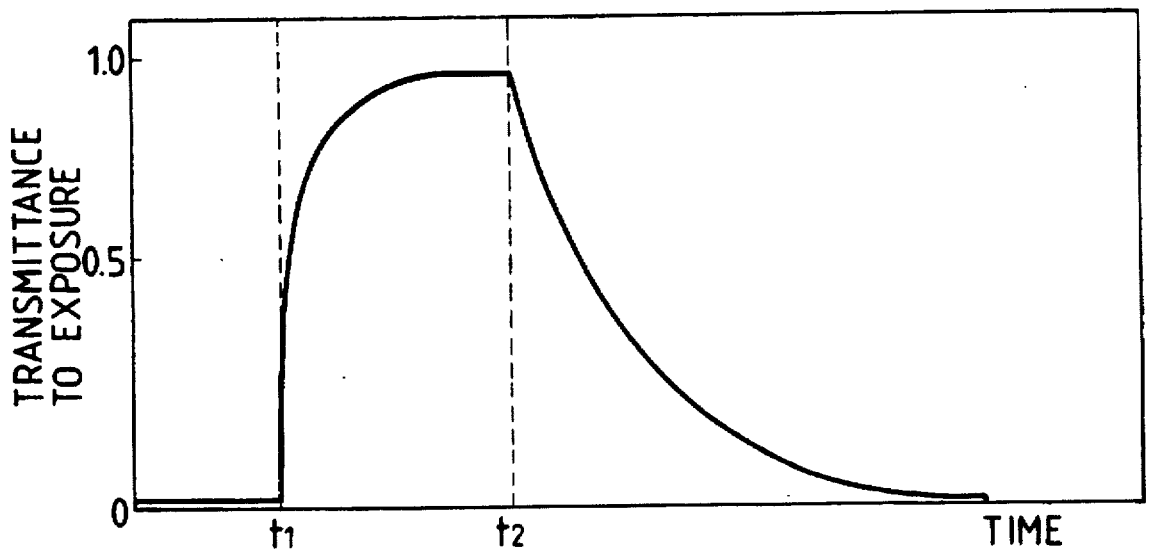
FIG. 94 is a diagram presenting the characteristics of the aforementioned substance.

Next, a photochromic CEL material 121A is dropped to the surface of the photoresist film 120 applied to the aforementioned semiconductor wafer, thereby to apply <2> a photochromic CEL film 121. The photochromic CEL film 121 used is nitron, for example, as shown in FIG. 93 (presenting the structural formula). This photochromic CEL film 121 has a property to become transparent (or bleached) if it is irradiated (as started at $t_1$) with a predetermined amount or more of light, as shown in FIG. 94 (presenting the transmittance to the exposure). Moreover, the photochromic CEL film 121 does not have a property to become opaque when the optical irradiation is stopped (as ended at $t_2$). Still moreover, these properties are contrary to each other.

Next, in the projecting exposure device, the pattern of reticle 125 is transferred <3> to the photoresist film 120, which is applied to the surface of the aforementioned semiconductor wafer 100, through a projecting optical system 124 and the aforementioned photochromic CEL film 121. This exposure is accomplished by superposing the patterns with different focal depths while using the FLEX method.

Figure 95:
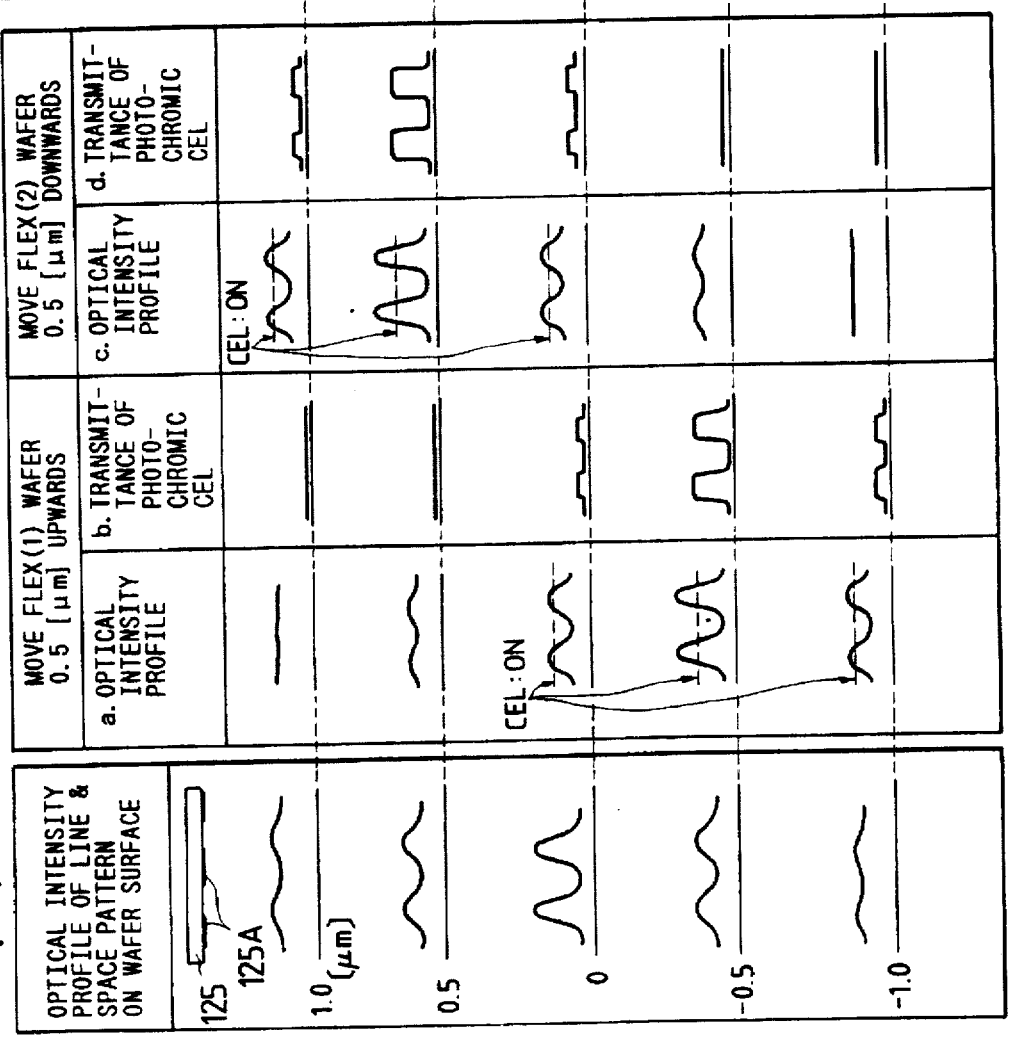
FIG. 95 is a diagram for explaining the effects when the aforementioned substance is used.

FIG. 95 presents the differences of the focal depths depending upon the presence or absence of the photochromic CEL film 121 when the FLEX method is applied to the line-and-space pattern. FIG. 95(A) presents the optical intensity profile of the exposure on the surface (or in the photoresist film 120) of the semiconductor wafer 100 to the line-and-space pattern. As shown in FIG. 95(A), the portion corresponding to the position, in which the chromium pattern 125A of the reticle 125 is absent, is irradiated with the light such that the optical intensity is the maximum at the focal point (0 [μm]) and becomes the lower as vertically leaving the more from the focal point.

FIG. 95(B) present the relations between the optical intensity profile and the characteristic of the photochromic CEL film 121 in case the FLEX method is applied to move the surface of the semiconductor wafer 100 vertically stepwise thereby to enhance the focal depth. If the surface of the semiconductor wafer 100 is moved upwards by 0.5 [μm], as shown in FIG. 95(B), (a) the optical intensity raises the position in which the photoresist-film 120 is deep. If this optical intensity reaches the predetermined value at which the photochromic CEL film 121 is turned transparent, (b) the photoresist film 120 is irradiated with the light in an amount exceeding the aforementioned constant amount. In case the aforementioned optical intensity is not more than the constant value, namely, in a shallow position of the photoresist film 120, the optical irradiation is shielded by the photochromic CEL film 121. Next, if the surface of the semiconductor wafer 100 is moved downwards by 0.5 [μm], as shown in FIG. 95(B), (c) the optical intensity has the higher value for the shallower position of the photoresist film 120. When this optical intensity reaches the constant value at which the photochromic CEL film 121 is turned transparent, (d) the photoresist film 120 is irradiated in an amount exceeding the aforementioned constant amount. In case the aforementioned optical intensity is not higher than the constant amount, namely, in the deep position of the photoresist film 120, the optical irradiation is shielded by the photochromic CEL film 121.

FIG. 95(C) presents the profile of the total optical intensity of the twice optical irradiations in case the FLEX method shown in FIG. 95(B) is applied. In FIG. 95(C), the column (a+b) corresponds to the case in the absence of the photochromic CEL film 121, and the column (a×b+c×d)

corresponds to the case in the presence of the photochromic CEL film 121. If, in the former case of the absence of the photochromic CEL film 121, the FLEX method is applied to the line-and-space pattern, the optical intensity profile exceeds the melting level of the photoresist film 120 in the unexposed portion so that the means is not suitable for improving the focal depth. In the latter case of the presence of the photochromic CEL film 121, the resolution and the focal depth can be improved by the bleaching effect of the photochromic CEL film 121 and by the change in the focal point by the FLEX method.

After the exposure step shown in FIGS. 91 and 92, the photochromic CEL film 121 is removed <4> by a cleaning liquid 122, and the aforementioned photoresist film 120 is developed <5> with a developing liquid 123.

As shown in FIG. 91, on the other hand, the photochromic CEL film 121A may be used in place of the step of applying the photochromic CEL film 121. This photochromic CEL material 121A is pushed, when used, against the surface of the photoresist film 120 which is applied to the surface of the semiconductor wafer 100.

Thus, in the photolithography, a high resolution and a large focal depth of the pattern can be achieved by using the FLEX method and the CEL method.

(Embodiment XI)

In the fabrication process of the DRAM 1 of the foregoing embodiment I, the present embodiment XI is directed to an eleventh embodiment of the present invention, in which the alignment accuracies of the individual layers are improved.

Figure 96:
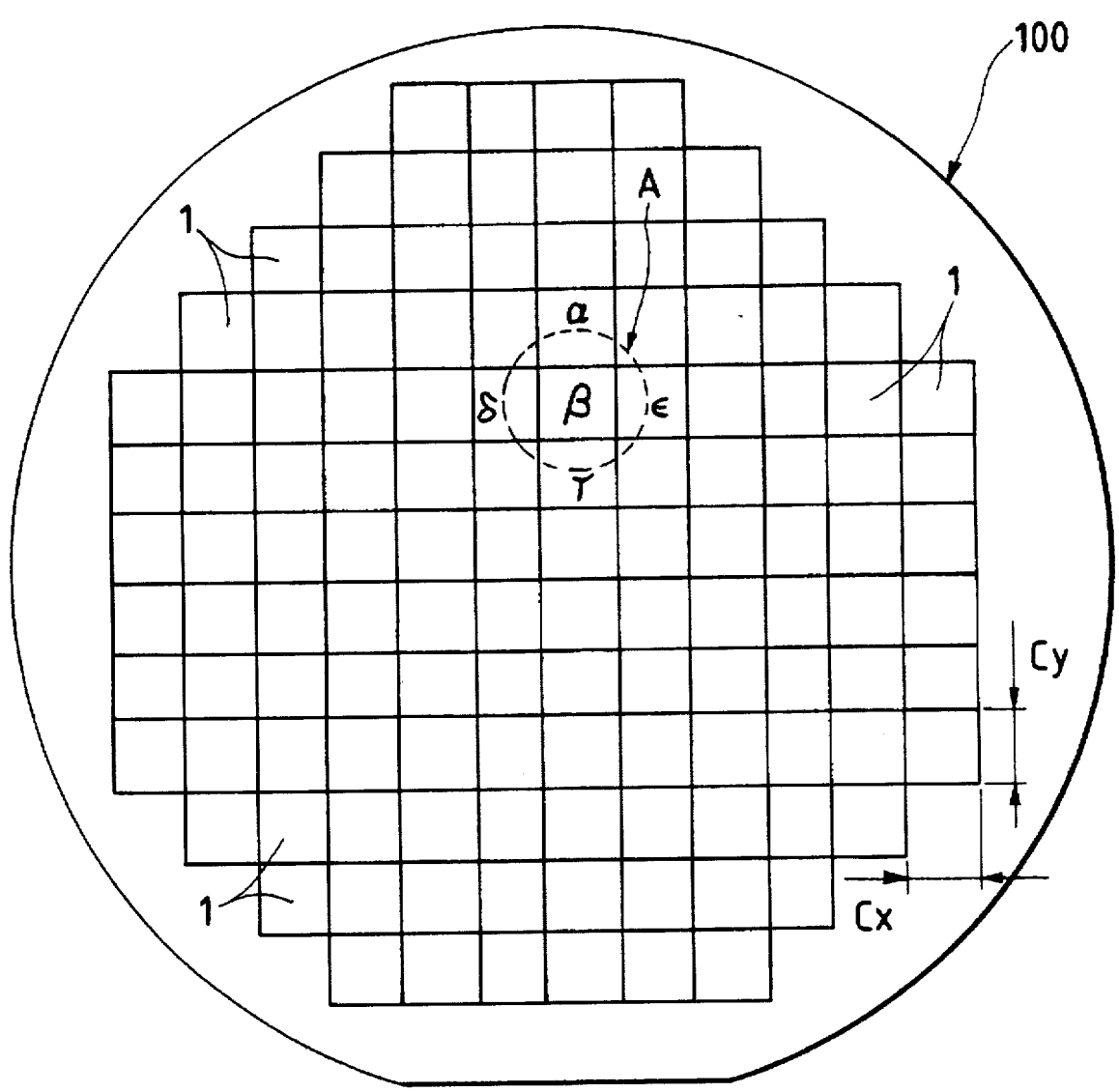
FIG. 96 is a schematic top plan view showing the structure of a semiconductor wafer according to an embodiment XI of the present invention.

The structure of the semiconductor wafer 100 before the dicing step of the DRAM 1 according to the embodiment XI of the present invention is shown in FIG. 96 (presenting a schematic top plan view).

Figure 97:
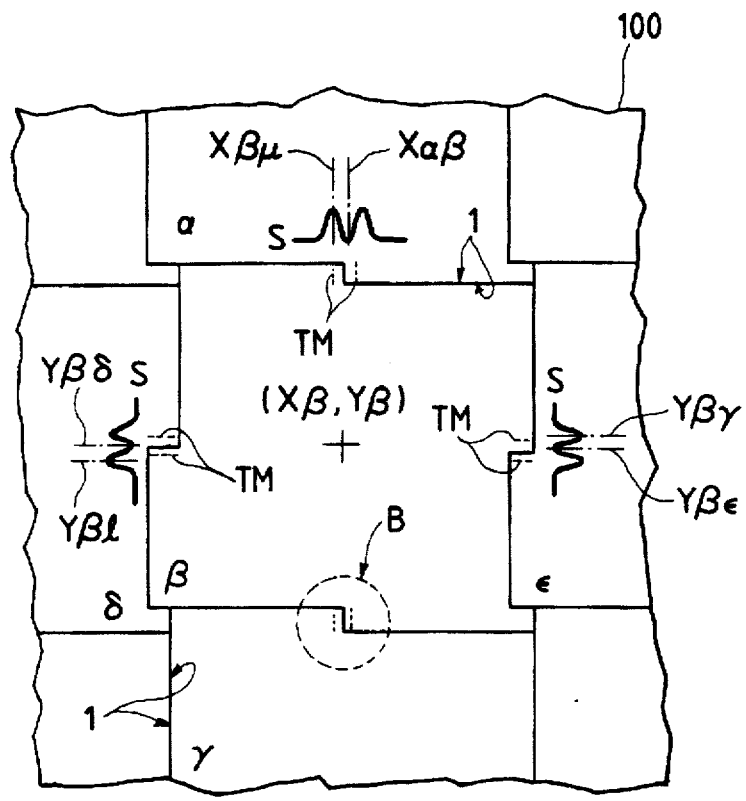
FIG. 97 is an enlarged top plan view showing the aforementioned semiconductor wafer.
Figure 98:
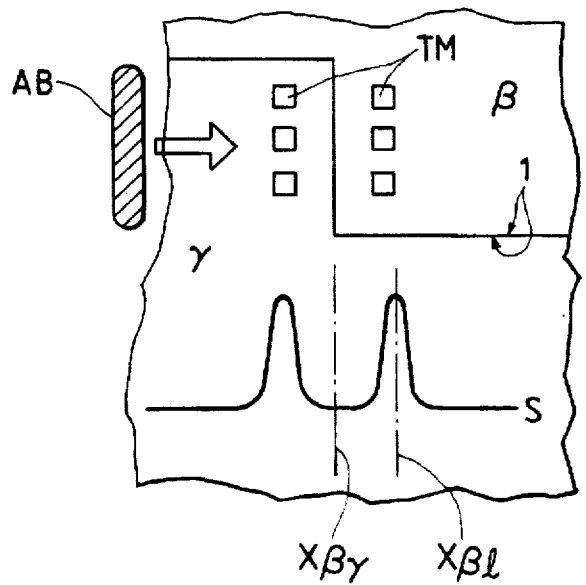
FIG. 98 is an enlarged top plan view showing the semiconductor wafer shown in FIG. 97.

As shown in FIG. 96, the semiconductor wafer 100 is arrayed in a matrix shape with a plurality of DRAMs 1 before the dicing step (i.e., before the shaping into pellets). The not-shown scribe areas are formed between the individual DRAMs 1. As shown in FIG. 97 (presenting an enlarged top plan view of the portion A of FIG. 96) and FIG. 98 (presenting an enlarged top plan view of a portion B of FIG. 97), the target marks TM to be shared between the adjoining DRAMs 1 are arranged in the scribe areas between the adjoining DRAMs ($\alpha$ to $\epsilon$) of the semiconductor wafer 100. Those target marks TM provide references for positioning the alignments in a reduced-scale projecting exposure device. As shown in FIGS. 97 and 98, the target marks TM to be shared between the adjoining DRAMs 1, e.g., $\beta$ and $\gamma$ are so arranged that they can be detected by the single scanning of an alignment beam AB in the X direction. FIGS. 97 and 98 show the waveforms of alignment signals S when the target marks TM are detected by the scanning with the alignment beam AB. On the basis of these alignment signals, the center position $X\beta$ in the X direction, the center position $Y\beta$ in the Y direction and the amount of rotation of the DRAM ($\beta$) shown in FIG. 97 can be calculated by the following equations:

$$X\beta = (X\alpha\beta + X\beta\gamma)/2;$$

$$Y\beta = (Y\beta\delta + Y\beta\epsilon)/2; \text{ and}$$

$$W\beta = \frac{1}{2}[(X\beta u - X\beta l)/Cx + (Y\beta l - Y\beta r)/Cy].$$

According to the alignment of the present embodiment XI, in case the pattern (i.e., pellet pattern) of the DRAM 1 of the second layer is to be arranged with the pattern (i.e., pellet pattern) of DRAM I of the first layer arrayed on the surface of the semiconductor wafer 100, the position of the target marks TM of the pattern of the first-layer DRAM 1 is detected and calculated by the alignment beam AB so that the pattern of the second-layer DRAM 1 is arranged while making a correction to reduce the positional displacement between the patterns of the adjoining second layer DRAMs 1. In other words, there is adopted the associative alignment method, in which the pattern of the second-layer DRAM 1 is associatively aligned with respect to the pattern of the first-layer DRAM 1. This associative alignment method can retain the regularity of the patterns of the DRAM 1, as compared with the pellet alignment method. In this pellet alignment method, the individual patterns of the DRAMs 1 on the surface of the semiconductor wafer 100 are repeatedly aligned and exposed.

On the other hand, the aforementioned associative alignment system will not cause serious alignment errors directly but can achieve a high alignment accuracy even in case the target marks TM are seriously erroneously detected.

Moreover, the associative alignment method can achieve a higher alignment accuracy than the multipoint wafer alignment method even in case the array of the pattern of the first-layers DRAM 1 is highly distorted. In the multi-point wafer alignment method, the plural target marks TM on the surface of the semiconductor wafer 100 are sampled and aligned so that the array of the DRAMs i is estimated from the statistical calculations of the alignment result until only the exposure is accomplished.

In the aforementioned alignment method, moreover, on the basis of the detections of the target marks TM arranged at the four sides of the pattern of the first-layer DRAMs 1, the amount of rotation of the pattern of the second-layer DRAMs 1 can be calculated and corrected. As a result, a higher correction accuracy of the amount of rotation can be achieved than that of the case in which the target marks TM arranged at two higher and lower points or two righthand and lefthand points of the DRAMs 1 are to be detected to correct the amount of rotation. Even in the case of the correction of the amount of rotation, the associative alignment method causes no direct large correction errors of the amount of rotation, even if one target mark TM is erroneously detected, so that a high alignment accuracy can be achieved.

In case, on the other hand, the aforementioned pellet alignment method and multi-point wafer alignment method are mixed, the alignment accuracy is generally dropped. However, the associative alignment method can achieve a high alignment accuracy even in case it is mixed with either method.

Moreover, the aforementioned associative alignment method can detect the target marks TM of the pattern of the adjoining two DRAMs 1 can be detected by the single scanning of the alignment beam AB so that a throughput substantially similar to that of the aforementioned pellet alignment method can be attained.

Figure 99A:
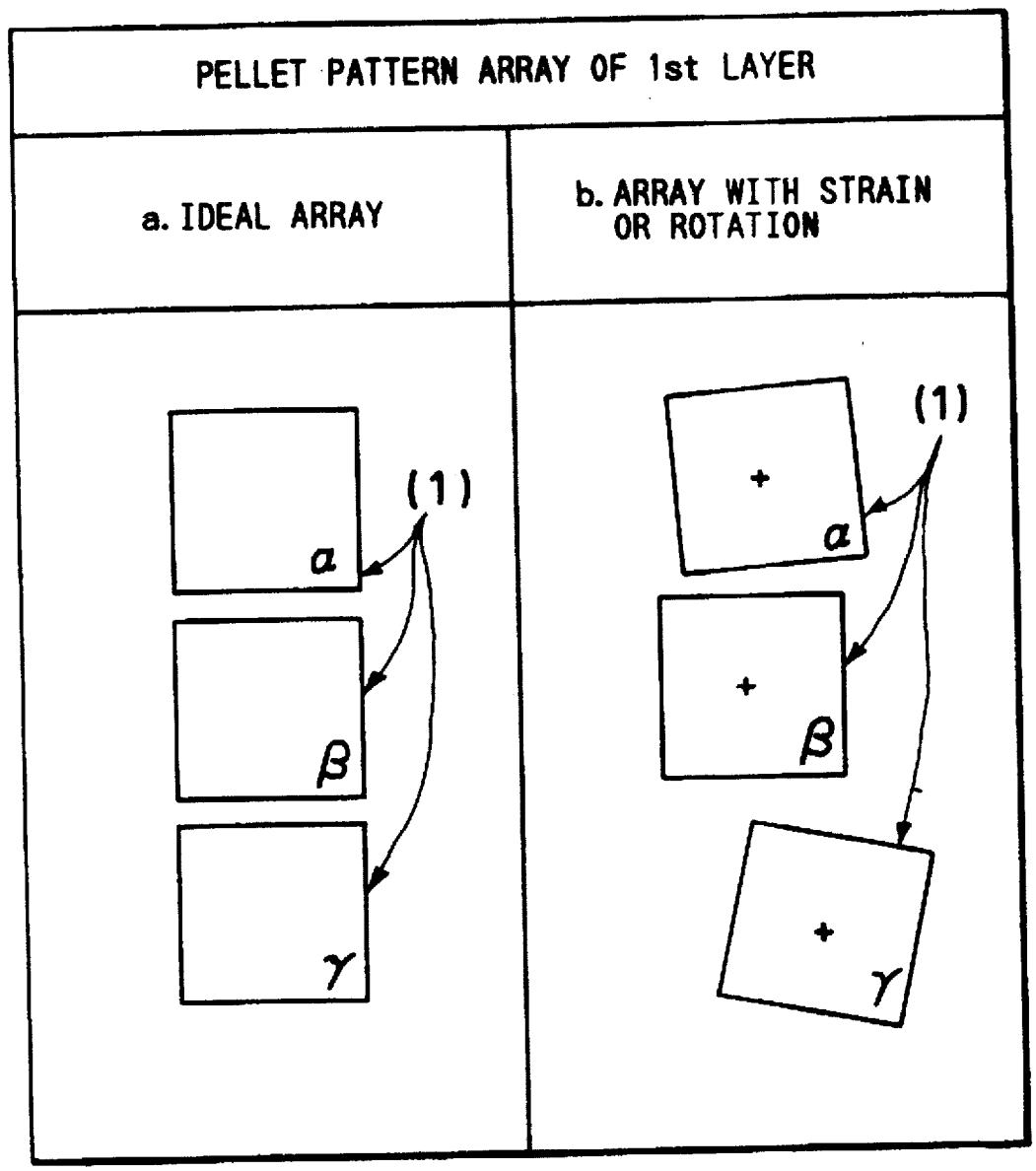
FIG. 99 is a diagram for explaining the effects in case the associative alignment type is applied.

FIG. 99 shows the comparisons of the individual alignment accuracies among the associative alignment method, the pellet alignment method and the multipoint wafer alignment method in case the array of the pattern of the first-layer DRAMs 1 are distorted or rotated. In FIG. 99(A), (a) shows the ideal array of the pattern (1) of the first-layer DRAMs 1, and (b) shows the individual arrays in case there are array strains and rotations in the pattern (1) of the first layer DRAMs 1. In the pattern (1) of the latter first-layer DRAMs 1: the individual X coordinates of the DRAMs $\alpha$ to $\gamma$ are not coincident; the individual pitches of the DRAMs $\alpha$ and $\beta$ and the DRAMs $\beta$ and $\gamma$ in the Y direction are different; and the DRAMs $\alpha$ and $\gamma$ individually have rotational errors.

These array strains and rotations are caused by the warp which is established in the semiconductor wafer 100 by the repeated heat treatments.

FIG. 99(B) shows the comparisons of the individual alignments when the pattern (2) of the second-layer DRAMs 1 are aligned in case the aforementioned array strains and rotations are in the array of the pattern (1) of the first-layer DRAMs 1. In either case, the pattern (2) of the second-layer DRAM γ shows the case in which the target marks TM are seriously erroneously detected with respect to the pattern (1) of the first-layer DRAM γ. On the other hand, the amount of rotation is calculated in the associative alignment method on the basis of the detections of the four target marks TM and in the other two alignment methods on the basis of the detections of the two target marks TM. In case the correction is and is not made on the amount of rotation, as shown in FIG. 99(B), the associative alignment method can achieve a higher alignment accuracy than the other pellet alignment method and multi-pint wafer alignment method.

Thus, the high alignment accuracy can be attained by adopting the associative alignment method.

(Embodiment XII)

In the DRAM 1 of the foregoing embodiment I, the present embodiment XII is directed to a twelfth embodiment of the present invention, in which the reliability is improved at the connected portions between the transition-metal film to be buried in the connecting holes of the interlayer insulating film by the selective CVD method and the wiring lines extending over said interlayer insulating film.

Figure 100:
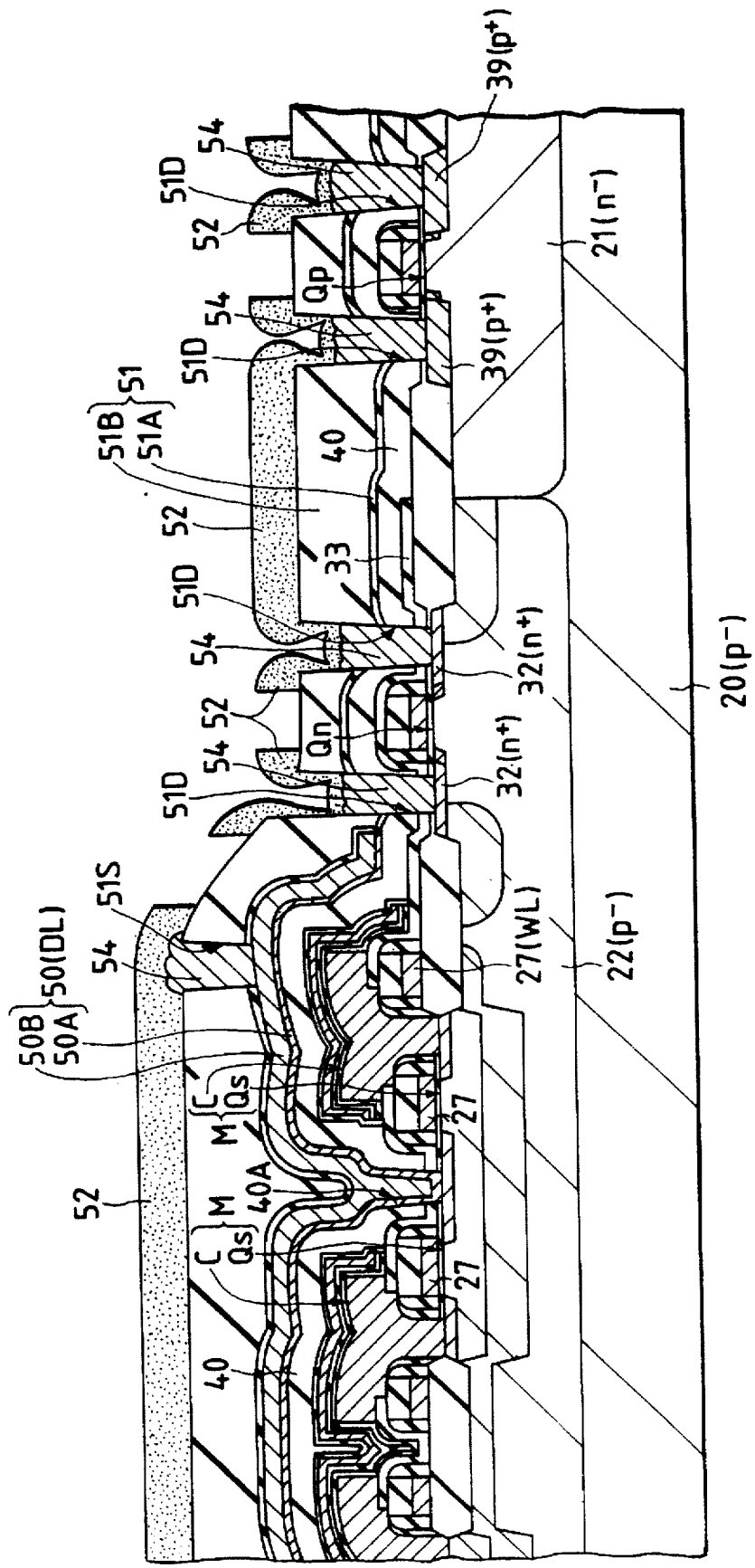
FIG. 100 is a section showing an essential portion of the DRAM 1 according to an embodiment XII of the present invention.

The structure of the DRAM 1 according to the embodiment XII of the present invention is shown in FIG. 100 (presenting an essential portion in section).

In the DRAM 1 of the present embodiment XII, as shown in FIG. 100, the transition-metal film 54 is buried in connecting holes 51D and 51S formed in the interlayer insulating film 51 and is connected with the wiring lines 52 extending over the interlayer insulating film 51.

Figure 101:
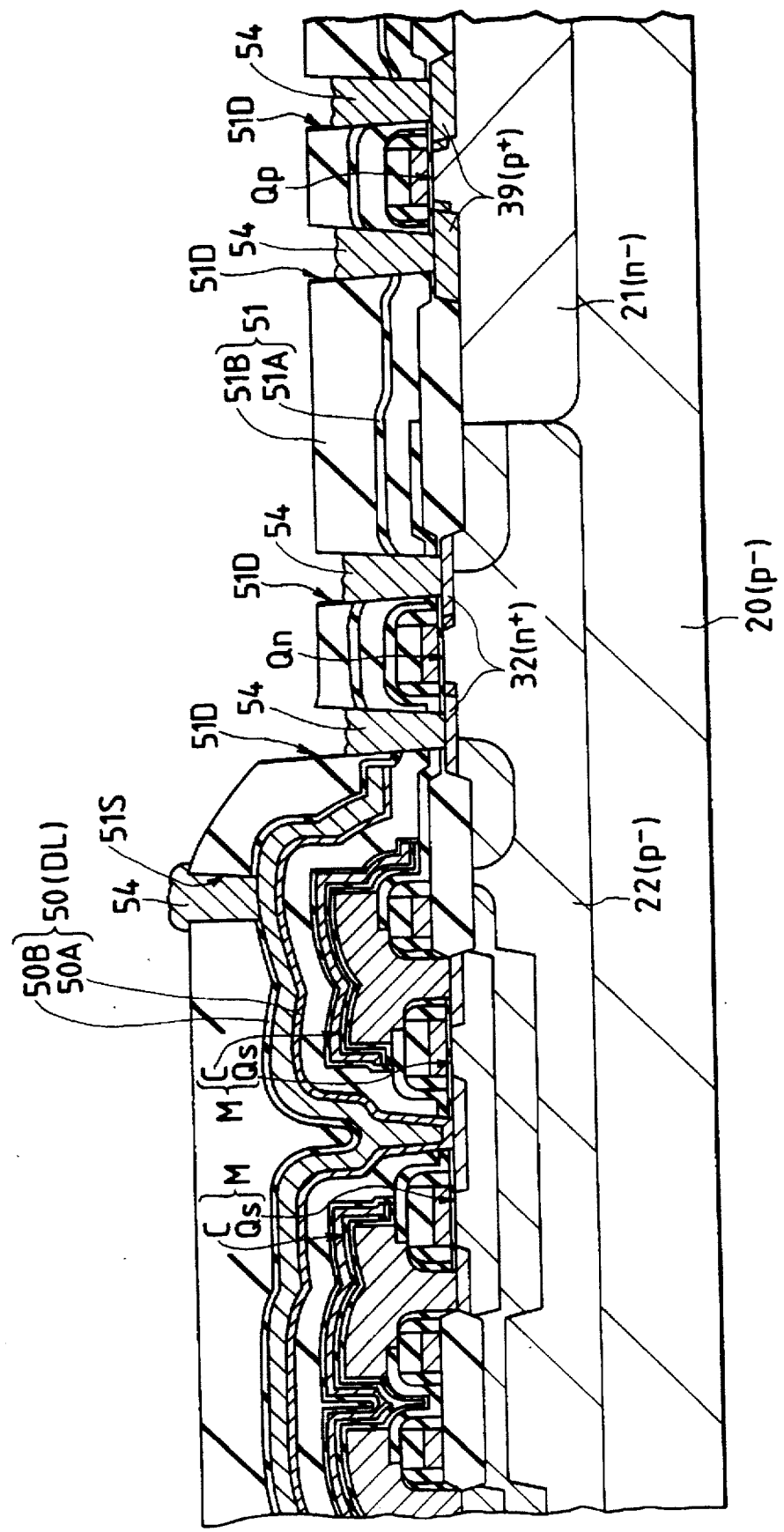
FIG. 101 is a section showing an essential portion at a predetermined fabrication step of the aforementioned DRAM.

In the region of the memory cell array 11E, there are arranged the memory cells M which are composed of the memory cell selecting MISFETs Qs and the information storing capacity elements C of the stacked structure, so that the region has a larger stepped shape than that of the regions of the peripheral circuits. As a result, the interlayer insulating film 51 has a thinner memory cell array 11E than the regions of the peripheral circuits. As shown in FIG. 100 and FIG. 101 (presenting an essential portion at a predetermined fabrication step in section), the connecting holes 51S formed in the memory cell array 11E of the interlayer insulating film 51 are made shallow, whereas the connecting holes 51S formed in the regions of the peripheral circuits are made deep.

The aforementioned transition-metal film 54 used is formed of the W film which is deposited by the selective CVD method like the foregoing embodiment I. The wiring lines 52 used are formed of an aluminum alloy film in the present embodiment XII. On the other hand, the wiring lines 52 may be exemplified by either a transition-metal film such as the W film deposited by the sputtering method or a composite film composed mainly of the former.

The transition-metal film 54 is formed to have such a thickness as to bury the shallow connecting holes 51S of the regions of the memory cell array 11E, as shown in FIGS. 100 and 101. In other words, the transition-metal film 54 is so formed with reference to the shallow connecting holes 51S that it may not protrude from the connecting holes 51S. In case the transition-metal film 54 highly protrude from the connecting holes 51S, the surfaces of the wiring lines 52 thereover protrude so that the size of the etching mask is changed from the set value to drop the treating accuracy of-the wiring lines 52 as a result of the thickness dispersions and the diffractions of the photoresist film for treating the wiring lines 52. Since, moreover, the transition-metal film 54 highly protruding from the aforementioned connecting holes 51S cannot be covered with the overlying wiring lines 52, they are etched more than necessary at the etching step of the wiring lines 52. The transition-metal film 54 to be buried in the deep connecting holes 51D of the regions of the peripheral circuits is buried to have such a thickness that the aspect ratio at the connecting holes 51D may not exceed 1, as shown in FIG. 100. In case the aspect ratio exceeds 1, the step coverage of the overlying wiring lines 52 is dropped to cause the disconnections of the wiring lines 52 frequently at the connecting holes 51D.

Thus, in the DRAM 1 in which the interlayer insulating film 51 is formed over the underlying surface having the stepped shape so that the shallow connecting holes 51S are formed in the regions (of the memory cell array 11E) having the high stepped shape of said underlying surface of the interlayer insulating film 51 whereas the deep connecting holes 51D are formed in the regions (of the peripheral circuits) having the low stepped shape and in which the wiring lines 52 are so extended over the interlayer insulating film 51 that they are connected with the transition-metal film 54 buried in the aforementioned connecting holes 51S and 51D, the transition-metal film 54 to be buried in the aforementioned shallow connecting holes 51S and the aforementioned deep connecting holes 51D is deposited by the selective CVD method, and the transition-metal film 54 is deposited to have a thickness substantially equal to the depth of the aforementioned shallow connecting holes 51S. Thanks to this construction, the transition-metal film 54 to be buried in the aforementioned shallow connecting holes 51S and the aforementioned deep connecting holes 51D is formed to have a thickness substantially equal to the depth of the shallow connecting holes 51S so that it is precluded from protruding from the shallow connecting holes 51S and the deep connecting holes 51D. As a result, it is possible to improve the treating accuracy and reliability of the aforementioned wiring lines 52.

(Embodiment XIII)

In the DRAM 1 of the foregoing embodiment I, the present embodiment XIII is directed to a thirteenth embodiment of the present invention, in which the reliability of the wiring lines 52 formed mainly of a transition-metal film.

Figure 102:
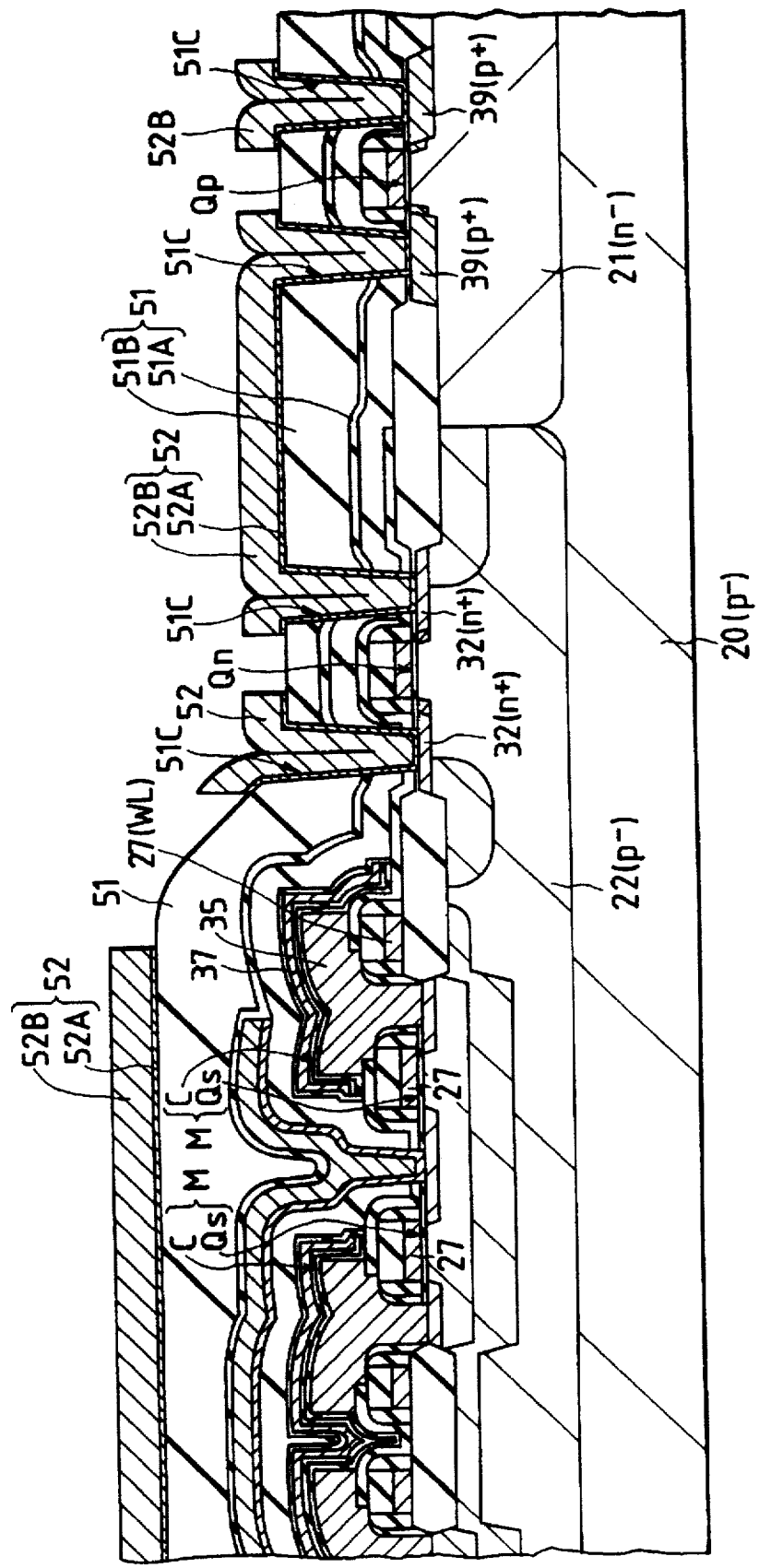
FIG. 102 is a section showing an essential portion of the DRAM according to an embodiment XIII of the present invention.

The structure of the DRAM 1 according to the embodiment XIII of the present invention is shown in FIG. 102 (presenting an essential portion in section).

As shown in FIG. 102, the DRAM 1 of the present embodiment XIII has its wiring lines 52 extending over the interlayer insulating film 51. The wiring lines 52 are formed of the composite film which is prepared by laminating over the transition-metal film 52A the transition-metal film 52B made of a substantially identical metal material.

Figure 103:
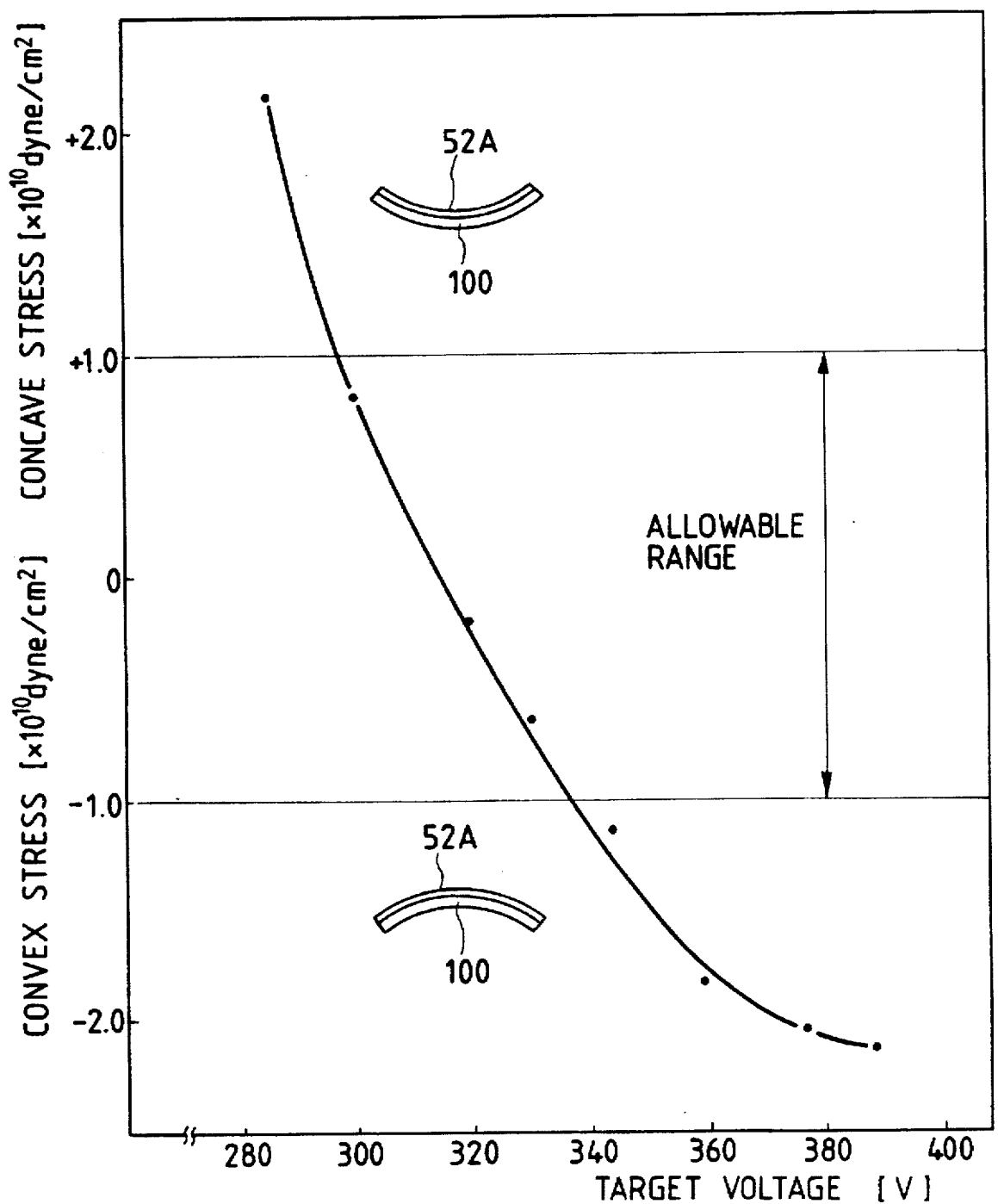
FIG. 103 is a graph presenting the relation between the target voltage and the stress when the film used in the aforementioned DRAM is sputtered.

The lower transition-metal film 52A of the wiring lines 52 is formed of a W film deposited by the sputtering method, for example, to have a thickness of about 80 to 129 [nm], for example. This lower transition-metal film 52A has a high adhesiveness to the underlying interlayer insulating film (e.g., the silicon oxide insulating film) 51. Moreover, the lower transition-metal film 52A is formed to have the above-specified thickness, because a too much thickness will cause an overhang over the stepped shape formed by the connecting holes 51C and accordingly the formation of cavity and the drop of the step coverage of the upper transition-metal film 52A. Still moreover, the lower transition-metal film 52A is deposited by using a target voltage establishing no film stress (i.e., within an allowable range at or neat the stress 0), because it will cause the separation from the surface of the interlayer insulating film 51, as seen from the relation between the target voltage and the film stress when in the sputtering operation in FIG. 103. Furthermore, the lower transition-metal film 52A has an etching rate substantially equal to that of the upper transition-metal film 52B. Furthermore, the lower transition-metal film 52A can have its contact resistance reduced because it has a higher corrosion resistance than that of the TiN film and a small work function difference from the Si.

The upper transition-metal film 52B of the aforementioned wiring lines 52 are made of the W film, which is deposited by the CVD method, to have a thickness of about 250 to 350 [nm], for example. This upper transition-metal film 52B reduces the substantial resistance of the wiring lines 52 and constitutes a major component of the wiring lines 52. The upper transition-metal film 52B can improve the reliability as the wiring lines because the it is deposited by the CVD method to have a high step coverage at the underlying stepped portions thereby to reduce the defects such as the disconnections. The upper transition-metal film 52B can have a high contactnesses with the underlying lower transition-metal film 52A because it is made of an identical metal film material.

Thus, in the DRAM 1 in which the wiring lines 52 are formed of the transition-metal film 52B deposited over the underlying interlayer insulating film 51, the transition-metal film 52A of substantially the same kind as the aforementioned transition-metal film 52B deposited by the sputtering method is sandwiched between the aforementioned interlayer insulating film 51 and the transition-metal film 52B of the aforementioned wiring lines 52. Thanks to this construction, the lower transition-metal film 52A deposited by the sputtering method has high contactnesses with the underlying interlayer insulating film 51 and the upper transition-metal film 52B of the wiring lines 52 so that it can improve the contactnesses between the underlying interlayer insulating film 51 and the wiring lines 52. Since the lower transition-metal film 52A deposited by the sputtering method is formed of the transition-metal film of substantially the same kind as that of the overlying transition-metal film 52B, the treated side walls of the wiring lines 52 can be prevented from being roughed to improve the treating accuracy of the wiring lines 52.

In case the lower transition-metal film 52A of the wiring lines 52 is connected directly with the n⁺-type semiconductor region 32 and the p⁺-type semiconductor regions 39, as shown in FIG. 102, the heat treatment after the deposition of the lower transition-metal film 52A is accomplished at such a temperature or lower that the W and the Si will not alloy. Specifically, the heat treatment is accomplished at about 600 [°C.] or lower. Thus, by restricting the heat treating temperature of the lower transition-metal film 52A of the aforementioned wiring lines 52, the resistance of the connected portions due to the alloying reaction between the aforementioned W and Si is suppressed from rising, to prevent the alloy spike phenomena.

(Embodiment XIV)

In the DRAM 1 of the foregoing embodiment I, the present invention XIV is directed to a fourteenth embodiment of the present invention, in which the reliabilities at the connected portions between the individual elements and the wiring lines are improved.

Figure 104:
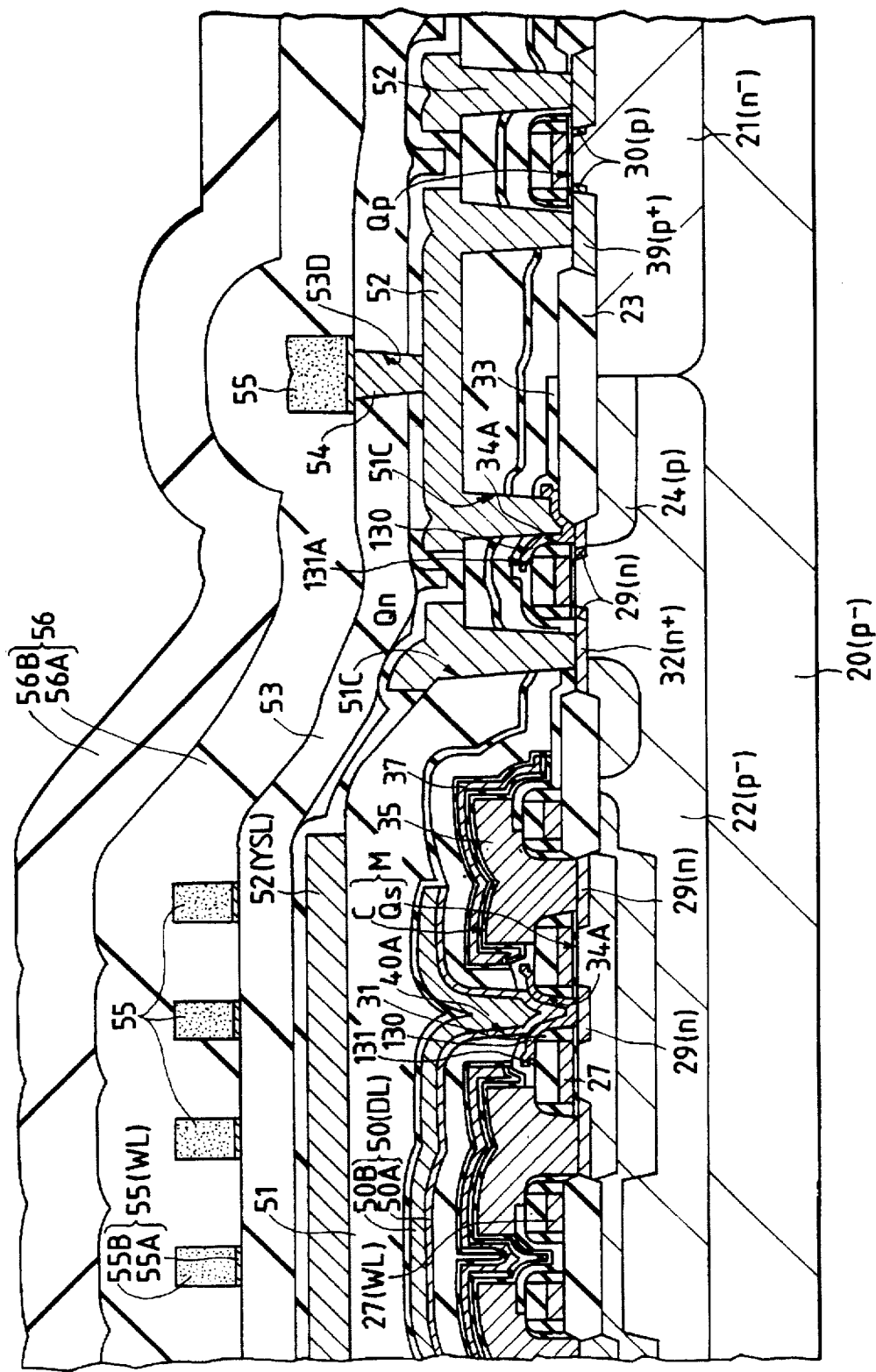
FIG. 104 is a section showing an essential portion of the DRAM 1 according to an embodiment XIV of the present invention.

The structure of the DRAM 1 according to the embodiment XIV of the present invention is shown in FIG. 104 (presenting an essential portion in section).

In the DRAMs 1 of the present embodiment XIV, as shown in FIG. 104, in the memory cell array 11E, an intermediate conducting film 130 is interposed between one of the n-type semiconductor regions 29 of the memory cell selecting MISFETs Qs of the memory cells M and the complementary data lines (DL) 50. This intermediate conducting film 130 is partially connected with the n-type semiconductor regions 29 through the connecting holes 131A formed in an interlayer insulating film 131 and the connecting holes 34A and is partially extended over the side wall spacers 31 and the interlayer insulating film 131. In the connecting holes 131A formed in the interlayer insulating film 131, the connecting holes 34A are formed by the side wall spacers 31, which are formed in the side walls of the gate electrodes 27 of the memory cell selecting MISFETs Qs, to define the opening size. Since the connecting holes 34A are formed in self-alignment with the gate electrodes 27, the connections between the intermediate conducting film 130 and the n-type semiconductor regions 29 are accomplished in self-alignment with the gate electrodes gate electrodes 27. In short, the n-type semiconductor regions 29 of the memory cell selecting MISFETs Qs and the complementary data lines 50 are connected through the intermediate conducting film 130 and in self-alignment with the gate electrodes, 27 of the memory cell selecting MISFETs Qs.

The intermediate conducting film 130 is formed above the gate electrodes 27 (including the word lines 27) of the memory cell selecting MISFETs Qs and below the lower electrode layer 35 of the information storing capacity element C of the stacked structure. Specifically, the lower electrode layer 35 of the information storing capacity element C of the stacked structure is formed to have the large thickness so as to increase the amount of charge storage so that the intermediate conducting film 130 is formed separately of and below the lower electrode layer 35 so as to improve the treating accuracy. The intermediate conducting film 130 is formed of the polycrystalline silicon film, which is deposited by the CVD method, for example, to have a small thickness of about 80 to 120 [nm], for example. This polycrystalline silicon film is doped with an n-type impurity to reduce the resistance.

The intermediate conducting film 130 can damp especially the steep stepped shape of the connected portions of the memory cells M and the complementary data lines 50 so that it can reduce the defects, i.e., the disconnections of the complementary data lines 50.

The intermediate conducting film 130 is formed in the elements of the peripheral circuits, too, at the common fabrication step. Although not limitative thereto, in the present embodiment XIV, the intermediate conducting film 130 is formed in the regions of the n-channel MISFETs Qn requiring an especially strict layout rules between the n⁺-type semiconductor regions 32 and the wiring lines 52. Usually, the peripheral circuits have looser layout rules than the memory cell arrays 11E. Even in case the wiring lines 52 ride on the element separating insulating film 23 in the regions of the peripheral circuits, as shown in FIG. 104, the intermediate conducting film 130 can be formed inbetween to connect the n⁺-type semiconductor regions 32 and the wiring lines 52 reliably to improve the degree of integration of the DRAMs 1 resultantly. Even in case the n-channel MISFETs Qn and the p-channel MISFETs of the peripheral circuits are connected through the wiring lines 52 which are made of a material for facilitating the mutual diffusions of the impurities such as the transition-metal film, too, the intermediate conducting film 130 can prevent the aforementioned mutual diffusions to reduce the resistance at the connected portions.

Next, the process of forming the DRAM 1 according to the present embodiment XIV will be briefly described with reference to FIGS. 105 and 106 (presenting essential portions at the individual fabrication steps in section).

First of all, the memory cell selecting MISFETs Qs of the memory cells M and the n-channel MISFETs Qn of the peripheral circuits are individually formed like the process for forming the DRAM 1 of the foregoing embodiment I.

Next, the interlayer insulating film interlayer insulating film 131 is so deposited all over the surface of the substrate as to cover the aforementioned memory cell selecting MISFETs Qs and n-channel MISFETs Qn. The interlayer insulating film 131 used is formed of the silicon oxide film, which is deposited by the CVD method using inorganic silane gases and nitrogen oxide gases, for example, as its source gases, to have a thickness of about 40 to 60 [nm].

Next, the connecting holes 131A and the connecting holes 34A are formed in the aforementioned interlayer insulating film 131 in the individual regions, i.e., one of the n-type semiconductor regions 29 of the memory cell selecting MISFETs Qs of the memory cells M and the $n^+$-type semiconductor regions 32 of a predetermined one of the n-channel MISFETs Qn.

Next, as shown in FIG. 105, there is formed the intermediate conducting film 130 which is to be connected through the aforementioned connecting holes 131A and 34A with the n-type semiconductor regions 29 and the $n^+$-type semiconductor regions 32.

Next, as shown in FIG. 106, the interlayer insulating film 33 is formed all over the surface of the substrate including the surface of the intermediate conducting film 130. After this, the DRAMs 1 of the present embodiment XIV is completed by accomplishing the steps similar to those of the process of forming the DRAMs 1 of the foregoing embodiment I such as the information storing capacity element C of the stacked structure or the p-channel MISFETs Qp. Thus, in the DRAMs 1 in which there are arranged the memory cells M which are formed of a series circuit between the memory cell selecting MISFETs Qs and the information storing capacity element C of the stacked structure having the lower electrode layer 35, the dielectric film 36 and the upper electrode layer 37 at the intersections between the complementary data lines 50 and the gate electrodes 27, there is formed between the complementary data lines 50 and one of the n-type semiconductor regions 29 of the memory cell selecting MISFETs Qs the intermediate conducting film 130 which is partially formed in self-alignment with said one of the n-type semiconductor regions 29, which is partially extracted to above the gate electrodes 27 of the memory cell selecting MISFETs Qs and which is formed below and separately of the lower electrode layer 35 of the information storing capacity element C of the stacked structure. Thanks to this construction, the intermediate conducting film 130 is sandwiched so that the area of the memory cells M can be reduced to improve the degree of integration to an extent corresponding to the masking allowance at the fabrication step between the one of the n-type semiconductor regions 29 of the memory cell selecting MISFETs Qs and the complementary data lines 50. At the same time, the gap between the intermediate conducting film 130 and the lower electrode layer 35 of the information storing capacity element C of the stacked structure can be eliminated to increase the area of the lower electrode layer 35 independently of the intermediate conducting film 130. As a result, the amount of charge storage of the information storing capacity element C of the stacked structure can be increased to reduce the area of the memory cells M thereby to improve the degree of integration.

Moreover, the intermediate conducting film 130 is constructed to have a smaller thickness than that of the lower electrode layer 35 of the information storing capacity element C of the stacked structure. Thanks to this construction, the information storing capacity element C of the stacked structure can increase the thickness of the lower electrode layer 35 to enlarge the area in the vertical direction so that the amount of charge storage can be improved to shrink the area of the memory cells M thereby to improve the degree of integration. At the same time, the intermediate conducting film 130 is made thin so that it can be simply treated.

Between the $n^+$-type semiconductor regions 32 of the n-channel MISFETs Qn constituting the peripheral circuits and the wiring lines 52 to be connected with the former, moreover, there is interposed the intermediate conducting film 130 which is formed of the same conducting layer as that of the intermediate conducting film 130 formed in the aforementioned memory cells M. Thanks to this construction, the intermediate conducting film 130 of the peripheral circuits can be formed at the step of forming the intermediate conducting film 130 in the memory cells M of the DRAM 1 so that the number of fabrication steps of the DRAM 1 can be reduced.

Although our invention has been specifically described hereinbefore in connection with the foregoing embodiments thereof, it should not be limited to the foregoing embodiments but can be modified in various manners without departing the gist thereof.

For example, the present invention can be applied to a semiconductor integrated circuit device such as a microcomputer using the DRAM as its one unit.

The present invention should not be limited to the aforementioned DRAM but can also be applied to a semiconductor integrated circuit device such as the SRAM or the ROM having storing functions.

Moreover, the present invention can be applied to a multi-layered wiring technology for the printed wiring substrate or the like.

The effects to be attained by the representatives of the invention thus far disclosed will be briefly described in the following:

(1) The degree of integration of the semiconductor integrated circuit device-having the storing functions can be improved;

(2) The electric reliability of the aforementioned semiconductor integrated circuit device can be improved;

(3) The soft error withstand voltage of the aforementioned semiconductor integrated circuit device can be improved;

(4) The number of fabrication steps of the aforementioned semiconductor integrated circuit device can be reduced;

(5) The treating accuracy for fabricating the aforementioned semiconductor integrated circuit device can be improved;

(6) The drivability of the semiconductor elements of the aforementioned semiconductor integrated circuit device can be improved;

(7) The fabrication yield of the aforementioned semiconductor integrated circuit device can be improved;

(8) The operating speed of the aforementioned semiconductor integrated circuit device can be increased;

(9) The wiring defects, e.g., the disconnections of the aforementioned semiconductor integrated circuit device can be prevented;

(10) The moisture resistance of the aforementioned semiconductor integrated circuit device can be improved;

(11) In the aforementioned semiconductor integrated circuit device having the redundancy fuses, the step of forming the redundancy fuses can be simplified;

(12) The quality of the films to be used in the aforementioned semiconductor integrated circuit device can be improved; and

(13) The apparatus for fabricating the item (12) can be provided.

What is claimed is:

1. A semiconductor integrated circuit device comprising:
   a semiconductor substrate having a main surface;
   an insulating film formed over said main surface of said semiconductor substrate; and
   a wiring line formed overlying said insulating film, wherein said wiring line comprises a first refractory metal layer formed by a sputtering method and a second refractory metal layer formed by a CVD method in contact with said first refractory metal layer, wherein said first refractory metal layer has substantially no film stress, wherein said second refractory metal layer is formed on said first refractory metal layer, and wherein said second refractory metal layer includes a same material as that of said first refractory metal layer.

2. A semiconductor integrated circuit device as set forth in claim 1, wherein said first refractory metal layer has a smaller thickness than that of said second refractory metal layer.

3. A semiconductor integrated circuit device as set forth in claim 1 wherein said wiring line comprises a tungsten film.

4. A semiconductor integrated circuit device as set forth in claim 1, further comprising a further insulating film formed on said wiring line.

5. A semiconductor integrated circuit device as set forth in claim 1, further comprising:
   a MISFET having a source region and a drain region and a gate electrode, and
   a capacitor element having a first electrode and a second electrode and a dielectric film formed between said first and second electrodes, wherein said MISFET and said capacitor element are formed under said insulating film and said MISFET is connected to said capacitor element.

6. A semiconductor integrated circuit device as set forth in claim 1, wherein said insulating film comprises a silicon oxide film.

7. A semiconductor integrated circuit device as set forth in claim 1, wherein said first refractory metal layer overlies said insulating film.

8. A semiconductor integrated circuit device as set forth in claim 1, wherein said wiring line is formed on said insulating film.

9. A semiconductor integrated circuit device as set forth in claim 8, wherein said first refractory metal layer overlies said insulating film.

10. A semiconductor integrated circuit device as set forth in claim 1, wherein the first and second refractory metal layers have substantially a same etching rate with an etchant.

11. A semiconductor integrated circuit device as set forth in claim 1, wherein the first and second refractory metal layers are made of an identical metal film material.

12. A semiconductor integrated circuit device comprising:
    a semiconductor substrate having a main surface;
    a semiconductor region formed in said semiconductor substrate extending to said main surface;
    an insulating film formed over said main surface of said semiconductor substrate, said insulating film having a hole at said semiconductor region so as to expose said semiconductor region; and
    a wiring line formed overlying said insulating film and said semiconductor region and into said hole, wherein said wiring line comprises a first refractory metal layer formed by a sputtering method and a second refractory metal layer formed by a CVD method in contact with said first refractory metal layer, wherein said first refractory metal layer has substantially no film stress, wherein said second refractory metal layer is formed on said first refractory metal layer, and wherein said second refractory metal layer includes a same material as that of said first refractory metal layer.

13. A semiconductor integrated circuit device as set forth in claim 12, wherein said first refractory metal layer has a smaller thickness than that of said second refractory metal layer.

14. A semiconductor integrated circuit device as set forth in claim 12, wherein said wiring line comprises a tungsten film.

15. A semiconductor integrated circuit device as set forth in claim 12, further comprising a further insulating film formed on said wiring line.

16. A semiconductor integrated circuit device as set forth in claim 12, wherein said insulating film comprises a silicon oxide film.

17. A semiconductor integrated circuit device as set forth in claim 12, wherein the first and second refractory metal layers have substantially a same etching rate with an etchant.

18. A semiconductor integrated circuit device as set forth in claim 12, wherein said first refractory metal layer overlies said insulating film.

19. A semiconductor integrated circuit device as set forth in claim 12, wherein said wiring line is formed on said insulating film.

20. A semiconductor integrated circuit device as set forth in claim 19, wherein said first refractory metal layer overlies said insulating film.

21. A semiconductor integrated circuit device as set forth in claim 12, wherein the first and second refractory metal layers are made of an identical metal film material.

* * * * *